(12) United States Patent
Kim et al.

(10) Patent No.: US 9,520,568 B2
(45) Date of Patent: Dec. 13, 2016

(54) ORGANIC LIGHT-EMITTING DIODE

(71) Applicants: SAMSUNG DISPLAY CO., LTD., Yongin, Gyeonggi-Do (KR); Industry-Academic Cooperation Foundation Gyeongsang National University, Gyeongnam (KR)

(72) Inventors: Se-Hun Kim, Yongin (KR); Dong-Hyun Kim, Yongin (KR); Hwan-Hee Cho, Yongin (KR); Mi-Kyung Kim, Yongin (KR); Chang-Woong Chu, Yongin (KR); Yun-Ji Lee, Yongin (KR); Yun-Hi Kim, Yongin (KR); Soon-Ki Kwon, Yongin (KR)

(73) Assignees: Industry-Academic Cooperation Foundation Gyeongsang National University, Gyeongnam (KR); Samsung Display Co., Ltd., Yongin-Si, Gyeonggi-Do (KR)

( * ) Notice: Subject to any disclaimer, the term of this patent is extended or adjusted under 35 U.S.C. 154(b) by 418 days.

(21) Appl. No.: 14/077,506

(22) Filed: Nov. 12, 2013

(65) Prior Publication Data

US 2014/0346464 A1    Nov. 27, 2014

(30) Foreign Application Priority Data

May 23, 2013    (KR) ........................ 10-2013-0058543

(51) Int. Cl.
     *H01L 51/00*      (2006.01)
     *H01L 51/50*      (2006.01)

(52) U.S. Cl.
     CPC ......... *H01L 51/0058* (2013.01); *H01L 51/006* (2013.01); *H01L 51/0052* (2013.01); *H01L 51/0055* (2013.01); *H01L 51/0072* (2013.01); *H01L 51/0094* (2013.01); *H01L 51/5012* (2013.01)

(58) Field of Classification Search
None
See application file for complete search history.

(56) References Cited

U.S. PATENT DOCUMENTS

| | | | |
|---|---|---|---|
| 5,635,308 | A | 6/1997 | Inoue et al. |
| 7,244,518 | B2 | 7/2007 | Yu et al. |

(Continued)

FOREIGN PATENT DOCUMENTS

| | | |
|---|---|---|
| JP | 03-200289 A | 9/1991 |
| JP | 07-138561 A | 5/1995 |

(Continued)

*Primary Examiner* — J. L. Yang
(74) *Attorney, Agent, or Firm* — Lee & Morse, P.C.

(57) ABSTRACT

An organic light-emitting diode including a substrate; a first electrode on the substrate; a second electrode facing the first electrode; and an emission layer between the first electrode and the second electrode, the emission layer including an anthracene-based compound represented by Formula 1, below, and a condensed ring compound represented by Formula 20, below:

<Formula 1>

(Continued)

-continued

<Formula 20>

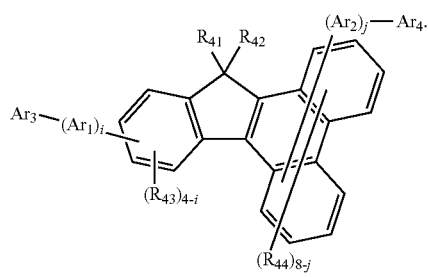

19 Claims, 1 Drawing Sheet

(56) References Cited

U.S. PATENT DOCUMENTS

| | | | |
|---|---|---|---|
| 2006/0008674 A1* | 1/2006 | Yu | C07F 7/0809 428/690 |
| 2012/0181520 A1 | 7/2012 | Kim et al. | |
| 2013/0069523 A1 | 3/2013 | Matsuura et al. | |

FOREIGN PATENT DOCUMENTS

| | | |
|---|---|---|
| JP | 8-12600 A | 1/1996 |
| JP | 08-239655 A | 9/1996 |
| JP | 2006-28175 A | 2/2006 |
| KR | 10-1018547 B1 | 2/2011 |
| KR | 10-1031463 B1 | 4/2011 |
| KR | 10-2012-0083203 A | 7/2012 |
| KR | 10-2012-0135501 A | 12/2012 |

* cited by examiner

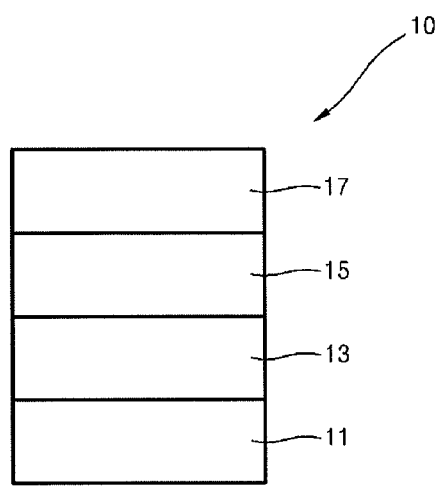

ORGANIC LIGHT-EMITTING DIODE

CROSS-REFERENCE TO RELATED APPLICATION

Korean Patent Application No. 10-2013-0058543, filed on May 23, 2013, in the Korean Intellectual Property Office, and entitled: "Organic Light-Emitting Diode," is incorporated by reference herein in its entirety.

BACKGROUND

1. Field

Embodiments relate to an organic light-emitting diode.

2. Description of the Related Art

Organic light-emitting diodes (OLEDs), which are self-emitting devices, may have advantages, such as wide viewing angles, excellent contrast, quick response, high brightness, excellent driving voltage characteristics, and providing full-color images.

An OLED may have a structure including a substrate, an anode, a hole transport layer, an emission layer, an electron transport layer, and a cathode, sequentially stacked on the substrate. The hole transport layer, the emission layer, and the electron transport layer may be organic thin films formed of organic compounds.

An operating principle of an OLED having the above-described structure may be as follows.

When a voltage is applied between the anode and the cathode, holes injected from the anode may move to the emission layer via the hole transport layer, and electrons injected from the cathode may move to the emission layer via the electron transport layer. The holes and electrons (e.g., carriers) may recombine in the emission layer to generate excitons. When the excitons drop from an excited state to a ground state, light may be emitted.

SUMMARY

Embodiments are directed to an organic light-emitting diode.

The embodiments may be realized by providing an organic light-emitting diode including a substrate; a first electrode on the substrate; a second electrode facing the first electrode; and an emission layer between the first electrode and the second electrode, the emission layer including an anthracene-based compound represented by Formula 1, below, and a condensed ring compound represented by Formula 20, below:

<Formula 1>

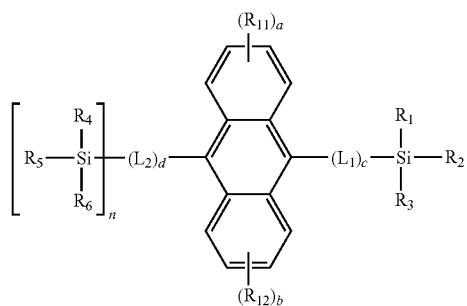

<Formula 20>

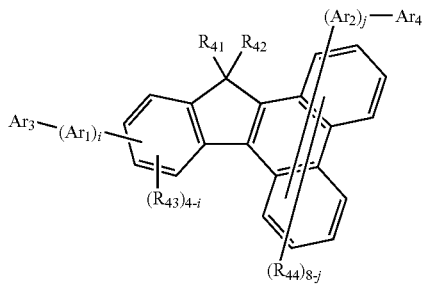

wherein, in Formulae 1 and 20 n is 0 or 1; $R_1$ to $R_6$ are each independently selected from a substituted or unsubstituted $C_1$-$C_{60}$ alkyl group, a substituted or unsubstituted non-condensed ring group in which a number of ring forming atoms is in a range of 3 to 10, and a substituted or unsubstituted condensed ring group in which two or more rings are condensed, and when n is 0, at least one of $R_1$ to $R_3$ is a substituted or unsubstituted condensed ring group in which two or more rings are condensed, and when n is 1, at least one of $R_1$ to $R_6$ is a substituted or unsubstituted condensed ring group in which two or more rings are condensed; $L_1$, $L_2$, $Ar_1$, and $Ar_2$ are each independently selected from a substituted or unsubstituted $C_3$-$C_{10}$ cycloalkylene group, a substituted or unsubstituted $C_3$-$C_{10}$ cycloalkenylene group, a substituted or unsubstituted $C_3$-$C_{10}$ heterocycloalkylene group, a substituted or unsubstituted $C_3$-$C_{10}$ heterocycloalkenylene group, a substituted or unsubstituted $C_6$-$C_{60}$ arylene group, and a substituted or unsubstituted $C_2$-$C_{60}$ heteroarylene group; c and d are each independently an integer of 1 to 3; $R_{11}$, $R_{12}$, $R_{43}$, and $R_{44}$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —N($Q_1$)($Q_2$), and —Si($Q_3$)($Q_4$)($Q_5$), wherein $Q_1$ to $Q_5$ are each independently a hydrogen atom, a $C_1$-$C_{10}$ alkyl group, a $C_6$-$C_{20}$ aryl group, or a $C_2$-$C_{20}$ heteroaryl group; a and b are each independently an integer of 1 to 4; $R_{41}$ and $R_{42}$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group; i and j are each independently an integer of 0 to 3; and $Ar_3$ and $Ar_4$ are each independently represented by one of Formulae 7A to 7F below:

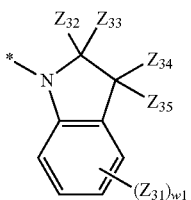

<Formula 7A>

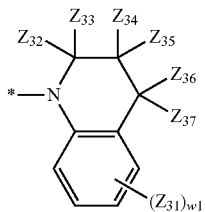

<Formula 7B>

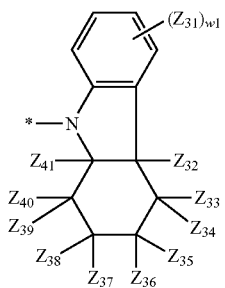

<Formula 7C>

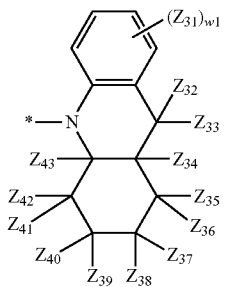

<Formula 7D>

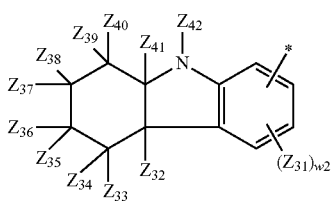

<Formula 7E>

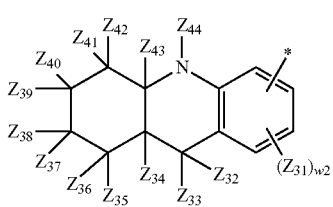

<Formula 7F> in Formulae 7A to 7F, $Z_{31}$ to $Z_{44}$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —N($Q_{51}$)($Q_{52}$), and —Si($Q_{53}$)($Q_{54}$)($Q_{55}$), wherein $Q_{51}$ to $Q_{55}$ are each independently a hydrogen atom, a C1-C10 alkyl group, a $C_6$-$C_{20}$ aryl group, or a $C_2$-$C_{20}$ heteroaryl group, and two or more of $Z_{31}$ to $Z_{44}$ are bindable to each other to selectively form a saturated or unsaturated ring having 6 to 20 carton atoms; w1 is an integer of 1 to 4; and w2 is an integer of 1 to 5.

A weight ratio of the anthracene-based compound to the condensed ring compound in the emission layer is in a range of about 99.9:0.01 to 80:20.

$R_1$ to $R_6$ in Formula 1 are each independently selected from
a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a thiophenyl group, a furanyl group, a pyrrolyl group, an imidazolyl group, a pyrazolyl group, an isothiazolyl group, an isoxazolyl group, a thiazolyl group, an oxazolyl group, an oxadiazolyl group, a thiadiazolyl group, a triazolyl group, a phenyl group, a pyridinyl group, a pyrazinyl group, a pyrimidinyl group, a pyridazinyl group, a triazinyl group, a pentalenyl group, an indenyl group, a naphthyl group, an azulenyl group, a heptalenyl group, a biphenylenyl group, an indacenyl group, an acenaphthylenyl group, a fluorenyl group, a spiro-fluorenyl group, a carbazolyl group, an anthracenyl group, a phenalenyl group, a phenanthrenyl group, a perylenyl group, a fluorantenyl group, a naphthacenyl group, a pycenyl group, a pentaphenyl group, a hexacenyl group, a dibenzofuranyl group, a dibenzothiophenyl group, a phenothiazinyl group, a phenoxazinyl group, a dihydrophenazinyl group, a phenoxathiinyl group, and a phenanthridinyl group; and
a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a thiophenyl group, a furanyl group, a pyrrolyl group, an imidazolyl group, a pyrazolyl group, an isothiazolyl group, an isoxazolyl group, a thiazolyl group, an oxazolyl group, an oxadiazolyl group, a thiadiazolyl group, a triazolyl group, a phenyl group, a pyridinyl group, a pyrazinyl group, a pyrimidinyl group, a pyridazinyl group, a triazinyl group, a pentalenyl group, an indenyl group, a naphthyl group, an azulenyl group, a heptalenyl group, a biphenylenyl group, an indacenyl group, an acenaphthylenyl group, a fluorenyl group, a spiro-fluorenyl group, a carbazolyl group, an anthracenyl group, a phenalenyl group, a phenanthrenyl group, a perylenyl group, a fluoranthenyl group, a naphthacenyl group, a pycenyl group, a pentaphenyl group, a hexacenyl group, a dibenzofuranyl group, a dibenzothiophenyl group, a phenothiazinyl group, a phenoxazinyl group, a dihydrophenazinyl group, a phenoxathiinyl group, and a phenanthridinyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11a}$)($Q_{12a}$), wherein $Q_{11a}$ and $Q_{12a}$ are each independently a hydrogen atom, a $C_1$-$C_{10}$ alkyl group, a $C_6$-$C_{20}$ aryl group, or a $C_2$-$C_{20}$ heteroaryl group, at least one of $R_1$ to $R_3$, when n is 0, or at least one of $R_1$ to $R_6$, when n is 1, are each independently selected from a pentalenyl group, an indenyl group, a naphthyl group, an azulenyl group, a heptalenyl group, a biphenylenyl group, an indacenyl group, an acenaphthylenyl group, a fluorenyl group, a spiro-fluorenyl group, a carbazolyl group, an anthracenyl group, a phenalenyl group, a phenanthrenyl group, a perylenyl group, a fluoranthenyl group, a naphthacenyl group, a pycenyl group, a pentaphenyl group, a hexacenyl group, a dibenzofuranyl group, a dibenzothiophenyl group, a phenothiazinyl group, a phenoxazinyl group, a dihydrophenazinyl group, a phenoxathiinyl group, and a phenanthridinyl group; and a pentalenyl group, an indenyl group, a naphthyl group, an azulenyl group, a heptalenyl group, a biphenylenyl group, an indacenyl group, an acenaphthylenyl group, a fluorenyl group, a spiro-fluorenyl group, a carbazolyl group, an anthracenyl group, a phenalenyl group, a phenanthrenyl group, a perylenyl group, a fluoranthenyl group, a naphthacenyl group, a pycenyl group, a pentaphenyl group, a hexacenyl group, a dibenzofuranyl group, a dibenzothiophenyl group, a phenothiazinyl group, a phenoxazinyl group, a dihydrophenazinyl group, a phenoxathiinyl group, and a phenanthridinyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11a}$)($Q_{12a}$) wherein $Q_{11a}$ and $Q_{12a}$ are each independently a hydrogen atom, a $C_1$-$C_{10}$ alkyl group, a $C_6$-$C_{20}$ aryl group, or a $C_2$-$C_{20}$ heteroaryl group.

$R_1$ to $R_6$ in Formula 1 are each independently selected from

Formulae 2A to 2T, below;

Formulae 3A to 3R, below;

a methyl group, an ethyl group, an n-propyl group, an i-propyl group, an n-butyl group, an i-butyl group, a t-butyl group, a pentyl group, a hexyl group, a heptyl group, an octyl group, a nonyl group, and a decyl group; and a methyl group, an ethyl group, an n-propyl group, an i-propyl group, an n-butyl group, an i-butyl group, a t-butyl group, a pentyl group, a hexyl group, a heptyl group, an octyl group, a nonyl group, and a decyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11a}$)($Q_{12a}$), wherein $Q_{11a}$ and $Q_{12a}$ are each independently a hydrogen atom, a $C_1$-$C_{10}$ alkyl group, a $C_6$-$C_{20}$ aryl group, or a $C_2$-$C_{20}$ heteroaryl group, at least one of $R_1$ to $R_3$, when n is 0, or at least one of $R_1$ to $R_6$, when n is 1, are each independently selected from Formulae 3A to 3R below:

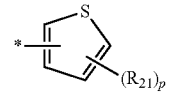

Formula 2A

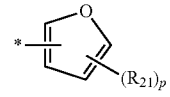

Formula 2B

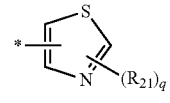

Formula 2C

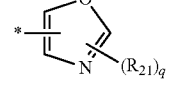

Formula 2D

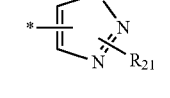

Formula 2E

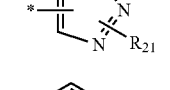

Formula 2F

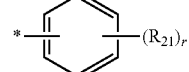

Formula 2G

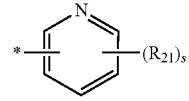

Formula 2H

-continued
Formula 2I
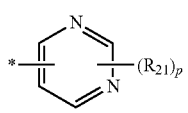
Formula 2J
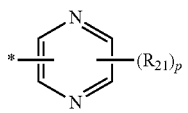
Formula 2K
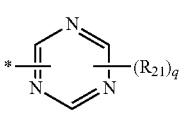
Formula 2L
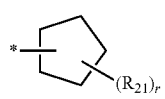
Formula 2M
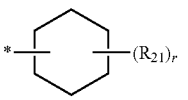
Formula 2N
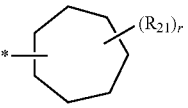
Formula 2O
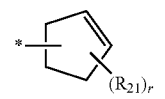
Formula 2P
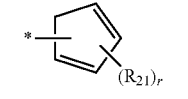
Formula 2Q
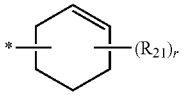
Formula 2R
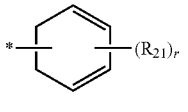
Formula 2S
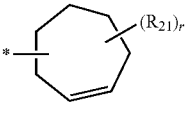
Formula 2T
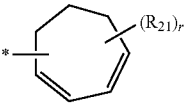
Formula 3A
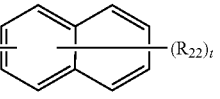
Formula 3B
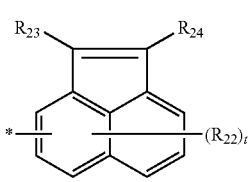
Formula 3C
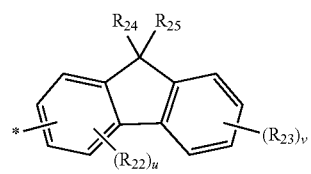
Formula 3D
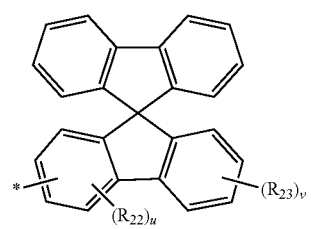
Formula 3E
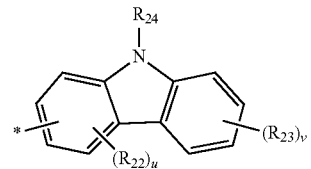
Formula 3F
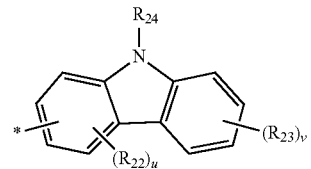
Formula 3G
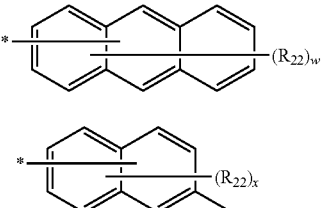
Formula 3H
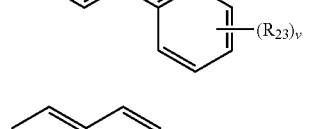
Formula 3I
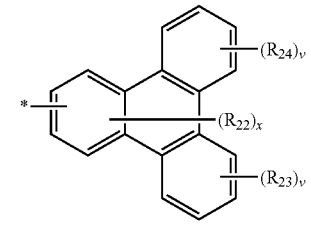

-continued

Formula 3J
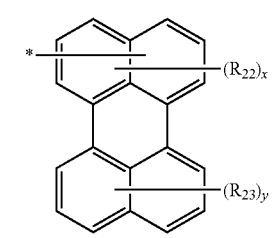

Formula 3K
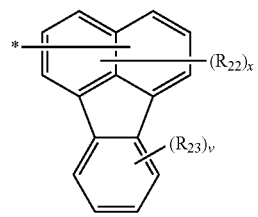

Formula 3L
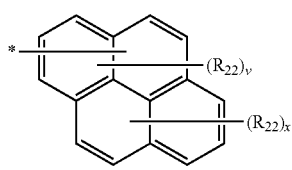

Formula 3M
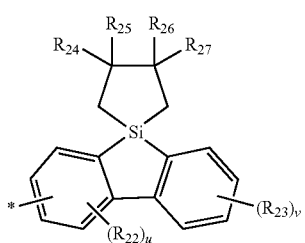

Formula 3N
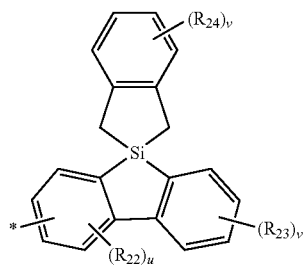

Formula 3O
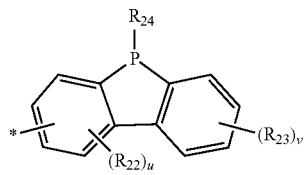

Formula 3P
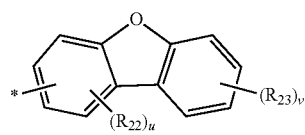

Formula 3Q
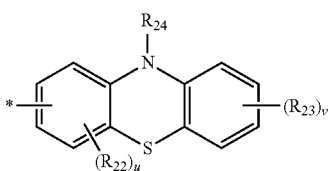

Formula 3R
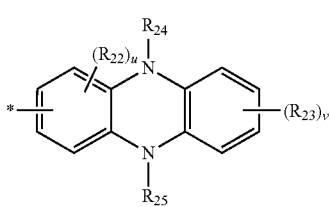

in Formulae 2A to 2T and 3A to 3R $R_{21}$ to $R_{27}$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11a}$)($Q_{12a}$), wherein $Q_{11a}$ and $Q_{12a}$ are each independently selected from a hydrogen atom, a $C_1$-$C_{10}$ alkyl group, a $C_6$-$C_{20}$ aryl group, and a $C_2$-$C_{20}$ heteroaryl group, p and u are each independently an integer of 1 to 3; q is 1 or 2; r and x are each independently an integer of 1 to 5; s and v are each independently an integer of 1 to 4; t is an integer of 1 to 7; w is an integer of 1 to 9; and y is an integer of 1 to 6.

$R_1$ to $R_6$ in Formula 1 are each independently selected from

Formula 2G below;

Formulae 4A to 4J below;

a methyl group, an ethyl group, an n-propyl group, an i-propyl group, an n-butyl group, an i-butyl group, a t-butyl group, a pentyl group, a hexyl group, a heptyl group, an octyl group, a nonyl group, and a decyl group; and a methyl group, an ethyl group, an n-propyl group, an i-propyl group, an n-butyl group, an i-butyl group, a t-butyl group, a pentyl group, a hexyl group, a heptyl group, an octyl group, a nonyl group, and a decyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a phenyl group, a naphthyl group, and an anthracenyl group, and at least one of $R_1$ to $R_3$, when n is 0, or at least one of $R_1$ to $R_6$, when n is 1, are each independently selected from Formulae 4A to 4J, below:

Formula 2G
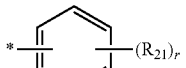

Formula 4A
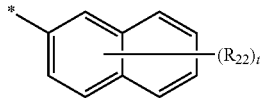

Formula 4B
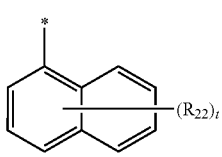

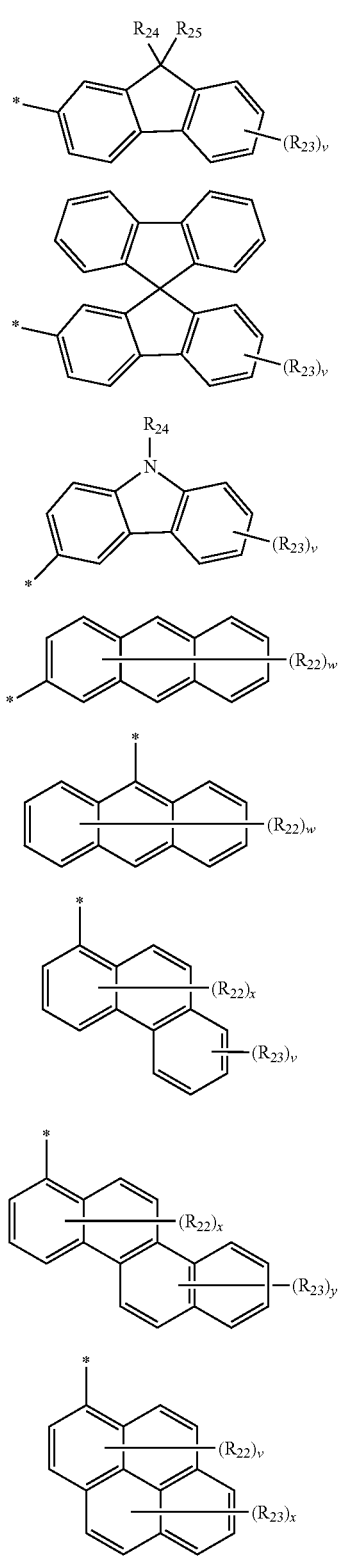

Formula 4C

Formula 4D

Formula 4E

Formula 4F

Formula 4G

Formula 4H

Formula 4I

Formula 4J in Formulae 2G and 4A to 4J $R_{21}$ to $R_{25}$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a dimethylfluorenyl group, a phenylcarbazolyl group, a pyrenyl group, a chrycenyl group, a benzothiazolyl group, a benzooxazolyl group, a phenylbenzoimidazolyl group, and —N($Q_{11a}$)($Q_{12a}$), wherein $Q_{11a}$ and $Q_{12a}$ are each independently selected from a hydrogen atom, a $C_1$-$C_{10}$ alkyl group, a phenyl group, a naphthyl group, and an anthracenyl group; r and x are each independently an integer of 1 to 5; v is an integer of 1 to 4; t is an integer of 1 to 7; w is an integer of 1 to 9; and y is an integer of 1 to 6.

$L_1$, $L_2$, $Ar_1$, and $Ar_2$ in Formulae 1 and 20 are each independently selected from a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, a cycloheptadienylene group, a thiophenylene group, a furanylene group, a pyrrolylene group, an imidazolylene group, a pyrrazolylene group, an isothiazolylene group, an isoxazolylene group, a thiazolylene group, an oxazolylene group, an oxadiazolylene group, a thiadiazolylene group, a triazolylene group, a phenylene group, a pyridinylene group, a pyrazinylene group, a pyrimidinylene group, a pyridazinylene group, a triazinylene group, a pentarenylene group, an indenylene group, a naphthylene group, an azulenylene group, a biphenylenylene group, an indacenylene group, an acenaphthylenylene group, a fluorenylene group, a spiro-fluorenylene group, a carbazolylene group, an anthracenylene group, a phenalenylene group, a phenanthrenylene group, a perylenylene group, a fluoranthenylene group, a naphthacenylene group, a picenylene group, a pentaphenylene group, a hexacenylene group, a dibenzofuranylene group, a dibenzothiophenylene group, a phenothiazinylene group, a phenoxazinylene group, a dihydrophenazinylene group, a phenoxathiinylene group, and a phenanthridinylene group; and a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, a cycloheptadienylene group, a thiophenylene group, a furanylene group, a pyrrolylene group, an imidazolylene group, a pyrrazolylene group, an isothiazolylene group, an isoxazolylene group, a thiazolylene group, an oxazolylene group, an oxadiazolylene group, a thiadiazolylene group, a triazolylene group, a phenylene group, a pyridinylene group, a pyrazinylene group, a pyrimidinylene group, a pyridazinylene group, a triazinylene group, a pentarenylene group, an indenylene group, a naphthylene group, an azulenylene group, a biphenylenylene group, an indacenylene group, an acenaphthylenylene group, a fluorenylene group, a spiro-fluorenylene group, a carbazolylene group, an anthracenylene group, a phenalenylene group, a phenanthrenylene group, a perylenylene group, a fluoranthenylene group, a naphthacenylene group, a picenylene group, a pentaphenylene group, a hexacenylene group, a dibenzofuranylene group, a dibenzothiophenylene group, a phenothiazinylene group, a phenoxazinylene group, a dihydrophenazinylene group, a phenoxathiinylene group, and a phenanthridinylene group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11b}$)($Q_{12b}$), wherein $Q_{11b}$ and $Q_{12b}$ are each independently a hydrogen atom, a $C_1$-$C_{10}$ alkyl group, a $C_6$-$C_{20}$ aryl group, or a $C_2$-$C_{20}$ heteroaryl group.

$L_1$, $L_2$, $Ar_1$, and $Ar_2$ in Formulae 1 and 20 are each independently selected from Formulae 5A to 5J:

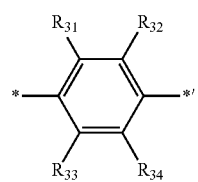

Formula 5A

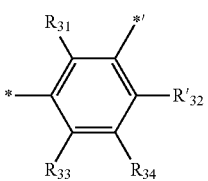

Formula 5B

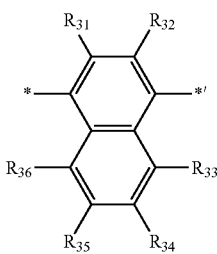

Formula 5C

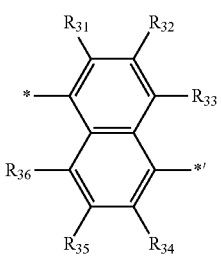

Formula 5D

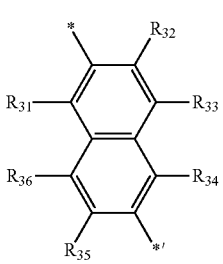

Formula 5E

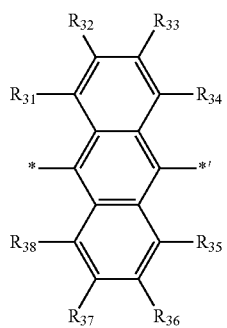

Formula 5F

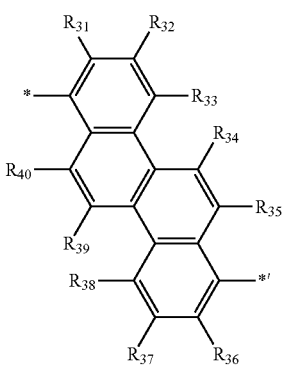

Formula 5G

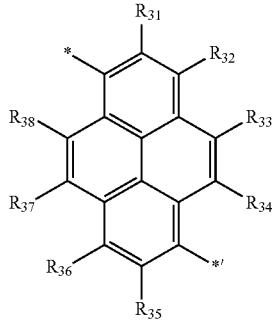

Formula 5H

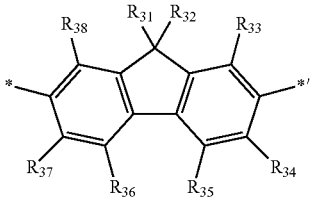

Formula 5I

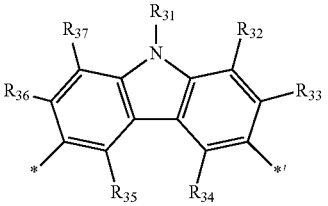

Formula 5J $R_{31}$ to $R_{40}$ in Formulae 5A to 5J are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11b}$)($Q_{12b}$), wherein $Q_{11b}$ and $Q_{12b}$ are each independently a hydrogen atom, a $C_1$-$C_{10}$ alkyl group, a $C_6$-$C_{20}$ aryl group, or a $C_2$-$C_{20}$ heteroaryl group; and * indicates a binding site.

In Formula 1 n is 1; $R_1$, $R_3$, $R_4$, and $R_6$ are each independently a substituted or unsubstituted $C_1$-$C_{60}$ alkyl group; and $R_2$ and $R_5$ are each independently selected from a substituted or unsubstituted non-condensed ring group in which the number of ring forming atoms is in a range of 3 to 10, and a substituted or unsubstituted condensed ring group in which two or more rings are condensed, wherein at least one of $R_3$ and $R_5$ is a substituted or unsubstituted condensed ring group in which two or more rings are condensed.

In Formula 1 n is 0; $R_1$ and $R_3$ are each independently a substituted or unsubstituted $C_1$-$C_{60}$ alkyl group; and $R_2$ is a substituted or unsubstituted condensed ring group in which two or more rings are condensed.

The anthracene-based compound is one of Compounds 1 to 24 below:

1

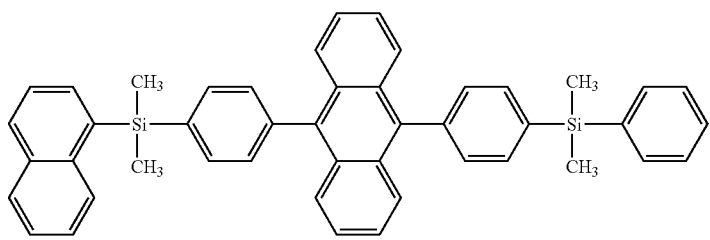

2

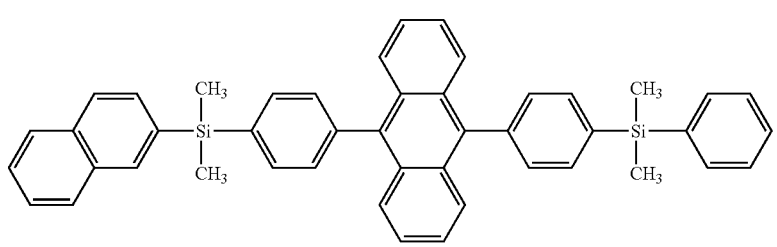

3

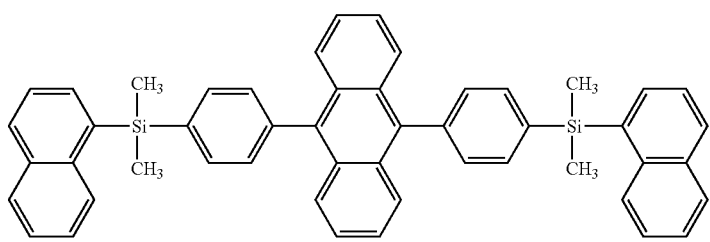

4

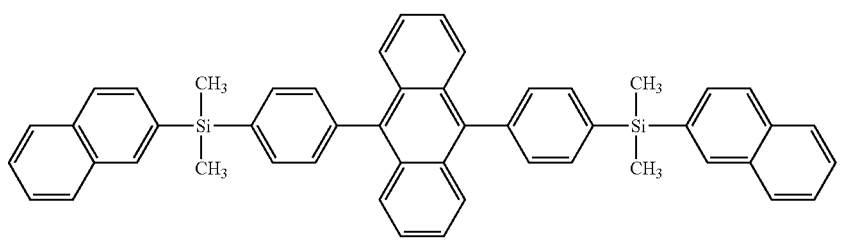

5

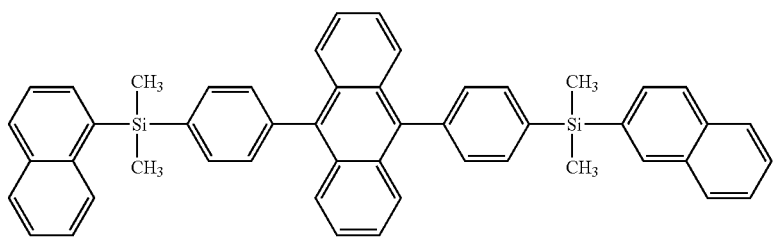

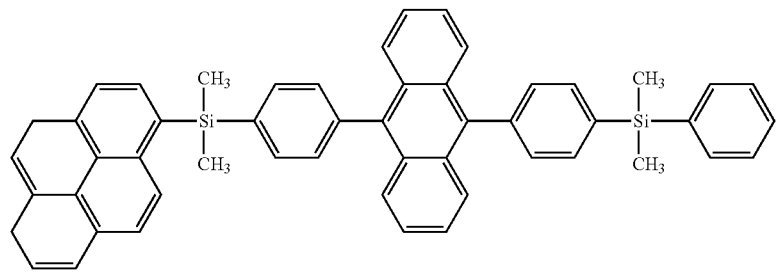
6
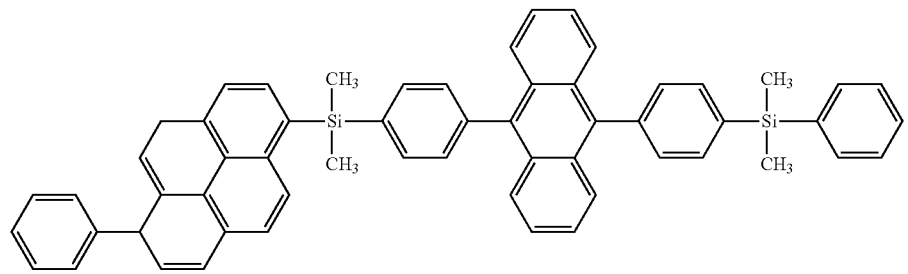
7
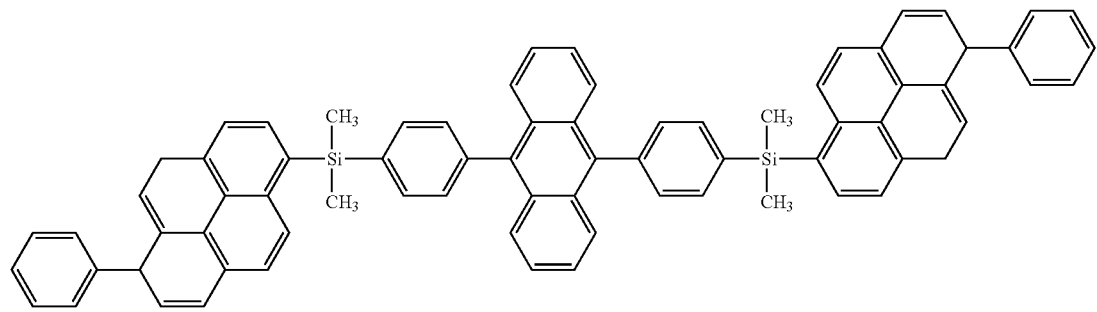
8
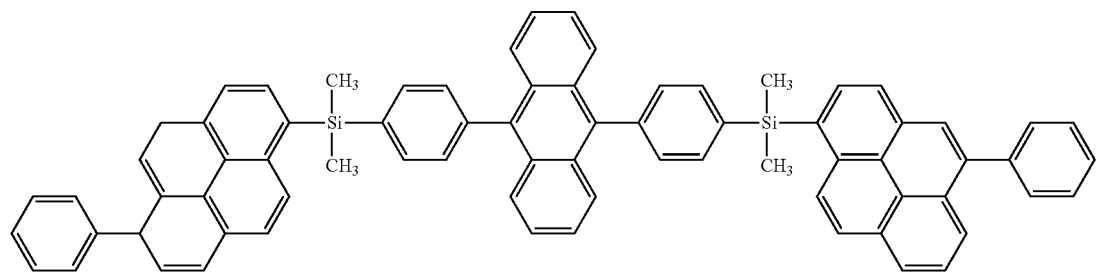
9
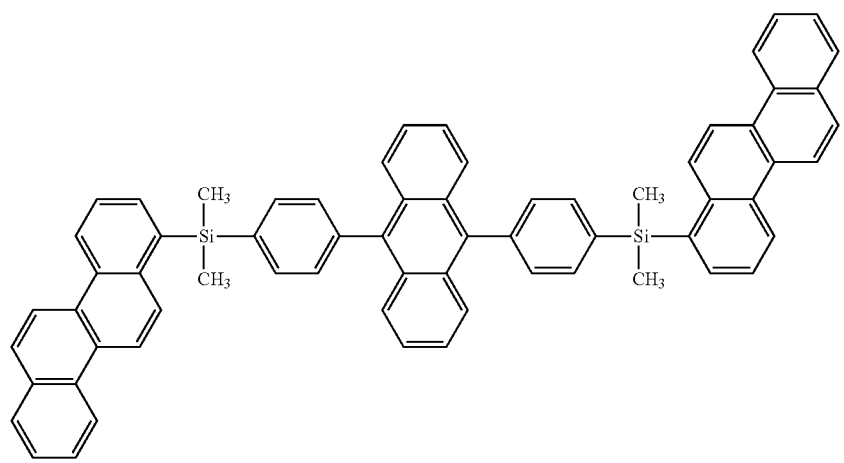
10

11
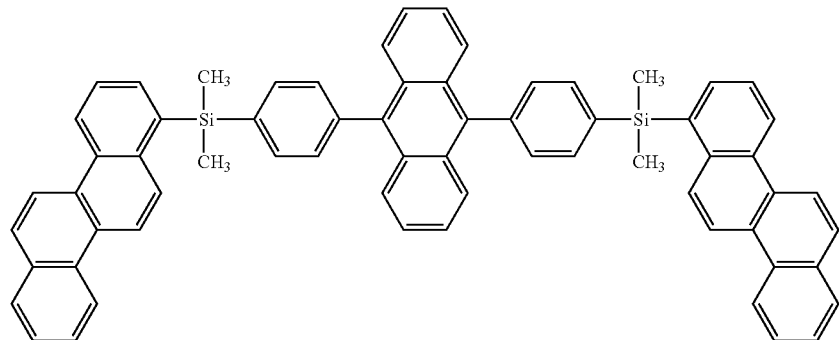
12
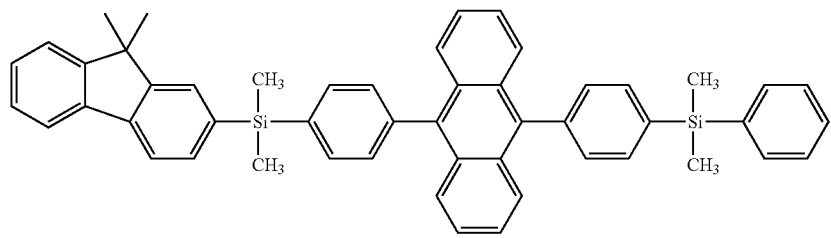
13
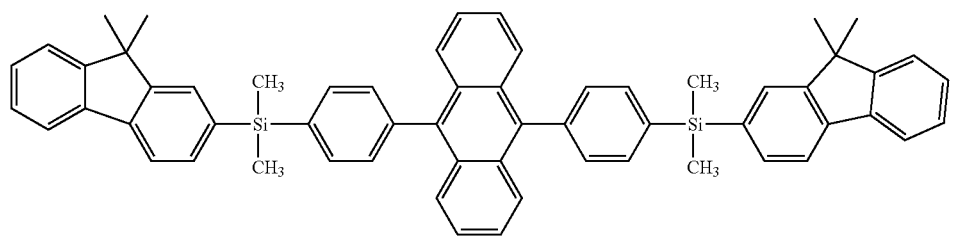
14
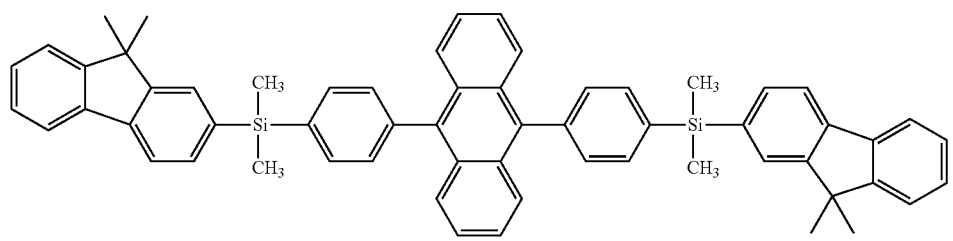
15
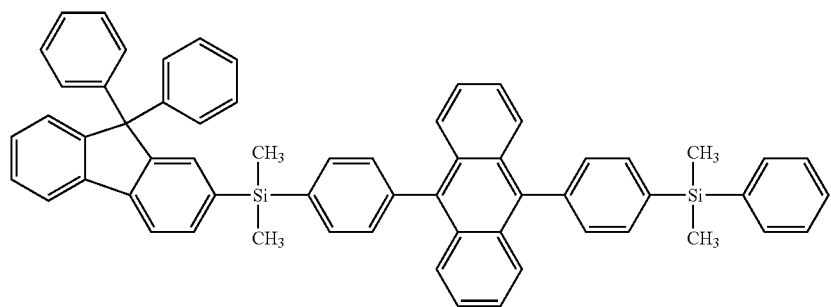

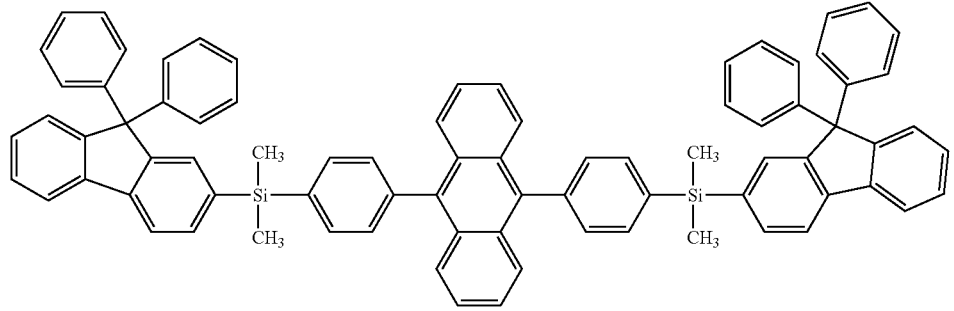
16
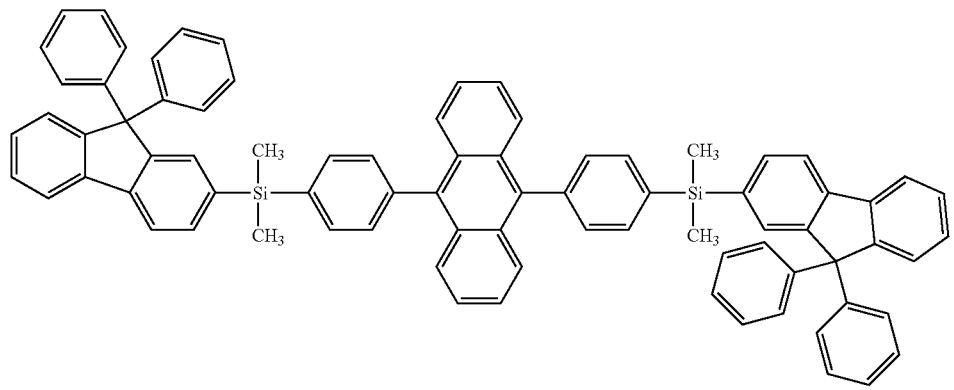
17
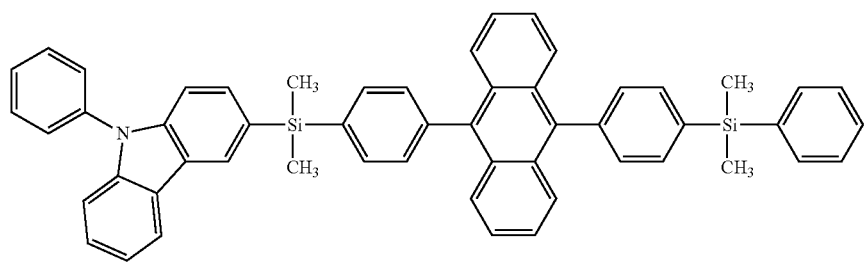
18
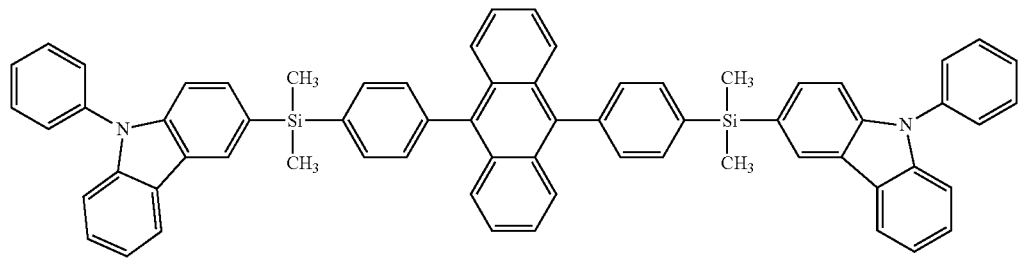
19
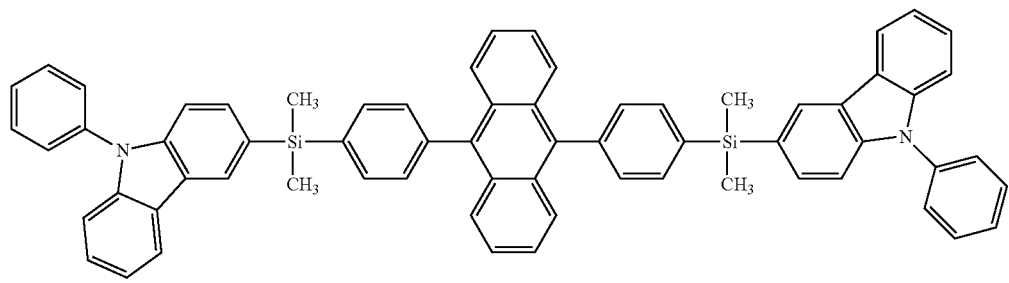
20

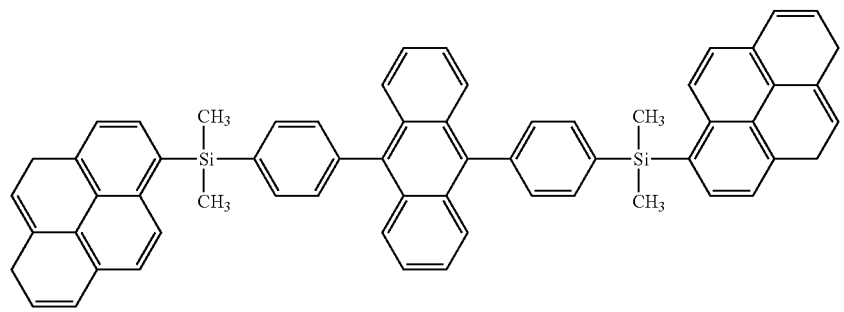

21

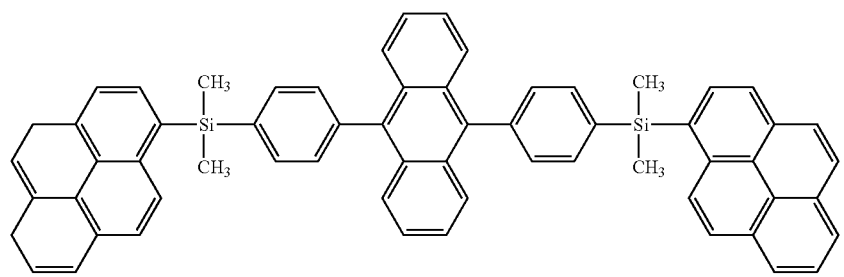

22

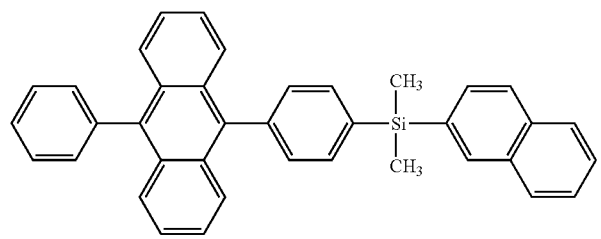

23

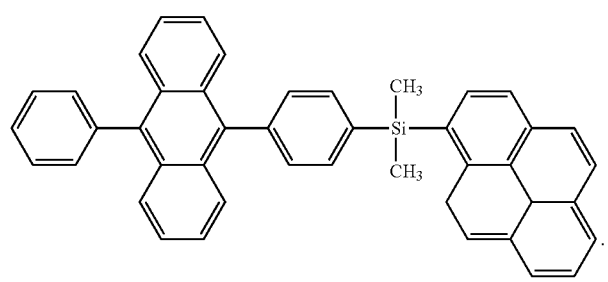

24

The condensed ring compound is a blue fluorescent dopant that emits blue light according to a fluorescence emission mechanism.

$R_{41}$ and $R_{42}$ in Formula 20 are each independently selected from a $C_1$-$C_{20}$ alkyl group, a $C_1$-$C_{20}$ alkoxy group, a phenyl group, a naphthyl group, an anthracenyl group, a pyrenyl group, and a chrycenyl group; and a $C_1$-$C_{20}$ alkyl group, a $C_1$-$C_{20}$ alkoxy group, a phenyl group, a naphthyl group, an anthracenyl group, a pyrenyl group, and a chrycenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a pyrenyl group, and a chrycenyl group.

In Formula 20, i is 0 and j is 0.

$Z_{31}$ to $Z_{44}$ in Formulae 7A to 7F are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, and a phosphoric acid or a salt thereof;

a phenyl group, a pentalenyl group, an indenyl group, a naphthyl group, an azulenyl group, an indacenyl group, an acenaphthyl group, a fluorenyl group, a spiro-fluorenyl group, a phenalenyl group, a phenanthrenyl group, an anthracenyl group, a fluorantenyl group, a triphenylenylene group, a pyrenyl group, a chrycenyl group, a naphthacenyl group, a pycenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group;

a phenyl group, a pentalenyl group, an indenyl group, a naphthyl group, an azulenyl group, an indacenyl group, an acenaphthyl group, a fluorenyl group, a spiro-fluorenyl group, a phenalenyl group, a phenanthrenyl group, an anthracenyl group, a fluorantenyl group, a triphenylenyl group, a pyrenyl group, a chrycenyl group, a naphthacenyl group, a pycenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenylene group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_1$-$C_{60}$ alkoxy group, a $C_6$-$C_{60}$ aryl group, and a $C_2$-$C_{60}$ heteroaryl group; and —Si($Q_{53}$)($Q_{54}$)($Q_{55}$), wherein $Q_{53}$ to $Q_{55}$ are each independently a hydrogen atom, a $C_1$-$C_{10}$ alkyl group, a $C_6$-$C_{20}$ aryl group, or a $C_2$-$C_{20}$ heteroaryl group.

$Z_{31}$ to $Z_{44}$ in Formulae 7A to 7F are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, or a phosphoric acid or a salt thereof;

a phenyl group, a naphthyl group, a fluorenyl group, a spiro-fluorenyl group, a phenalenyl group, a phenanthrenyl group, an anthracenyl group, a fluorantenyl group, a pyrenyl group, a chrycenyl group, a pyridinyl group, a pyrazinyl group, a pyrimidinyl group, a pyridazinyl group, a quinolinyl group, an isoquinolinyl group, a carbazolyl group, a furanyl group, a benzofuranyl group, a thiophenyl group, or a benzothiophenyl group;

a phenyl group, a naphthyl group, a fluorenyl group, a spiro-fluorenyl group, a phenalenyl group, a phenanthrenyl group, an anthracenyl group, a fluorantenyl group, a pyrenyl group, a chrycenyl group, a pyridinyl group, a pyrazinyl group, a pyrimidinyl group, a pyridazinyl group, a quinolinyl group, an isoquinolinyl group, a carbazolyl group, a furanyl group, a benzofuranyl group, a thiophenyl group, and a benzothiophenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a carbazolyl group, a pyridinyl group, a pyrimidinyl group, a pyrazinyl group, and a triazinyl group; and —Si($Q_{53}$)($Q_{54}$)($Q_{55}$), wherein $Q_{53}$ to $Q_{55}$ are each independently selected from a hydrogen atom, a $C_1$-$C_{10}$ alkyl group, a phenyl group, a naphthyl group, an anthracenyl group, and a pyrenyl group.

$Ar_3$ and $Ar_4$ in Formula 20 are identical to each other.

The condensed ring compound represented by Formula 20 is represented by Formula 20A(1) below:

<Formula 20A(1)>

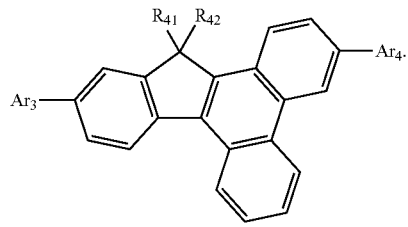

The condensed ring compound is one of Compounds 25 to 68 below:

25

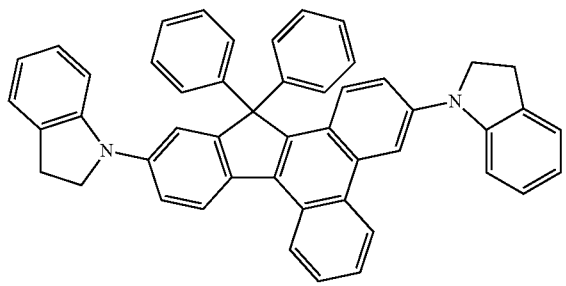

-continued
26
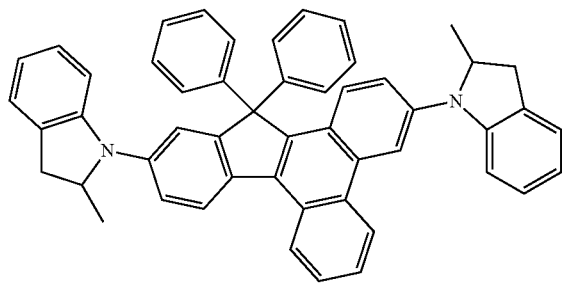
27
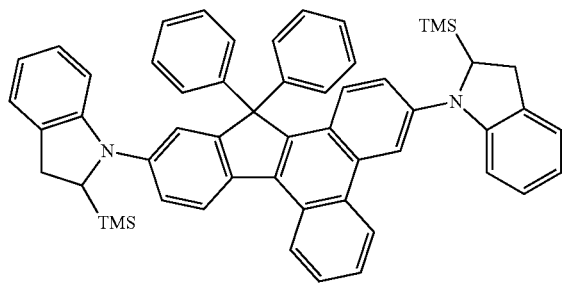
28
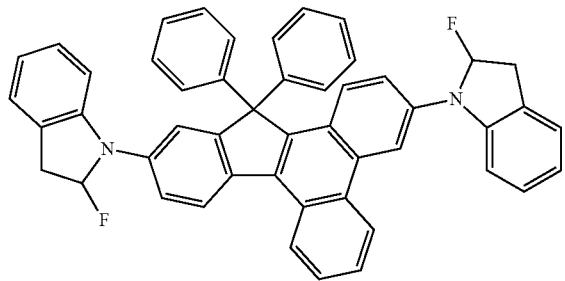
29
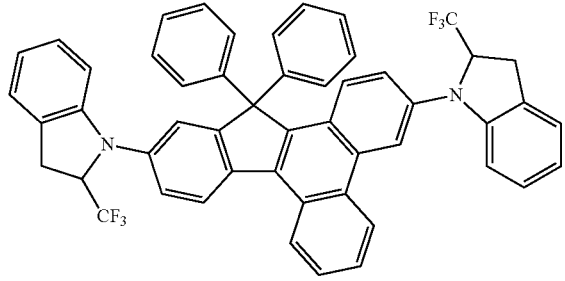
30
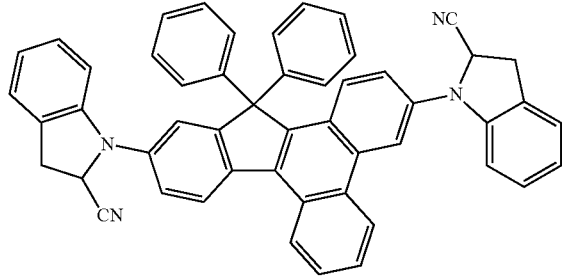

-continued
31
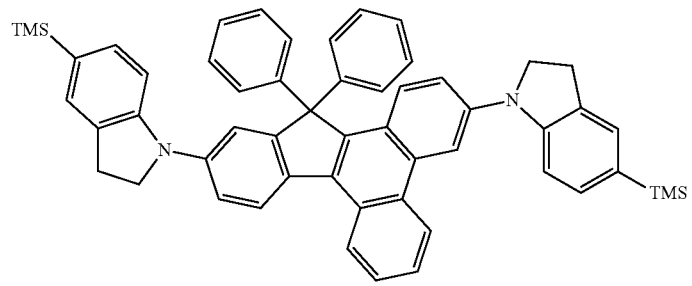
32
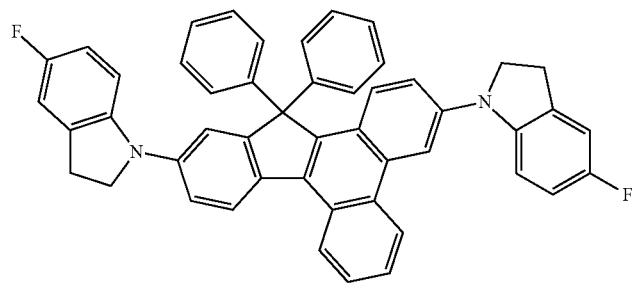
33
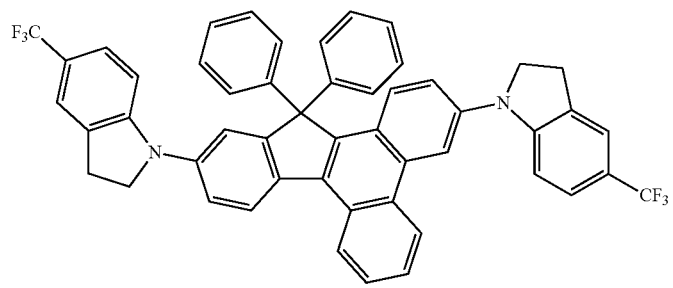
34
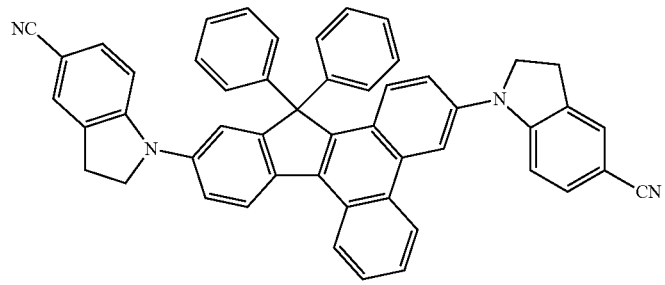
35
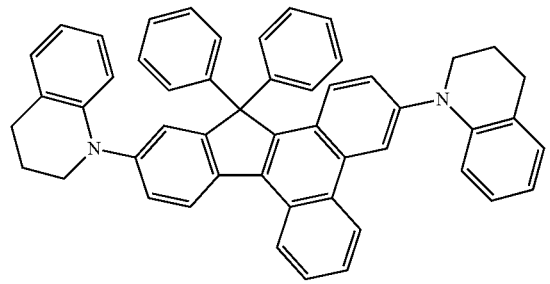

-continued
36
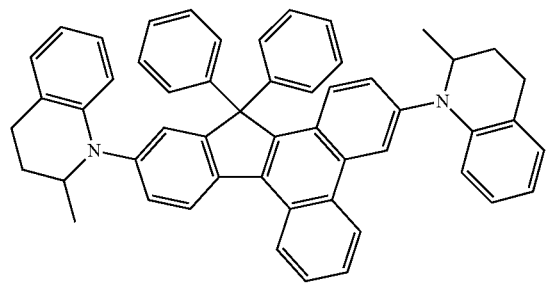
37
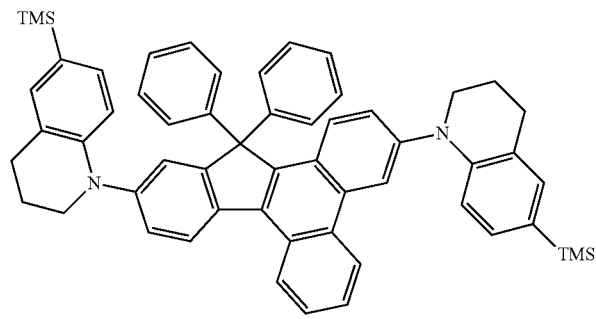
38
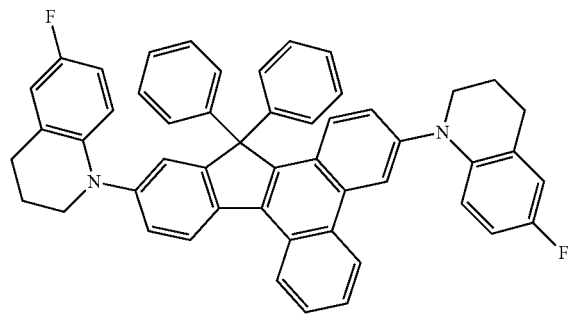
39
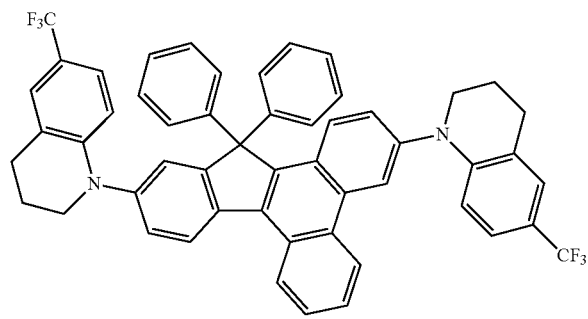
40
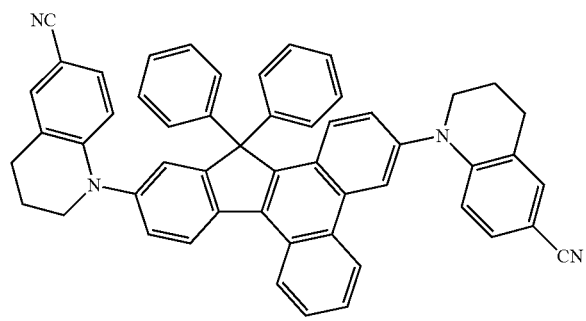

-continued
41
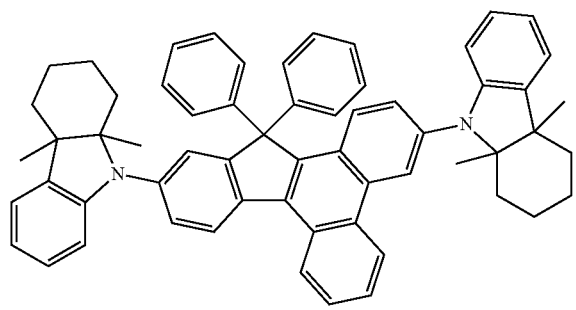
42
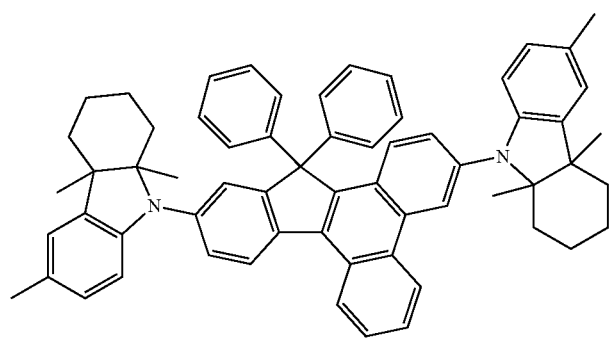
43
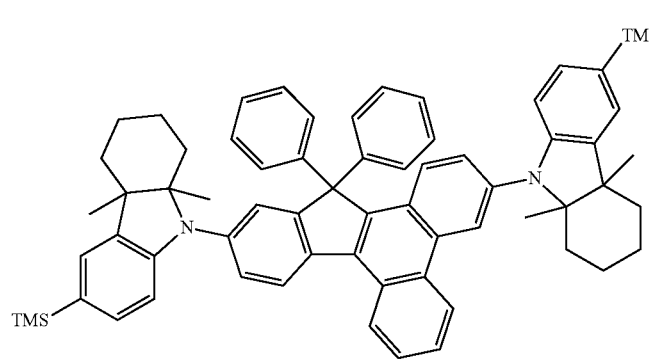
44
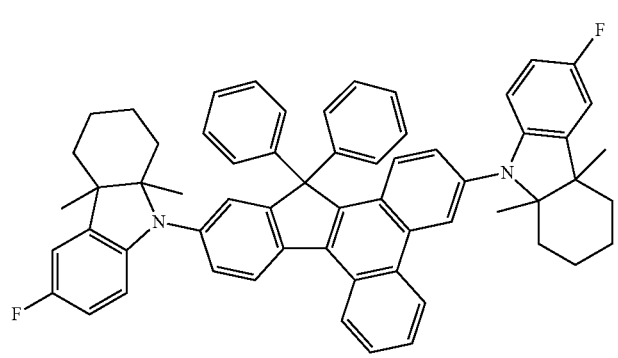

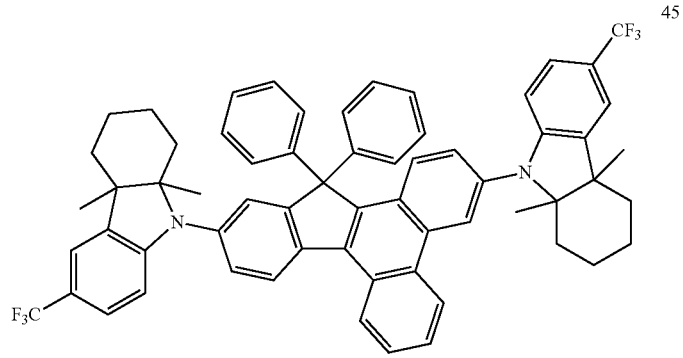
45
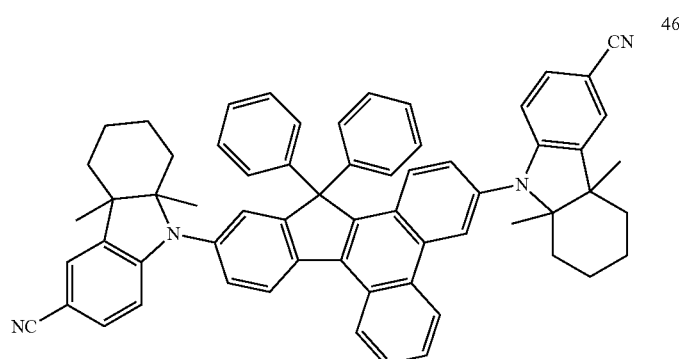
46
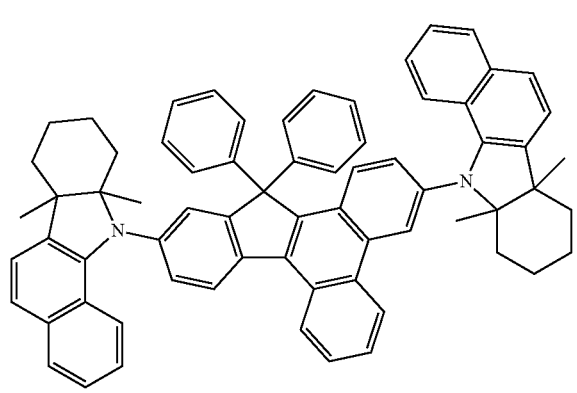
47
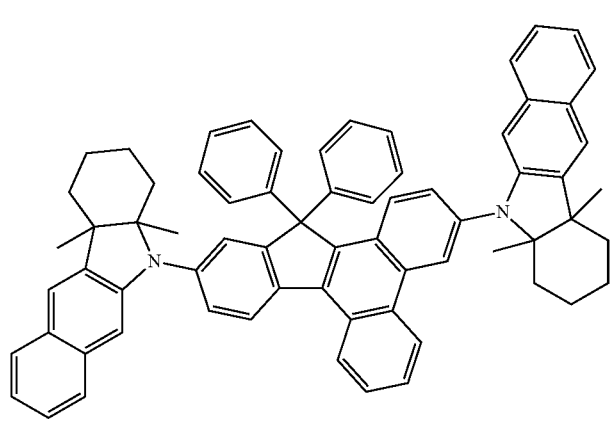
48

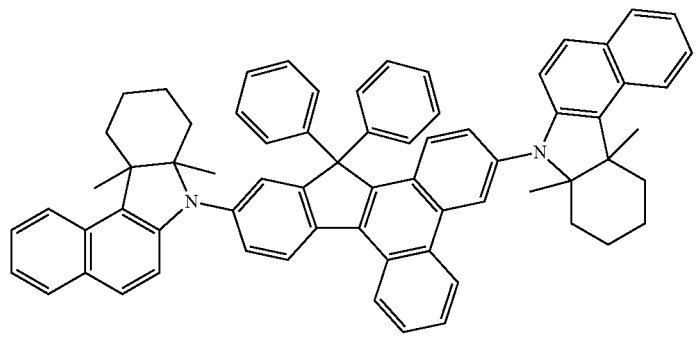
49
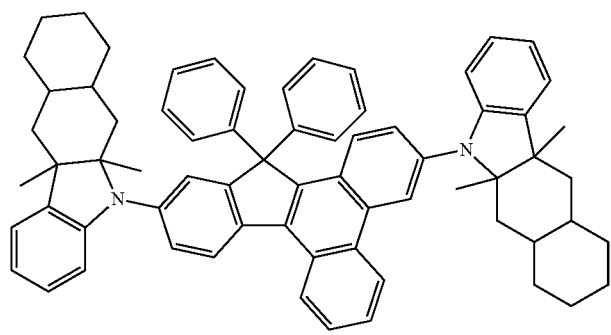
50
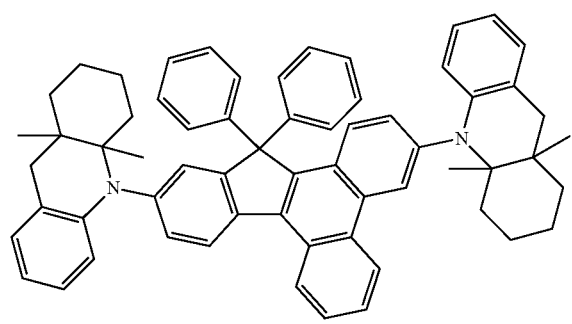
51
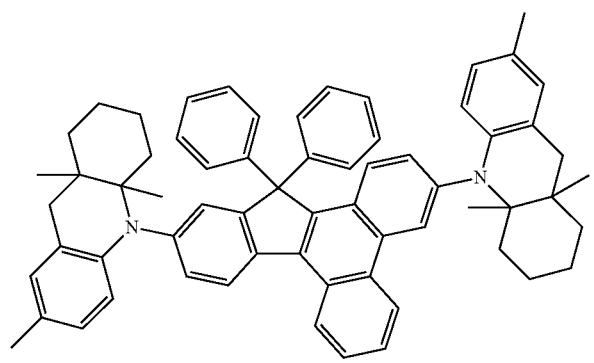
52

-continued
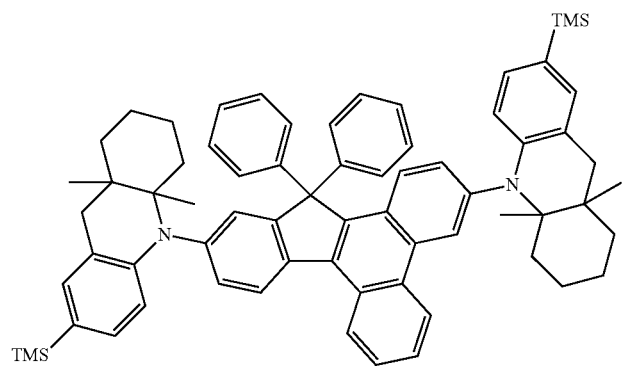
53
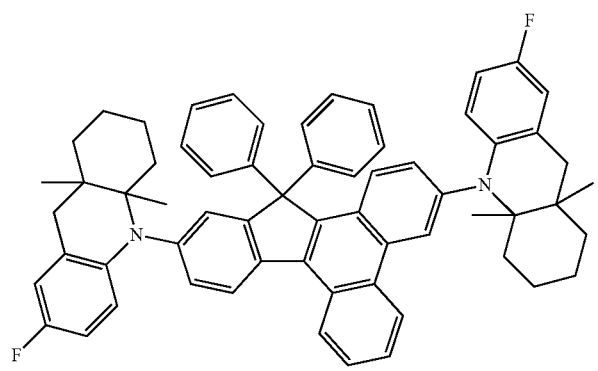
54
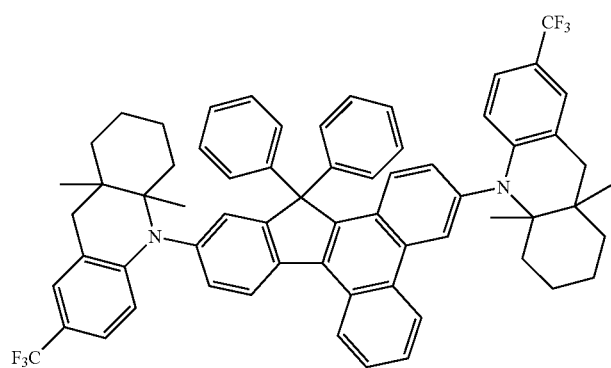
55
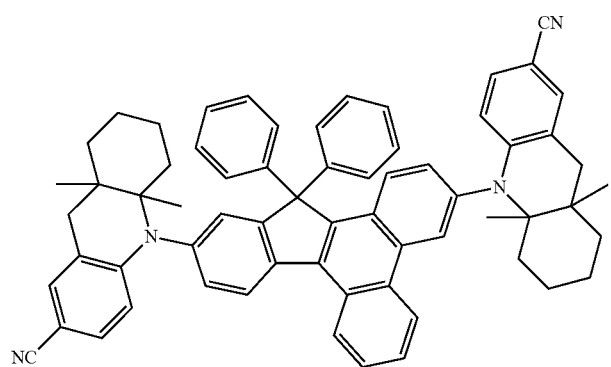
56

57
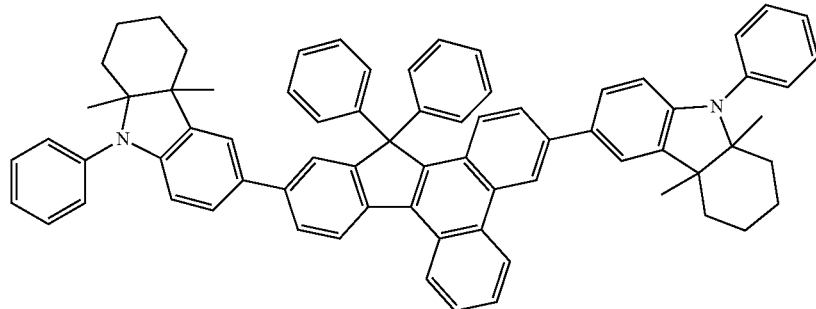
58
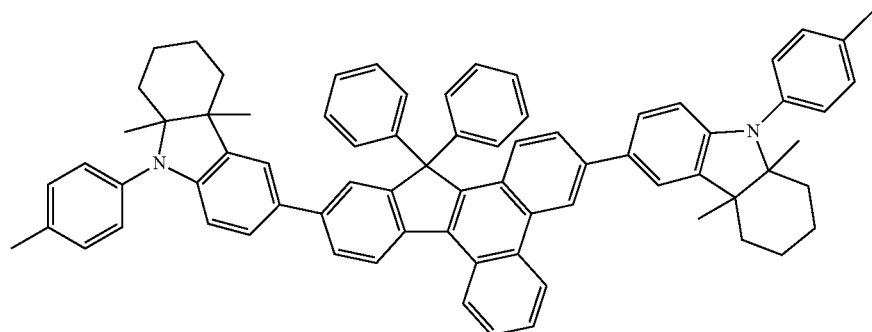
59
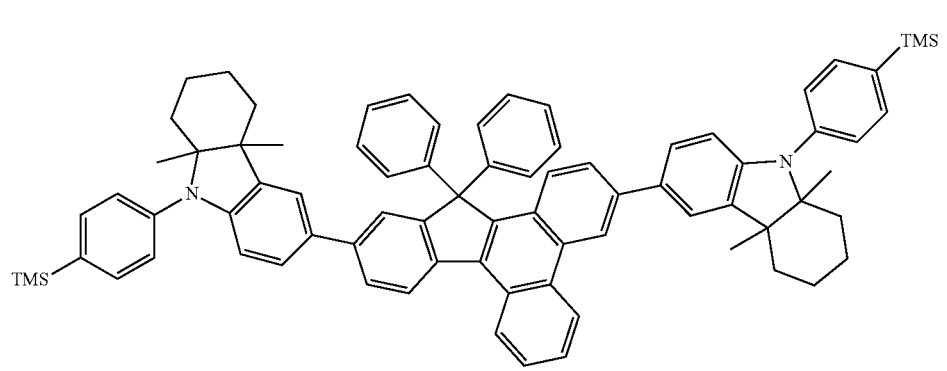
60
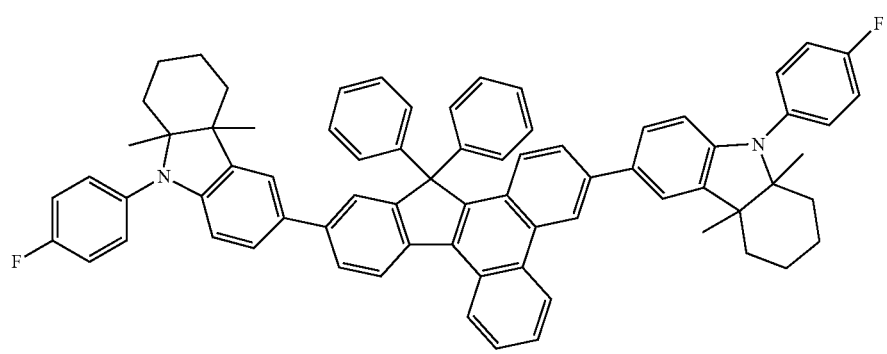

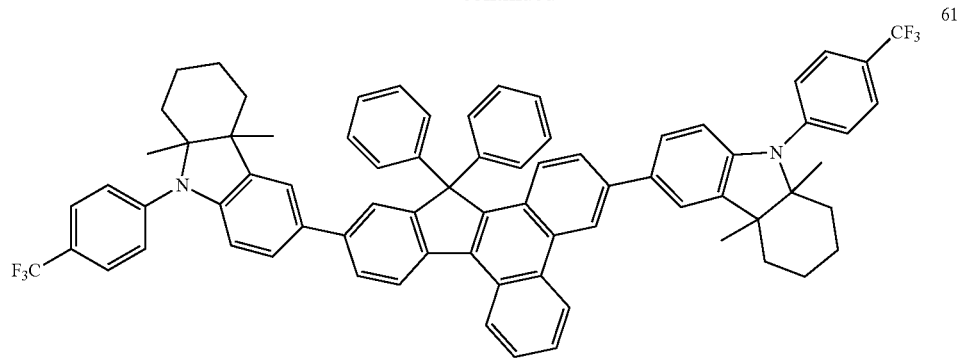
61
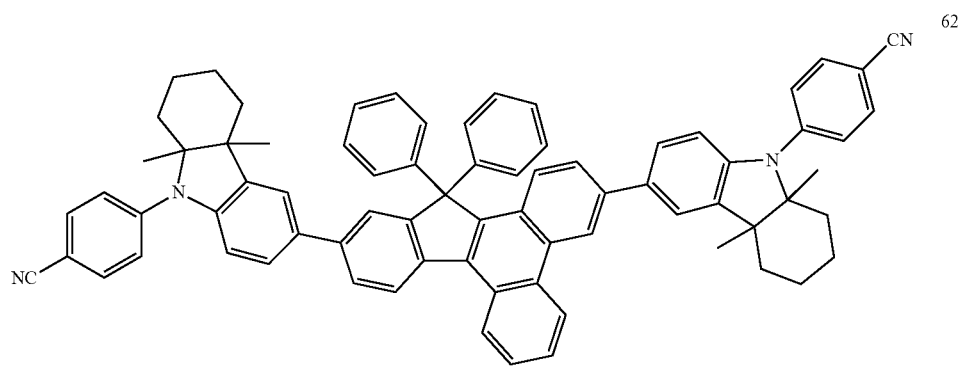
62
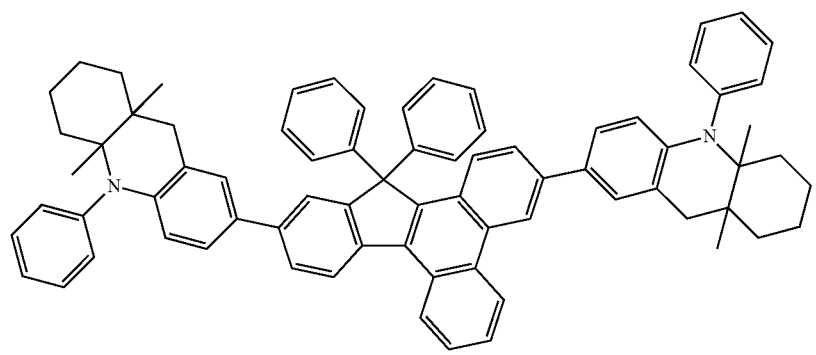
63
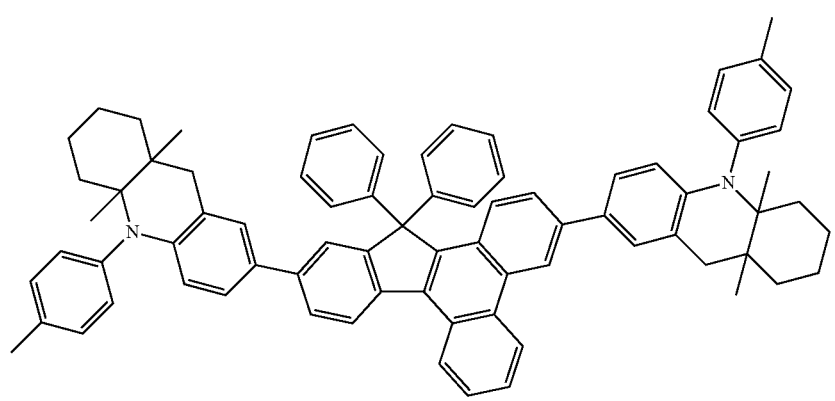
64

-continued
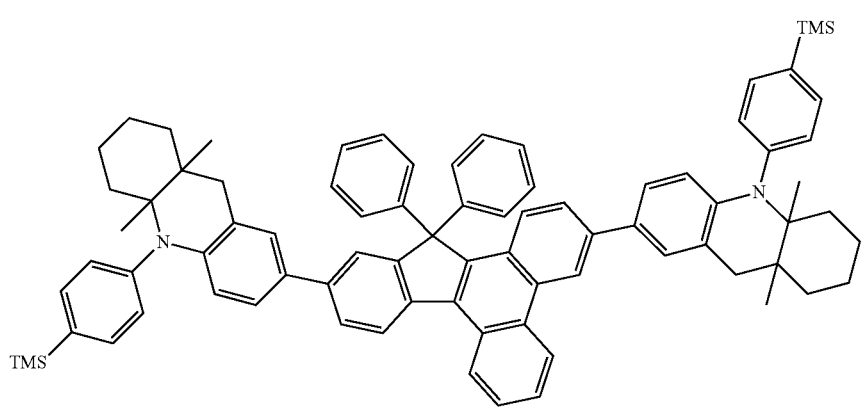
65
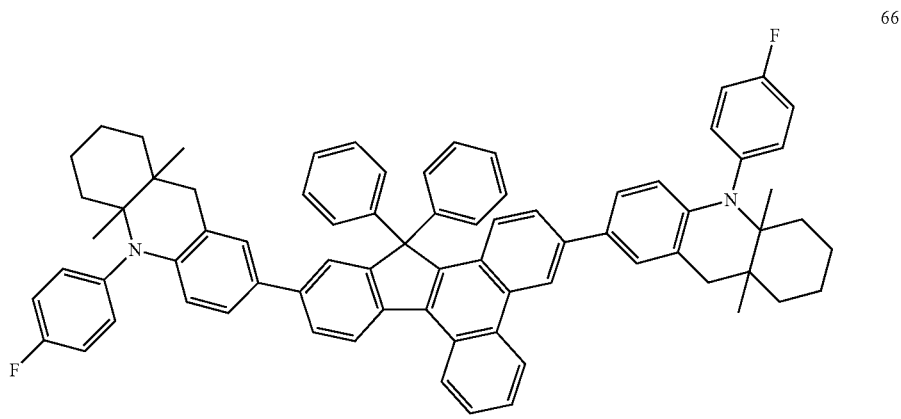
66
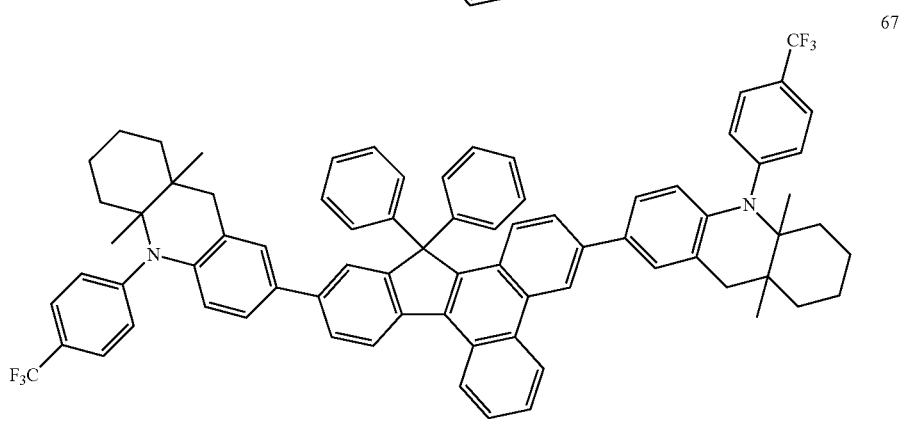
67
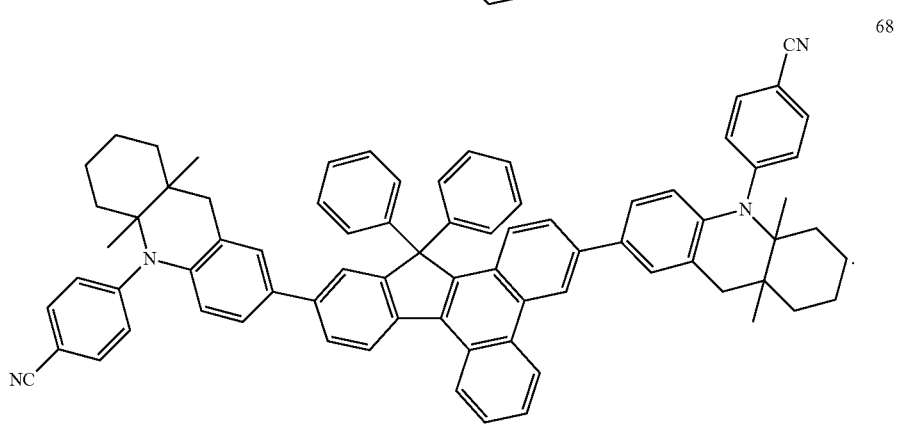
68

The embodiments may also be realized by providing an organic light-emitting diode including a substrate; a first electrode on the substrate; a second electrode facing the first electrode; and an emission layer that is disposed between the first electrode and the second electrode and that includes an anthracene-based compound selected from Compounds 1 to 24 below and a condensed ring compound selected from Compounds 25 to 68 below;

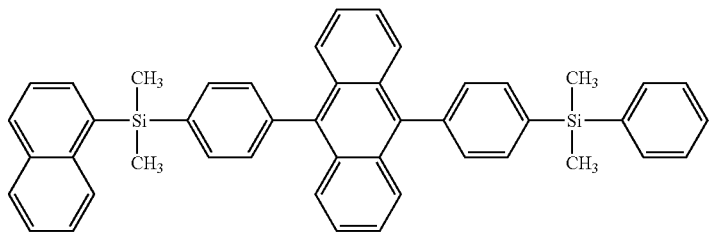

1

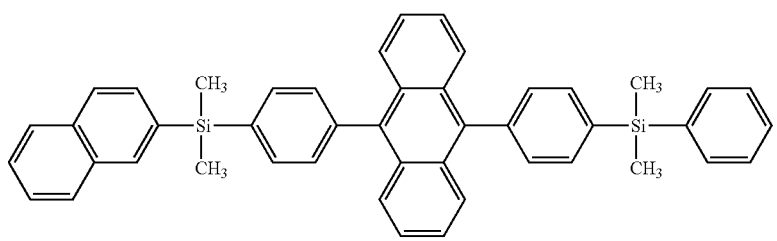

2

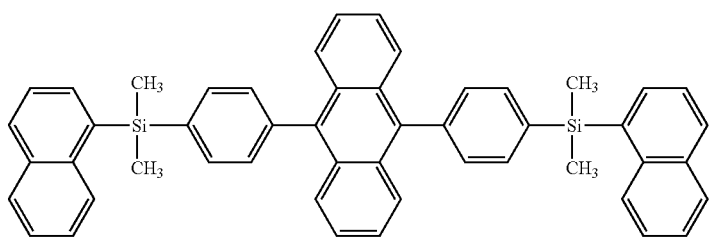

3

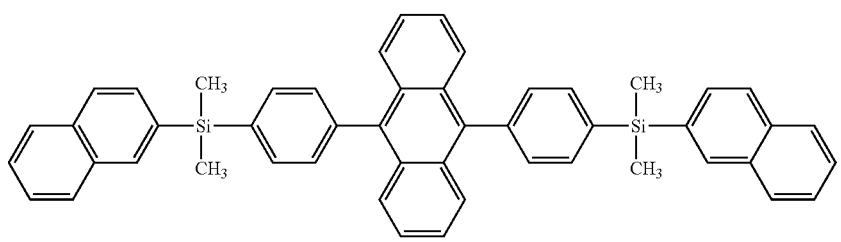

4

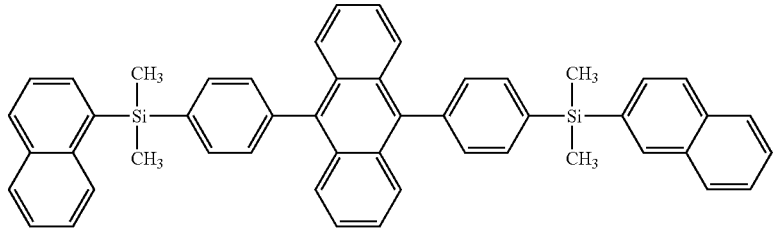

5

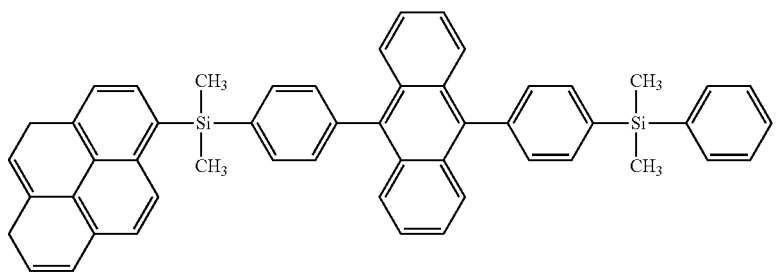

6

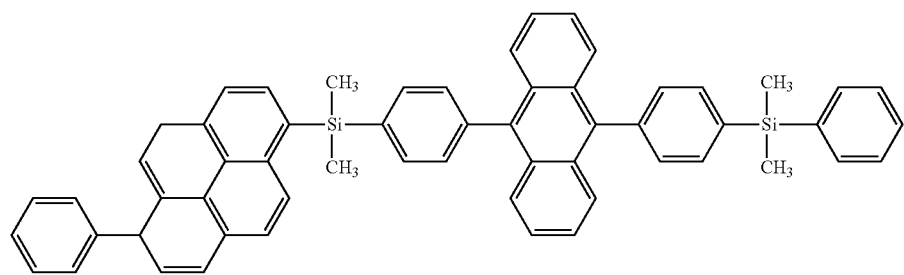
7
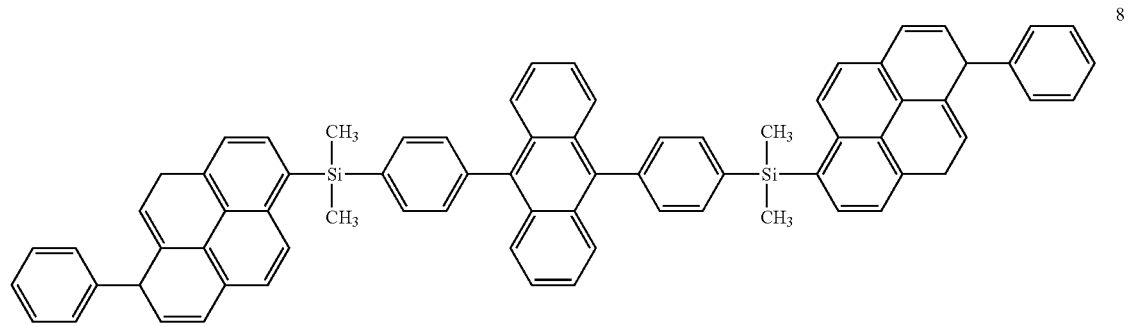
8
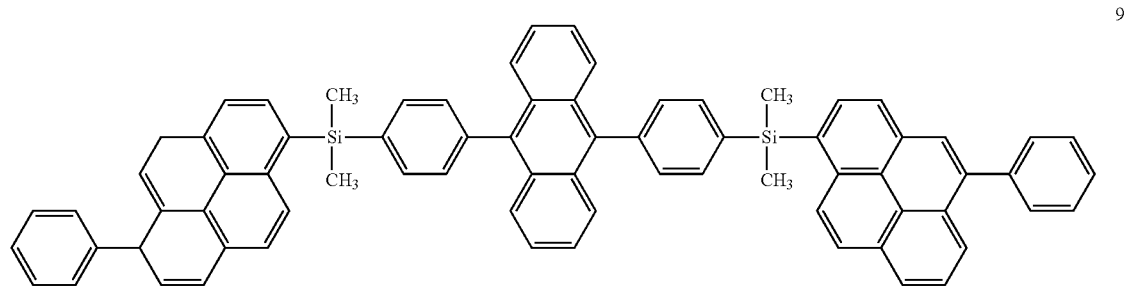
9
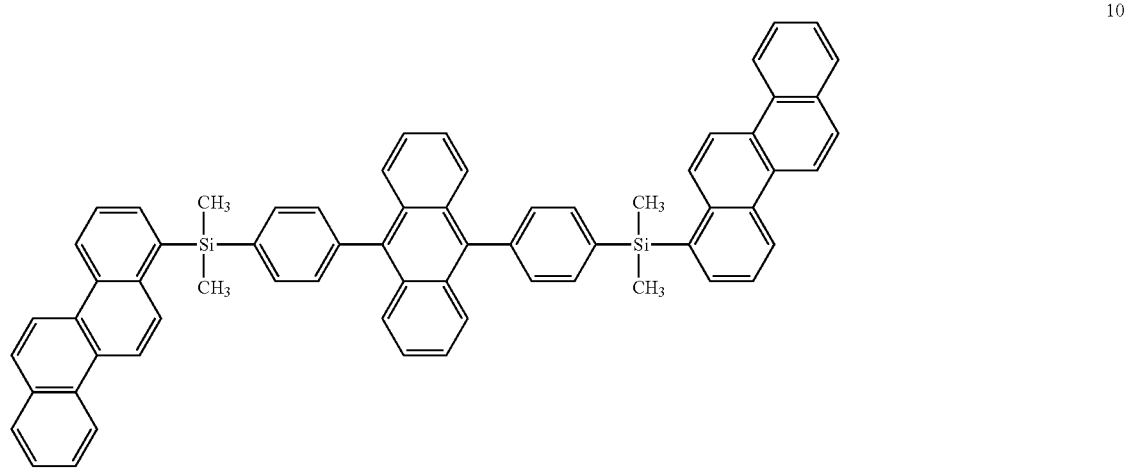
10

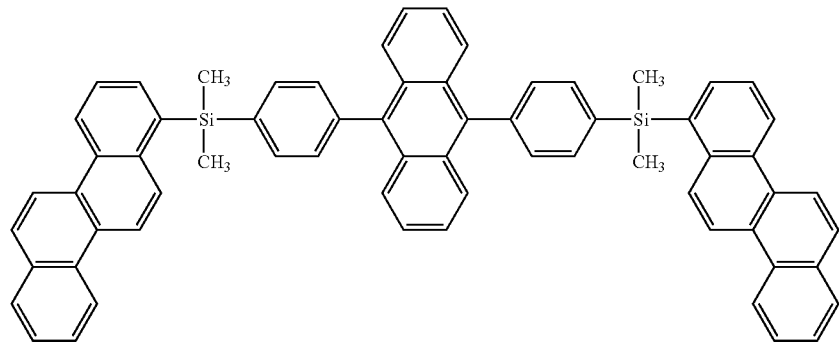
11
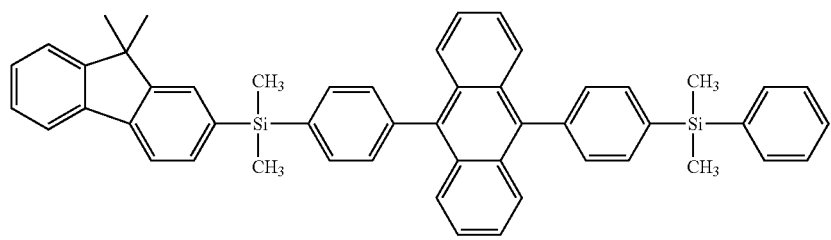
12
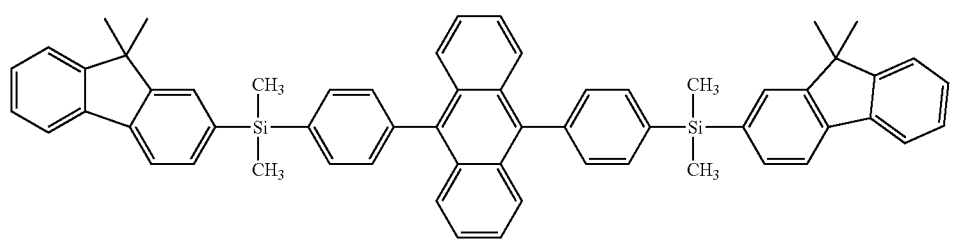
13
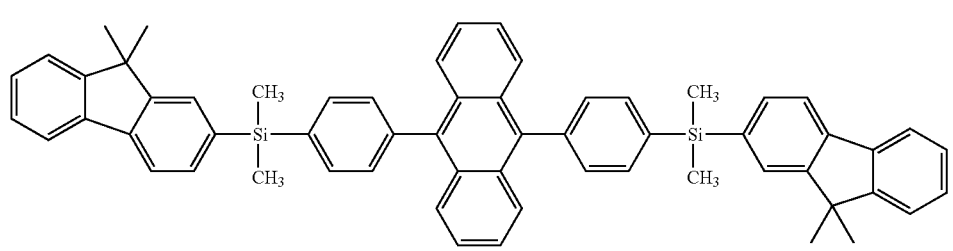
14
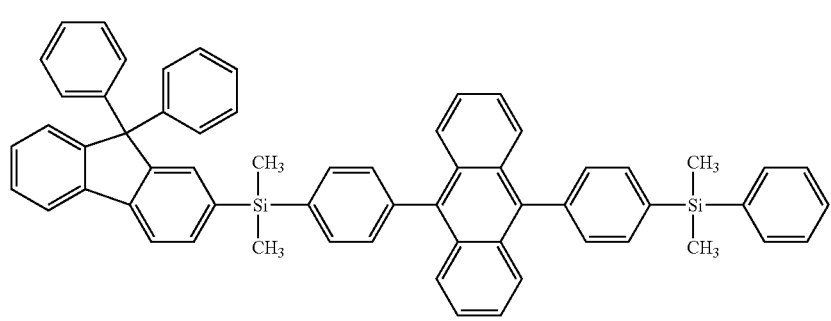
15

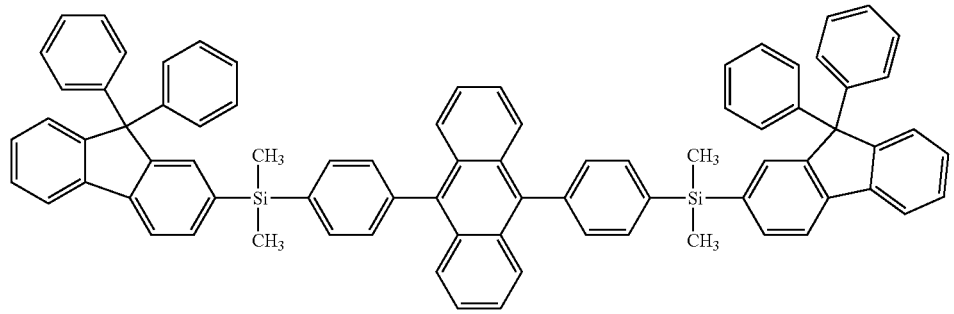
16
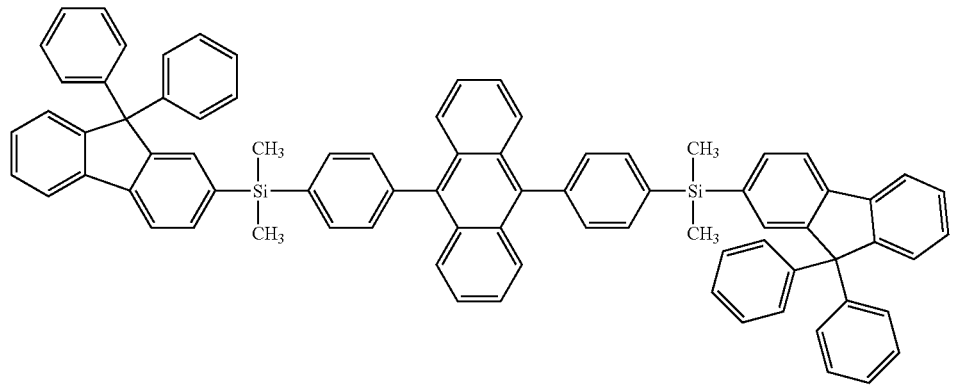
17
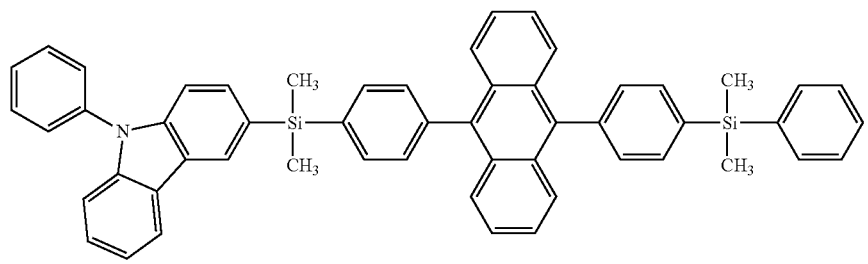
18
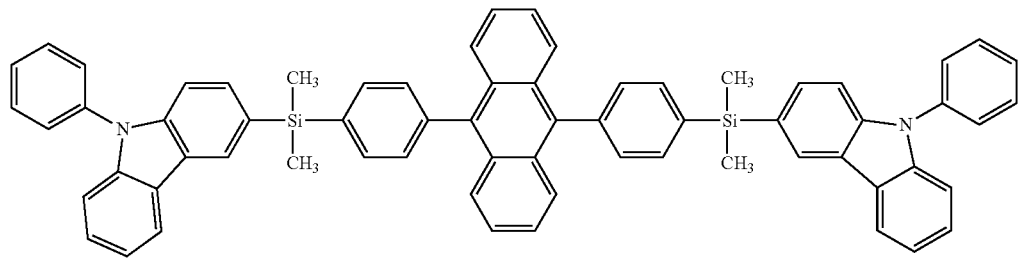
19
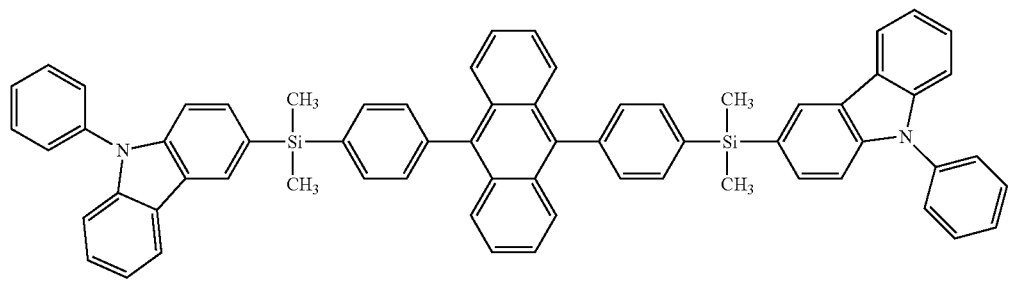
20

-continued
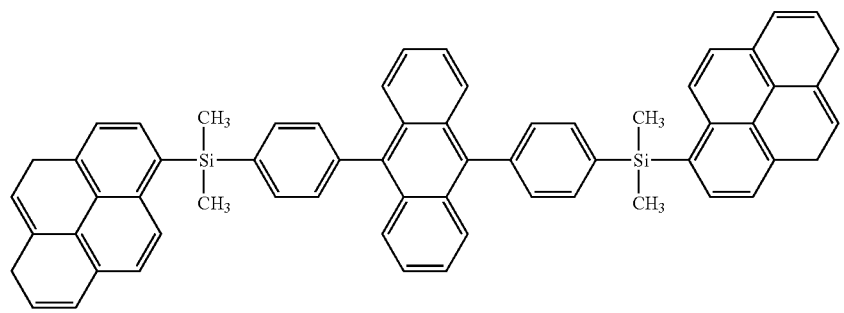
21
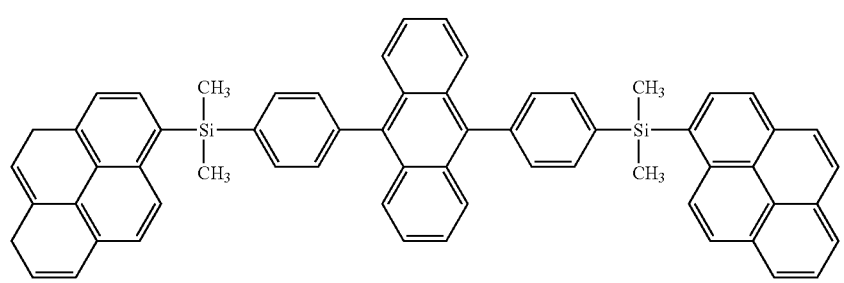
22
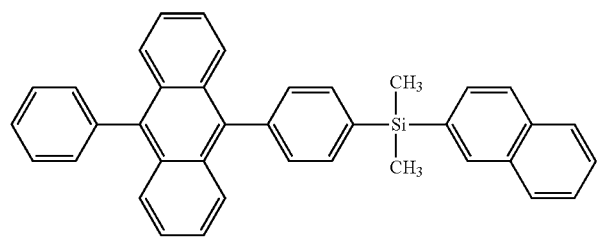
23
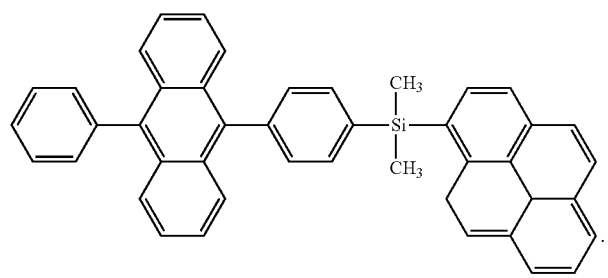
24
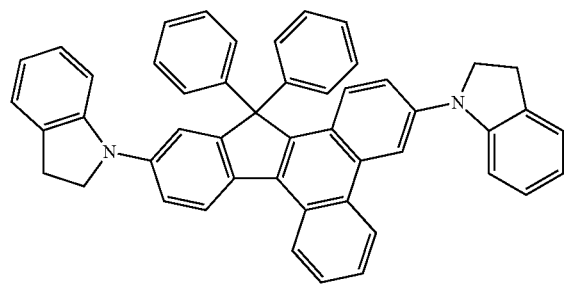
25

-continued
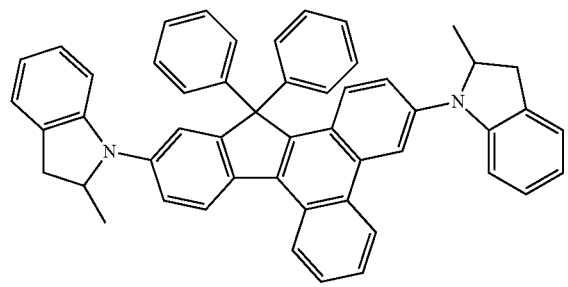
26
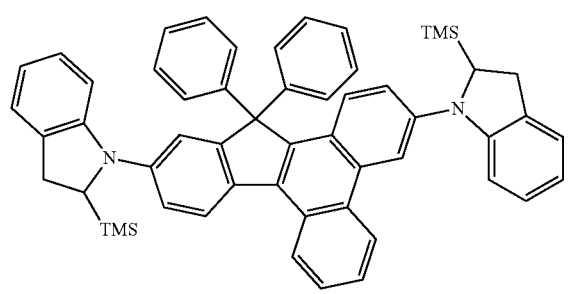
27
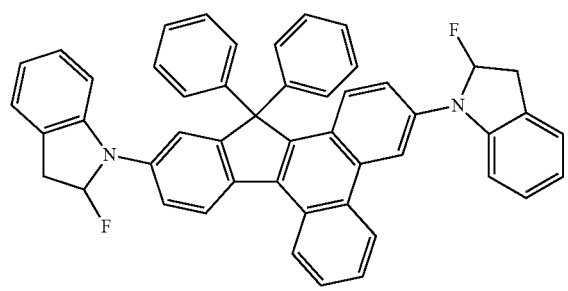
28
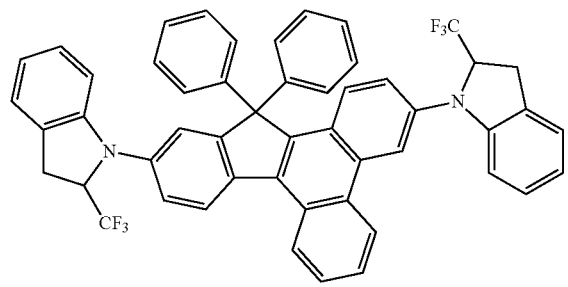
29
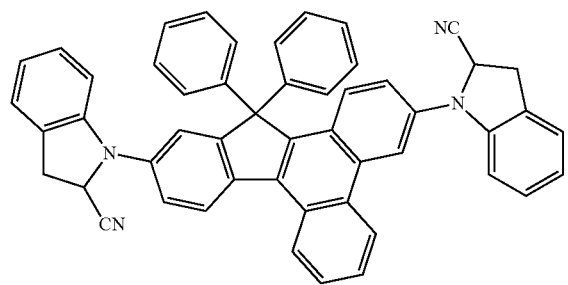
30

-continued
31
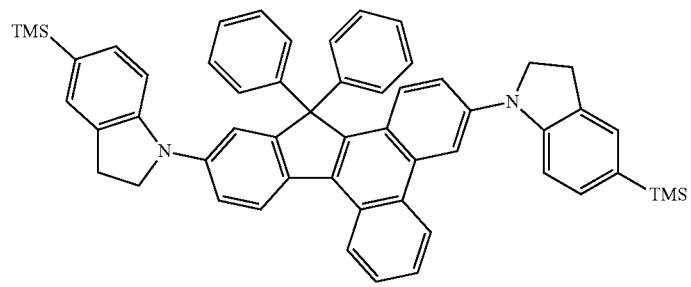
32
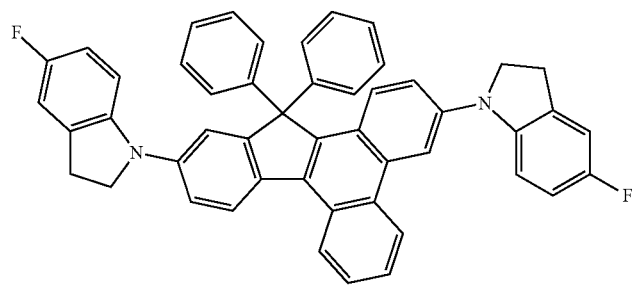
33
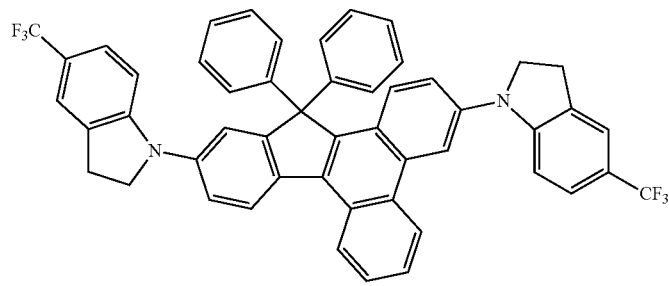
34
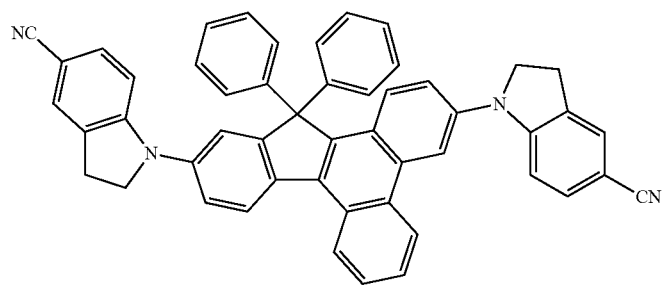
35
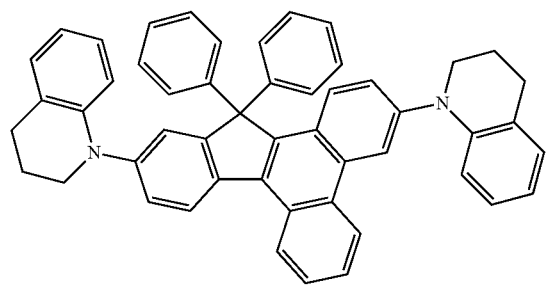

-continued
36
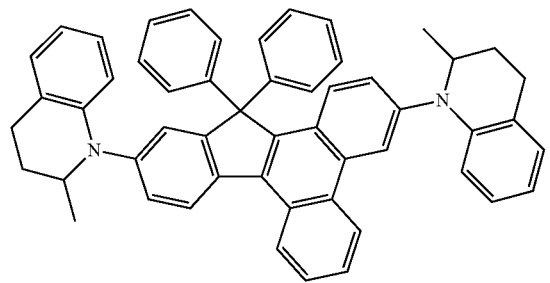
37
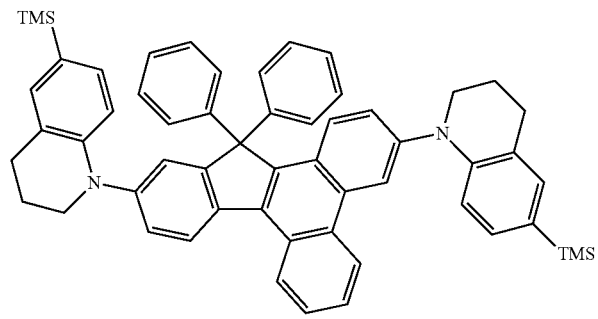
38
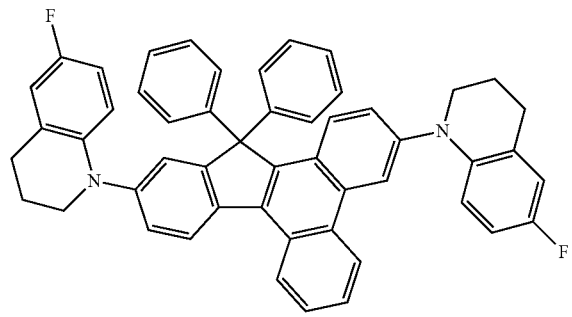
39
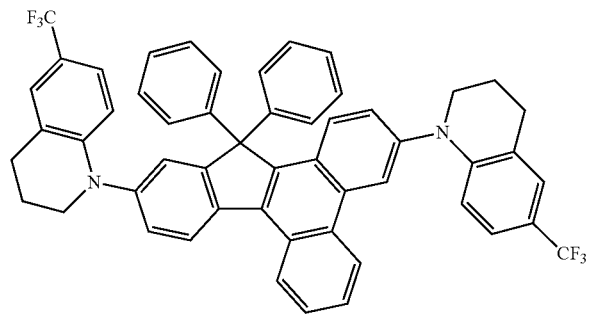
40
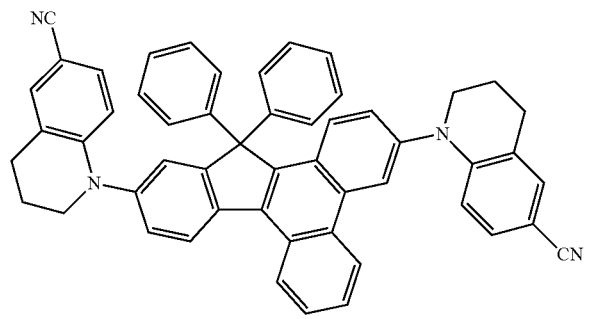

-continued
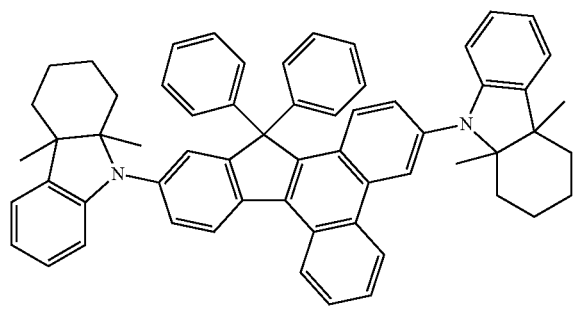
41
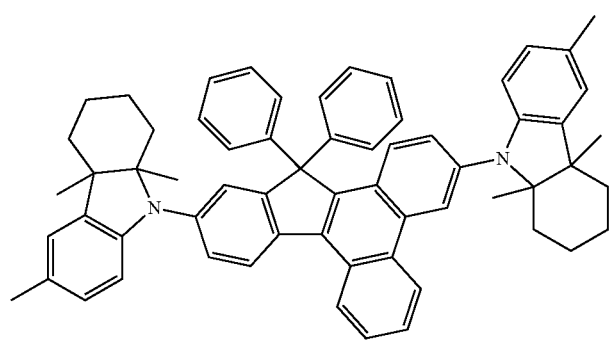
42
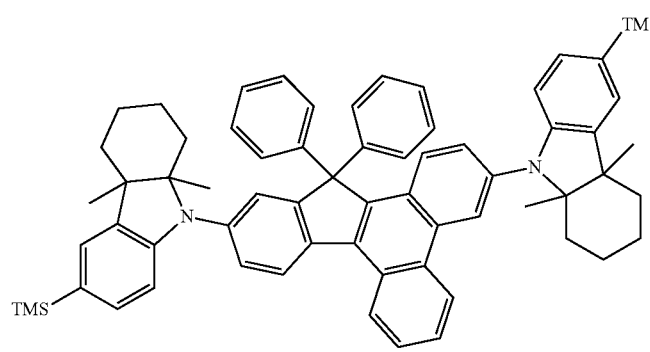
43
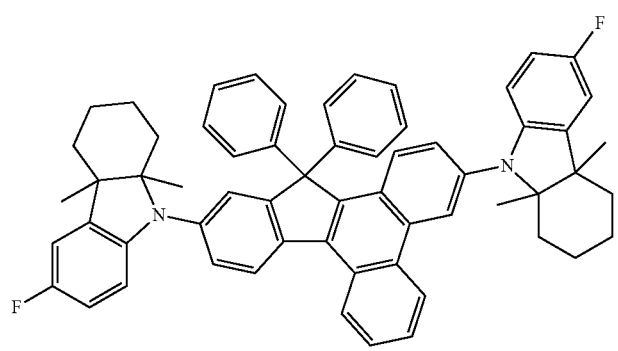
44

-continued
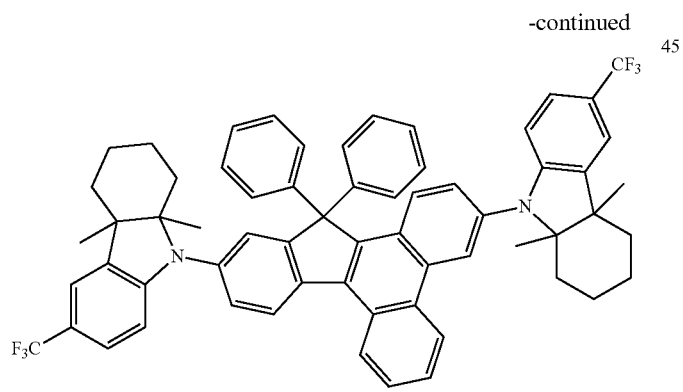
45
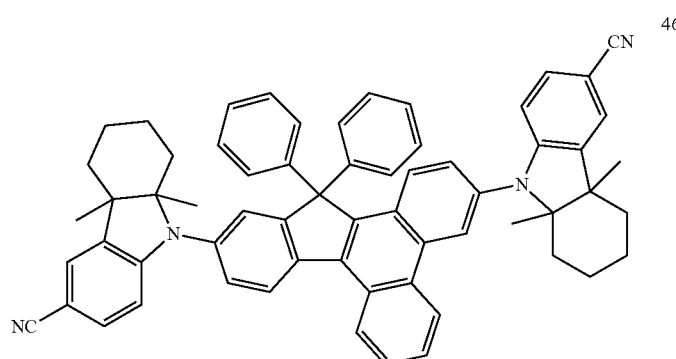
46
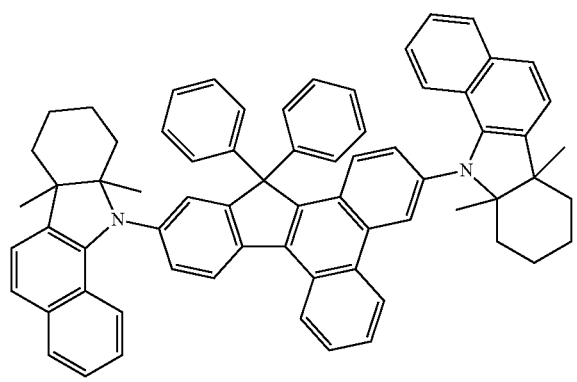
47
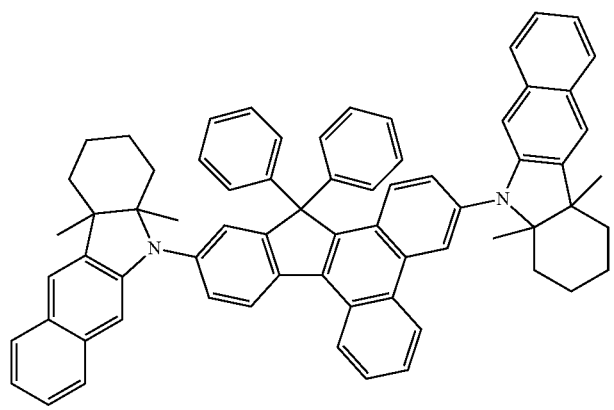
48

-continued
49
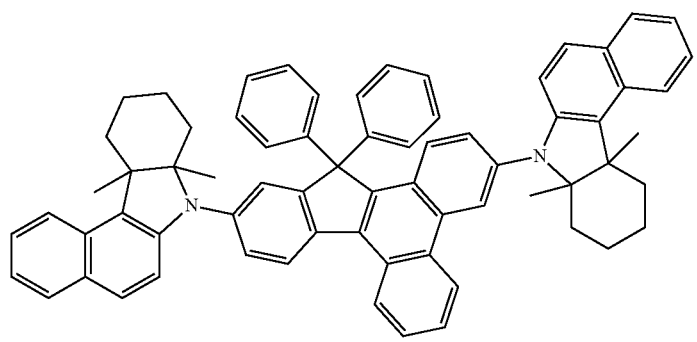
50
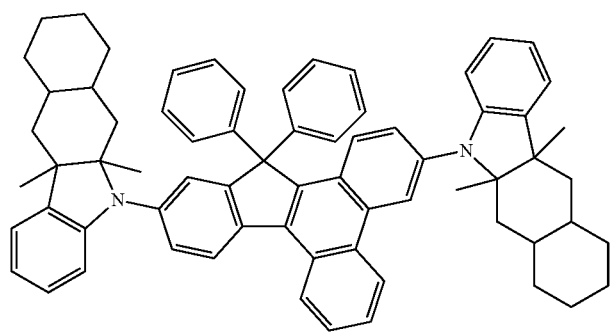
51
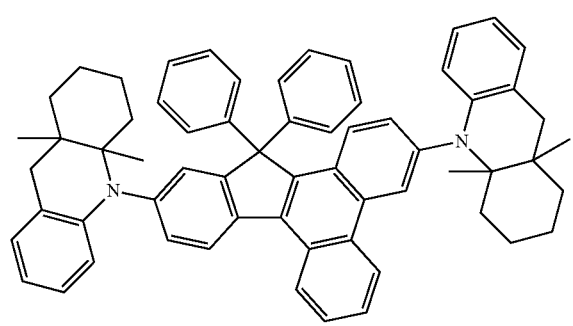
52
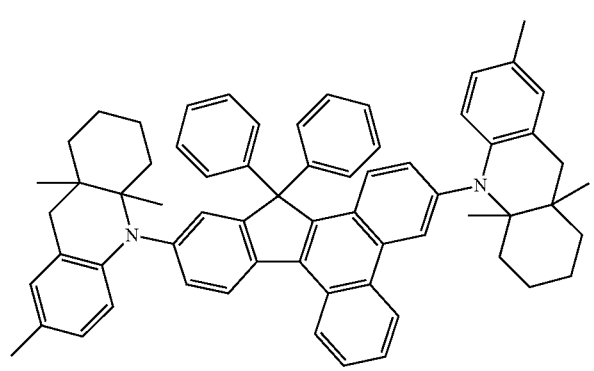

-continued
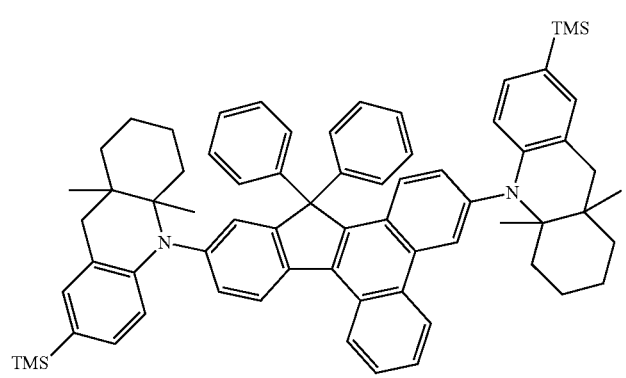
53
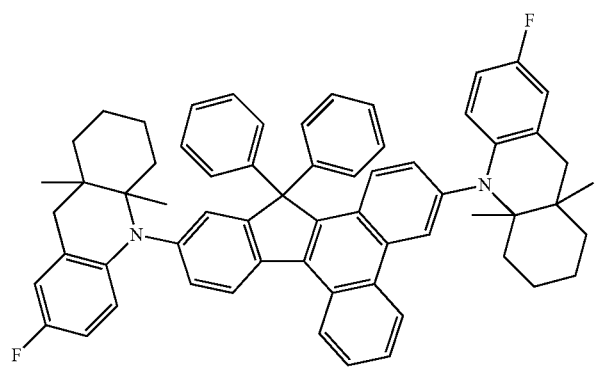
54
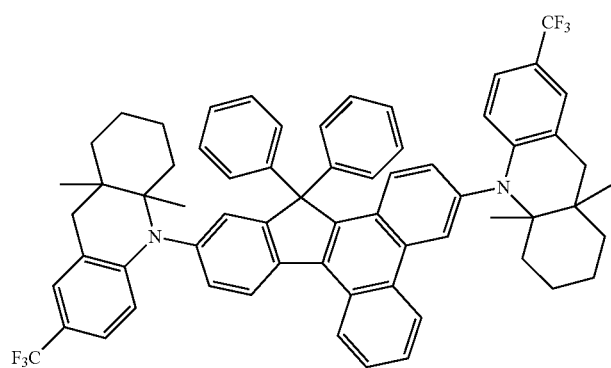
55
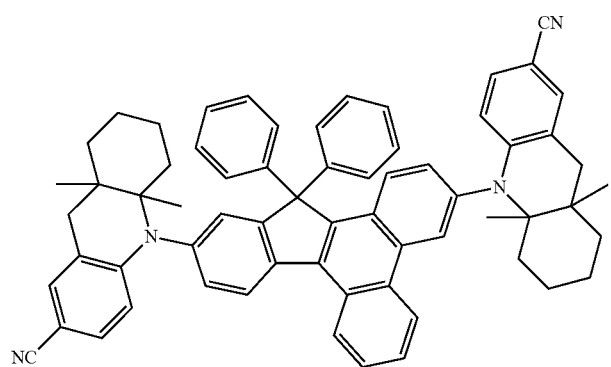
56

-continued
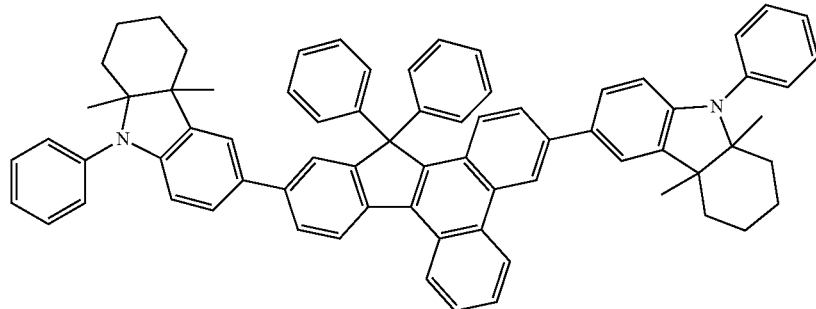
57
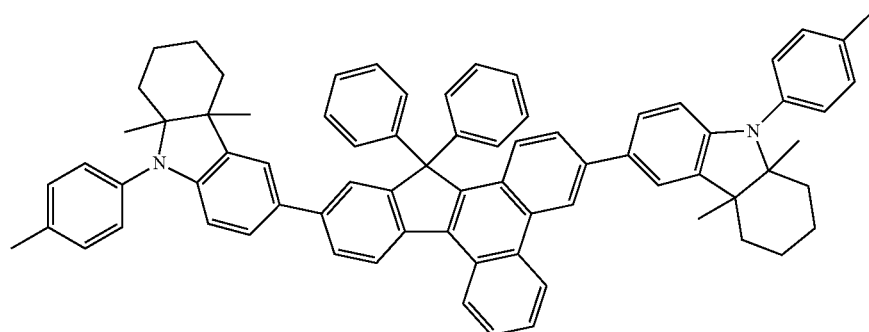
58
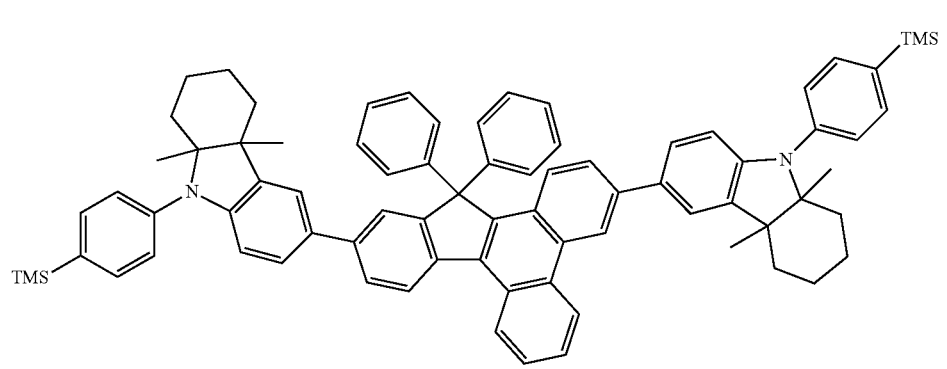
59
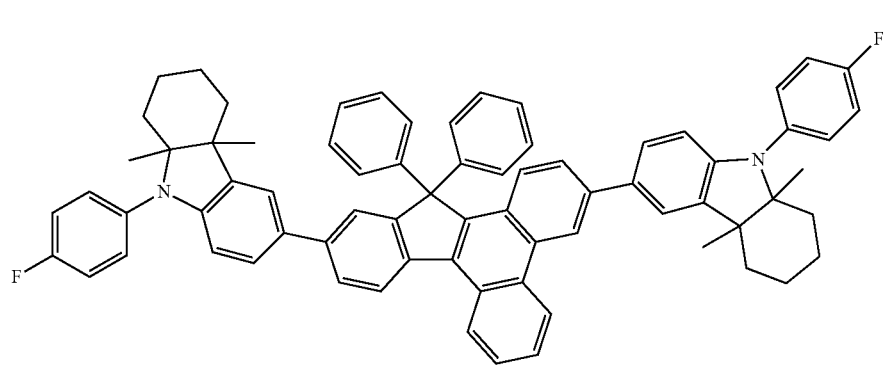
60

61
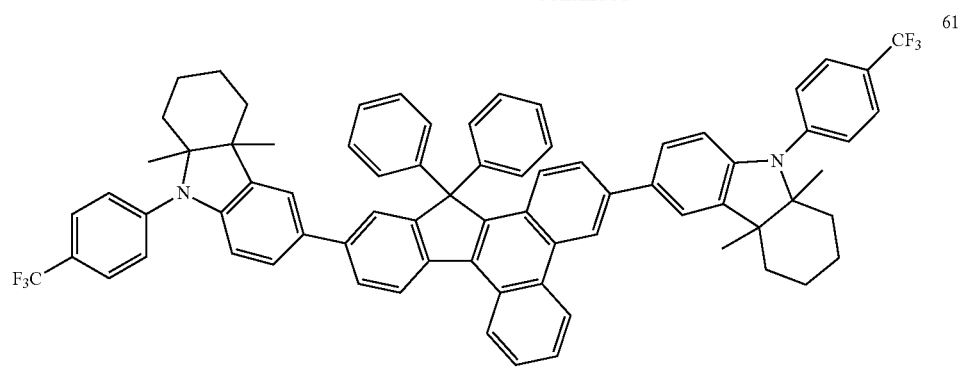
62
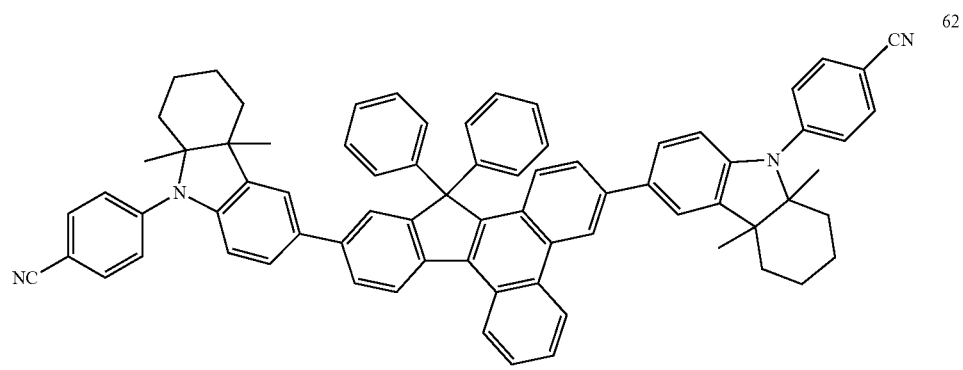
63
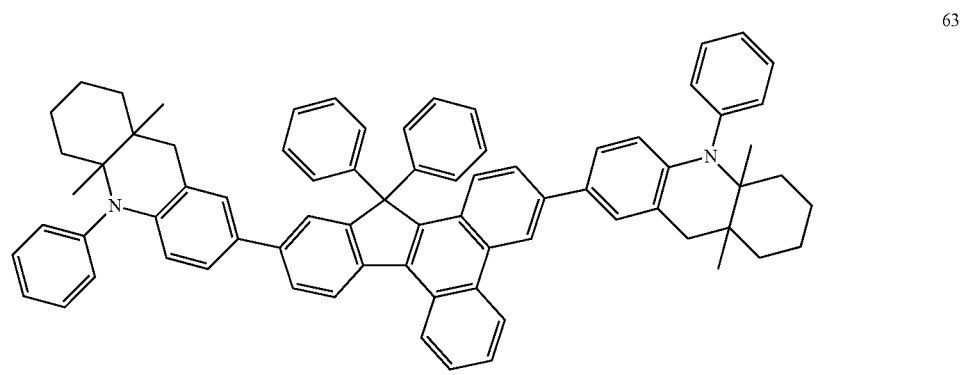
64
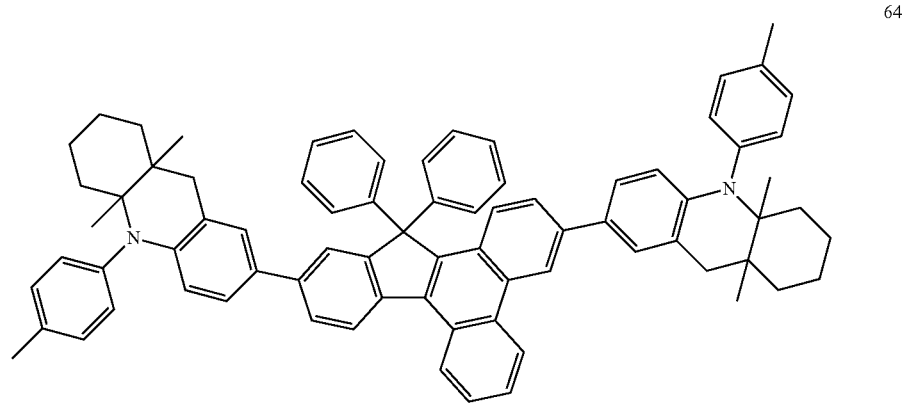

-continued
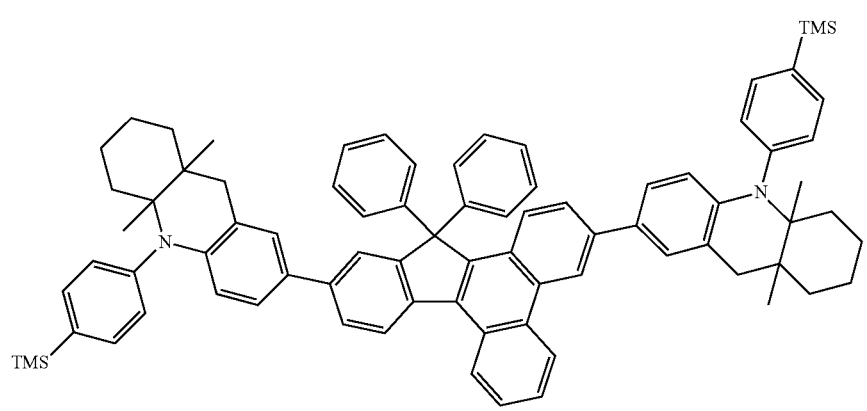
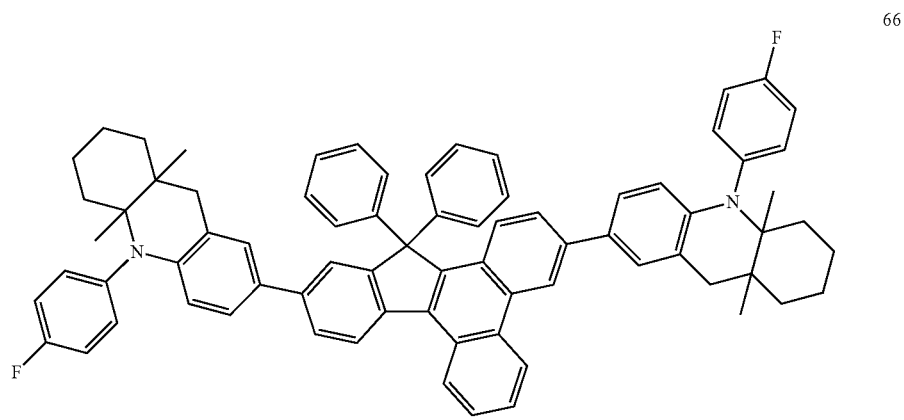
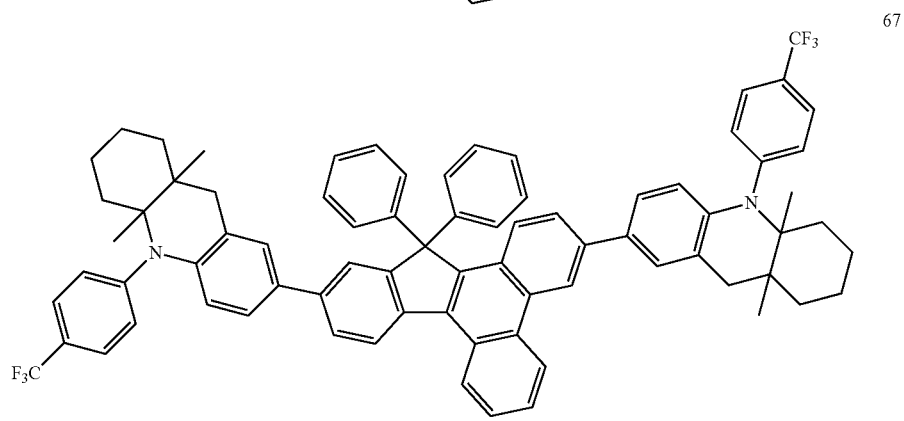
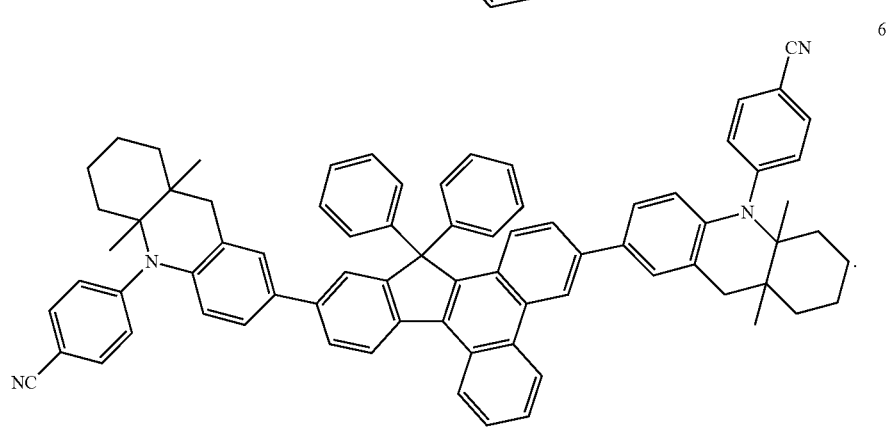

BRIEF DESCRIPTION OF THE DRAWING

Features will be apparent to those of skill in the art by describing in detail exemplary embodiments with reference to the attached drawings in which:

FIG. 1 illustrates a cross-sectional view of the structure of an organic light-emitting diode according to an embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Expressions such as "at least one of," when preceding a list of elements, modify the entire list of elements and do not modify the individual elements of the list.

FIG. 1 illustrates a schematic sectional view of an organic light-emitting diode 10 according to an embodiment. The organic light-emitting diode 10 may include a substrate 11, a first electrode 13, an organic layer 15, and a second electrode 17. Hereinafter, the structure of an organic light-emitting diode according to an embodiment and a method of manufacturing the same, according to an embodiment, will be described in connection with FIG. 1.

The substrate 11, which may be a suitable substrate for organic light-emitting diodes, may be, e.g., a glass substrate or a transparent plastic substrate with excellent mechanical strength, thermal stability, transparency, surface smoothness, ease of handling, and water resistance.

The first electrode 13 may be formed by depositing or sputtering a material for a first electrode on the substrate 11. When the first electrode 13 is an anode, the material for the first electrode may be selected from materials with a high work function to allow holes to be easily injected. The first electrode 13 may be a reflective electrode or a transmissive electrode. In an implementation, the material for the first electrode 13 may be a transparent material with high conductivity. Examples of such a material may include indium tin oxide (ITO), indium zinc oxide (IZO), tin oxide ($SnO_2$), and zinc oxide (ZnO). When magnesium (Mg), aluminum (Al), aluminum-lithium (Al—Li), calcium (Ca), magnesium-indium (Mg—In), magnesium-silver (Mg—Ag), or the like is used, the first electrode 13 may be a reflective electrode.

The first electrode 13 may have a single-layer structure or a multi-layer structure including at least two layers. For example, the first electrode 13 may have a three-layered structure of ITO/Ag/ITO.

The organic layer 15 may be disposed on the first electrode 13.

The organic layer 15 may be a multiple layer interposed between the first electrode 13 and the second electrode 17 of the organic light-emitting diode 10. The organic layer 15 may include an emission layer and may further include at least one of a hole injection layer, a hole transport layer, a functional layer having a hole injection capability and a hole transport capability, a buffer layer, an electron blocking layer, a hole blocking layer, an electron transport layer, an electron injection layer, and a functional layer having an electron injection capability and an electron transport capability.

According to an embodiment, the organic layer 15 may include a hole injection layer, a hole transport layer, a buffer layer, an emission layer, an electron transport layer, and an electron injection layer, which are sequentially stacked in this stated order.

A hole injection layer (HIL) may be formed on the first electrode 13 by using various methods, such as vacuum deposition, spin coating, casting, Langmuir-Blodgett (LB) deposition.

When an HIL is formed using vacuum deposition, vacuum deposition conditions may vary according to the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When an HIL is formed using spin coating, the coating conditions may vary according to the compound that is used to form the HIL, and the desired structure and thermal properties of the HIL to be formed. For example, the coating rate may be in the range of about 2,000 rpm to about 5,000 rpm, and a temperature at which heat treatment is performed to remove a solvent after coating may be in the range of about 80° C. to about 200° C. However, the coating conditions are not limited thereto.

For use as a hole injection material, a suitable hole injection material may be used. The hole injection material may include, e.g., N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4''-tris(3-methylphenylphenylamino) triphenylamine [m-MTDATA], N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrene sulfonate)(PEDOT/PSS), polyaniline/camphor sulfonic acid (Pani/CSA), or (polyaniline)/poly(4-styrenesulfonate) (PANI/PSS).

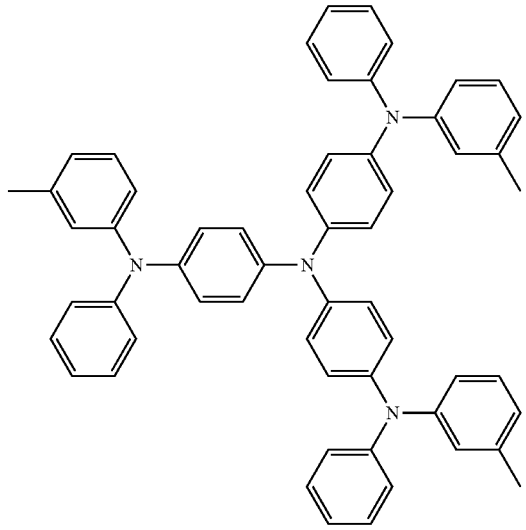

m-MTDATA

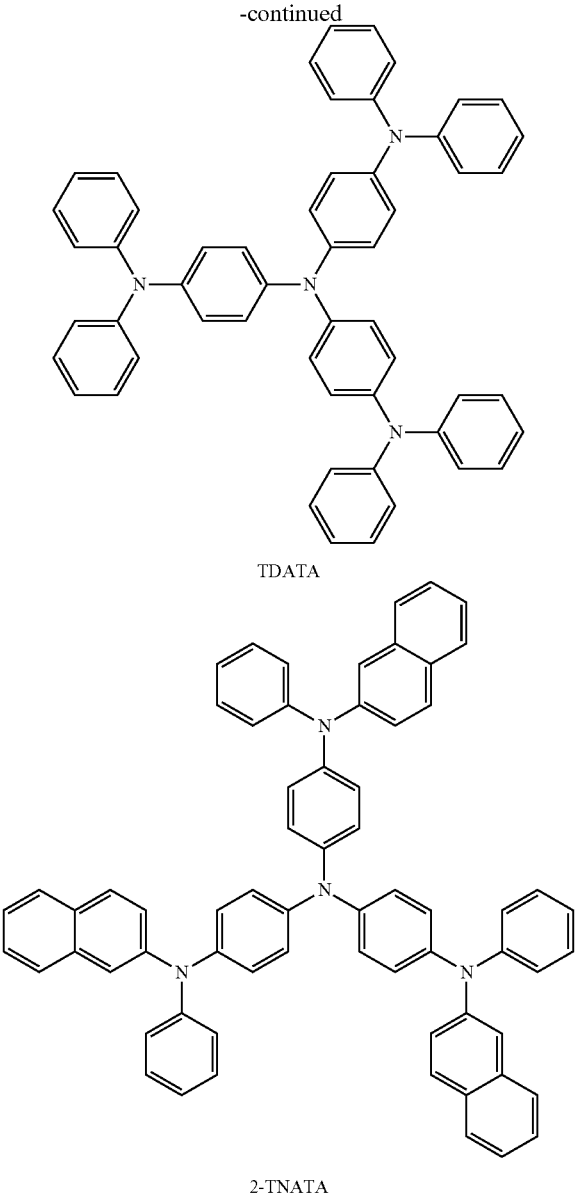

TDATA

2-TNATA

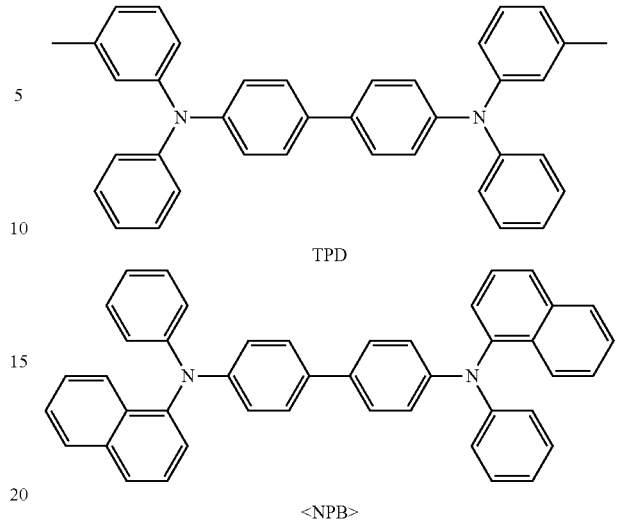

TPD

<NPB>

A thickness of the HTL may be in a range of about 50 Å to about 2,000 Å, e.g., about 100 Å to about 1,500 Å. When the thickness of the HTL is within these ranges, the HTL may have satisfactory hole transporting ability without a substantial increase in driving voltage.

In an implementation, instead of the HIL and the HTL, an H-functional layer (a functional layer having a hole injection capability and a hole transport capability) may be formed. The H-functional layer may include one or more materials selected from the materials for the HIL and the materials for the HTL. A thickness of the H-functional layer may be in a range of about 100 Å to about 10,000 Å, e.g., about 100 Å to about 1,000 Å. When the thickness of the H-functional layer is within these ranges, the H-functional layer may have satisfactory hole injection and transport characteristics without a substantial increase in a driving voltage.

Also, at least one layer selected from the HIL, the HTL, and the H-functional layer may include at least one selected from a compound represented by Formula 300 below or a compound represented by Formula 301 below.

A thickness of the HIL may be in a range of about 100 Å to about 10,000 Å, e.g., about 100 Å to about 1,000 Å. When the thickness of the HIL is within these ranges, the HIL may have satisfactory hole injection ability without a substantial increase in driving voltage.

Then, a hole transportation layer (HTL) may be formed on the HIL by using vacuum deposition, spin coating, casting, LB deposition, or the like. When an HTL is formed using vacuum deposition or spin coating, the deposition and coating conditions may be similar to those for the formation of the HIL, although the conditions for deposition and coating may vary according to the material that is used to form the HTL.

As a hole transport material, a suitable hole transport material may be used. Examples the hole transport material may include a carbazole derivative, such as N-phenylcarbazole, or polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine (NPB).

<Formula 300>

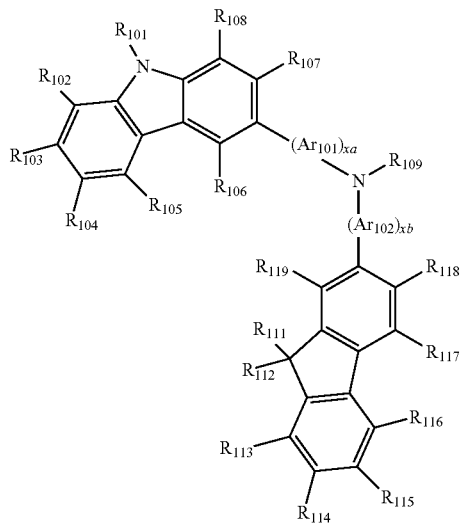

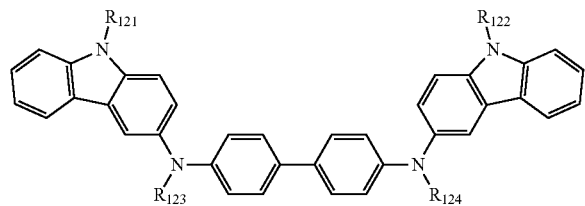

<Formula 301>

Ar$_{101}$ and Ar$_{102}$ in Formula 300 may be each independently a substituted or unsubstituted C$_6$-C$_{60}$ arylene group.

For example, Ar$_{101}$ and Ar$_{102}$ may be each independently selected from:

a phenylene group, a pentalenylene group, an indenylene group, a naphthylene group, an azulenylene group, an acenaphthylene group, a fluorenylene group, a phenalenylene group, a phenanthrenylene group, an anthracenylene group, a fluorantenylene group, a triphenylenylene group, a pyrenylene group, a chrysenylenylene group, a naphthacenylene group, a pycenylene group, a perylenylene group, and a pentacenylene group; and a phenylene group, a pentalenylene group, an indenylene group, a naphthylene group, an azulenylene group, an acenaphthylene group, a fluorenylene group, a phenalenylene group, a phenanthrenylene group, an anthracenylene group, a fluorantenylene group, a triphenylenylene group, a pyrenylene group, a chrysenylenylene group, a naphthacenylene group, a pycenylene group, a perylenylene group, and a pentacenylene group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_3$-C$_{10}$ cycloalkenyl group, a C$_3$-C$_{10}$ heterocycloalkyl group, a C$_3$-C$_{10}$ heterocycloalkenyl group, a C$_6$-C$_{60}$ aryl group, a C$_6$-C$_{60}$ aryloxy group, a C$_6$-C$_{60}$ arylthio group, and a C$_2$-C$_{60}$ heteroaryl group.

xa and xb in Formula 300 may be each independently an integer of 0 to 5, or 0, 1, or 2. For example, xa may be 1, and xb may be 0, but xa and xb are not limited thereto.

R$_{101}$ to R$_{108}$, R$_{111}$ to R$_{119}$, and R$_{121}$ to R$_{124}$ in Formulae 300 and 301 may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{60}$ cycloalkyl group, a substituted or unsubstituted C$_5$-C$_{60}$ aryl group, a substituted or unsubstituted C$_5$-C$_{60}$ aryloxy, and a substituted or unsubstituted C$_5$-C$_{60}$ arylthio group.

For example, R$_{101}$ to R$_{108}$, R$_{111}$ to R$_{119}$, and R$_{121}$ to R$_{124}$ may be each independently selected from:

a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a C$_1$-C$_{10}$ alkyl group (for example, methyl, ethyl, propyl, butyl, pentyl, hexyl, or the like), and a C$_1$-C$_{10}$ alkoxy group (for example, methoxy, ethoxy, propoxy, butoxy, pentoxy, or the like);

a C$_1$-C$_{10}$ alkyl group and a C$_1$-C$_{10}$ alkoxy group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, and a phosphoric acid or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a C$_1$-C$_{10}$ alkyl group, and a C$_1$-C$_{10}$ alkoxy group, but R$_{101}$ to R$_{108}$, R$_{111}$ to R$_{119}$, and R$_{121}$ to R$_{124}$ are not limited thereto.

R$_{109}$ in Formula 300 may be selected from a phenyl group, a naphthyl group, an anthracenyl group, a biphenyl group, and a pyridyl group; and a phenyl group, a naphthyl group, an anthracenyl group, a biphenyl group, and a pyridyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a substituted or unsubstituted C$_1$-C$_{20}$ alkyl group, and a substituted or unsubstituted C$_1$-C$_{20}$ alkoxy group.

According to an embodiment, the compound represented by Formula 300 may be represented by Formula 300A below.

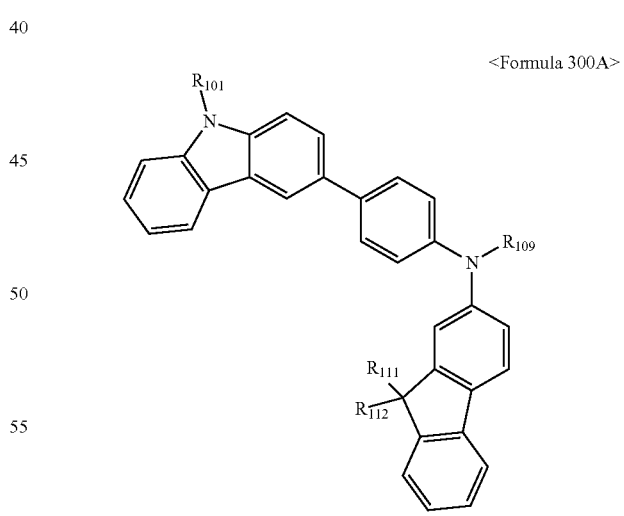

<Formula 300A>

R$_{101}$, R$_{111}$, R$_{112}$, and R$_{109}$ in Formula 300A are already described in detail above.

For example, at least one layer selected from the HIL, the HTL, and the H-functional layer may include at least one selected from Compounds 301 to 320. However, these layers may instead or also include other compounds.

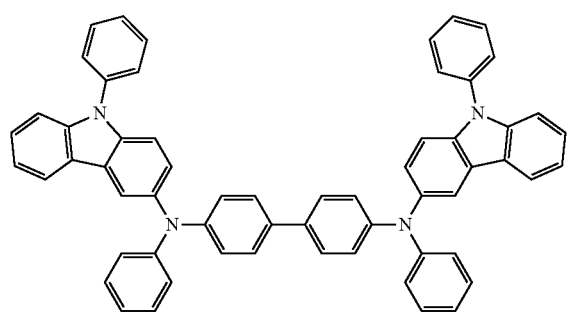
301
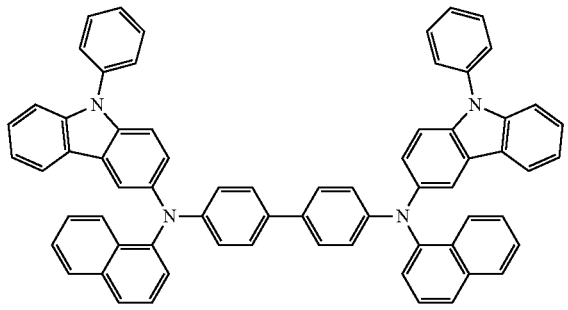
305
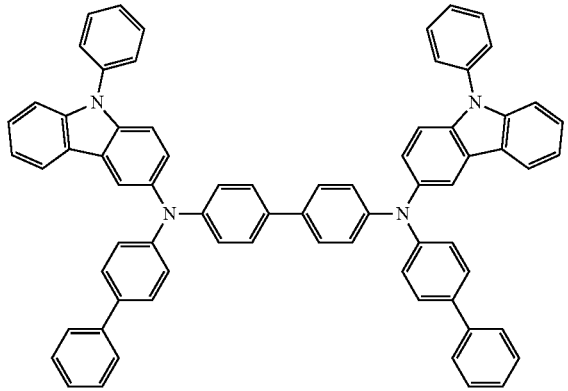
306
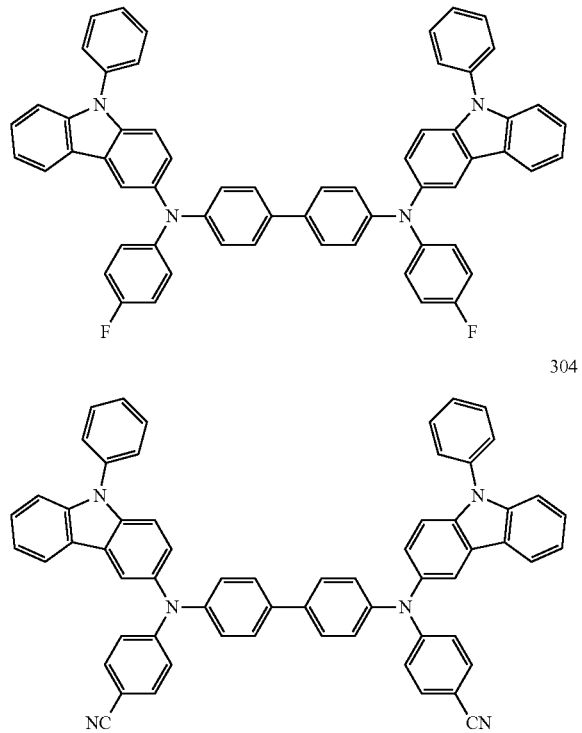
302
303
304
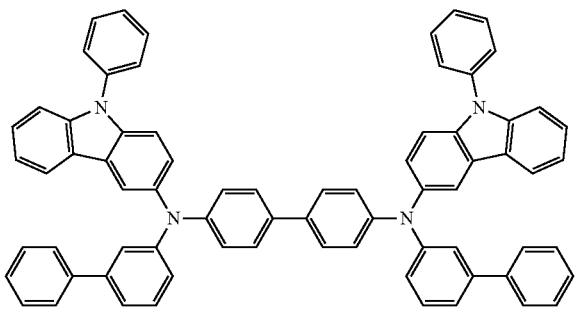
307
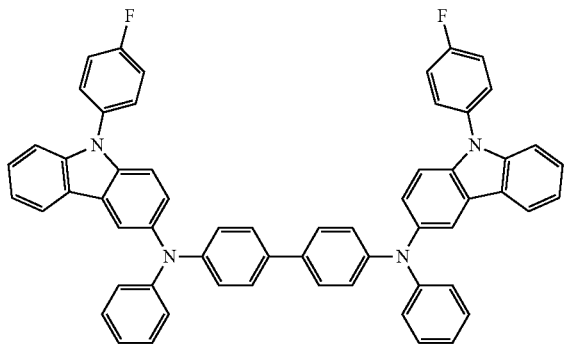
308

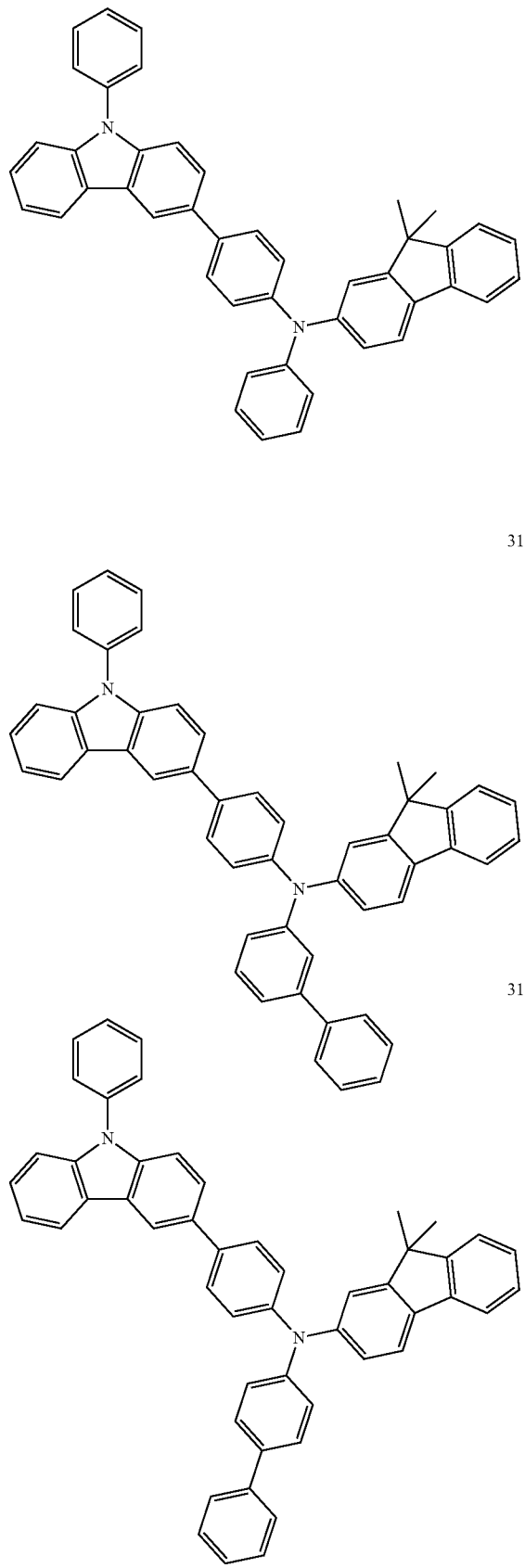
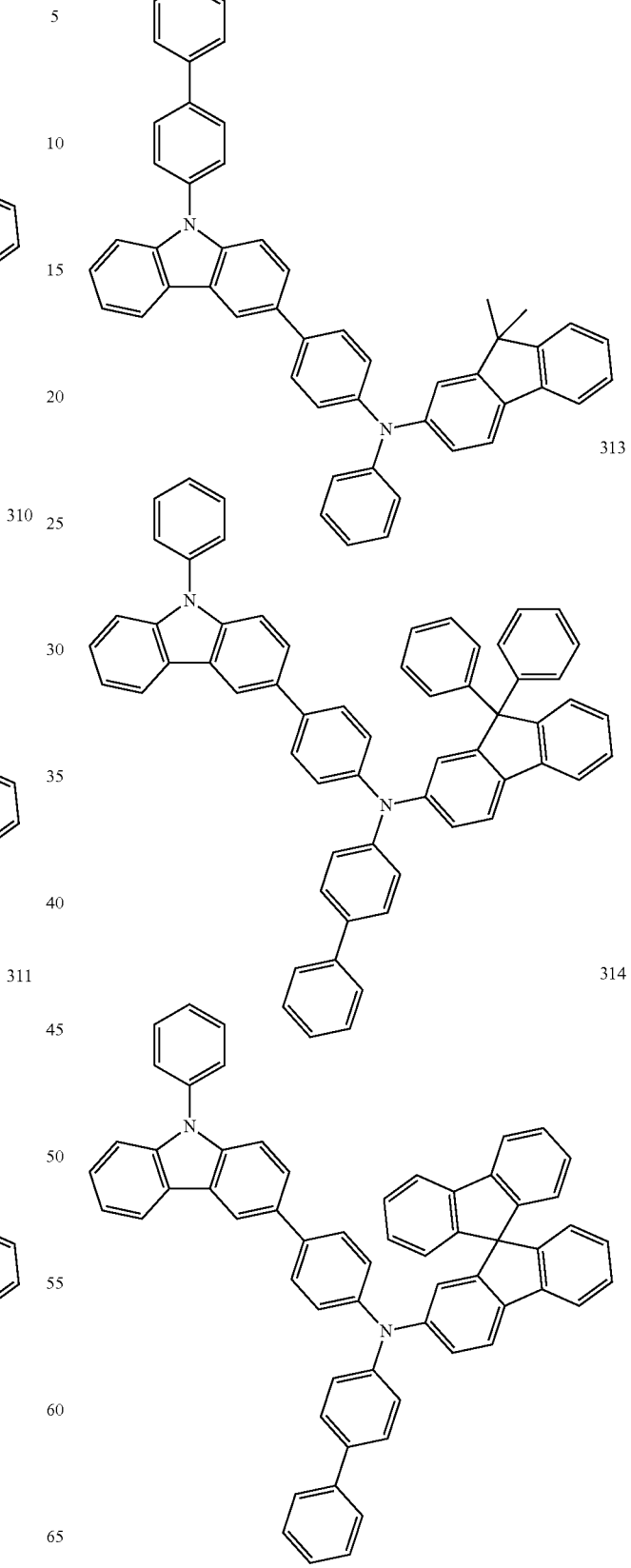

315 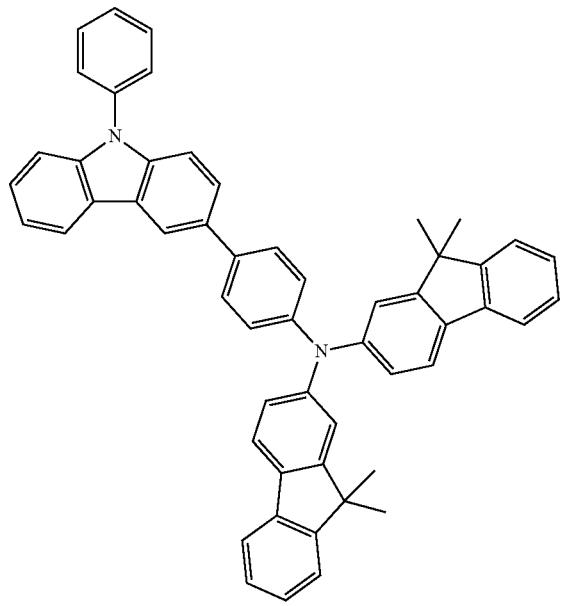
316 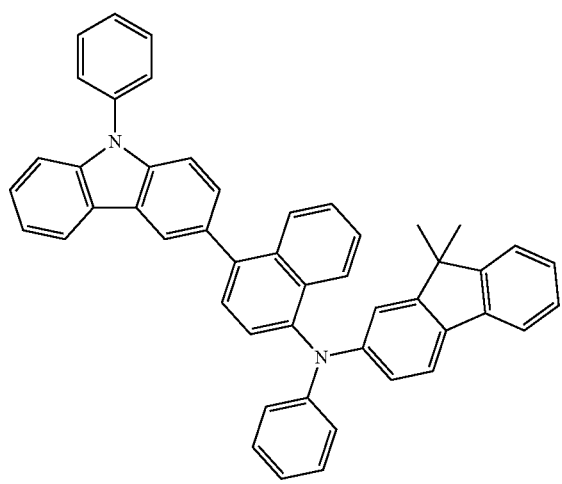
317 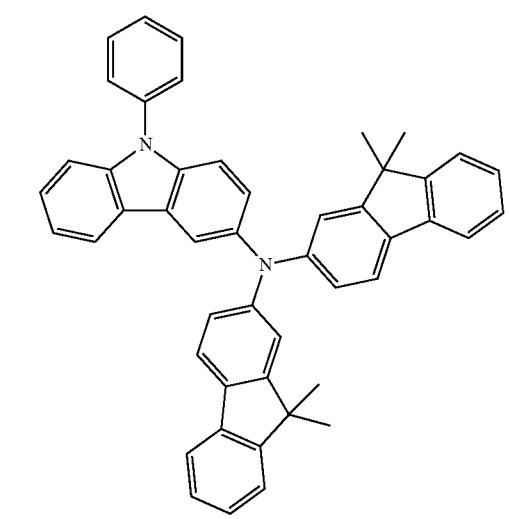
318 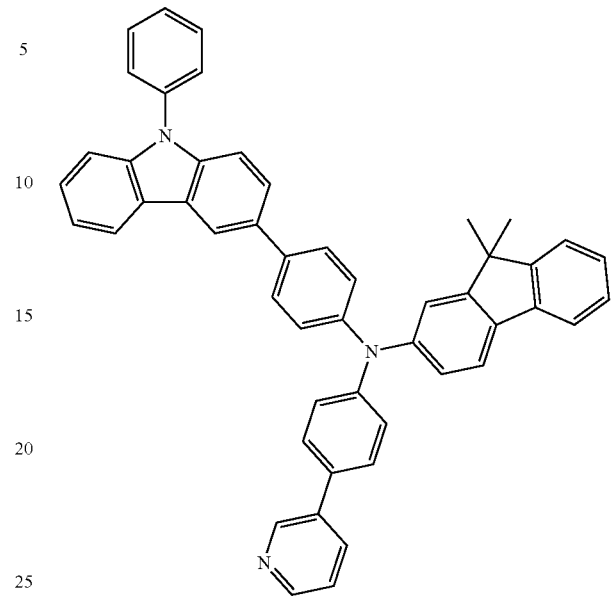
319 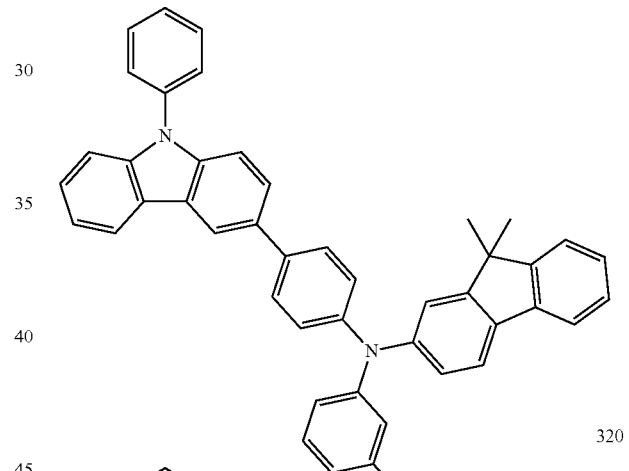
320 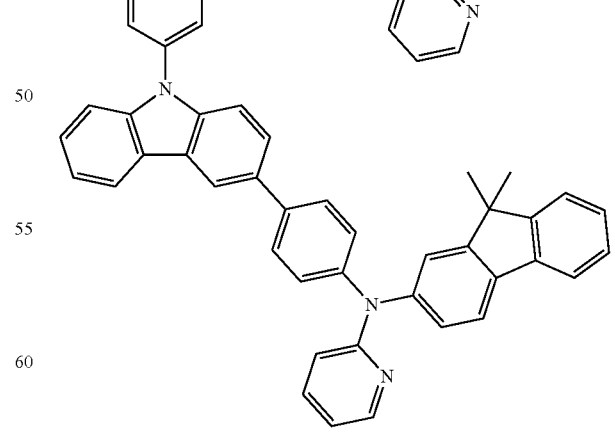
At least one layer selected from the HIL, the HTL, and the H-functional layer may further include, in addition to hole injection materials, hole transport materials, and/or materials having a hole injection function and a hole transport function, a charge-generating material to increase conductivity of a film.

The charge-generating material may include, e.g., a p-dopant. The p-dopant may be one of quinine derivatives, metal oxides, and compounds with a cyano group. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as tungsten oxide or molybdenium oxide; and a cyano group-containing compound, such as Compound 200 below, but they are not limited thereto.

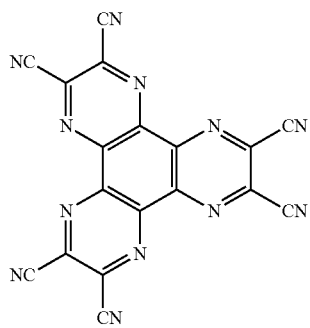

<Compound 200>

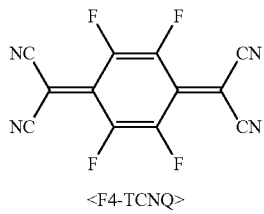

<F4-TCNQ>

When the HIL, the HTL, or the H-functional layer further includes a charge-generating material, the charge-generating material may be homogeneously dispersed or non-homogeneously distributed in the HIL, the HTL, or the H-functional layer.

A buffer layer may be disposed between an emission layer and at least one of the HIL, the HTL, and the H-functional layer. The buffer layer may help compensate for an optical resonance distance of light according to a wavelength of the light emitted from the emission layer, and thus may increase efficiency. The buffer layer may include suitable hole injecting materials or hole transporting materials. In an implementation, the buffer layer may include the same material as one of the materials included in the HIL, the HTL, and the H-functional layer that are disposed under the buffer layer.

Then, an emission layer (EML) may be formed on the HIL, the HTL, or the H-functional layer by, e.g., vacuum deposition, spin coating, casting, LB deposition, or the like. When the EML is formed using vacuum deposition or spin coating, the deposition and coating conditions may be similar to those for the formation of the HIL, though the conditions for deposition and coating may vary according to the material that is used to form the EML.

The EML may include an anthracene-based compound represented by Formula 1, below, and a condensed ring compound represented by Formula 20, below.

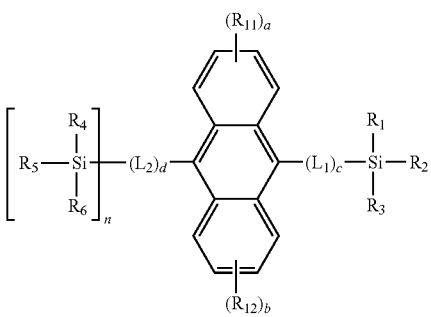

<Formula 1>

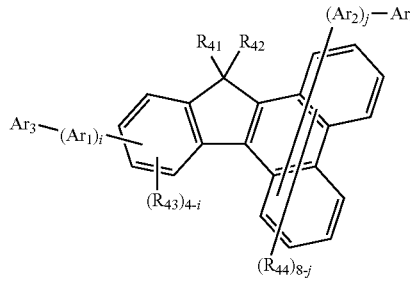

<Formula 20>

The anthracene-based compound may act as a host, and the condensed ring compound may act as a dopant. The condensed ring compound may act as a blue fluorescent dopant that emits blue light according to a fluorescence emission mechanism. A weight ratio of the anthracene-based compound to the condensed ring compound in the EML may be in a range of about 99.9:0.01 to 80:20.

n in Formula 1 may be 0 or 1. When n is 0, $-Si(R_4)(R_5)(R_6)$ in Formula 1 may not be present.

$R_1$ to $R_6$ in Formula 1 may be each independently selected from a substituted or unsubstituted $C_1$-$C_{60}$ alkyl group, a substituted or unsubstituted non-condensed ring group in which a number of ring forming atoms is in a range of 3 to 10, and a substituted or unsubstituted condensed ring group in which two or more rings are condensed. In an implementation, when n is 0, at least one of $R_1$ to $R_3$ may be a substituted or unsubstituted condensed ring group in which two or more rings are condensed, and when n is 1, at least one of $R_1$ to $R_6$ may be a substituted or unsubstituted condensed ring group in which two or more rings are condensed.

The term "a substituted or unsubstituted non-condensed ring group in which the number of ring forming atoms is in a range of 3 to 10" refers to a cyclic group that has 3 to 10 ring forming atoms and includes one ring not to be a condensed ring. The ring forming atoms of the "substituted or unsubstituted non-condensed ring group in which the number of ring forming atoms is in a range of 3 to 10" may be selected from C, N, O, P, S, and Si, and may be recognized by referring to Formulae 2A to 2T, which are illustrated below.

The term "a substituted or unsubstituted condensed ring group in which two or more rings are condensed" refers to a group that has two or more rings, wherein the rings are condensed each other. The "substituted or unsubstituted condensed ring group in which two or more rings are condensed" may be an aromatic group or a non-aromatic group, and may have a ring forming atom number from 3 to 60, and a ring forming atom of the group may be selected from C, N, O, P, S, and Si. The "substituted or unsubstituted condensed ring group in which two or more rings are condensed" may be recognized by referring to Formulae 3A to 3R and 4A to 4J, which are illustrated below.

$R_1$ to $R_6$ in Formula 1 may be each independently selected from:

a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a thiophenyl group, a furanyl group, a pyrrolyl group, an imidazolyl group, a pyrazolyl group, an isothiazolyl group, an isoxazolyl group, a thiazolyl group, an oxazolyl group, an oxadiazolyl group, a thiadiazolyl group, a triazolyl group, a phenyl group, a pyridinyl group, a pyrazinyl group, a pyrimidinyl group, a pyridazinyl group, a triazinyl group, a pentalenyl group, an indenyl group, a naphthyl group, an azulenyl group, a heptalenyl group, a biphenylenyl group, an indacenyl group, an acenaphthylenyl group, a fluorenyl group, a spiro-fluorenyl group, a carbazolyl group, an anthracenyl group, a phenalenyl group, a phenanthrenyl group, a perylenyl group, a fluoranthenyl group, a naphthacenyl group, a pycenyl group, a pentaphenyl group, a hexacenyl group, a dibenzofuranyl group, a dibenzothiophenyl group, a phenothiazinyl group, a phenoxazinyl group, a dihydrophenazinyl group, a phenoxathiinyl group, and a phenanthridinyl group; and a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a thiophenyl group, a furanyl group, a pyrrolyl group, an imidazolyl group, a pyrazolyl group, an isothiazolyl group, an isoxazolyl group, a thiazolyl group, an oxazolyl group, an oxadiazolyl group, a thiadiazolyl group, a triazolyl group, a phenyl group, a pyridinyl group, a pyrazinyl group, a pyrimidinyl group, a pyridazinyl group, a triazinyl group, a pentalenyl group, an indenyl group, a naphthyl group, an azulenyl group, a heptalenyl group, a biphenylenyl group, an indacenyl group, an acenaphthylenyl group, a fluorenyl group, a spiro-fluorenyl group, a carbazolyl group, an anthracenyl group, a phenalenyl group, a phenanthrenyl group, a perylenyl group, a fluoranthenyl group, a naphthacenyl group, a pycenyl group, a pentaphenyl group, a hexacenyl group, a dibenzofuranyl group, a dibenzothiophenyl group, a phenothiazinyl group, a phenoxazinyl group, a dihydrophenazinyl group, a phenoxathiinyl group, and a phenanthridinyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11a}$)($Q_{12a}$) (wherein $Q_{11a}$ and $Q_{12a}$ may be each independently a hydrogen atom, a $C_1$-$C_{10}$ alkyl group, a $C_6$-$C_{20}$ aryl group, or a $C_2$-$C_{20}$ heteroaryl group).

In an implementation, at least one of $R_1$ to $R_3$, when n is 0, or at least one of $R_1$ to $R_6$, when n is 1, may be each independently selected from:

a pentalenyl group, an indenyl group, a naphthyl group, an azulenyl group, a heptalenyl group, a biphenylenyl group, an indacenyl group, an acenaphthylenyl group, a fluorenyl group, a spiro-fluorenyl group, a carbazolyl group, an anthracenyl group, a phenalenyl group, a phenanthrenyl group, a perylenyl group, a fluoranthenyl group, a naphthacenyl group, a pycenyl group, a pentaphenyl group, a hexacenyl group, a dibenzofuranyl group, a dibenzothiophenyl group, a phenothiazinyl group, a phenoxazinyl group, a dihydrophenazinyl group, a phenoxathiinyl group, and a phenanthridinyl group; or a pentalenyl group, an indenyl group, a naphthyl group, an azulenyl group, a heptalenyl group, a biphenylenyl group, an indacenyl group, an acenaphthylenyl group, a fluorenyl group, a spiro-fluorenyl group, a carbazolyl group, an anthracenyl group, a phenalenyl group, a phenanthrenyl group, a perylenyl group, a fluoranthenyl group, a naphthacenyl group, a pycenyl group, a pentaphenyl group, a hexacenyl group, a dibenzofuranyl group, a dibenzothiophenyl group, a phenothiazinyl group, a phenoxazinyl group, a dihydrophenazinyl group, a phenoxathiinyl group, and a phenanthridinyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11a}$)($Q_{12a}$) (wherein $Q_{11a}$ and $Q_{12a}$ may be each independently a hydrogen atom, a $C_1$-$C_{10}$ alkyl group, a $C_6$-$C_{20}$ aryl group, or a $C_2$-$C_{20}$ heteroaryl group).

For example, $R_1$ to $R_6$ in Formula 1 may be each independently selected from:

a methyl group, an ethyl group, an n-propyl group, an i-propyl group, an n-butyl group, an i-butyl group, a t-butyl group, a pentyl group, a hexyl group, a heptyl group, an octyl group, a nonyl group, and a decyl group;

a methyl group, an ethyl group, an n-propyl group, an i-propyl group, an n-butyl group, an i-butyl group, a t-butyl group, a pentyl group, a hexyl group, a heptyl group, an octyl group, a nonyl group, and a decyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11a}$)($Q_{12a}$) (wherein $Q_{11a}$ and $Q_{12a}$ may be each independently a hydrogen atom, a $C_1$-$C_{10}$ alkyl group, a $C_6$-$C_{20}$ aryl group, or a $C_2$-$C_{20}$ heteroaryl group), Formulae 2A to 2T below; and Formulae 3A to 3R below.

In an implementation, at least one of $R_1$ to $R_3$, when n is 0, or at least one of $R_1$ to $R_6$, when n is 1, may be each independently selected from Formulae 3A to 3R below.

Formula 2A

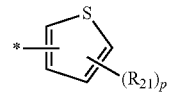

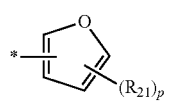 Formula 2B
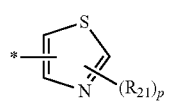 Formula 2C
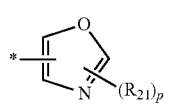 Formula 2D
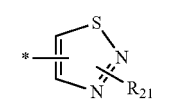 Formula 2E
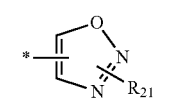 Formula 2F
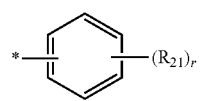 Formula 2G
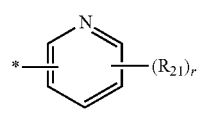 Formula 2H
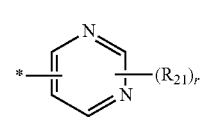 Formula 2I
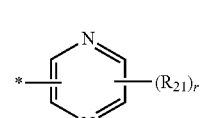 Formula 2J
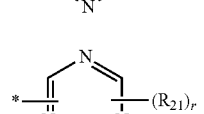 Formula 2K
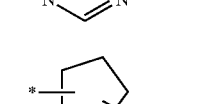 Formula 2L
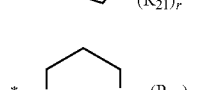 Formula 2M
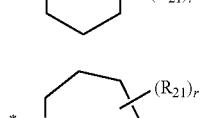 Formula 2N
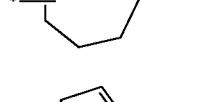 Formula 2O
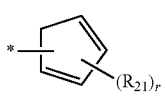 Formula 2P
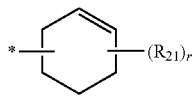 Formula 2Q
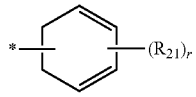 Formula 2R
 Formula 2S
 Formula 2T
 Formula 3A
 Formula 3B
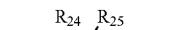 Formula 3C
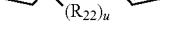 Formula 3D
 Formula 3E
 Formula 3F

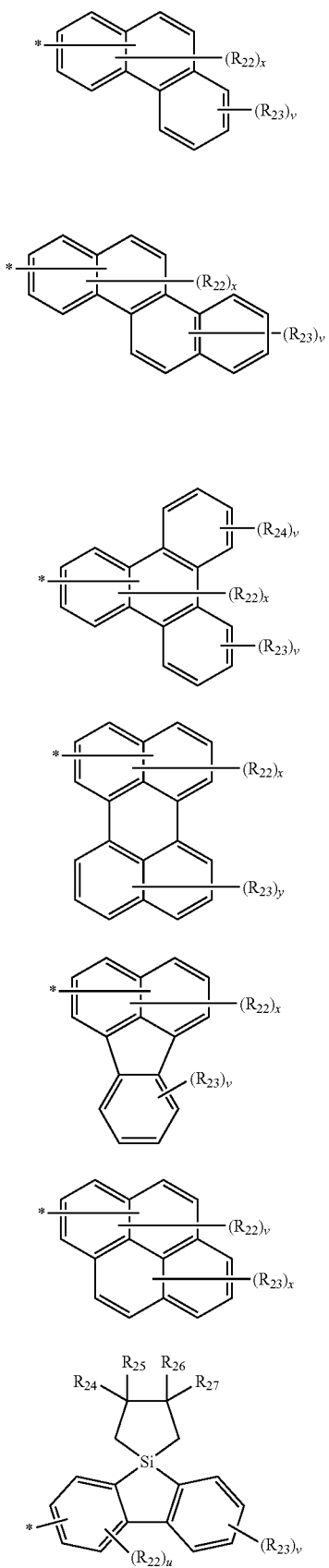

$R_{21}$ to $R_{27}$ in Formulae 2A to 2T and 3A to 3R may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11a}$)($Q_{12a}$) (wherein $Q_{11a}$ and $Q_{12a}$ may be each independently a hydrogen atom, a $C_1$-$C_{10}$ alkyl group, a $C_6$-$C_{20}$ aryl group, or a $C_2$-$C_{20}$ heteroaryl group). p and u may be each independently an integer of 1 to 3; q is 1 or 2; r and x may be each independently an integer of 1 to 5; s and v may be each independently an integer of 1 to 4; t is an integer of 1 to 7; w is an integer of 1 to 9; and y is an integer of 1 to 6. In Formulae 2A to 2T and 3A to 3R, "*" may represent a binding site to a Si atom in Formula 1.

For example, $R_{21}$ to $R_{27}$ in Formulae 2A to 2T and 3A to 3R may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a dimethylfluorenyl group, a phenylcarbazolyl group, a pyrenyl group, a chrycenyl group, a benzothiazolyl group, a benzooxazolyl group, a phenylbenzoimidazolyl group, and —N($Q_{11a}$)($Q_{12a}$) (wherein $Q_{11a}$ and $Q_{12a}$ may be each independently a hydrogen atom, a $C_1$-$C_{10}$ alkyl group, a phenyl group, a naphthyl group, or an anthracenyl group).

In an implementation, $R_1$ to $R_6$ in Formula 1 may be each independently selected from a methyl group, an ethyl group, an n-propyl group, an i-propyl group, an n-butyl group, an i-butyl group, a t-butyl group, a pentyl group, a hexyl group, a heptyl group, an octyl group, a nonyl group, and a decyl group;

a methyl group, an ethyl group, an n-propyl group, an i-propyl group, an n-butyl group, an i-butyl group, a t-butyl group, a pentyl group, a hexyl group, a heptyl group, an octyl group, a nonyl group, and a decyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a phenyl group, a naphthyl group, and an anthracenyl group;

Formula 2G below; and

Formulae 4A to 4J below.

In an implementation, at least one of R1 to R3, when n is 0, or at least one of $R_1$ to $R_6$, when n is 1, may be each independently selected from Formulae 4A to 4J below.

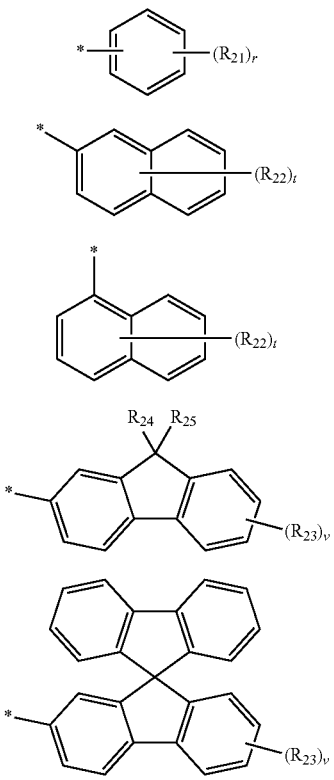

For example, $R_{21}$ to $R_{25}$ in Formulae 2G and 4A to 4J may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a dimethylfluorenyl group, a phenylcarbazolyl group, a pyrenyl group, a chrycenyl group, a benzothiazolyl group, a benzooxazolyl group, a phenylbenzoimidazolyl group, and —N($Q_{11a}$)($Q_{12a}$) (wherein $Q_{11a}$ and $Q_{12a}$ may be each independently a hydrogen atom, a $C_1$-$C_{10}$ alkyl group, a phenyl group, a naphthyl group, or an anthracenyl group). r and x may be each independently an integer of 1 to 5; v is an integer of 1 to 4; t is an integer of 1 to 7; w is an integer of 1 to 9; and y is an integer of 1 to 6. In Formulae 2G and 4A to 4J, "*" may represent a binding site to an Si atom in Formula 1.

$L_1$, $L_2$, $Ar_1$, and $Ar_2$ in Formulae 1 and 20 may be each independently selected from a substituted or unsubstituted $C_3$-$C_{10}$ cycloalkylene group, a substituted or unsubstituted $C_3$-$C_{10}$ cycloalkenylene group, a substituted or unsubstituted $C_3$-$C_{10}$ heterocycloalkylene group, a substituted or unsubstituted $C_3$-$C_{10}$ heterocycloalkenylene group, a substituted or unsubstituted $C_6$-$C_{60}$ arylene group, and a substituted or unsubstituted $C_2$-$C_{60}$ heteroarylene group.

In an implementation, $L_1$, $L_2$, $Ar_1$, and $Ar_2$ in Formulae 1 and 20 may be each independently selected from:

a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, a cycloheptadienylene group, a thiophenylene group, a furanylene group, a pyrrolylene group, an imidazolylene group, a pyrrazolylene group, an isothiazolylene group, an isoxazolylene group, a thiazolylene group, an oxazolylene group, an oxadiazolylene group, a thiadiazolylene group, a triazolylene group, a phenylene group, a pyridinylene group, a pyrazinylene group, a pyrimidinylene group, a pyridazinylene group, a triazinylene group, a pentarenylene group, an indenylene group, a naphthylene group, an azulenylene group, a biphenylenylene group, an indacenylene group, an acenaphthylenylene group, a fluorenylene group, a spiro-fluorenylene group, a carbazolylene group, an anthracenylene group, a phenalenylene group, a phenanthrenylene group, a perylenylene group, a fluoranthenylene group, a naphthacenylene group, a picenylene group, a pentaphenylene group, a hexacenylene group, a dibenzofuranylene group, a dibenzothiophenylene group, a phenothiazinylene group, a phenoxazinylene group, a dihydrophenazinylene group, a phenoxathiinylene group, and a phenanthridinylene group; and a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, a cycloheptadienylene group, a thiophenylene group, a furanylene group, a pyrrolylene group, an imidazolylene group, a pyrrazolylene group, an isothiazolylene group, an isoxazolylene group, a thiazolylene group, an oxazolylene group, an oxadiazolylene group, a thiadiazolylene group, a triazolylene group, a phenylene group, a pyridinylene group, a pyrazinylene group, a pyrimidinylene group, a pyridazinylene group, a triazinylene group, a pentarenylene group, an indenylene group, a naphthylene group, an azulenylene group, a biphenylenylene group, an indacenylene group, an acenaphthylenylene group, a fluorenylene group, a spiro-fluorenylene group, a carbazolylene group, an anthracenylene group, a phenalenylene group, a phenanthrenylene group, a perylenylene group, a fluoranthenylene group, a naphthacenylene group, a picenylene group, a pentaphenylene group, a hexacenylene group, a dibenzofuranylene group, a dibenzothiophenylene group, a phenothiazinylene group, a phenoxazinylene group, a dihydrophenazinylene group, a phenoxathiinylene group, or a phenanthridinylene group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11b}$)($Q_{12b}$) (wherein $Q_{11b}$ and $Q_{12b}$ may be each independently a hydrogen atom, a $C_1$-$C_{10}$ alkyl group, a $C_6$-$C_{20}$ aryl group, or a $C_2$-$C_{20}$ heteroaryl group).

In an implementation, $L_1$, $L_2$, $Ar_1$, and $Ar_2$ in Formulae 1 and 20 may be each independently selected from Formulae 5A to 5J, below.

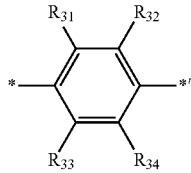

Formula 5A

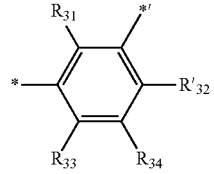

Formula 5B

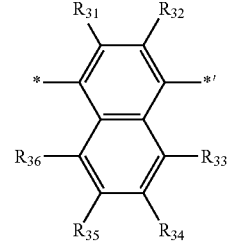

Formula 5C

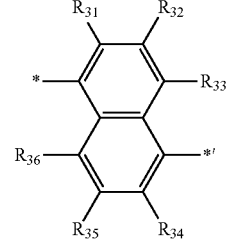

Formula 5D

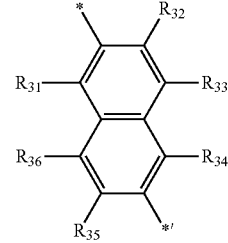

Formula 5E

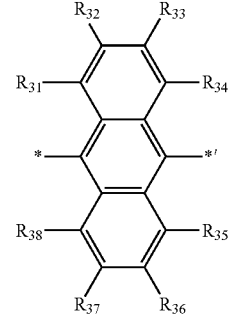

Formula 5F

-continued

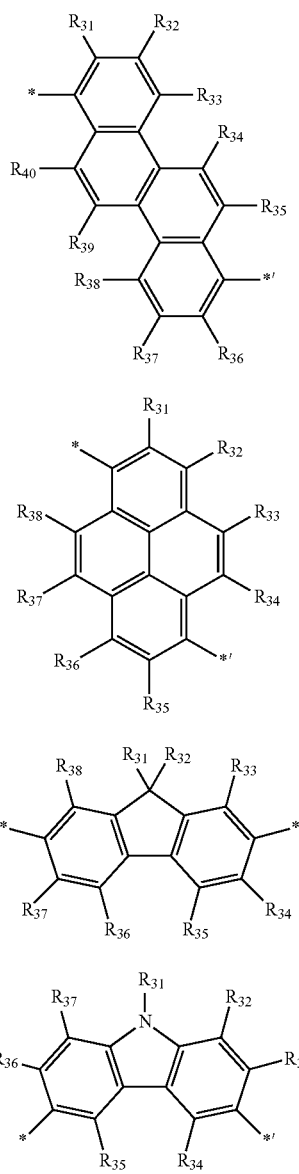

Formula 5G

Formula 5H

Formula 5I

Formula 5J $R_{31}$ to $R_{40}$ in Formulae 5A to 5J may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11b}$)($Q_{12b}$) (wherein $Q_{11b}$ and $Q_{12b}$ may be each independently a hydrogen atom, a $C_1$-$C_{10}$ alkyl group, a $C_6$-$C_{20}$ aryl group, or a $C_2$-$C_{20}$ heteroaryl group). In Formulae 5A to 5J, "*" may indicate a binding site to Formula 1 and/or Formula 20, e.g., at an anthracene core in Formula 1.

For example, $R_{31}$ to $R_{40}$ in Formulae 5A to 5J may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a dimethylfluorenyl group, a phenylcarbazolyl group, a pyrenyl group, a chrycenyl group, a benzothiazolyl group, a benzooxazolyl group, and a phenylbenzoimidazolyl group.

c in Formula 1 indicates the number of $L_1$, and may be an integer of 1 to 3 When c is 2 or more, a plurality of L1 may be identical to or different from each other. Also, d in Formula 1 indicates the number of $L_2$, and may be an integer of 1 to 3. When d is 2 or more, a plurality of $L_2$ may be identical to or different from each other. c and d in Formula 1 may be 1.

In an implementation, $R_{11}$, $R_{12}$, $R_{43}$, and $R_{44}$ in Formulae 1 and 20 may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —N($Q_1$)($Q_2$), and —Si($Q_3$)($Q_4$)($Q_5$), wherein $Q_1$ to $Q_5$ may be each independently a hydrogen atom, a $C_1$-$C_{10}$ alkyl group, a $C_6$-$C_{20}$ aryl group, or a $C_2$-$C_{20}$ heteroaryl group.

For example, $R_{11}$, $R_{12}$, $R_{43}$, and $R_{44}$ in Formulae 1 and 20 may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, and an anthracenyl group.

In an implementation, $R_{11}$, $R_{12}$, $R_{43}$, and $R_{44}$ in Formulae 1 and 20 may be hydrogen atoms.

In an implementation, in Formula 1, when n is 1; and $R_1$, $R_3$, $R_4$, and $R_6$ may be each independently selected from a substituted or unsubstituted $C_1$-$C_{60}$ alkyl group; $R_2$ and $R_5$ may be each independently a substituted or unsubstituted non-condensed ring group in which the number of ring forming atoms is in a range of 3 to 10, or a substituted or unsubstituted condensed ring group in which two or more rings are condensed, wherein at least one of $R_3$ and $R_5$ may be a substituted or unsubstituted condensed ring group in which two or more rings are condensed.

In an implementation, in Formula 1, when n is 0; $R_1$ and $R_3$ may be each independently a substituted or unsubstituted $C_1$-$C_{60}$ alkyl group; and $R_2$ may be a substituted or unsubstituted condensed ring group in which two or more rings are condensed.

The anthracene-based compound may be one of Compounds 1 to 24, below.
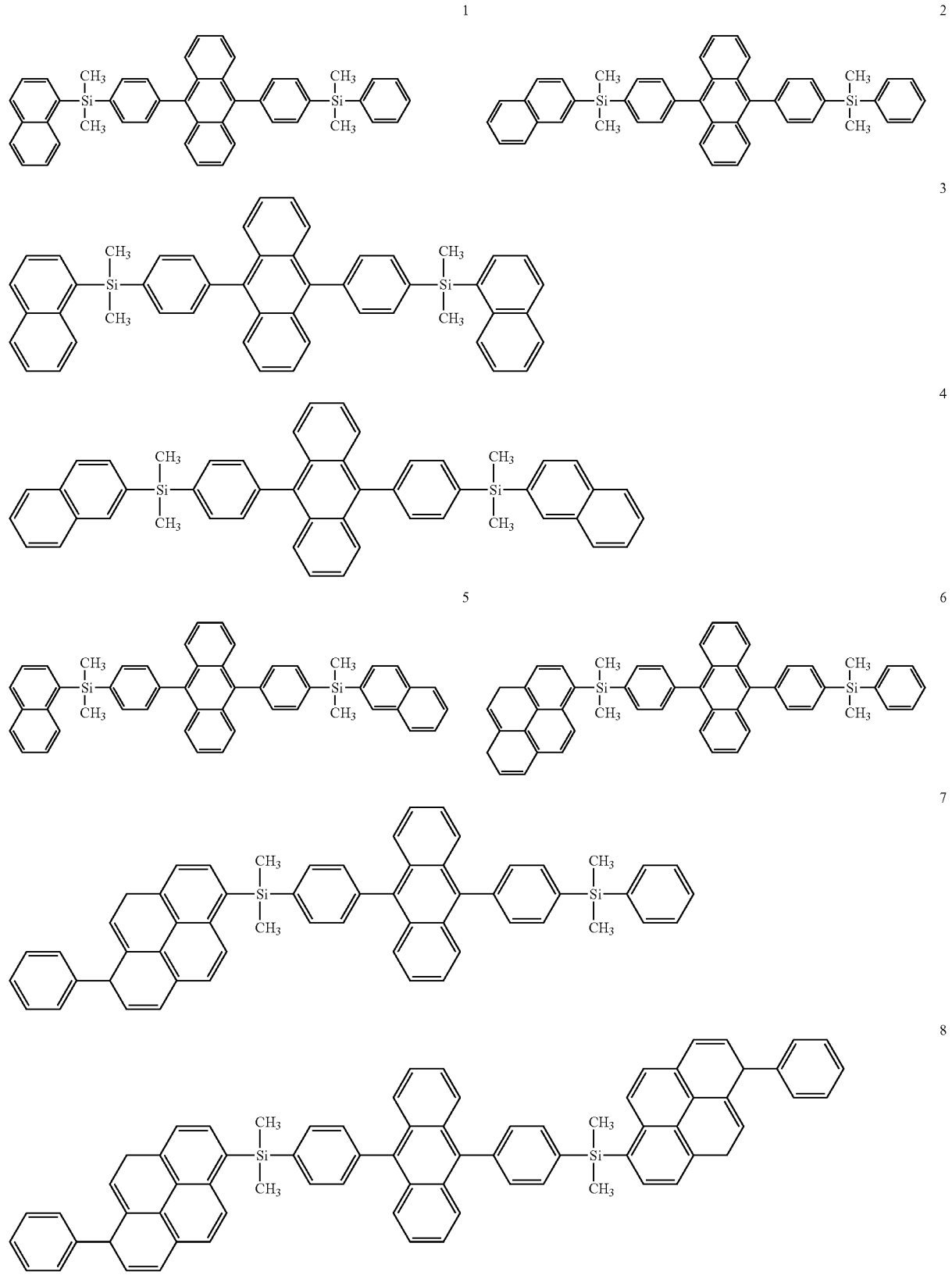

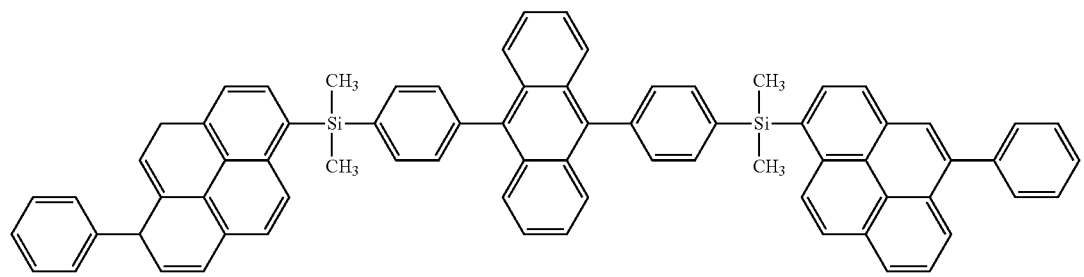
9
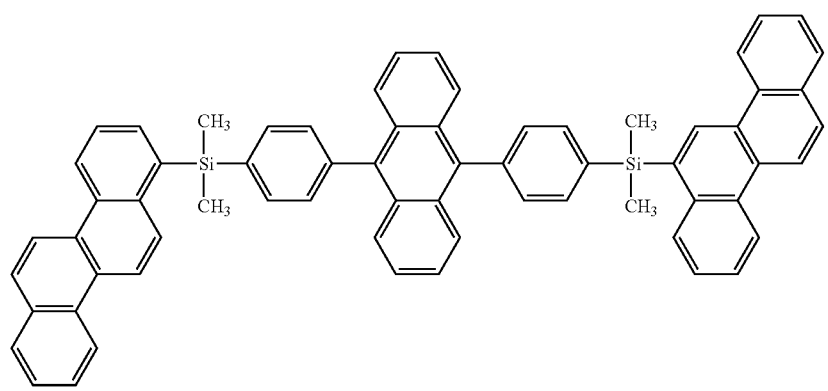
10
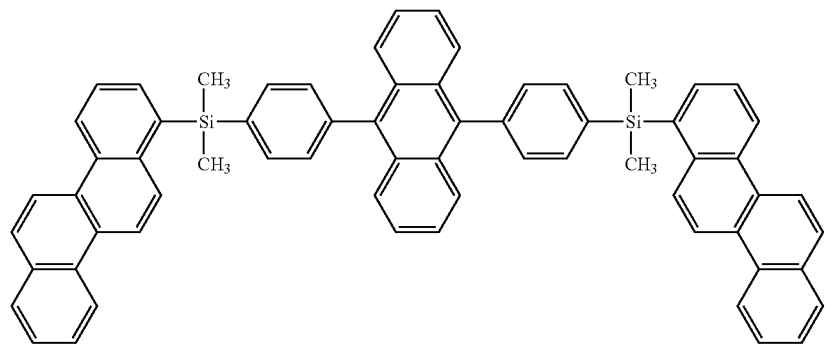
11
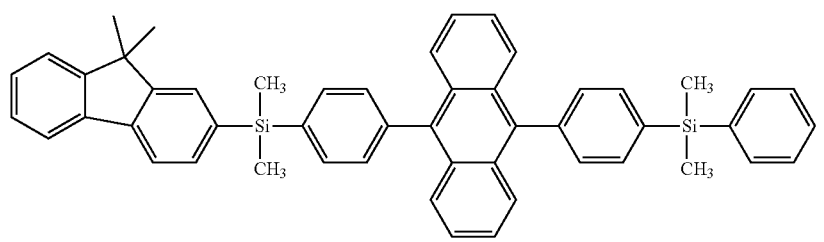
12
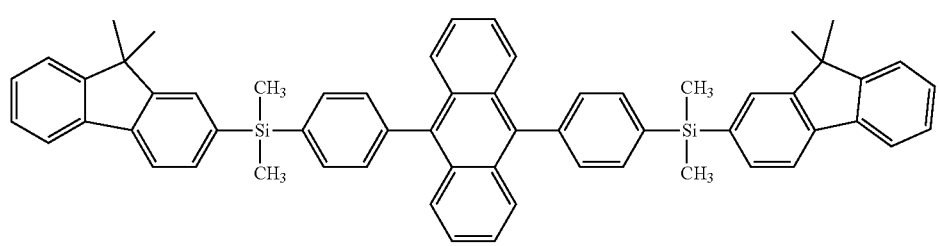
13

-continued
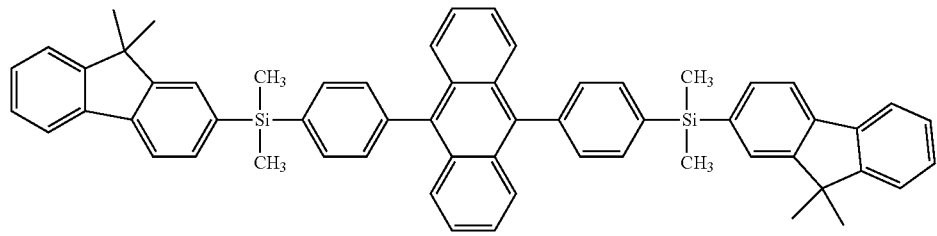
14
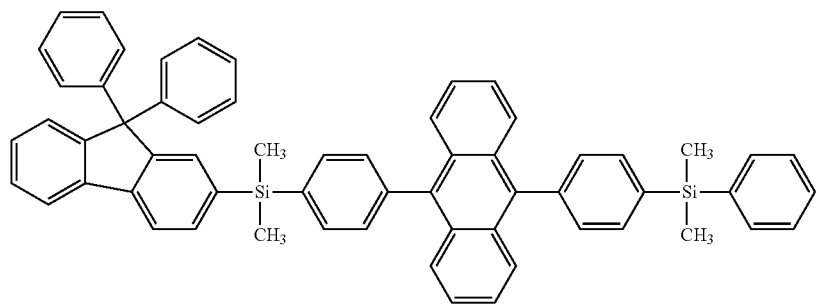
15
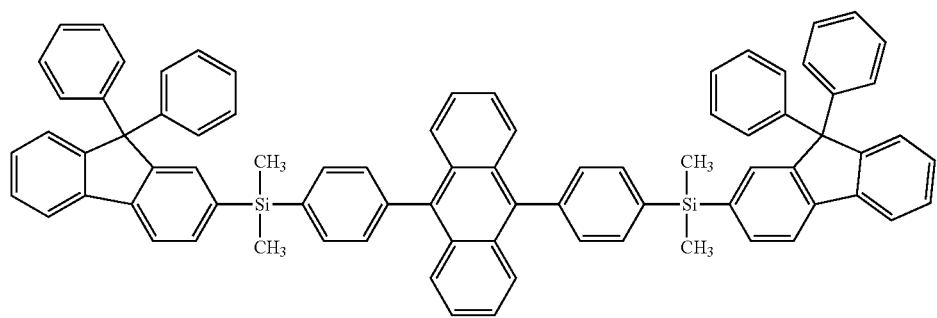
16
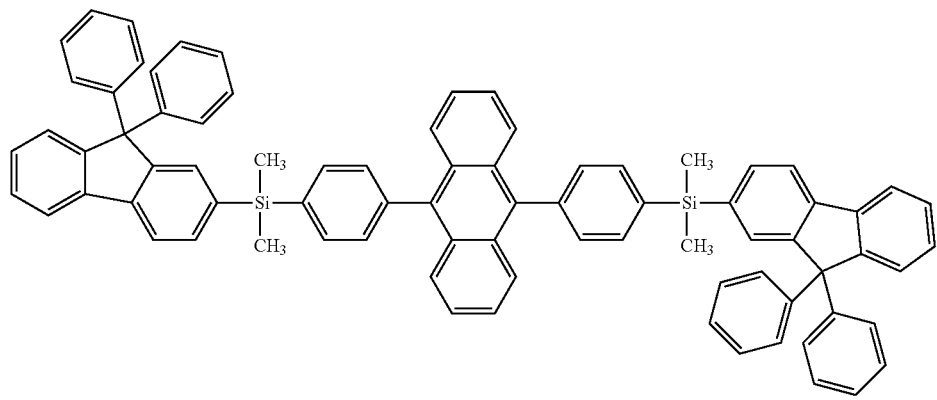
17
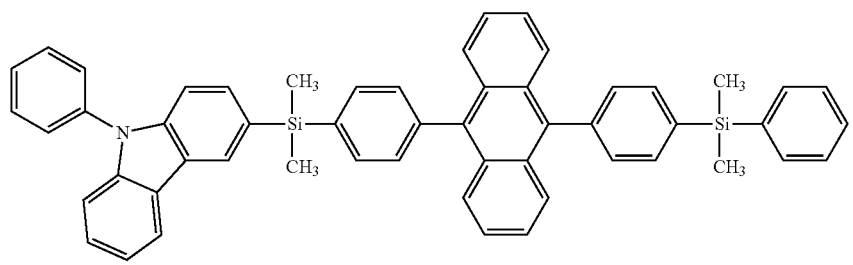
18

-continued

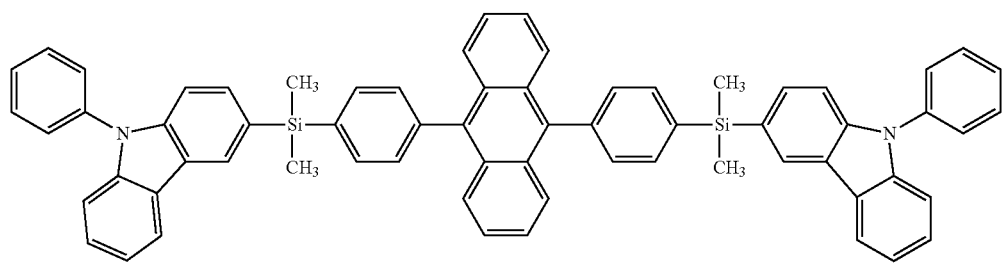

19

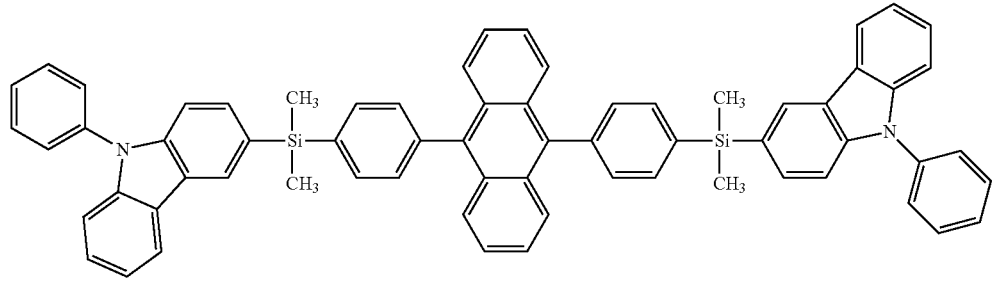

20

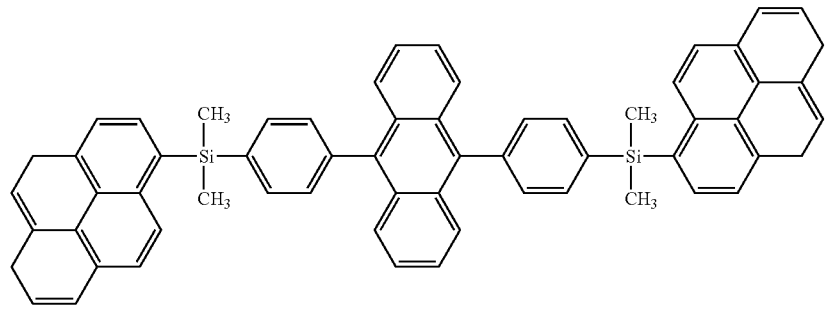

21

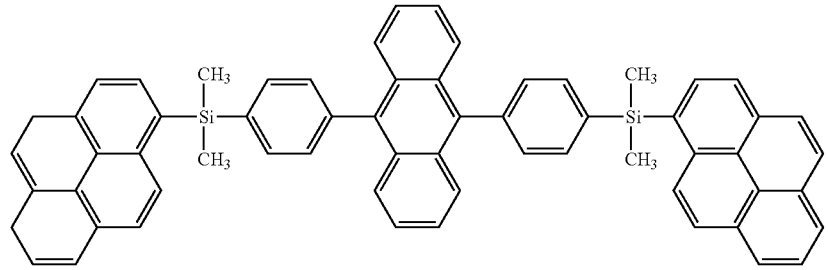

22

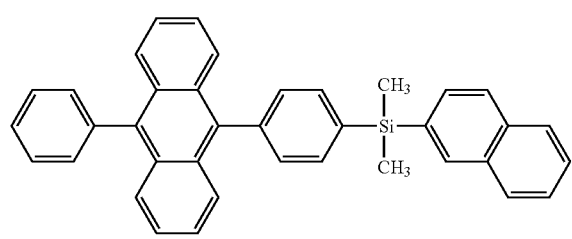

23

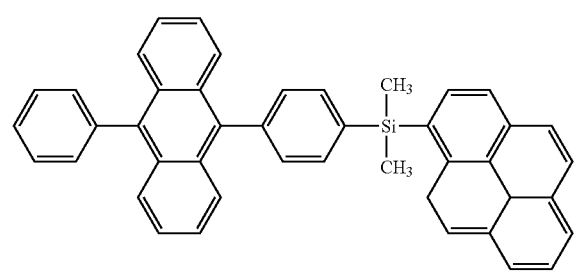

24

In an implementation, $R_{41}$ and $R_{42}$ in Formula 20 may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group.

For example, $R_{41}$ and $R_{42}$ in Formula 20 may be each independently selected from
a $C_1$-$C_{20}$ alkyl group, a $C_1$-$C_{20}$ alkoxy group, a phenyl group, a naphthyl group, an anthracenyl group, a pyrenyl group, and a chrycenyl group; and
a $C_1$-$C_{20}$ alkyl group, a $C_1$-$C_{20}$ alkoxy group, a phenyl group, a naphthyl group, an anthracenyl group, a pyrenyl group, or a chrycenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a pyrenyl group, and a chrycenyl group.

For example, $R_{41}$ and $R_{42}$ in Formula 20 may be each independently selected from a methyl group, an ethyl group, a propyl group, a butyl group, a pentyl group, a phenyl group, a naphthyl group, and an anthracenyl group.

i in Formula 1 indicates the number of $Ar_1$, and may be an integer of 0 to 3 When i is 0, N of —$N(Ar_3)(Ar_4)$ may directly link to a core of Formula 20. When i is 2 or more, a plurality of $Ar_1$ may be identical to or different from each other. Also, j indicates the number of $Ar_2$, and may be an integer of 0 to 3. When j is 0, N of —$N(Ar_5)(Ar_6)$ may directly link to the core of Formula 20. When j is 2 or more, a plurality of $Ar_2$ may be identical to or different from each other.

In an implementation, in Formula 20, i may be 0 and j may be 0; i may be 1 and j may be 0; i may be 0 and j may be 1; or i may be 1 and j may be 1. For example, in Formula 20, i may be 0 and j may be 0. However, i and j are not limited thereto.

$Ar_3$ and $Ar_4$ in Formula 20 may be each independently represented by one of Formulae 7A to 7F, below.

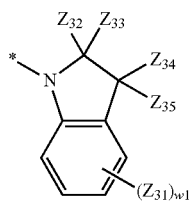
<Formula 7A>

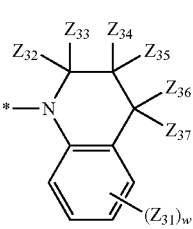
<Formula 7B>

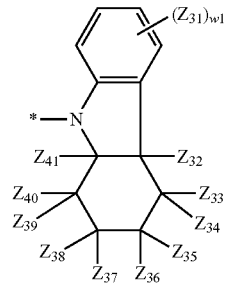
<Formula 7C>

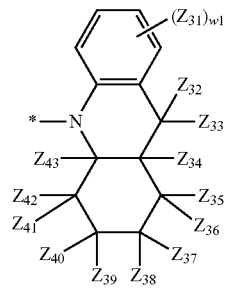
<Formula 7D>

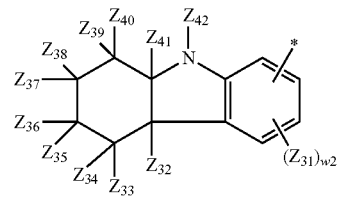
<Formula 7E>

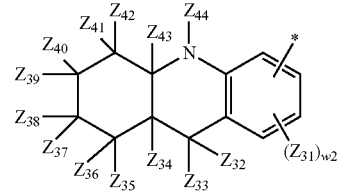
<Formula 7F>

In Formulae 7A to 7F:
$Z_{31}$ to $Z_{44}$ may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —$N(Q_{51})(Q_{52})$, and —$Si(Q_{53})(Q_{54})(Q_{55})$, wherein $Q_{51}$ to $Q_{55}$ may be each independently a hydrogen atom, a $C_1$-$C_{10}$ alkyl group, a $C_6$-$C_{20}$ aryl group, or a $C_2$-$C_{20}$ heteroaryl group. In an implementation, two or more of $Z_{31}$ to $Z_{44}$ may be bindable to each other to selectively form a saturated or unsaturated ring having 6 to 20 carton atoms.

w1 may be an integer of 1 to 4; and w2 may be an integer of 1 to 5. In Formulae 7A to 7F, "*" may represent a binding site with $Ar_1$, $Ar_2$, and/or a carbon atom in Formula 20.

In an implementation, $Z_{31}$ to $Z_{44}$ in Formulae 7A to 7F may be each independently selected from:

a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, and a phosphoric acid or a salt thereof;

a phenyl group, a pentalenyl group, an indenyl group, a naphthyl group, an azulenyl group, an indacenyl group, an acenaphthyl group, a fluorenyl group, a spiro-fluorenyl group, a phenalenyl group, a phenanthrenyl group, an anthracenyl group, a fluorantenyl group, a triphenylenyl group, a pyrenyl group, a chrycenyl group, a naphthacenyl group, a pycenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group;

a phenyl group, a pentalenyl group, an indenyl group, a naphthyl group, an azulenyl group, an indacenyl group, an acenaphthyl group, a fluorenyl group, a spiro-fluorenyl group, a phenalenyl group, a phenanthrenyl group, an anthracenyl group, a fluorantenyl group, a triphenylenyl group, a pyrenyl group, a chrycenyl group, a naphthacenyl group, a pycenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenylene group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_1$-$C_{60}$ alkoxy group, a $C_6$-$C_{60}$ aryl group, and a $C_2$-$C_{60}$ heteroaryl group; and —Si$(Q_{53})(Q_{54})(Q_{55})$ (wherein $Q_{53}$ to $Q_{55}$ may be each independently a hydrogen atom, a $C_1$-$C_{10}$ alkyl group, a $C_6$-$C_{20}$ aryl group, and a $C_2$-$C_{20}$ heteroaryl group).

For example, $Z_{31}$ to $Z_{44}$ in Formulae 7A to 7F may be each independently selected from:

a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, and a phosphoric acid or a salt thereof;

a phenyl group, a naphthyl group, a fluorenyl group, a spiro-fluorenyl group, a phenalenyl group, a phenanthrenyl group, an anthracenyl group, a fluorantenyl group, a pyrenyl group, a chrycenyl group, a pyridinyl group, a pyrazinyl group, a pyrimidinyl group, a pyridazinyl group, a quinolinyl group, an isoquinolinyl group, a carbazolyl group, a furanyl group, a benzofuranyl group, a thiophenyl group, and a benzothiophenyl group;

a phenyl group, a naphthyl group, a fluorenyl group, a spiro-fluorenyl group, a phenalenyl group, a phenanthrenyl group, an anthracenyl group, a fluorantenyl group, a pyrenyl group, a chrycenyl group, a pyridinyl group, a pyrazinyl group, a pyrimidinyl group, a pyridazinyl group, a quinolinyl group, an isoquinolinyl group, a carbazolyl group, a furanyl group, a benzofuranyl group, a thiophenyl group, and a benzothiophenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a carbazolyl group, a pyridinyl group, a pyrimidinyl group, a pyrazinyl group, and a triazinyl group, or —Si$(Q_{53})(Q_{54})(Q_{55})$ (wherein $Q_{53}$ to $Q_{55}$ may be each independently selected from a hydrogen atom, a C1-C10 alkyl group, a phenyl group, a naphthyl group, an anthracenyl group, and a pyrenyl group).

In an implementation, $Ar_3$ and $Ar_4$ in Formula 20 may be each independently selected from Formulae 7A(1) to 7A(3), 7B(1) to 7B(3), 7C(1) to 7C(6), 7D(1), 7D(2), 7E(1), and 7F(1).

<Formula 7A(1)>

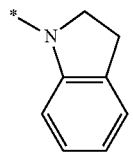

115
-continued
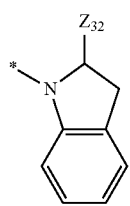
<Formula 7A(2)>
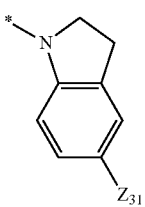
<Formula 7A(3)>
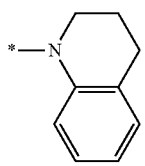
<Formula 7B(1)>
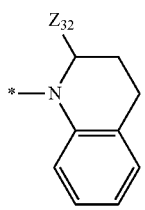
<Formula 7B(2)>
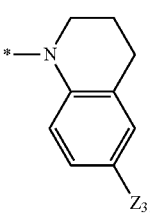
<Formula 7B(3)>
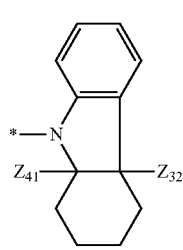
<Formula 7C(1)>
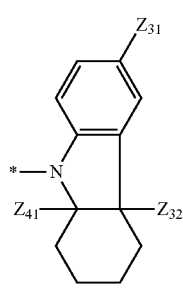
<Formula 7C(2)>
116
-continued
<Formula 7C(3)>
<Formula 7C(4)>
<Formula 7C(5)>
<Formula 7C(6)>
<Formula 7D(1)>

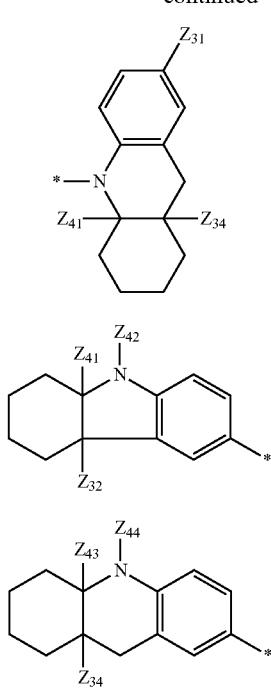

<Formula 7D(2)>

<Formula 7E(1)>

<Formula 7F(1)>

$Z_{31}$, $Z_{32}$, $Z_{34}$, and $Z_{41}$ to $Z_{44}$ in Formula 7A(1) to 7A(3), 7B(1) to 7B(3), 7C(1) to 7C(6), 7D(1), 7D(2), 7E(1) and 7F(1) are already described above.

For example, $Z_{31}$, $Z_{32}$, $Z_{34}$, and $Z_{41}$ to $Z_{44}$ in Formulae 7A(1) to 7A(3), 7B(1) to 7B(3), 7C(1) to 7C(6), 7D(1), 7D(2), 7E(1), and 7F(1) may be each independently selected from:

a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, and a phosphoric acid or a salt thereof;

a phenyl group, a naphthyl group, a fluorenyl group, a spiro-fluorenyl group, a phenalenyl group, a phenanthrenyl group, an anthracenyl group, a fluorantenyl group, a pyrenyl group, a chrycenyl group, a pyridinyl group, a pyrazinyl group, a pyrimidinyl group, a pyridazinyl group, a quinolinyl group, an isoquinolinyl group, a carbazolyl group, a furanyl group, a benzofuranyl group, a thiophenyl group, and a benzothiophenyl group;

a phenyl group, a naphthyl group, a fluorenyl group, a spiro-fluorenyl group, a phenalenyl group, a phenanthrenyl group, an anthracenyl group, a fluorantenyl group, a pyrenyl group, a chrycenyl group, a pyridinyl group, a pyrazinyl group, a pyrimidinyl group, a pyridazinyl group, a quinolinyl group, an isoquinolinyl group, a carbazolyl group, a furanyl group, a benzofuranyl group, a thiophenyl group, and a benzothiophenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a carbazolyl group, a pyridinyl group, a pyrimidinyl group, a pyrazinyl group, and a triazinyl group, or —Si($Q_{53}$)($Q_{54}$)($Q_{55}$) (wherein $Q_{53}$ to $Q_{55}$ may be each independently selected from a hydrogen atom, a $C_1$-$C_{10}$ alkyl group, a phenyl group, a naphthyl group, an anthracenyl group, and a pyrenyl group).

In an implementation, $Ar_3$ and $Ar_4$ in Formula 20 may be identical to each other.

In an implementation, the condensed ring compound represented by Formula 20 may be represented by Formula 20A.

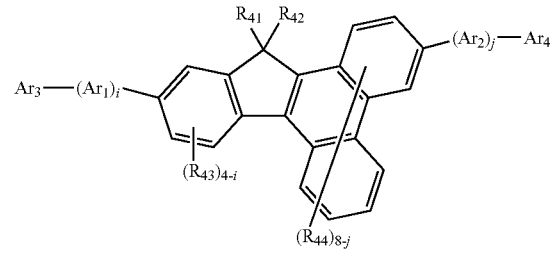

<Formula 20A>

$R_{41}$, $R_{42}$, $Ar_1$ to $Ar_4$, I, and j in Formula 20A are already described above.

For example, in Formula 20A:

$R_{41}$ and $R_{42}$ may be each independently selected from a methyl group, an ethyl group, a propyl group, a butyl group, a pentyl group, a phenyl group, a naphthyl group, and an anthracenyl group;

$R_{43}$ and $R_{44}$ may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a pyrenyl group, and a chrycenyl group; and $Ar_3$ to $Ar_4$ may be each independently selected from Formulae 7A(1) to 7A(3), 7B(1) to 7B(3), 7C(1) to 7C(6), 7D(1), 7D(2), 7E(1), and 7F(1).

As noted above, in an implementation, the condensed ring compound may be represented by Formula 20A(1) below.

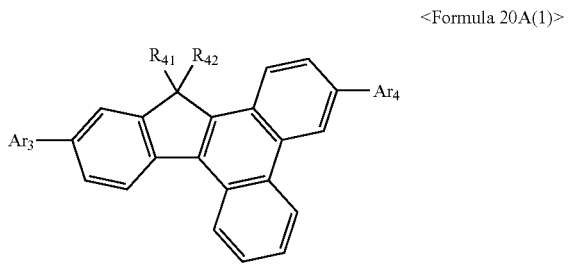

<Formula 20A(1)>

$R_{41}$, $R_{42}$, $Ar_3$, and $Ar_4$ in Formula 20A(1) are already described above.

In an implementation, the condensed compound may be one of Compounds 25 to 68, below.
25
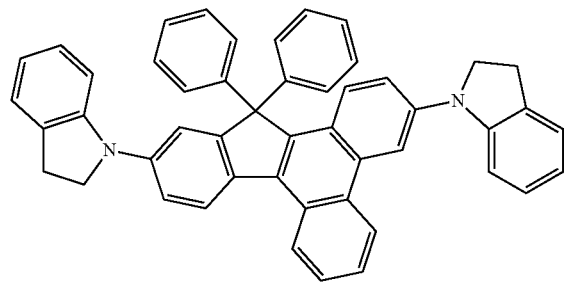
26
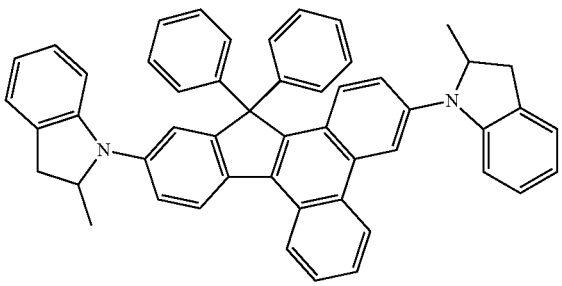
27
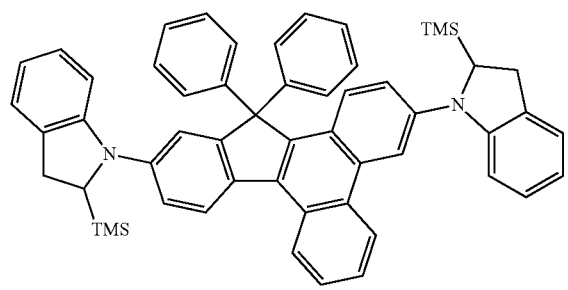
28
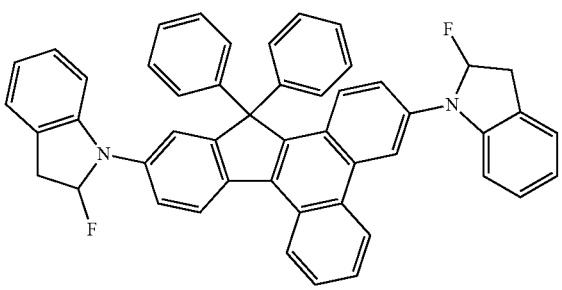
29
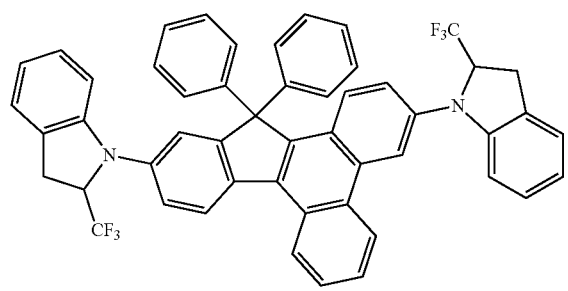
30
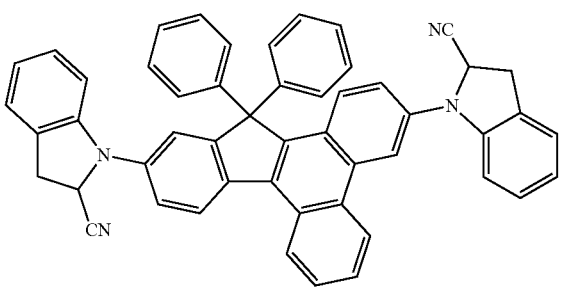
31
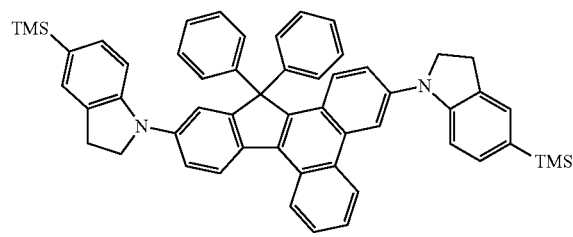
32
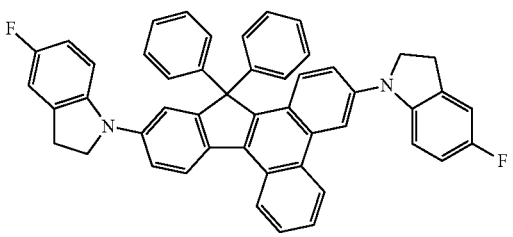
33
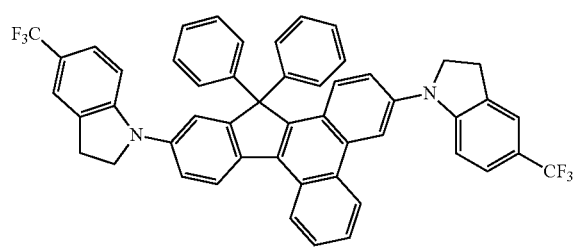
34
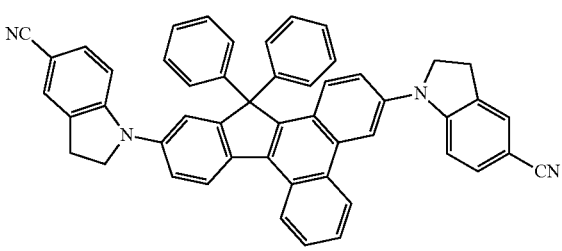

-continued
35
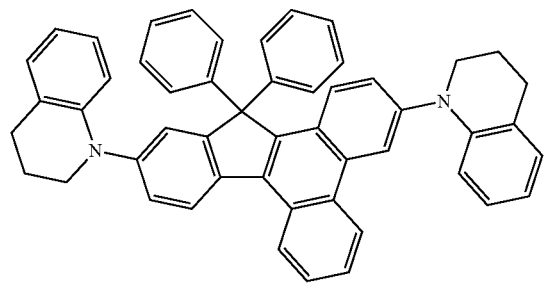
36
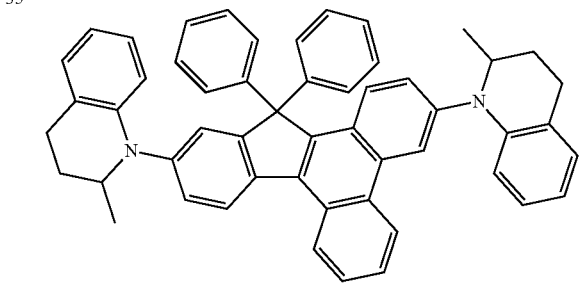
37
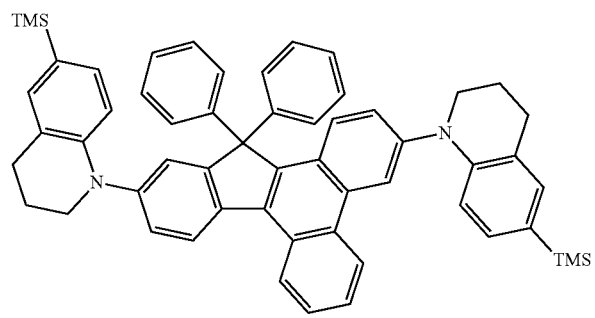
38
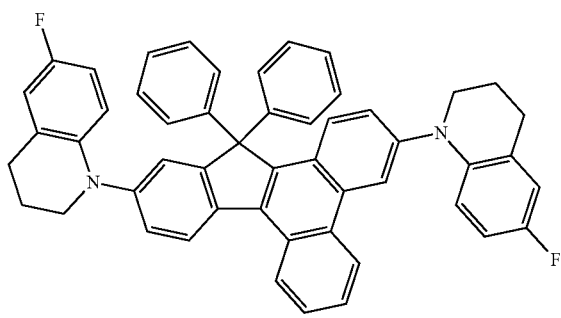
39
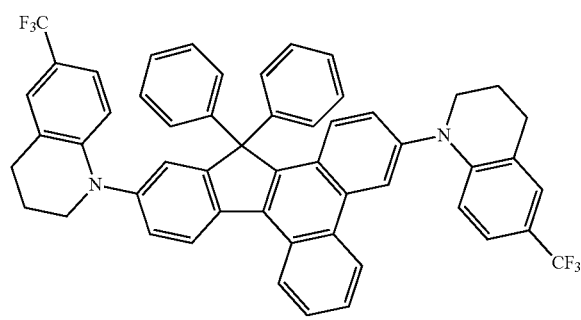
40
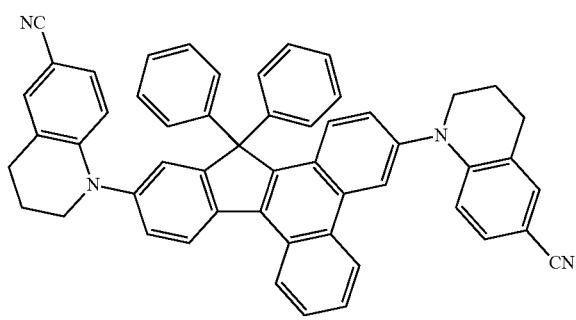
41
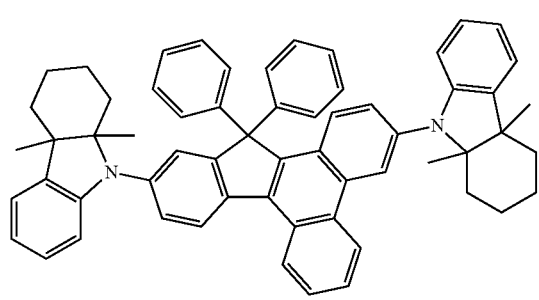
42
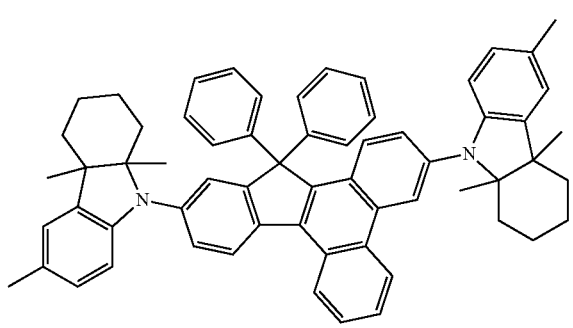
43
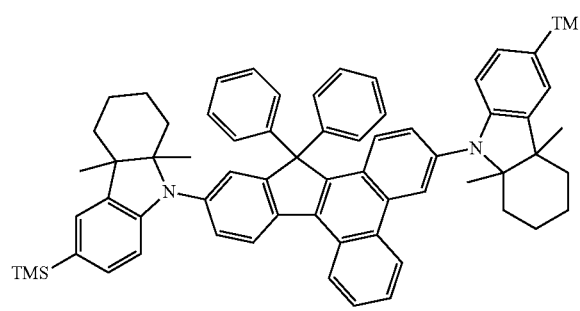
44
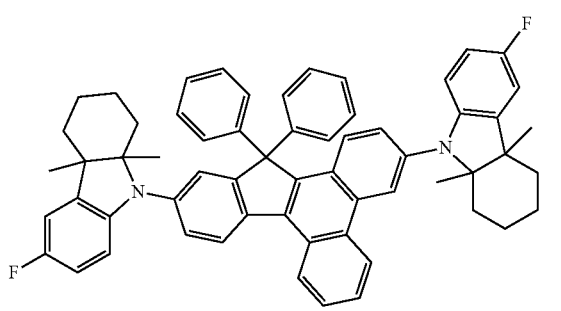

-continued
45
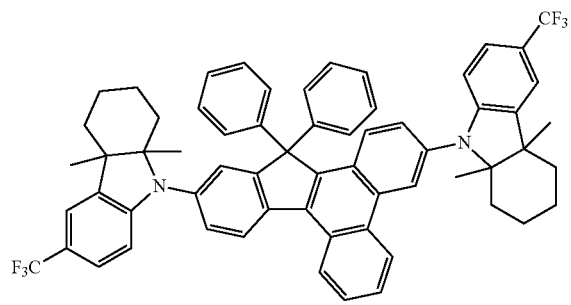
46
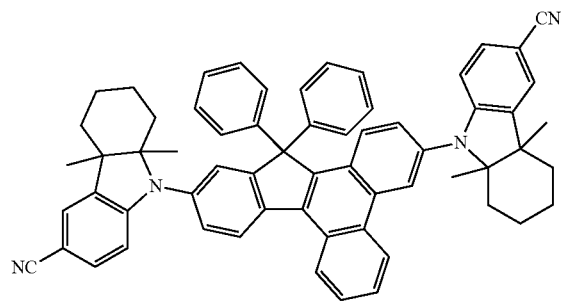
47
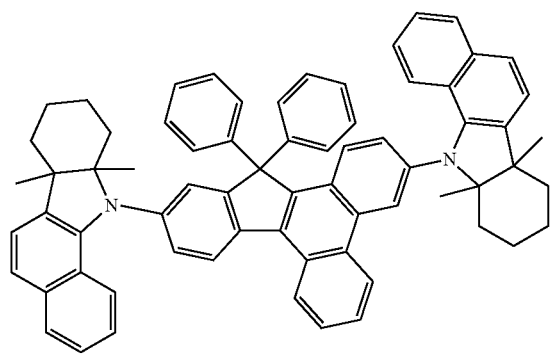
48
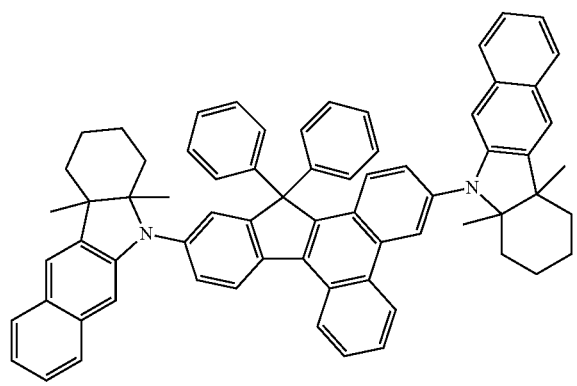
49
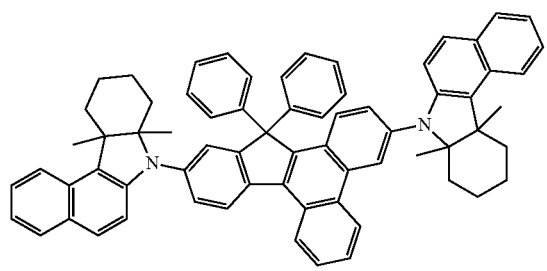
50
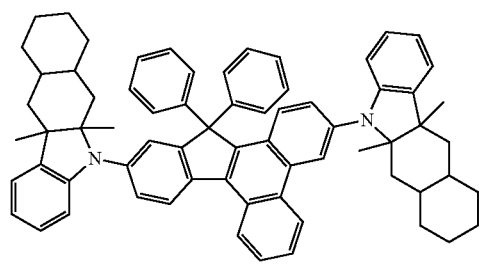
51
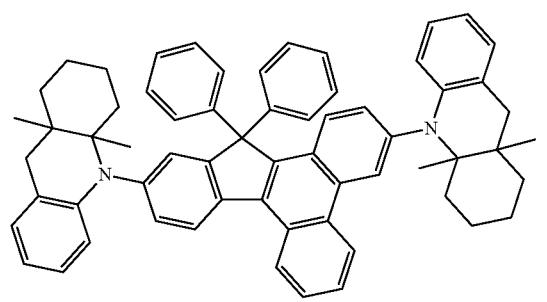
52
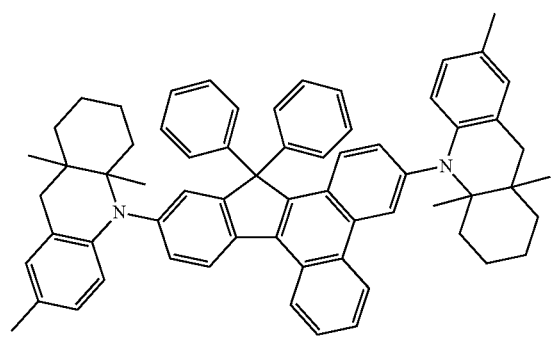

-continued
53
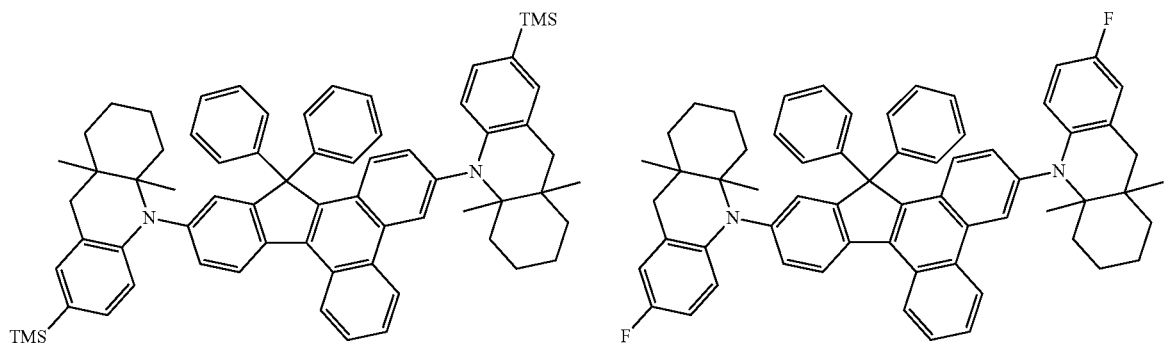
54
55
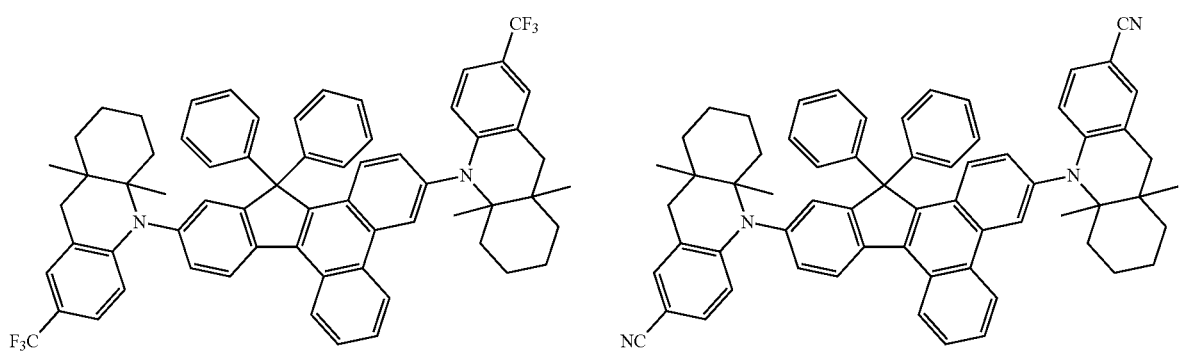
56
57
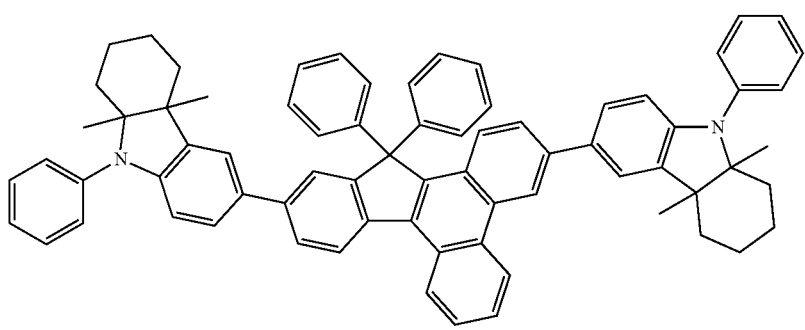
58
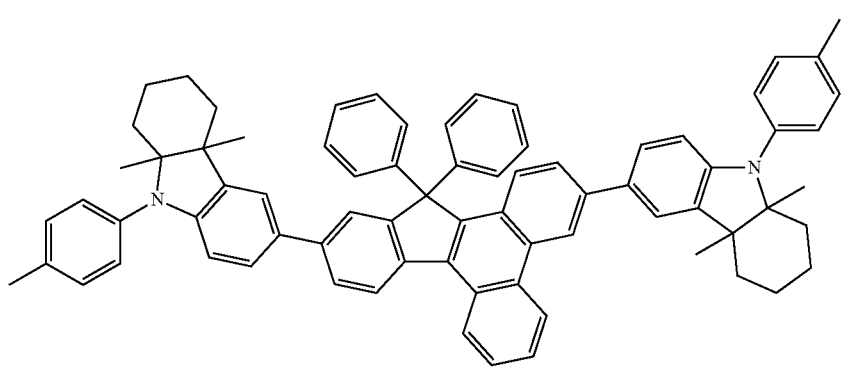

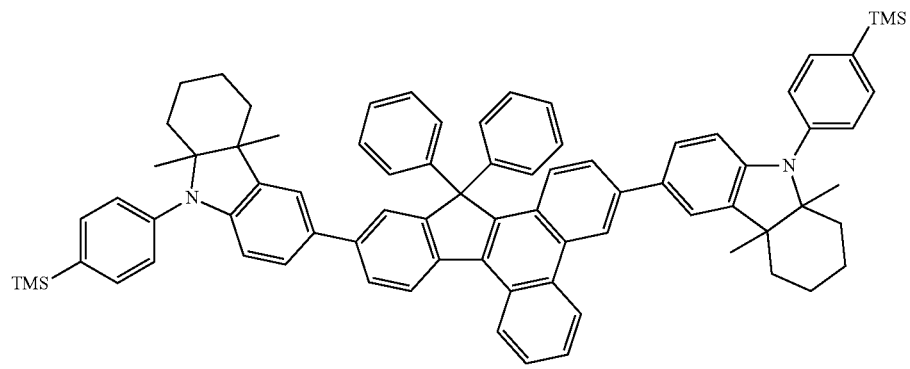
59
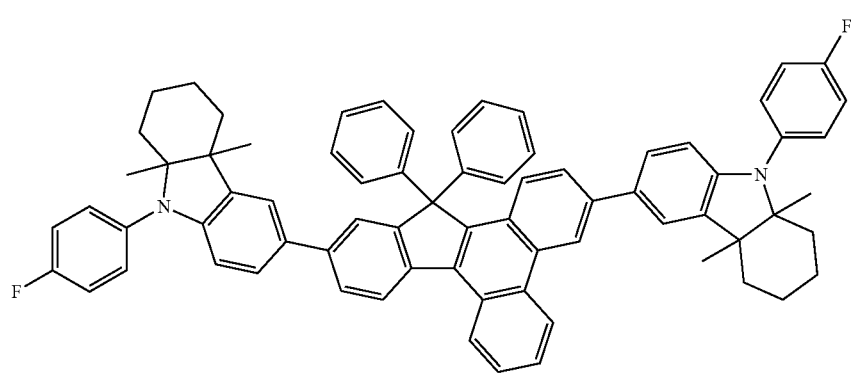
60
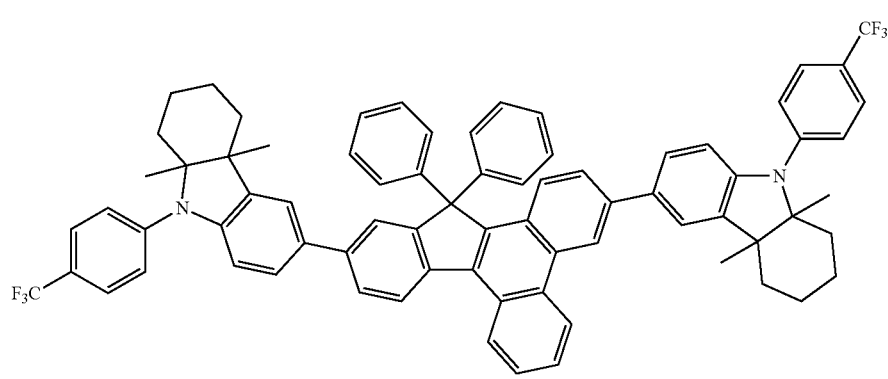
61
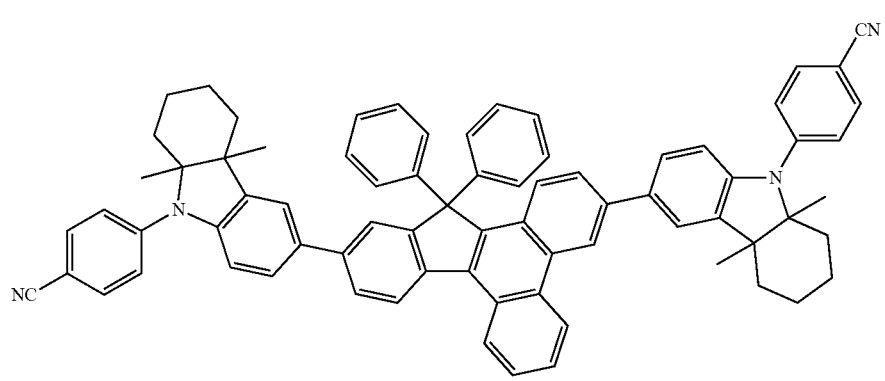
62

-continued
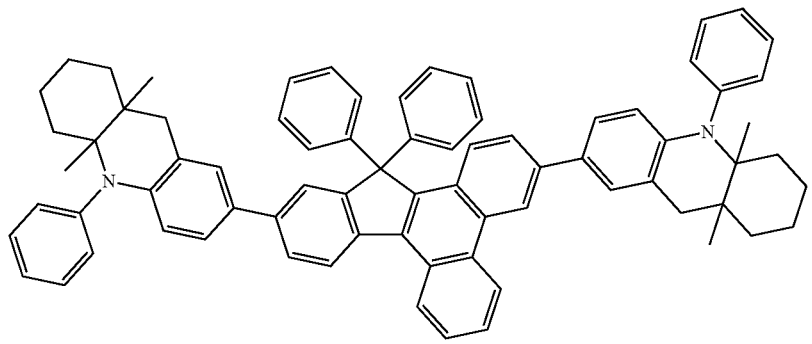
63
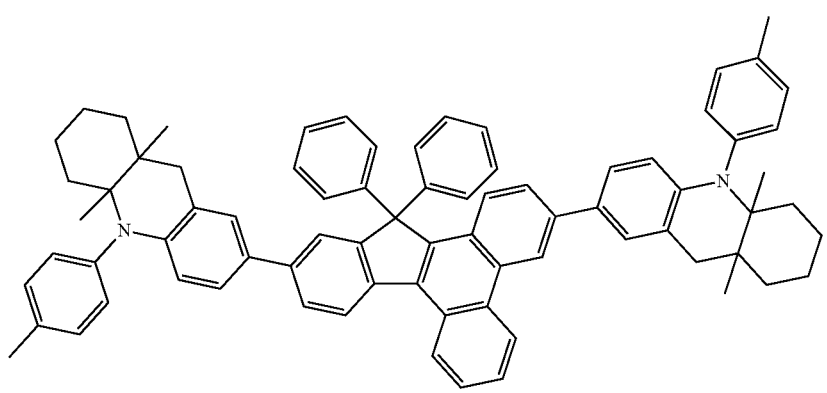
64
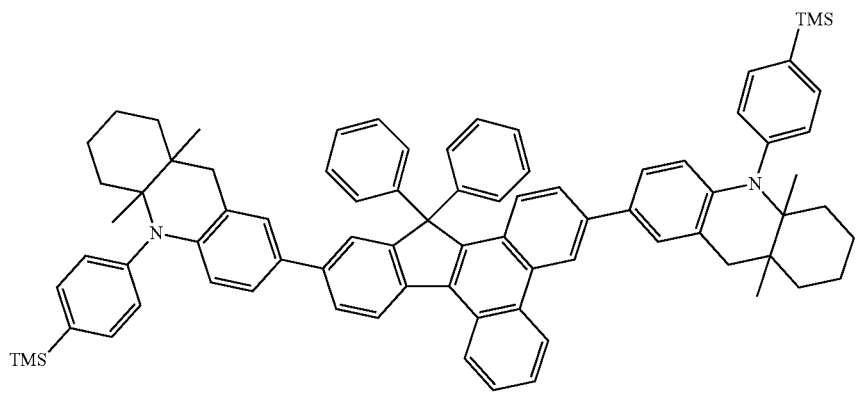
65
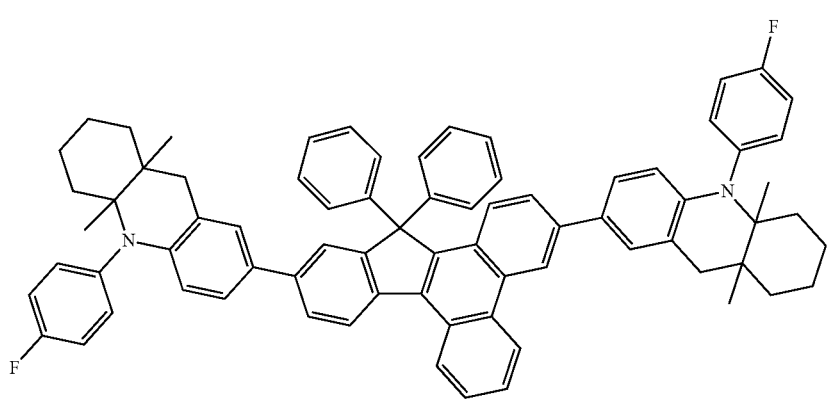
66

-continued

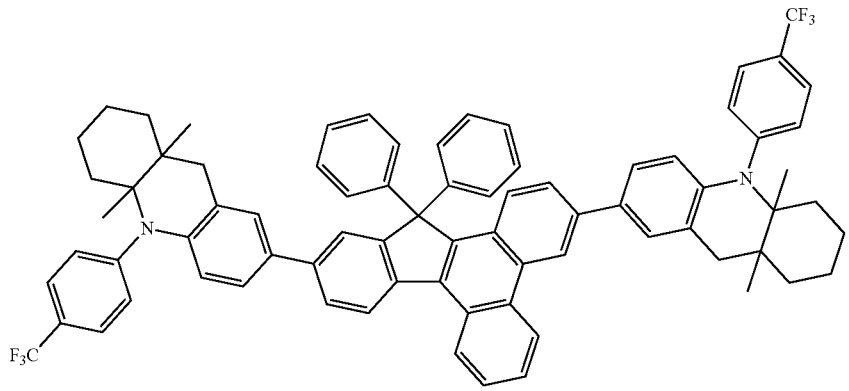

67

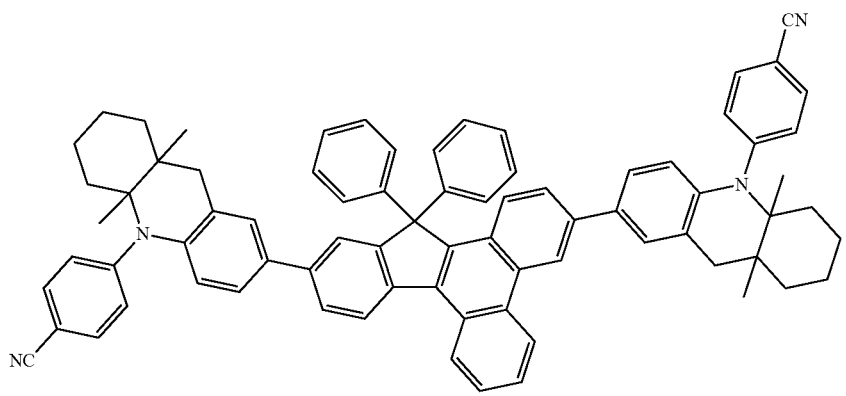

68

In an implementation, the EML may include one of Compounds 1 to 24, above, as the anthracene-based compound, and one of Compounds 25 to 68, above, as the condensed ring compound.

The anthracene-based compound represented by Formula 1 may include, as a substituent of Si, "a substituted or unsubstituted condensed ring group in which two or more rings are condensed." Accordingly, the anthracene-based compound may have a cascade structure, thereby providing high luminescence efficiency. Accordingly, when the anthracene-based compound represented by Formula 1 is used as a host in an EML of an organic light-emitting diode, a formed organic light-emitting diode may have high efficiency and long lifespan. Also, when the anthracene-based compound represented by Formula 1 is used as a host, and the condensed ring compound represented by Formula 20 is used as a dopant, due to high energy transition efficiency between these compounds, an organic light-emitting diode including an EML including the anthracene-based compound represented by Formula 1 and the condensed ring compound represented by Formula 20 may have high luminescent efficiency and lifespan characteristics.

When the organic light-emitting diode is a full color organic light-emitting diode, the EML may be patterned into a red EML, a green EML, and a blue EML. In an implementation, the EML may have a stack structure of two or more of a red EML, a green EML, and a blue EML to emit white light. In this regard, the blue EML may have a host and a dopant as described above.

At least one of the red EML and the green EML may include dopants illustrated below (ppy is an abbreviation of phenylpyridine).

For example, compounds illustrated below may be used as a red dopant. In an implementation, DCM or DCJTB may be used as the red dopant.

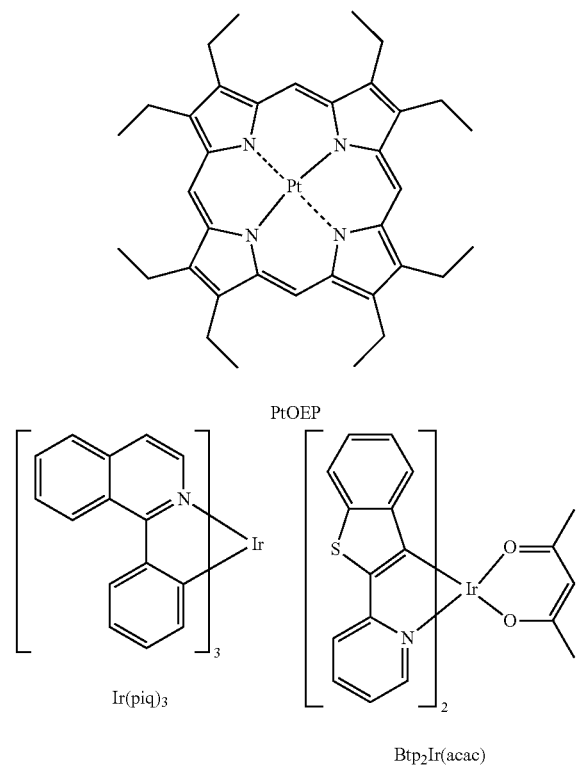

PtOEP

Ir(piq)₃

Btp₂Ir(acac)

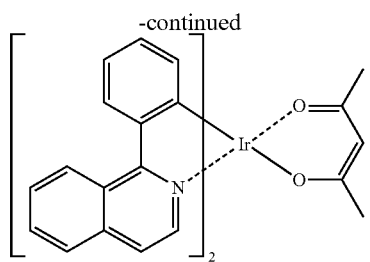
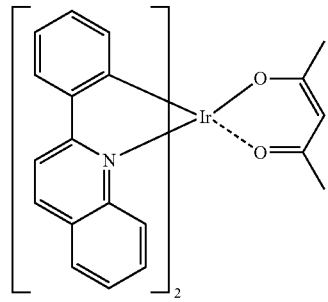
Ir(pq)₂(acac)
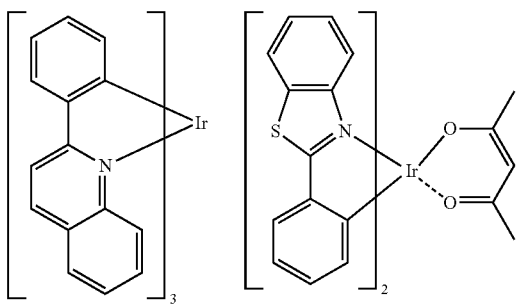
Ir(2-phq)₃    Ir(BT)₂(acac)
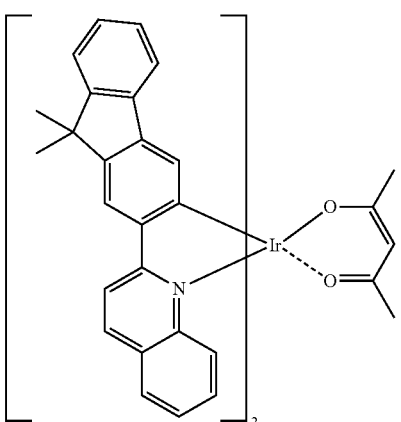
Ir(flq)₂(acac)
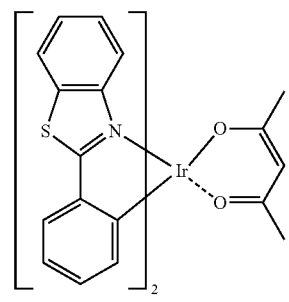
Ir(fliq)₂(acac)
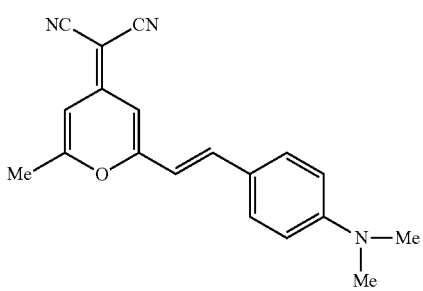
DCM
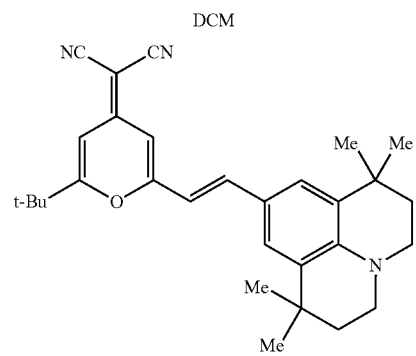
DCJTB
For example, compounds illustrated below may be used as a green dopant. In an implementation, C545T below may be used as a green dopant.
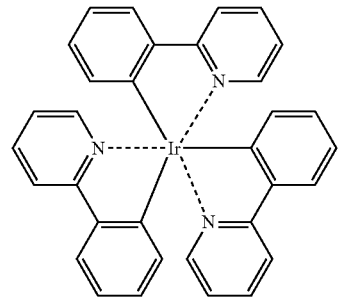
Ir(ppy)₃

-continued

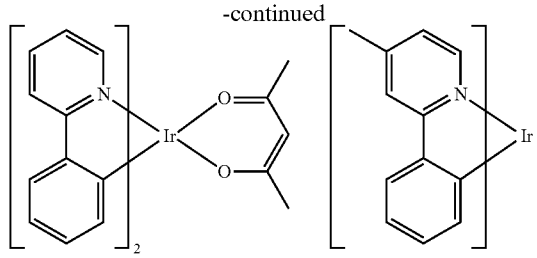

Ir(ppy)₂(acac)    Ir(mpyp)₃

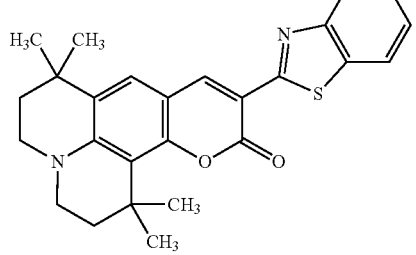

C545T

A thickness of the EML may be in a range of about 100 Å to about 1,000 Å, e.g., about 200 Å to about 600 Å. When the thickness of the EML is within these ranges, the EML may have improved luminescent ability without a substantial increase in driving voltage.

Next, an electron transport layer (ETL) may be formed on the EML using suitable methods, e.g., by vacuum deposition, spin coating, casting, or the like. When the ETL is formed using vacuum deposition or spin coating, the deposition and coating conditions may be similar to those for the formation of the HIL, though the conditions for deposition and coating may vary according to the material that is used to form the ETL. A material for an ETL may include suitable electron transporting materials that stably transport electrons injected from an electron injection electrode (cathode). Examples of the electron transporting material may include a quinoline derivative, such as tris(8-quinolinolate) aluminum (Alq₃), TAZ, Balq, beryllium bis(benzoquinolin-10-olate) (Bebq2), ADN, Compound 201, and Compound 202.

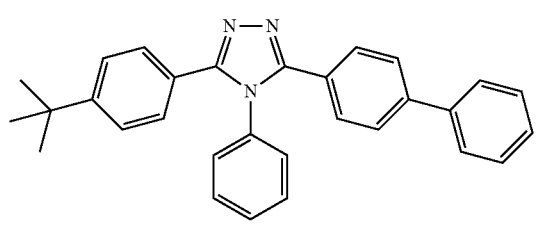

TAZ

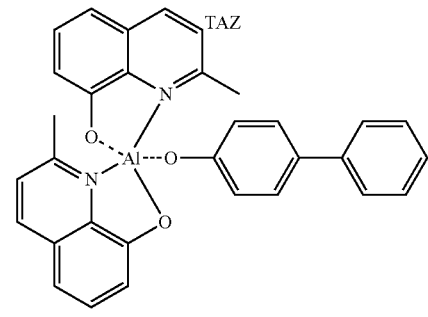

BAlq

-continued

<Compound 201>

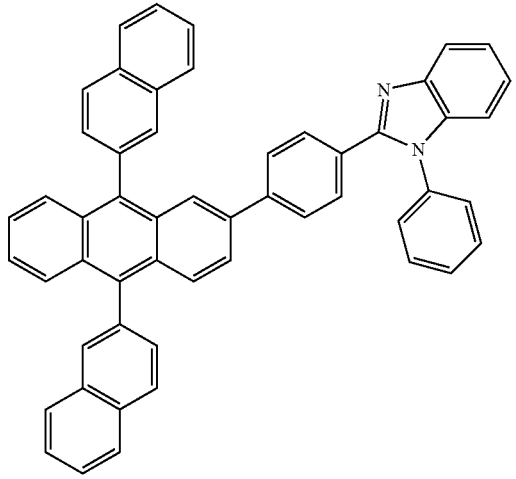

<Compound 202>

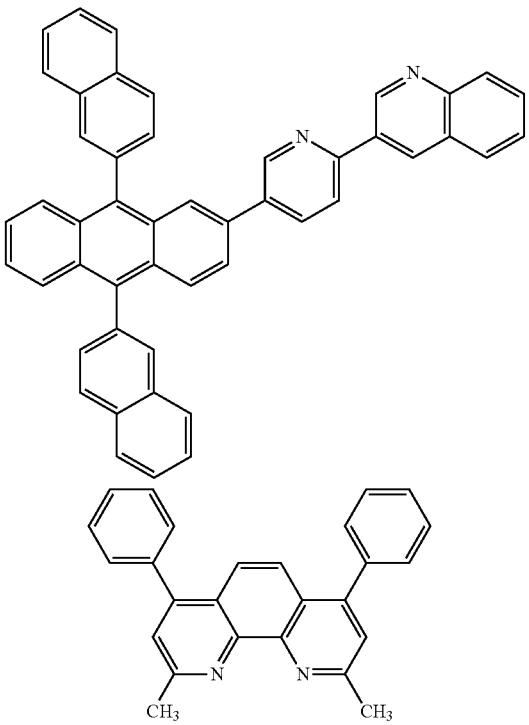

BCP

A thickness of the ETL may be in a range of about 100 Å to about 1,000 Å, e.g., about 150 Å to about 500 Å. When the thickness of the ETL is within these ranges, the ETL may have satisfactory electron transporting ability without a substantial increase in driving voltage.

The ETL may further include a metal-containing material, in addition to a suitable electron transporting inorganic material.

The metal-containing material may include a lithium (Li) complex. Non-limiting examples of the Li complex may include lithium quinolate (LiQ) and Compound 203, below.

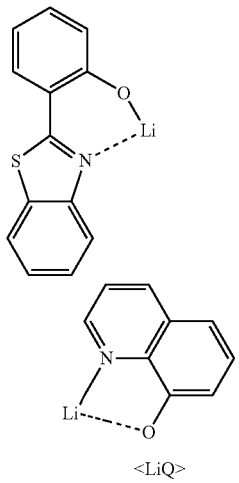

<Compound 203>

<LiQ>

Then, an electron injection layer (EIL), which may facilitate injection of electrons from the second electrode, may be formed on the ETL. A suitable electron injecting material may be used to form the EIL.

Non-limiting examples of materials for forming the EIL may include LiF, NaCl, a CsF, $Li_2O$, and BaO. The deposition conditions of the EIL may be similar to those used to form the HIL, although the deposition conditions may vary according to the material that is used to form the EIL.

A thickness of the EIL may be in a range of about 1 Å to about 100 Å, e.g., about 3 Å to about 90 Å. When the thickness of the EIL is within these ranges, the EIL may have satisfactory electron injection ability without a substantial increase in driving voltage.

The second electrode 17 may be disposed on the organic layer 15. The second electrode 17 may be a cathode, which is an electron injecting electrode. A material for forming the second electrode 17 may be a metal, an alloy, an electrically conductive compound, which have a low-work function, or a mixture thereof. In an implementation, the second electrode 17 may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type-transmission electrode. In an implementation, to manufacture a top-emission light-emitting diode, a transmissive electrode formed of indium tin oxide (ITO) or indium zinc oxide (IZO) may be used.

Hereinbefore, an organic light-emitting diode according to an embodiment is described with reference to FIG. 1. However, the organic light-emitting diode is not limited thereto.

In addition, when a phosphorescent dopant is used in the EML, a triplet exciton or a hole may diffuse to an ETL. To prevent the diffusion, a hole blocking layer (HBL) may be formed between the HTL and the EML or between the H-functional layer and the EML by vacuum deposition, spin coating, casting, LB deposition, or the like. When the HBL is formed by using vacuum deposition or spin coating, the deposition and coating conditions may be similar to those for the formation of the HIL, though the conditions for deposition and coating may vary according to the material that is used to form the HBL. A suitable hole blocking material may be used. Non-limiting examples of hole blocking materials may include oxadiazole derivatives, triazole derivatives, and phenanthroline derivatives. For example, BCP illustrated below may be used as the hole blocking material.

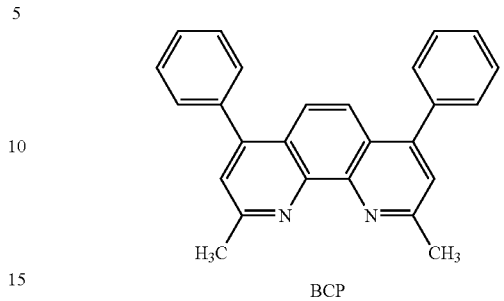

BCP

A thickness of the HBL may be in a range of about 20 Å to about 1,000 Å, e.g., about 30 Å to about 300 Å. When the thickness of the HBL is within these ranges, the HBL may have improved hole blocking ability without a substantial increase in driving voltage.

The unsubstituted $C_1$-$C_{60}$ alkyl group (or $C_1$-$C_{60}$ alkyl group) used herein refers to a linear or branched $C_1$-$C_{60}$ alkyl group, such as methyl, ethyl, propyl, isobutyl, sec-butyl, pentyl, iso-amyl, or hexyl, and the substituted $C_1$-$C_{60}$ alkyl group is prepared by substituting one or more hydrogen atoms of the unsubstituted $C_1$-$C_{60}$ alkyl group with a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_1$-$C_{60}$ fluoroalkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, —$N(Q_{11})(Q_{12})$, and —$Si(Q_{13})(Q_{14})(Q_{15})$ (wherein $Q_{11}$ to $Q_{15}$ are each independently selected from a hydrogen atom, a $C_1$-$C_{60}$ alkyl group, a $C_2$-$C_{60}$ alkenyl group, a $C_2$-$C_{60}$ alkynyl group, a $C_6$-$C_{60}$ aryl group, and a $C_2$-$C_{60}$ heteroaryl group).

$Q_{11a}$, $Q_{11b}$, and $Q_{11c}$ used herein may be each independently understood by referring to the description about $Q_{11}$; and $Q_{12a}$, $Q_{12b}$, and $Q_{12c}$ used herein may be each independently understood by referring to the description about $Q_{12}$; $Q_{13a}$, $Q_{13b}$, and $Q_{13c}$ used herein may be each independently understood by referring to the description about $Q_{13}$; $Q_{14a}$, $Q_{14b}$, and $Q_{14c}$ used herein may be each independently understood by referring to the description about $Q_{14}$; and $Q_{15a}$, $Q_{15b}$, and $Q_{15c}$ used herein may be each independently understood by referring to the description about $Q_{15}$.

The unsubstituted $C_1$-$C_{60}$ alkoxy group (or $C_1$-$C_{60}$ alkoxy group) used herein refers to a group represented by —OA (wherein A is the unsubstituted $C_1$-$C_{60}$ alkyl group described above), and detailed examples thereof are methoxy, ethoxy, and isopropyloxy, and one or more hydrogen atoms of these alkoxy groups may be substituted with the same substituents as described in connection with the substituted $C_1$-$C_{60}$ alkyl group.

The unsubstituted $C_2$-$C_{60}$ alkenyl group (or $C_2$-$C_{60}$ alkenyl group) used herein refers to an unsubstituted $C_2$-$C_{60}$ alkyl group having one or more carbon double bonds at a center or end thereof. Examples of the unsubstituted $C_2$-$C_{60}$ alkenyl group are ethenyl group, prophenyl group, and butenyl. One or more hydrogen atoms of these unsubstituted $C_2$-$C_{60}$ alkenyl groups may be substituted with the same substituents as described in connection with the substituted $C_1$-$C_{60}$ alkyl group.

The unsubstituted $C_2$-$C_{60}$ alkynyl group (or $C_2$-$C_{60}$ alkynyl group) used herein refers to an unsubstituted $C_2$-$C_{60}$ alkyl group having one or more carbon triple bonds at a center or end thereof. Examples of the unsubstituted $C_2$-$C_{60}$ alkynyl group are an ethynyl group, a propynyl group, and the like. One or more hydrogen atoms of these alkynyl groups may be substituted with the same substituents as described in connection with the substituted $C_1$-$C_{60}$ alkyl group.

The unsubstituted $C_6$-$C_{60}$ aryl group is a monovalent group having a carbocyclic aromatic system having 6 to 60 carbon atoms including at least one aromatic ring. The unsubstituted $C_6$-$C_{60}$ arylene group is a divalent group having a carbocyclic aromatic system having 6 to 60 carbon atoms including at least one aromatic ring. When the aryl group and or the arylene group have at least two rings, they may be fused to each other via a single bond. One or more hydrogen atoms of the aryl group and the arylene group may be substituted with the same substituents as described in connection with the substituted $C_1$-$C_{60}$ alkyl group.

Examples of the substituted or unsubstituted $C_6$-$C_{60}$ aryl group are a phenyl group, a $C_1$-$C_{10}$ alkylphenyl group (for example, an ethylphenyl group), a $C_1$-$C_{10}$ alkylbiphenyl group (for example, an ethylbiphenyl group), a halophenyl group (for example, an o-, m-, or p-fluorophenyl group, or a dichlorophenyl group), a dicyanophenyl group, a trifluoromethoxyphenyl group, o-, m-, and p-tolyl groups, o-, m- and p-cumenyl groups, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (for example, a fluoronaphthyl group), a $C_1$-$C_{10}$ alkylnaphthyl group (for example, a methylnaphthyl group), a $C_1$-$C_{10}$ alkoxynaphthyl group (for example, a methoxynaphthyl group), an anthracenyl group, an azrenyl group, an acenaphthylenyl group, a phenalenyl group, a fluorenyl group, an anthraquinolinyl group, a methylanthracenyl group, a phenanthracenyl group, a triphenylenyl group, a pyrenyl group, a chrysenyl group, an ethylchrysenyl group, a picenyl group, a perylenyl group, a chloroperylenyl group, a pentaphenyl group, a pentasenyl group, a tetraphenylenyl group, a hexaphenyl group, a hexacenyl group, a rubicenyl group, a coroneryl group, a trinaphthylenyl group, a heptaphenyl group, a heptacenyl group, a piranthrenyl group, an obarenyl group, and a spiro-fluorenyl group, and examples of the substituted $C_6$-$C_{60}$ aryl group may be easily understood by referring to the examples of the unsubstituted $C_6$-$C_{60}$ aryl group and the substituents of the substituted $C_1$-$C_{60}$ alkyl group. Examples of the substituted or unsubstituted $C_6$-$C_{60}$ arylene group may be easily understood by referring to examples of the substituted or unsubstituted $C_6$-$C_{60}$ aryl group.

The unsubstituted $C_2$-$C_{60}$ heteroaryl group used herein refers to a monovalent group having a system composed of one or more aromatic rings having at least one heteroatom selected from nitrogen (N), oxygen (O), phosphorous (P), sulfur (S), and Si and carbon atoms as the remaining ring atoms. The unsubstituted $C_2$-$C_{60}$ heteroarylene group used herein refers to a divalent group having a system composed of one or more aromatic rings having at least one heteroatom selected from nitrogen (N), oxygen (O), phosphorous (P), sulfur (S) and Si and carbon atoms as the remaining ring atoms. In this regard, when the heteroaryl group and the heteroarylene group each include two or more rings, the rings may be fused to each other. One or more hydrogen atoms of the heteroaryl group and the heteroarylene group may be substituted with the same substituents as described in connection with the substituted $C_1$-$C_{60}$ alkyl group.

Examples of the unsubstituted $C_2$-$C_{60}$ heteroaryl group are a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, an imidazopyrimidinyl group, a furanyl group, a thiophenyl group, a benzofuranyl group, a benzothiophenyl group, a dibenzofuranyl group, and a dibenzothiophenyl group. Examples of the unsubstituted $C_2$-$C_{60}$ heteroarylene group may be easily understood by referring to examples of the substituted or unsubstituted $C_2$-$C_{60}$ arylene group.

The substituted or unsubstituted $C_6$-$C_{60}$ aryloxy group refers to —$OA_2$ (wherein $A_2$ is the substituted or unsubstituted $C_6$-$C_{60}$ aryl group), and the substituted or unsubstituted $C_6$-$C_{60}$ arylthio group refers to —$SA_3$ (wherein $A_3$ is the substituted or unsubstituted $C_6$-$C_{60}$ aryl group).

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Synthesis Example 1

Synthesis of Complex 2

<Synthesis of Compound 2-1>

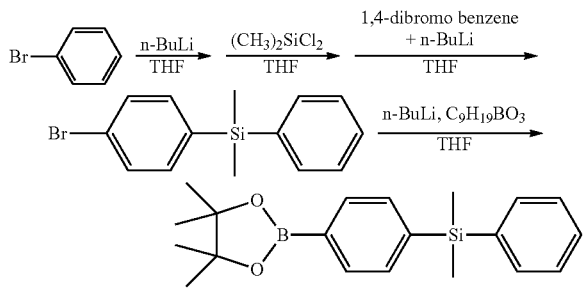

Compound 2-1

1-bromobenzene (12 g, 58.25 mmol) was dissolved in THF (200 ml) in a nitrogen atmosphere in a 500 ml 3-neck round flask (flask 1). Then, at a temperature of −78° C., 2.5 M n-BuLi (23.65 ml, 58.25 mmol) was slowly dropped thereto, and then, the mixture was stirred while the temperature was maintained constant for 20 minutes. At a temperature of −80° C. or lower, dimethyldichlorosilane (6.93 g, 54.17 mmol) was very slowly dropped thereto, and then, the temperature was raised and the resultant mixture was stirred at a temperature of −10° C. or lower for 2 hours. Separately, in a nitrogen atmosphere, 1,4-dibromobenzene (18.97 g, 80.39 mmol) was dissolved in THF(200 ml) in a 250 mL 3-neck flask (flask 2), and then, at a temperature of −78° C., n-BuLi (32.63 ml, 80.39 mmol) was slowly dropped thereto and the mixture was stirred while the temperature was maintained for 20 minutes. The reaction products of the flask 1 and the flask 2 were maintained at a temperature of −78° C., and a syringe was filled with the reaction product in the flask 2. Then the reaction product was dropped into the flask 1, and then, the resultant mixture was stirred for 12 hours, followed by termination of the reaction with water. Then an extraction was performed thereon with chloroform, and after silica-gel coating, column chromatography was performed with hexane and recrystallization was performed thereon with hexane to obtain (4-bromo-phenyl)-dimethyl-phenyl-1-yl-silane. (4-bromo-phenyl)-dimethyl-phenyl-1-yl-silane and THF (250 ml) were added to a 500 ml 3 neck-flask. Then, at a temperature of −78° C., 2.5 M n-BuLi (14.21 ml, 35 mmol) was slowly dropped thereto and then the mixture was stirred while the temperature was maintained constant for 40 minutes. Then, at a temperature of −78° C. or lower, 2-isopropoxy-4,4,5,5-tetramethyl-1,3,2-dioxabororane (6.55 g, 35 mmol) was slowly added thereto and the resultant mixture was stirred for 30 minutes, and then, the temperature was slowly raised and then the result was stirred for 12 hours, followed by termination of the reaction with 10% HCl and an extraction process with ethyl acetate. The extracted organic layer was subjected to a silica gel column chromatography using hexane and recrystallized with ethyl acetate and hexane, thereby obtaining Compound 2-1 (white solid, 3.94 g, 12.65 mmol, yield: 20%).

1H NMR (300 MHz, CDCl3) δ: 7.85 (2H), 7.55 (1H), 7.46 (4H), 7.37 (2H), 1.24 (12H), 0.66 (6H)

<Synthesis of Compound 2-2>

Compound 2-2

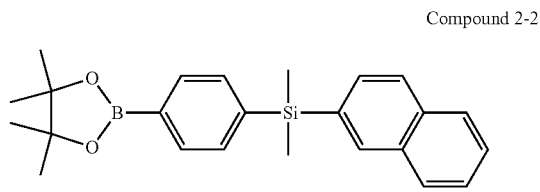 [SMILES: CC1(C)OB(c2ccc([Si](C)(C)c3ccc4ccccc4c3)cc2)OC1(C)C]

Compound 2-2 (white solid, yield: 22%) was synthesized in the same manner as used to synthesize Compound 2-1, except that 2-bromonaphthalene was used instead of 1-bromobenzene.

1H NMR (300 MHz, CDCl3) δ: 8.10 (1H), 8.00 (2H), 7.95 (1H), 7.85 (2H), 7.60 (1H), 7.59 (2H), 7.46 (2H), 1.24 (12H), 0.66 (6H)

<Synthesis of Compound 2>

<Reaction Scheme 2>

Compound 2-1 + Compound 2-2 $\xrightarrow[\text{Toluene/THF}]{\text{9,10-dibromo anthracene} + \text{2M NaOH, Pd(Ph}_3)_4}$

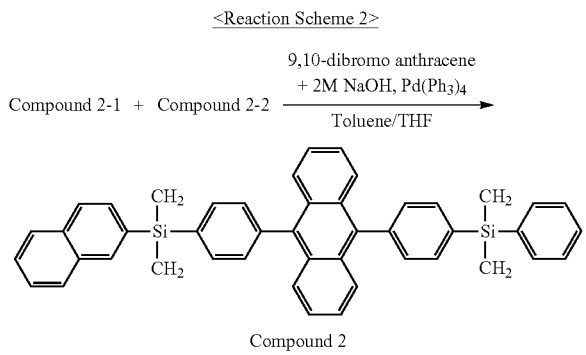

Compound 2

In a 250 ml 3 neck-flask, Compound 2-1 (5 g, 14.79 mmol), Compound 2-2 (5.74 g, 14.79 mmol), and 9,10-dibromoanthracene (4.28 g, 12.86 mmol) were added to 300 ml of toluene, and then 100 ml of 2M NaOH (100 ml) was added thereto to perform a nitrogen substitution process for 30 minutes. A catalyst amount of tetrakis(triphenylphosphine) palladium (0) was added thereto, and then, the mixture was reacted at a temperature of 100° C. for 36 hours. The reaction was terminated with HCl, and then, the reaction product was filtered and washed several times with acetone and dried. A product obtained therefrom was subjected to a Soxhlet extraction with toluene to obtain Compound 2 (white solid, 4.10 g, 6.36 mmol, and yield: 43%).

1H NMR (300 MHz, CDCl3) δ: 8.10 (1H), 8.00 (2H), 7.95 (1H), 7.91 (4H), 7.89 (4H), 7.60 (1H), 7.59 (2H), 7.55 (1H), 7.52 (4H), 7.46 (2H), 7.39 (4H), 7.37 (2H), 0.66 (12H).

HRMS (FAB): calcd for C46H36Si2: 644.24. found: 644.95.

Synthesis Example 2

Synthesis of Compound 6

<Synthesis of Compound 6-1>

Compound 6-1

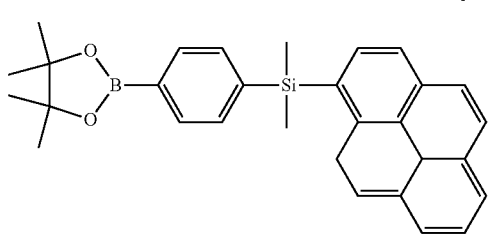

Compound 6-1 (white solid, yield: 20%) was synthesized in the same manner as used to synthesize Compound 2-1, except that 6-bromopyrene was used instead of 1-bromobenzene.

1H NMR (300 MHz, CDCl3) δ: 7.91 (1H), 7.85 (1H), 7.81 (1H), 7.46 (2H), 7.17 (1H), 7.10 (1H), 6.58 (1H), 6.44 (1H), 6.19 (1H), 6.00 (1H), 1.24 (12H), 0.66 (6H).

Compound 13-1 (white solid, yield: 18%) was synthesized in the same manner as used to synthesize Compound 2-1, except that 2-bromo-(9,9'-dimethyl)fluorene was used instead of 1-bromobenzene. 18%).

1H NMR (300 MHz, CDCl3) δ: 7.97 (1H), 7.87 (1H), 7.85 (2H), 7.83 (1H), 7.66 (1H), 7.55 (1H), 7.46 (2H), 7.38 (1H), 7.28 (1H), 1.72 (6H), 1.24 (12H), 0.66 (6H).

<Synthesis of Compound 13>

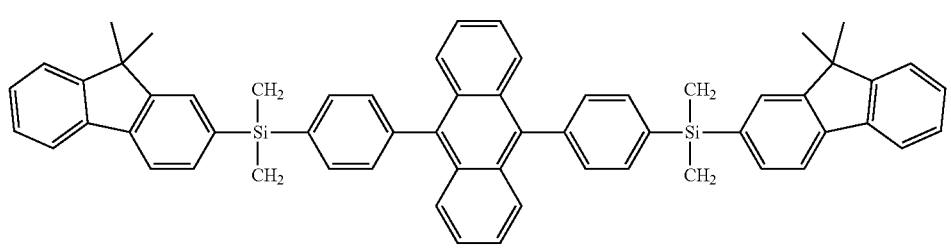

Compound 13

<Synthesis of Compound 6>

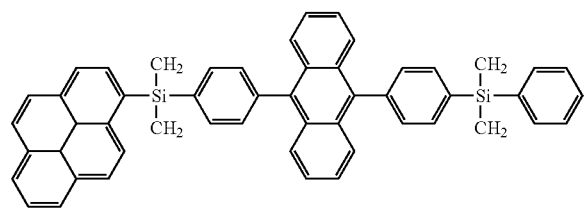

Compound 6

Compound 6 was synthesized in the same manner as used to synthesize Compound 2, except that Compound 6-1 was used instead of Compound 2-2 (yield: 41%)

1H NMR (300 MHz, CDCl3) δ: 7.98 (9H), 7.91 (4H), 7.89 (2H), 7.79 (2H), 7.55 (1H), 7.52 (2H), 7.46 (2H), 7.39 (4H), 7.37 (2H), 7.24 (2H), 4.82 (2H), 0.66 (12H).

HRMS (FAB): calcd for C$_{52}$H$_{40}$Si$_2$: 720.27. found: 721.04.

Synthesis Example 3

Synthesis of Compound 13

<Synthesis of Compound 13-1>

Compound 13-1

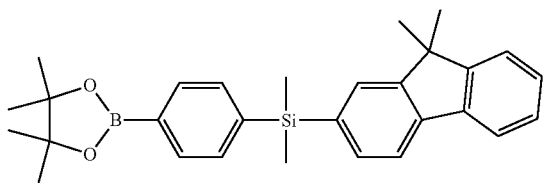

Compound 13 (yield: 38%) was synthesized in the same manner as used to synthesize Compound 2, except that Compound 6-1 was used instead of Compound 2-1 and Compound 2-2

1H NMR (300 MHz, CDCl3) δ: 7.97 (2H), 7.91 (4H), 7.89 (4H), 7.87 (2H), 7.83 (2H), 7.66 (2H), 7.55 (2H), 7.52 (4H), 7.39 (4H), 7.38 (2H), 7.28 (2H), 1.72 (12H), 0.66 (12H).

HRMS (FAB): calcd for C$_{60}$H$_{50}$Si$_2$: 826.35. found: 827.21.

Synthesis Example 4

Synthesis of Compound 19

<Synthesis of Compound 19-1>

Compound 19-1

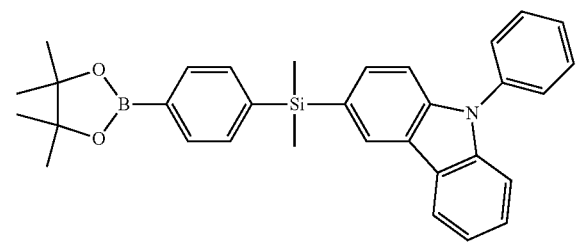

Compound 19-1 (white solid, yield: 20%) was synthesized in the same manner as used to synthesize Compound 2-1, except that 3-bromo-(9-phenyl)carbazol was used instead of 1-bromobenzene.

1H NMR (300 MHz, CDCl3) δ: 8.55 (1H), 7.94 (1H), 7.85 (2H), 7.83 (1H), 7.73 (1H), 7.58 (2H), 7.50 (2H), 7.46 (2H), 7.45 (1H), 7.36 (1H), 7.33 (1H), 7.25 (1H), 1.24 (12H), 0.66 (6H).

<Synthesis of Compound 19>
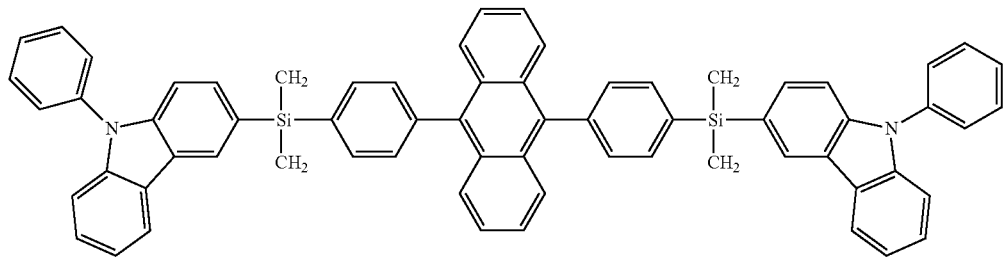
Compound 19
Compound 19 (yield: 39%) was synthesized in the same manner as used to synthesize Compound 2, except that Compound 6-1 was used instead of Compound 2-1 and Compound 2-2
1H NMR (300 MHz, CDCl3) δ: 8.55 (2H), 7.94 (2H), 7.91 (4H), 7.89 (4H), 7.83 (2H), 7.73 (2H), 7.58 (4H), 7.52 (4H), 7.50 (4H), 7.45 (2H), 7.39 (4H), 7.36 (2H), 7.33 (2H), 7.25 (2H), 0.66 (12H).
HRMS (FAB): calcd for $C_{66}H_{48}N_2Si_2$: 924.34. found: 925.27.
Synthesis Example 5
Synthesis of Compound 21
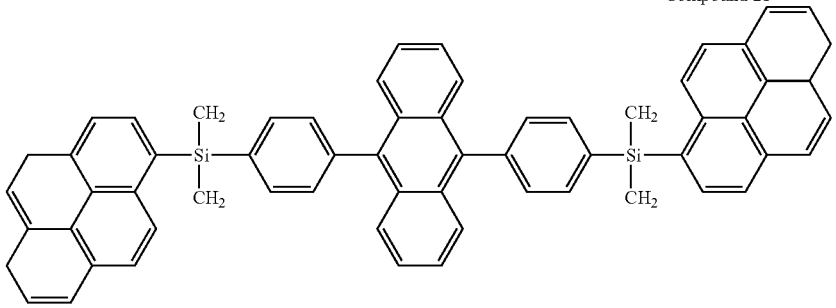
Compound 21

Compound 21 (yield: 42%) was synthesized in the same manner as used to synthesize Compound 2, except that Compound 6-1 was used instead of Compound 2-1 and Compound 2-2

1H NMR (300 MHz, CDCl3) δ: 8.37 (4H), 8.24 (6H), 8.12 (6H), 8.03 (2H), 7.81 (4H), 7.72 (4H), 7.46 (4H), 7.33 (4H), 0.98 (12H)

HRMS (FAB): calcd for C62H46Si2: 846.31. found: 847.20.

Synthesis Example 6

Synthesis of Compound 24

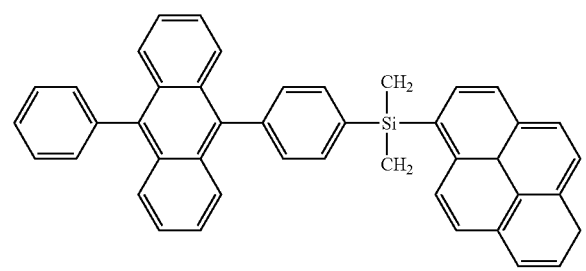

Compound 24

Compound 24 (yield: 47%) was synthesized in the same manner as used to synthesize Compound 2, except that 10-bromo-9-phenylanthracene was used instead of 9,10-dibromo anthracene, Compound 6-1 was used instead of Compound 2-1, and Compound 2-2 was not used.

1H NMR (300 MHz, CDCl3) δ: 7.98 (6H), 7.91 (4H), 7.79 (2H), 7.39 (4H), 7.24 (2H), 5.34 (1H), 3.22 (2H), 2.05 (6H), 0.66 (6H).

HRMS (FAB): calcd for $C_{44}H_{32}Si$: 588.23. found: 588.81.

Synthesis Example 7

Synthesis of Compound 47

<Synthesis of Compound 47-1>

[Reaction Scheme 47-1]

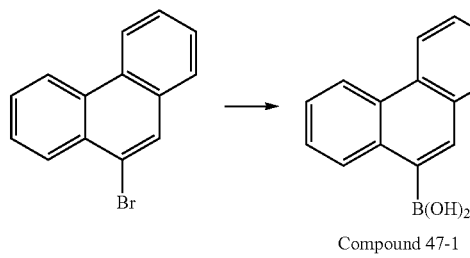

Compound 47-1

50 g (194 mmol) of 9-bromo phenanthrene was added to a round-bottom flask containing 500 ml of tetrahydrofurane, and then, in a nitrogen atmosphere, the temperature was adjusted to be −78° C. After 30 minutes, 146 ml (233 mmol) of normal butyl lithium was slowly dropped thereto, and after one hour, 28.3 g (274 mmol) of trimethylborate was slowly dropped thereto and the temperature was raised to room temperature. At room temperature, the mixture was stirred for about 12 hours, and then, 2N (normal) hydrochloric acid aqueous solution was dropped into the reaction solution until the reaction solution turned into an acid, followed by extraction. Then, the obtained organic layer was subjected to distillation under reduced pressure. Recrystallization was performed thereon with normal hexane, and then, the product was recrystallized and filtered and dried, and thus, white solid Compound 47-1 (35 g, 157.14 mmol, yield 81%) was obtained.

<Synthesis of Compound 47-2>

[Reaction Scheme 47-2]

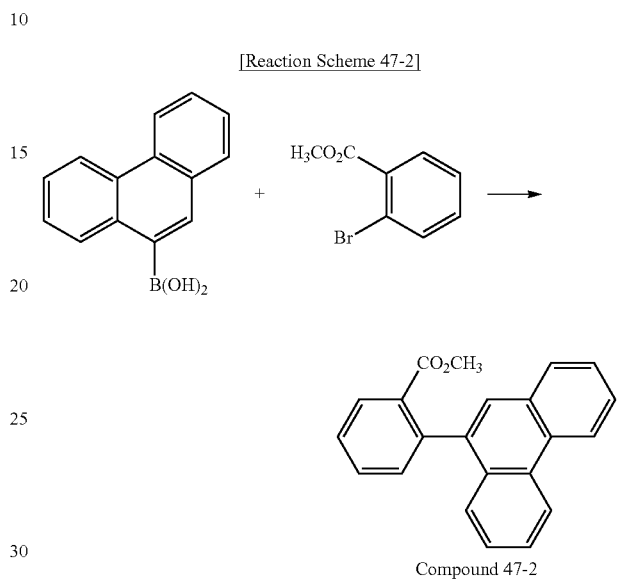

Compound 47-2

24 g (112 mmol) of methyl 2-bromobenzoate, 34.7 g (156 mmol) of Compound 47-1, 2.6 g (2 mmol) of tetrakis (triphenylphosphine)palladium {Pd(PPh3)4}, 30.9 g (223 mmol) of potassium carbonate, 50 ml of water, 125 ml of toluene, and 125 ml of tetrahydrofuran were added to a round-bottom flask and then, the mixture was refluxed for 12 hours. After the reaction was terminated, the reaction product was divided into two layers, the obtained organic layer was condensed under reduced pressure, was subjected to column chromatography, and dried, thereby obtaining white solid Compound 47-2 (25 g, 112.32 mmol, yield 72%).

<Synthesis of Compound 47-3>

[Reaction Scheme 47-3]

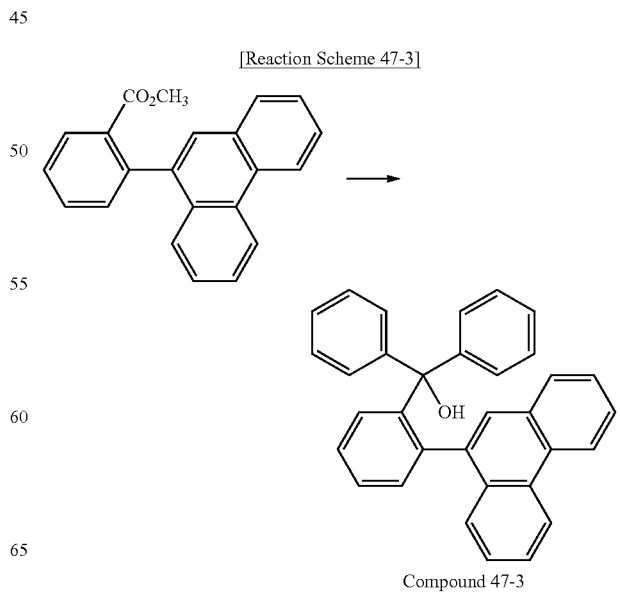

Compound 47-3

25 g (80 mmol) of Compound 47-2 was added to a round-bottom flask containing 250 ml of tetrahydrofuran, and then, in a nitrogen atmosphere, the temperature was decreased to −78° C. After 30 minutes, the temperature was raised to room temperature while 150 ml (240 mmol) of 1.6 M phenyl lithium was slowly dropped thereto. After mixing for about 2 hours at room temperature, an ammonium chloride aqueous solution was dropped thereto, an extraction process was performed thereon, and the obtained organic layer was subjected to distillation under reduced pressure. After re-crystallization with normal hexane, the obtained product was filtered and dried to obtain white solid Compound 47-3 (29 g, 66.4 mmol, and yield 83%).

<Synthesis of Compound 47-4>

[Reaction Scheme 47-4]

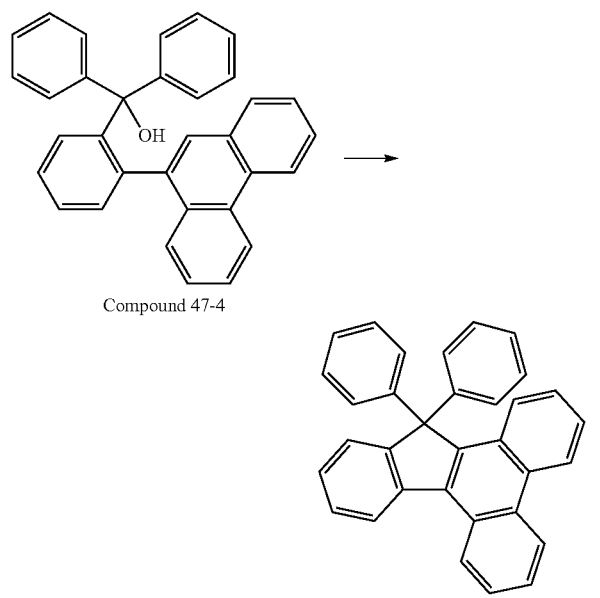

Compound 47-4

29 g (66 mmol) of Intermediate compound 47-3 was added to a round-bottom flask containing 290 ml of an acetic acid. Thereafter, the temperature was raised to 80° C., and then, one or two drops of a hydrochloric acid aqueous solution was added thereto and the mixture was refluxed, and the temperature was adjusted to room temperature. A solid generated therefrom was dried to produce white solid Compound 47-4 (27 g, 61.38 mmol, and yield 93%).

Synthesis of Compound 47-5

[Reaction Scheme 47-5]

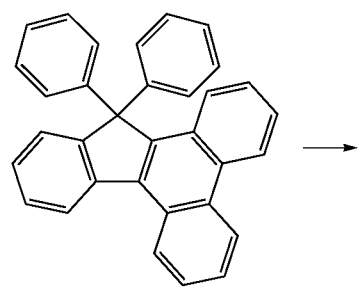

-continued

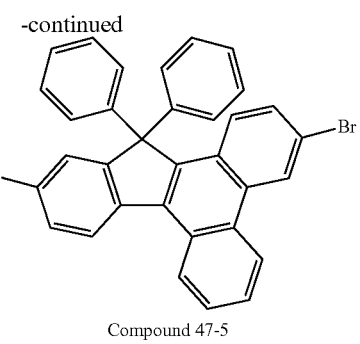

Compound 47-5

27 g (65 mmol) of Intermediate compound 47-4 was added to a round-bottom flask containing 216 ml of chloroform, and then the mixture was stirred. 28.9 g (181 mmol) of bromine was diluted with 54 ml of chloroform and then, the dilution was slowly dropped thereto, and the resultant mixture was stirred for 48 hours at room temperature. A solid generated therefrom was dried to produce white solid Compound 47-5 (27 g, 60.45 mmol, and yield 93%).

<Synthesis of Compound 47-6>

[Reaction Scheme 47-6]

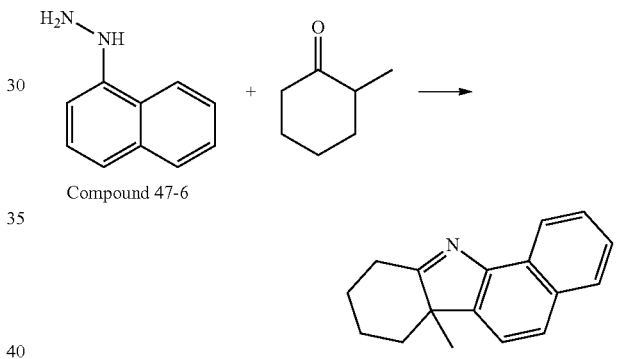

Compound 47-6

50 g (316.30 mmol) of 1-naphthylhydrazine and 170 ml of an acetic acid were heated to a temperature of 60° C. in a 500 ml round-bottom flask. 35.45 g (316.30 mmol) of 2-methylcyclohexanone was dropped into the heated flask. When the dropping was finished, the mixture was refluxed for 8 hours. When the reaction was finished, 100 ml of water was added thereto and a sodium hydroxide was added thereto to turn the resultant reaction solution into a base. An extraction process was performed thereon with water and ethyl acetate, and an organic layer was treated with magnesium sulfate to be condensed under reduced pressure. Then, the obtained product was subjected to column chromatograph by using hexane and ethyl acetate as a development solvent, thereby obtaining Compound 47-6 (62.47 g, 265.69 mmol, and yield 84%).

<Synthesis of Compound 47-7>

[Reaction Scheme 47-7]

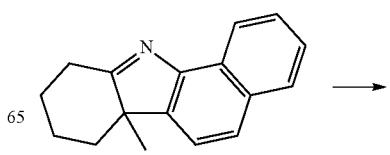

-continued

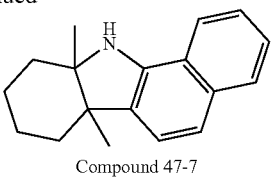

Compound 47-7

50 g (212.64 mmol) of Compound 47-6 was dissolved in 570 ml of toluene in a 2 L round-bottom flask in a nitrogen atmosphere, and the temperature was decreased to −10° C. 202 ml (318.96 mmol) of 1.6M methyl lithium was slowly dropped into the resultant solution, and the reaction was performed at a temperature of −10° C. for 3 hours. When the reaction was finished, water was slowly added thereto until reactivity completely disappeared. An extraction process was performed thereon with water and ethyl acetate, and an organic layer was treated with magnesium sulfate to be condensed under reduced pressure. The resultant product was subjected to column chromatography by using hexane and ethyl acetate as a development solvent, thereby obtaining Compound 47-7 (40.59 g, 161.61 mmol, and yield 76%).

<Synthesis of Compound 47>

<Reaction Scheme 47>

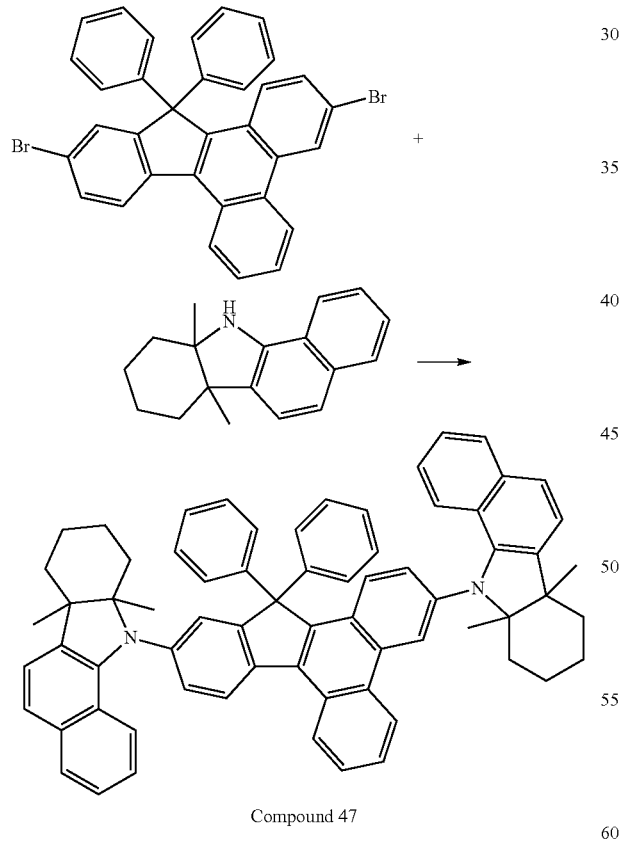

Compound 47

10 g (17.42 mmol) of Compound 47-5, 11.60 g (46.17 mmol) of Compound 47-7, 0.2 g (0.7 mmol) of palladium acetate {Pd(OAc)$_2$}, 6.87 g (70.73 mmol) of sodium tertiary butoxide, 0.14 g (0.70 mmol) of tri tertiary-butylphosphine, and 100 ml of toluene were added to a round-bottom flask, and then, the reaction was performed at a temperature of 100° C. for 2 hours. When the reaction was finished, a filtrate obtained by filtering was condensed and then subjected to column chromatography. The obtained product was re-crystallized with toluene and methanol to produce a solid, and the obtained solid was filtered and dried to obtain Compound 47 (6.39 g, 6.97 mmol, and yield 40%).

MS: m/z 916 [M]$^+$ $^1$H NMR (CDCl$_3$) δ 8.93 (1H), 8.12 (1H), 8.10 (1H), 8.04 (2H), 8.03 (2H), 7.90 (1H), 7.88 (1H), 7.87 (1H), 7.82 (1H), 7.53 (2H), 7.51 (2H), 7.49 (2H), 7.33 (4H), 7.26 (2H), 7.11 (4H), 6.99 (1H), 6.91 (2H), 6.78 (1H), 6.61 (1H), 2.00 (4H), 1.72 (4H), 1.53 (8H), 1.51 (6H), 1.50 (6H)

Synthesis Example 8

Synthesis of Compound 57

<Synthesis of Compound 57-1>

[Reaction Scheme 57-1]

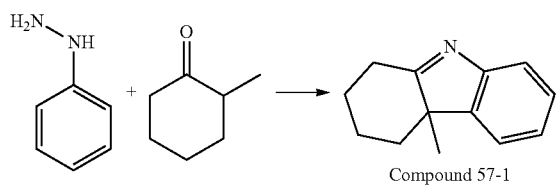

Compound 57-1

50 g (462 mmol) of phenylhydrazine and 170 ml of an acetic acid were heated to a temperature of 60° C. in a 500 ml round-bottom flask. 51.9 g (462 mmol) of 2-methylcyclohexanone was dropped into the heated flask. When the dropping was finished, the mixture was refluxed for 8 hours. When the reaction was finished, 100 ml of water was added thereto and a sodium hydroxide was added thereto to turn the resultant reaction solution into a base. An extraction process was performed thereon with water and ethyl acetate, and an organic layer was treated with magnesium sulfate to be condensed under reduced pressure. Then, the obtained product was subjected to column chromatograph by using hexane and ethyl acetate as a development solvent, thereby obtaining Compound 57-1 (72 g, 388.08 mmol, and yield 84%).

<Synthesis of Compound 57-2>

[Reaction Scheme 57-2]

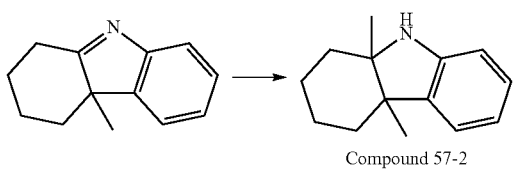

Compound 57-2

57 g (308 mmol) of Compound 57-1 was dissolved in 570 ml of toluene in a 2 L round-bottom flask in a nitrogen atmosphere, and the temperature was decreased to −10° C. 300 ml (474 mmol) of 1.6 M methyl lithium was slowly dropped into the resultant solution, and the reaction was performed at a temperature of −10° C. for 3 hours. When the reaction was finished, water was slowly added thereto until reactivity completely disappeared. An extraction process was performed thereon with water and ethyl acetate, and an organic layer was treated with magnesium sulfate to be condensed under reduced pressure. The resultant product was subjected to column chromatography by using hexane and ethyl acetate as a development solvent, thereby obtaining Compound 57-2 (47 g, 234.08 mmol, and yield 76%).

<Synthesis of Compound 57-3>

[Reaction Scheme 57-3]

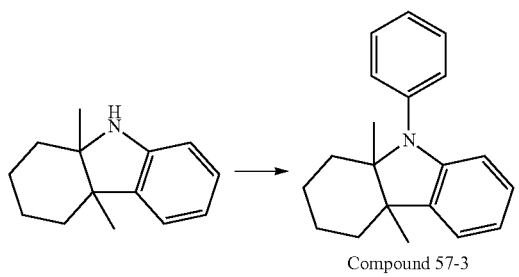

Compound 57-3

40 g (199 mmol) of Compound 57-2, 48.6 g (238 mmol) of iodobenzene, 0.89 g (4 mmol) of tris(dibenzylideneacetone)dipalladium(0), 2.47 g (4 mmol) of 2,2-bis(diphenylphosphino)-1,1'-binaphthyl, 38.19 g (397 mmol) of sodium tertiary-butoxide, and 400 ml of toluene were added to a 1 L round-bottom flask and then, the mixture was refluxed for 8 hours. When the reaction was finished, the reaction product was filtered through Eelite and then condensed under reduced pressure, followed by column chromatography performed using hexane as a development solvent, thereby obtaining Compound 57-3 (44 g, 157.21 mmol, and yield 79%).

<Synthesis of Compound 57-4>

[Reaction Scheme 57-4]

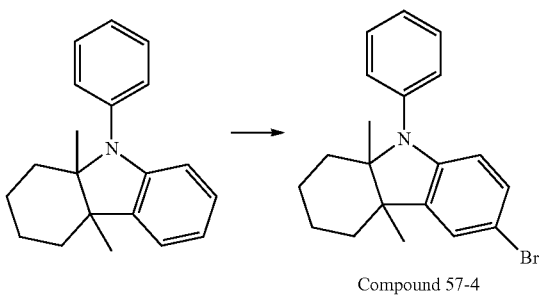

Compound 57-4

44 g (158 mmol) of Compound 57-3 and 130 ml of dimethylformamide were added to a 500 ml round-bottom flask, and the temperature was decreased to −10° C. 25.2 g (142 mmol) of N-bromosuccinimide was dissolved in 220 ml of dimethylformamide and then the mixture was slowly dropped thereto. When the dropping was finished, the temperature was raised to room temperature and then the mixture was stirred for 2 hours. When the reaction was finished, an extraction was performed with water and dichloromethane, and an organic layer was treated with magnesium sulfate to be condensed under reduced pressure. Hexane was poured thereto to filter the produced crystal. As a result, Compound 57-4 (45 g, 126.4 mol, and yield 80%) was obtained.

<Synthesis of Compound 57-5>

[Reaction Scheme 57-5]

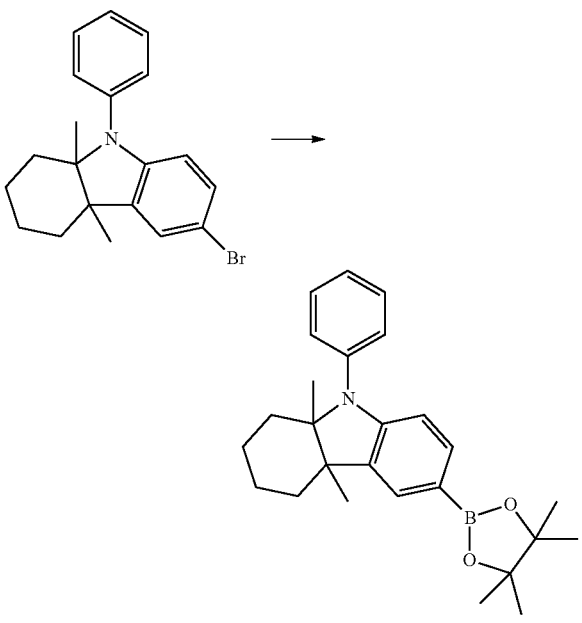

Compound 57-5

40 g (112 mmol) of Compound 57-4, 34 g (134 mmol) of bis(pinacolato)diboron, 2.73 g (3 mmol) of palladium(II) chloride-1-,1'-bis(diphenylphosphino)ferrocene, 32.9 g (335 mmol) of potassium acetate, and 480 ml of toluene were added to a 1 L round-bottom flask, and then, the mixture was refluxed for 8 hours. When the reaction was finished, the reaction product was filtered through Celite and then condensed under reduced pressure. The obtained product was subjected to column chromatography performed using hexane and ethyl acetate as a development solvent to obtain Compound 57-5 (26 g, 64.96 mmol, and yield 58%).

<Synthesis of Compound 57>

<Reaction Scheme 57>

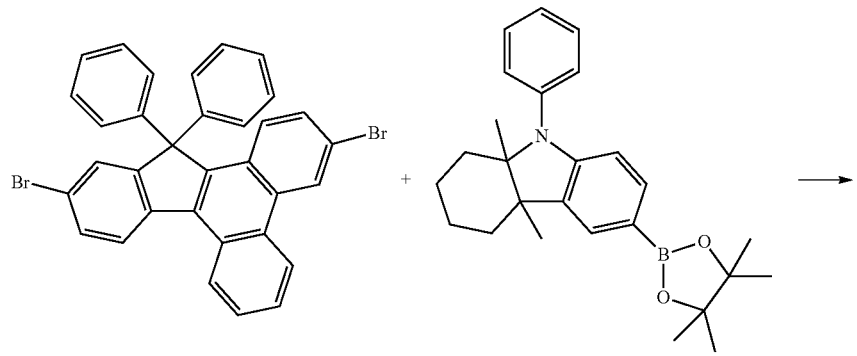

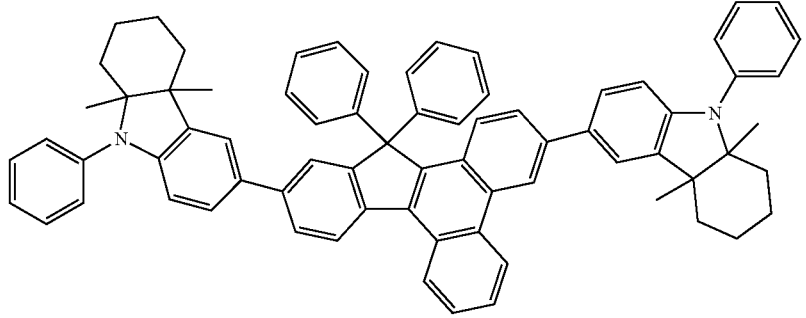

Comopund 57

5.0 g (9 mmol) of Compound 47-5, 8.4 g (2.1 mmol) of Compound 57-5, 0.4 g (0.3 mmol) of tetrakis(triphenylphosphine)palladium, 3.6 g (26 mmol) of potassium carbonate, 25 ml of 1,4-dioxane, 25 ml of toluene, and 10 ml of water were added to a round-bottom flask, and then the mixture was refluxed. When the reaction was finished, water and hexane were added thereto. The produced crystal was obtained by filtering. The crystal was re-crystallized to obtain Compound 57 (5.3 g, 5.13 mmol, and yield 57%).

MS: m/z 969[M]$^+$ $^1$H NMR (CDCl$_3$) δ 9.15 (1H), 8.93 (1H), 8.18 (1H), 8.15 (1H), 8.12 (1H), 8.04 (1H), 7.88 (1H), 7.83 (1H), 7.82 (1H), 7.80 (2H), 7.69 (1H), 7.37 (2H), 7.33 (8H), 7.26 (2H), 7.23 (4H), 7.11 (4H), 6.77 (2H), 6.58 (2H), 2.00 (4H), 1.72 (4H), 1.53 (8H), 1.50 (6H), 1.45 (6H)

Example 1

As a substrate and an anode, a Corning 15 Ωcm$^2$ (1,200 Å) ITO glass substrate was cut to a size of 50 mm×50 mm×0.7 mm, followed by ultrasonically cleaning the glass substrate using isopropyl alcohol and pure water for 5 minutes each, and then irradiating UV light for 30 minutes and exposing to ozone to clean. Then, the glass substrate was loaded into a vacuum deposition apparatus.

2-TNATA was deposited on an ITO layer as the anode to form an HIL having a thickness of 600 Å, and then, 4,4'-bis[N-(1-naphthyl)-N-phenylamino]biphenyl (NPB) was deposited on the HIL to form an HTL having a thickness of 300 Å.

Compound 2 (host) and Compound 47 (dopant) were co-deposited on the HTL at a weight ratio of 95:5 to form an EML having a thickness of 400 Å.

Subsequently, Compound 201 was deposited on the EML to form an ETL having a thickness of 300 Å, and then, LiF was deposited on the ETL to form an EIL having a thickness of 10 Å. Al was deposited on the EIL to form a second electrode (cathode) having a thickness of 3,000 Å, thereby completing the manufacturing of an organic light-emitting diode.

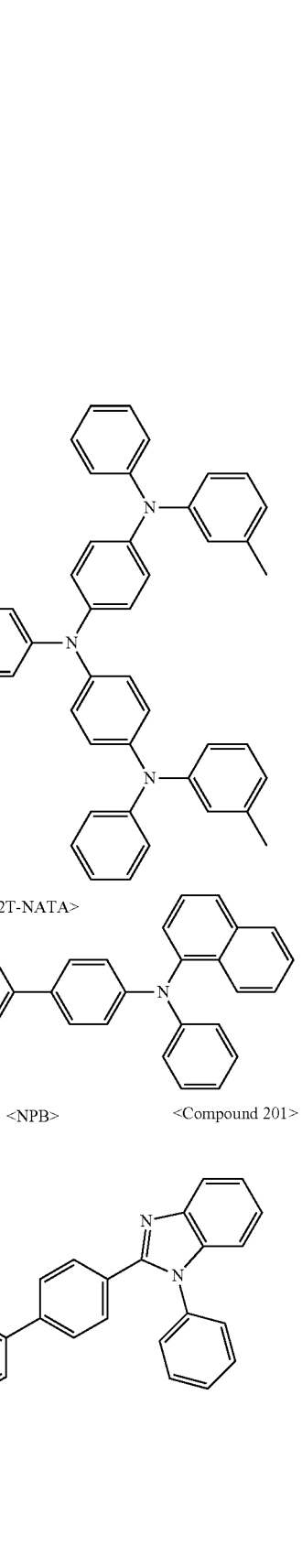

Example 2

An organic light-emitting diode was manufactured in the same manner as in Example 1, except that Compound 6 was used instead of Compound 2 in forming the EML.

Example 3

An organic light-emitting diode was manufactured in the same manner as in Example 1, except that Compound 13 was used instead of Compound 2 in forming the EML.

Example 4

An organic light-emitting diode was manufactured in the same manner as in Example 1, except that Compound 19 was used instead of Compound 2 in forming the EML.

Example 5

An organic light-emitting diode was manufactured in the same manner as in Example 1, except that Compound 21 was used instead of Compound 2 in forming the EML.

Example 6

An organic light-emitting diode was manufactured in the same manner as in Example 1, except that Compound 24 was used instead of Compound 2 in forming the EML.

Example 7

An organic light-emitting diode was manufactured in the same manner as in Example 1, except that Compound 57 was used instead of Compound 47 in forming the EML.

Example 8

An organic light-emitting diode was manufactured in the same manner as in Example 7, except that Compound 6 was used instead of Compound 2 in forming the EML.

Example 9

An organic light-emitting diode was manufactured in the same manner as in Example 7, except that Compound 13 was used instead of Compound 2 in forming the EML.

Example 10

An organic light-emitting diode was manufactured in the same manner as in Example 7, except that Compound 19 was used instead of Compound 2 in forming the EML.

Example 11

An organic light-emitting diode was manufactured in the same manner as in Example 7, except that Compound 21 was used instead of Compound 2 in forming the EML.

Example 12

An organic light-emitting diode was manufactured in the same manner as in Example 7, except that Compound 24 was used instead of Compound 2 in forming the EML.

Comparative Example 1

An organic light-emitting diode was manufactured in the same manner as in Example 1, except that host A was used instead of Compound 2 in forming the EML.

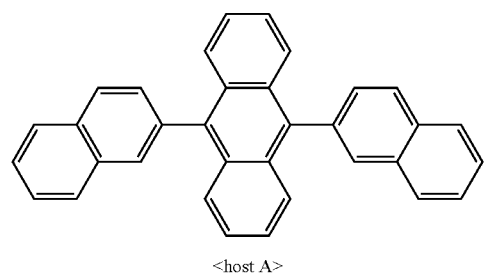 [SMILES: c1ccc2cc(-c3c4ccccc4c(-c4ccc5ccccc5c4)c4ccccc34)ccc2c1]

<host A>

Comparative Example 2

An organic light-emitting diode was manufactured in the same manner as in Example 7, except that host A was used instead of Compound 2 in forming the EML.

Comparative Example 3

An organic light-emitting diode was manufactured in the same manner as in Example 1, except that host B below and 2,5,8,11-tetra-tert-butyl-perylene (TBPe) were respectively used instead of Compound 2 and Compound 47.

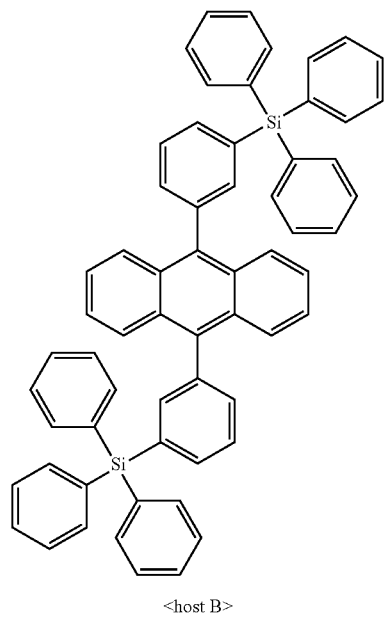 [SMILES: c1ccc([Si](c2ccccc2)(c2ccccc2)c2cccc(-c3c4ccccc4c(-c4cccc([Si](c5ccccc5)(c5ccccc5)c5ccccc5)c4)c4ccccc34)c2)cc1]

<host B>

Evaluation Example

Driving voltage, current density, efficiency, and color purity of the organic light-emitting diodes of Examples 1 to 12 and Comparative Examples 1 to 3 were evaluated by using a PR650 Spectroscan Source Measurement Unit (PhotoResearch) while power was supplied thereto by using a current voltmeter (Kethley SMU 236). The results are shown in Table 1, below (T95 lifespan indicates a time period from when initial brightness 100% was measured at a current density of 10 mA/cm² to when the brightness was reduced down to 95%.).

TABLE 1

| | Host | Dopant | Driving voltage | Efficiency (cd/A) | Color coordinate CIE x | Color coordinate CIE y | T95 Lifespan [hr] |
|---|---|---|---|---|---|---|---|
| Example 1 | Compound 2 | Compound 47 | 3.7 | 2.6 | 0.148 | 0.042 | 150 |
| Example 2 | Compound 6 | Compound 47 | 3.7 | 3.0 | 0.147 | 0.046 | 210 |
| Example 3 | Compound 13 | Compound 47 | 3.2 | 2.6 | 0.148 | 0.045 | 150 |
| Example 4 | Compound 19 | Compound 47 | 3.4 | 2.6 | 0.148 | 0.044 | 160 |
| Example 5 | Compound 21 | Compound 47 | 3.5 | 3.4 | 0.148 | 0.046 | 200 |
| Example 6 | Compound 24 | Compound 47 | 3.8 | 3.2 | 0.149 | 0.046 | 180 |
| Example 7 | Compound 2 | Compound 57 | 3.5 | 2.8 | 0.148 | 0.044 | 160 |
| Example 8 | Compound 6 | Compound 57 | 3.8 | 3.4 | 0.147 | 0.048 | 200 |
| Example 9 | Compound 13 | Compound 57 | 3.2 | 2.9 | 0.149 | 0.046 | 150 |
| Example 10 | Compound 19 | Compound 57 | 3.3 | 3.0 | 0.148 | 0.047 | 170 |
| Example 11 | Compound 21 | Compound 57 | 3.6 | 3.8 | 0.148 | 0.049 | 240 |
| Example 12 | Compound 24 | Compound 57 | 3.7 | 3.5 | 0.148 | 0.048 | 220 |
| Comparative Example 1: | <host A> | Compound 47 | 4.9 | 2.3 | 0.147 | 0.054 | 90 |
| Comparative Example 2: | <host A> | Compound 57 | 4.7 | 2.4 | 0.148 | 0.062 | 130 |
| Comparative Example 3: | <host B> | TBPe | 5.2 | 2.2 | 0.152 | 0.072 | 40 |

From Table 1, it may be seen that the organic light-emitting diodes of Examples 1 to 12 had lower driving voltage and higher efficiency, and longer lifetime and better color purity characteristics than the organic light-emitting diodes of Comparative Examples 1 to 3.

An organic light-emitting diode according to an embodiment may have a low-driving voltage, high efficiency, high color-purity, and a long lifespan.

The embodiments may provide an organic light-emitting diode having high efficiency and long lifespan.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting diode, comprising:
   a substrate;
   a first electrode on the substrate;
   a second electrode facing the first electrode; and an emission layer between the first electrode and the second electrode, the emission layer including an anthracene-based compound represented by Formula 1, below, and a condensed ring compound represented by Formula 20, below:

<Formula 1>

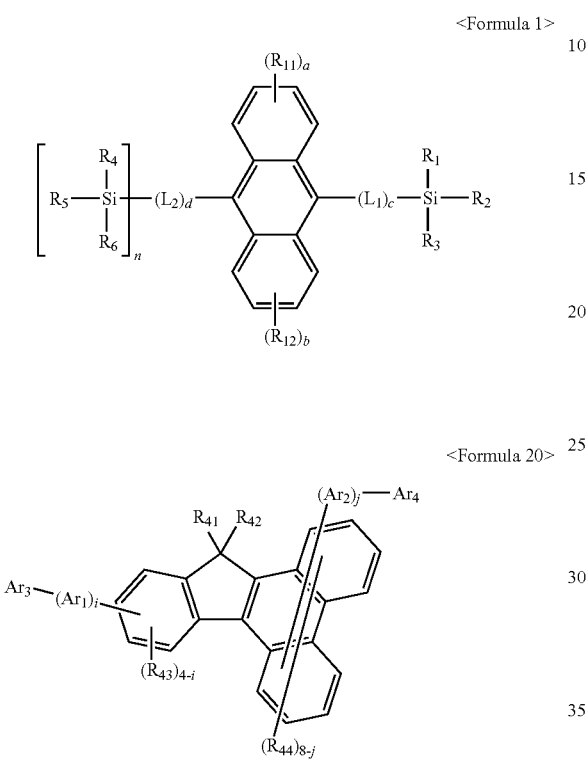

<Formula 20> wherein, in Formulae 1 and 20:
n is 0 or 1;
$R_1$ to $R_6$ are each independently selected from a substituted or unsubstituted $C_1$-$C_{60}$ alkyl group, a substituted or unsubstituted non-condensed ring group in which a number of ring forming atoms is in a range of 3 to 10, and a substituted or unsubstituted condensed ring group in which two or more rings are condensed, and when n is 0, at least one of $R_1$ to $R_3$ is a substituted or unsubstituted condensed ring group in which two or more rings are condensed, and when n is 1, at least one of $R_1$ to $R_6$ is a substituted or unsubstituted condensed ring group in which two or more rings are condensed;
$L_1$, $L_2$, $Ar_1$, and $Ar_2$ are each independently selected from a substituted or unsubstituted $C_3$-$C_{10}$ cycloalkylene group, a substituted or unsubstituted $C_3$-$C_{10}$ cycloalkenylene group, a substituted or unsubstituted $C_3$-$C_{10}$ heterocycloalkylene group, a substituted or unsubstituted $C_3$-$C_{10}$ heterocycloalkenylene group, a substituted or unsubstituted $C_6$-$C_{60}$ arylene group, and a substituted or unsubstituted $C_2$-$C_{60}$ heteroarylene group;
c and d are each independently an integer of 1 to 3;
$R_{11}$, $R_{12}$, $R_{43}$, and $R_{44}$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —$N(Q_1)(Q_2)$, and —$Si(Q_3)(Q_4)(Q_5)$, wherein $Q_1$ to $Q_5$ are each independently a hydrogen atom, a $C_1$-$C_{10}$ alkyl group, a $C_6$-$C_{20}$ aryl group, or a $C_2$-$C_{20}$ heteroaryl group;
a and b are each independently an integer of 1 to 4;
$R_{41}$ and $R_{42}$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group;
i and j are each independently an integer of 0 to 3; and
$Ar_3$ and $Ar_4$ are each independently represented by one of Formulae 7B, 7D, or 7F below:

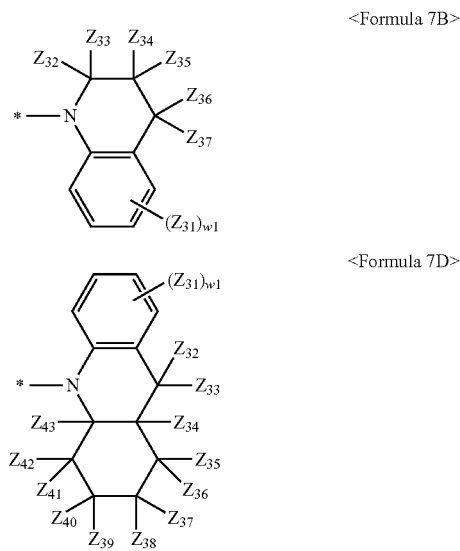

<Formula 7B>

<Formula 7D>

-continued

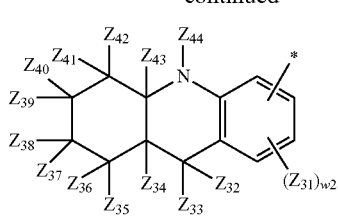

<Formula 7F> in Formulae 7B, 7D, and 7F, $Z_{31}$ to $Z_{44}$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —$N(Q_{51})(Q_{52})$, and —$Si(Q_{53})(Q_{54})(Q_{55})$, wherein $Q_{51}$ to $Q_{55}$ are each independently a hydrogen atom, a $C_1$-$C_{10}$ alkyl group, a $C_6$-$C_{20}$ aryl group, or a $C_2$-$C_{20}$ heteroaryl group, and two or more of $Z_{31}$ to $Z_{44}$ are bindable to each other to selectively form a saturated or unsaturated ring having 6 to 20 carton atoms;

w1 is an integer of 1 to 4; and w2 is an integer of 1 to 5.

2. The organic light-emitting diode as claimed in claim 1, wherein a weight ratio of the anthracene-based compound to the condensed ring compound in the emission layer is in a range of about 99.9:0.01 to 80:20.

3. The organic light-emitting diode as claimed in claim 1, wherein:

$R_1$ to $R_6$ in Formula 1 are each independently selected from:

a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a thiophenyl group, a furanyl group, a pyrrolyl group, an imidazolyl group, a pyrazolyl group, an isothiazolyl group, an isoxazolyl group, a thiazolyl group, an oxazolyl group, an oxadiazolyl group, a thiadiazolyl group, a triazolyl group, a phenyl group, a pyridinyl group, a pyrazinyl group, a pyrimidinyl group, a pyridazinyl group, a triazinyl group, a pentalenyl group, an indenyl group, a naphthyl group, an azulenyl group, a heptalenyl group, a biphenylenyl group, an indacenyl group, an acenaphthylenyl group, a fluorenyl group, a spiro-fluorenyl group, a carbazolyl group, an anthracenyl group, a phenalenyl group, a phenanthrenyl group, a perylenyl group, a fluorantenyl group, a naphthacenyl group, a pycenyl group, a pentaphenyl group, a hexacenyl group, a dibenzofuranyl group, a dibenzothiophenyl group, a phenothiazinyl group, a phenoxazinyl group, a dihydrophenazinyl group, a phenoxathiinyl group, and a phenanthridinyl group; and a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a thiophenyl group, a furanyl group, a pyrrolyl group, an imidazolyl group, a pyrazolyl group, an isothiazolyl group, an isoxazolyl group, a thiazolyl group, an oxazolyl group, an oxadiazolyl group, a thiadiazolyl group, a triazolyl group, a phenyl group, a pyridinyl group, a pyrazinyl group, a pyrimidinyl group, a pyridazinyl group, a triazinyl group, a pentalenyl group, an indenyl group, a naphthyl group, an azulenyl group, a heptalenyl group, a biphenylenyl group, an indacenyl group, an acenaphthylenyl group, a fluorenyl group, a spiro-fluorenyl group, a carbazolyl group, an anthracenyl group, a phenalenyl group, a phenanthrenyl group, a perylenyl group, a fluorantenyl group, a naphthacenyl group, a pycenyl group, a pentaphenyl group, a hexacenyl group, a dibenzofuranyl group, a dibenzothiophenyl group, a phenothiazinyl group, a phenoxazinyl group, a dihydrophenazinyl group, a phenoxathiinyl group, and a phenanthridinyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, or —$N(Q_{11a})(Q_{12a})$, wherein $Q_{11a}$ and $Q_{12a}$ are each independently a hydrogen atom, a $C_1$-$C_{10}$ alkyl group, a $C_6$-$C_{20}$ aryl group, and a $C_2$-$C_{20}$ heteroaryl group, at least one of $R_1$ to $R_3$, when n is 0, or at least one of $R_1$ to $R_6$, when n is 1, are each independently selected from:

a pentalenyl group, an indenyl group, a naphthyl group, an azulenyl group, a heptalenyl group, a biphenylenyl group, an indacenyl group, an acenaphthylenyl group, a fluorenyl group, a spiro-fluorenyl group, a carbazolyl group, an anthracenyl group, a phenalenyl group, a phenanthrenyl group, a perylenyl group, a fluorantenyl group, a naphthacenyl group, a pycenyl group, a pentaphenyl group, a hexacenyl group, a dibenzofuranyl group, a dibenzothiophenyl group, a phenothiazinyl group, a phenoxazinyl group, a dihydrophenazinyl group, a phenoxathiinyl group, and a phenanthridinyl group; and a pentalenyl group, an indenyl group, a naphthyl group, an azulenyl group, a heptalenyl group, a biphenylenyl group, an indacenyl group, an acenaphthylenyl group, a fluorenyl group, a spiro-fluorenyl group, a carbazolyl group, an anthracenyl group, a phenalenyl group, a phenanthrenyl group, a perylenyl group, a fluorantenyl group, a naphthacenyl group, a pycenyl group, a pentaphenyl group, a hexacenyl group, a dibenzofuranyl group, a dibenzothiophenyl group, a phenothiazinyl group, a phenoxazinyl group, a dihydrophenazinyl group, a phenoxathiinyl group, and a phenanthridinyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, or —N($Q_{11a}$)($Q_{12a}$), wherein $Q_{11a}$ and $Q_{12a}$ are each independently a hydrogen atom, a $C_1$-$C_{10}$ alkyl group, a $C_6$-$C_{20}$ aryl group, and a $C_2$-$C_{20}$ heteroaryl group.

4. The organic light-emitting diode as claimed in claim 1, wherein:

$R_1$ to $R_6$ in Formula 1 are each independently selected from:

a methyl group, an ethyl group, an n-propyl group, an i-propyl group, an n-butyl group, an i-butyl group, a t-butyl group, a pentyl group, a hexyl group, a heptyl group, an octyl group, a nonyl group, and a decyl group;

a methyl group, an ethyl group, an n-propyl group, an i-propyl group, an n-butyl group, an i-butyl group, a t-butyl group, a pentyl group, a hexyl group, a heptyl group, an octyl group, a nonyl group, and a decyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, or —N($Q_{11a}$)($Q_{12a}$), wherein $Q_{11a}$ and $Q_{12a}$ are each independently a hydrogen atom, a $C_1$-$C_{10}$ alkyl group, a $C_6$-$C_{20}$ aryl group, and a $C_2$-$C_{20}$ heteroaryl group, Formulae 2A to 2T, below; and
Formulae 3A to 3R, below,
at least one of $R_1$ to $R_3$, when n is 0, or at least one of $R_1$ to $R_6$, when n is 1, are each independently selected from Formulae 3A to 3R below:

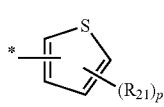

Formula 2A

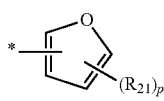

Formula 2B

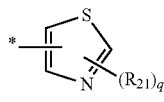

Formula 2C

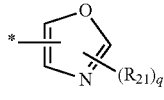

Formula 2D

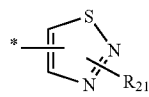

Formula 2E

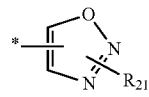

Formula 2F

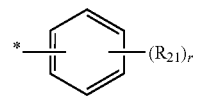

Formula 2G

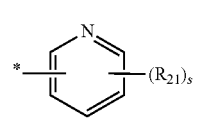

Formula 2H

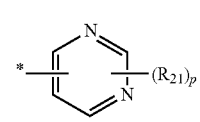

Formula 2I

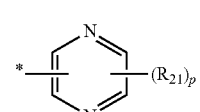

Formula 2J

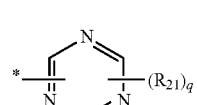

Formula 2K

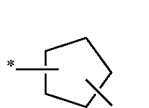

Formula 2L

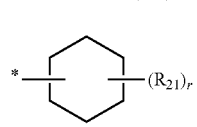

Formula 2M

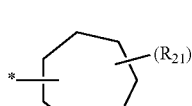

Formula 2N

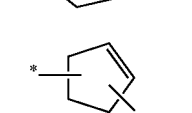

Formula 2O

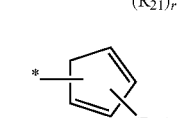

Formula 2P

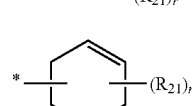

Formula 2Q

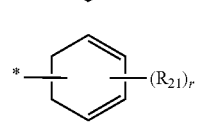

Formula 2R

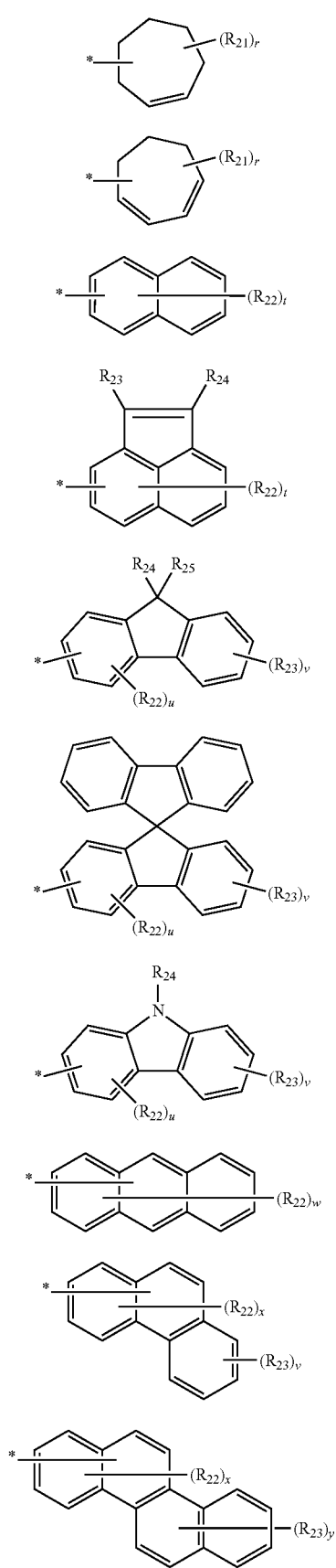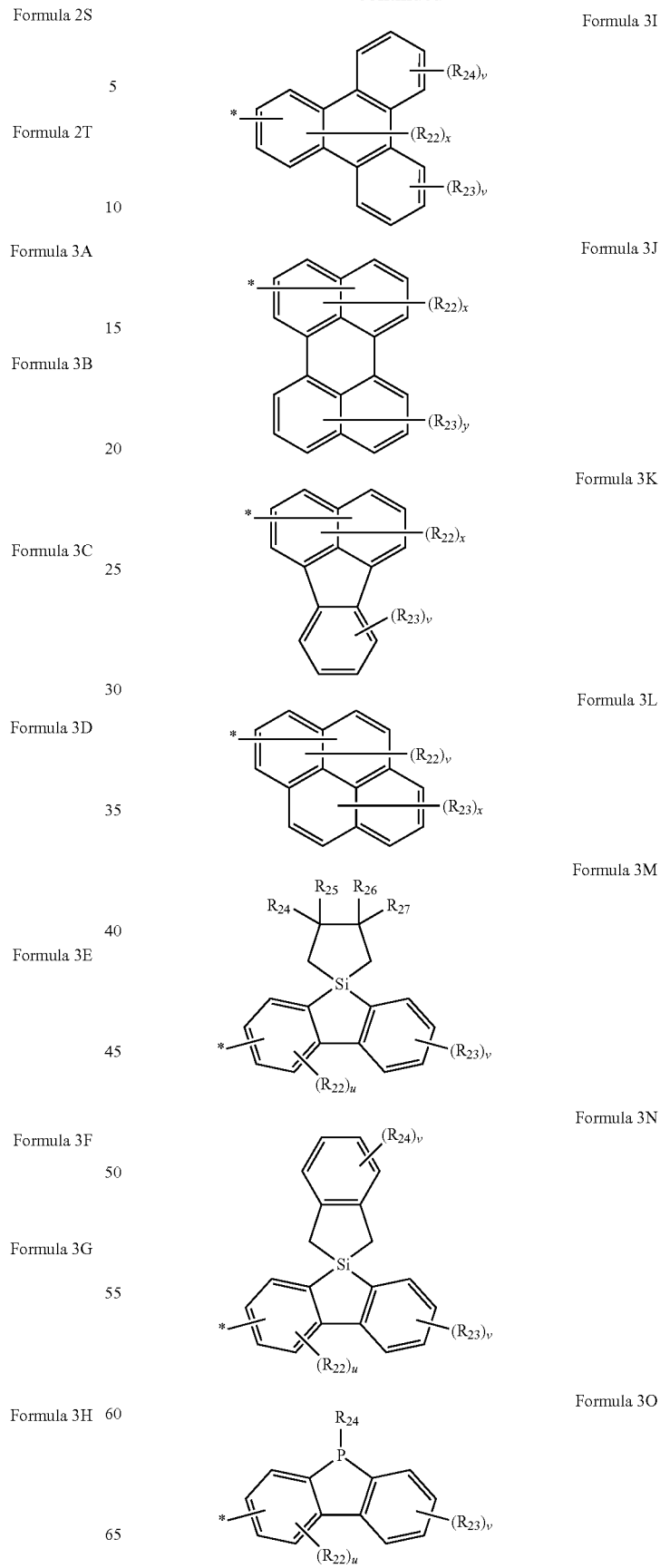

-continued

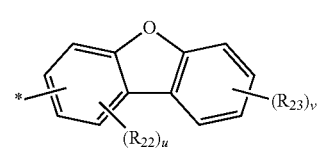
Formula 3P

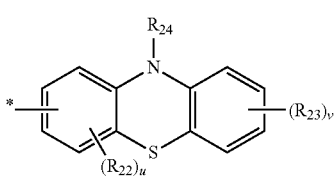
Formula 3Q

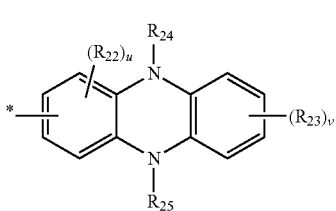
Formula 3R in Formulae 2A to 2T and 3A to 3R:
$R_{21}$ to $R_{27}$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, or —N($Q_{11a}$)($Q_{12a}$), wherein $Q_{11a}$ and $Q_{12a}$ are each independently selected from a hydrogen atom, a $C_1$-$C_{10}$ alkyl group, a $C_6$-$C_{20}$ aryl group, and a $C_2$-$C_{20}$ heteroaryl group,
p and u are each independently an integer of 1 to 3;
q is 1 or 2;
r and x are each independently an integer of 1 to 5;
s and v are each independently an integer of 1 to 4;
t is an integer of 1 to 7;
w is an integer of 1 to 9; and
y is an integer of 1 to 6.

5. The organic light-emitting diode as claimed in claim 1, wherein:
$R_1$ to $R_6$ in Formula 1 are each independently selected from
a methyl group, an ethyl group, an n-propyl group, an i-propyl group, an n-butyl group, an i-butyl group, a t-butyl group, a pentyl group, a hexyl group, a heptyl group, an octyl group, a nonyl group, and a decyl group;
a methyl group, an ethyl group, an n-propyl group, an i-propyl group, an n-butyl group, an i-butyl group, a t-butyl group, a pentyl group, a hexyl group, a heptyl group, an octyl group, a nonyl group, and a decyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a phenyl group, a naphthyl group, and an anthracenyl group;
Formula 2G below; and
Formulae 4A to 4J below, and
at least one of $R_1$ to $R_3$, when n is 0, or at least one of $R_1$ to $R_6$, when n is 1, are each independently selected from Formulae 4A to 4J, below:

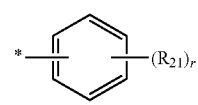
Formula 2G

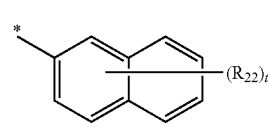
Formula 4A

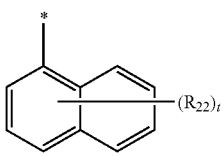
Formula 4B

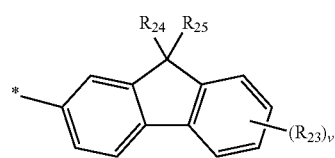
Formula 4C

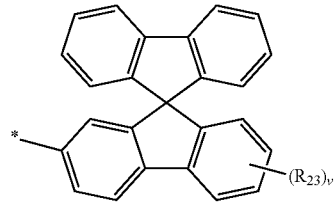
Formula 4D

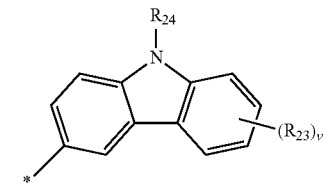
Formula 4E

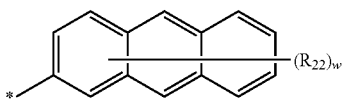
Formula 4F

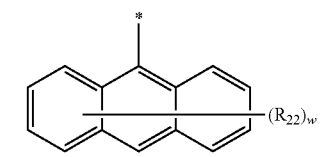
Formula 4G

-continued

Formula 4H

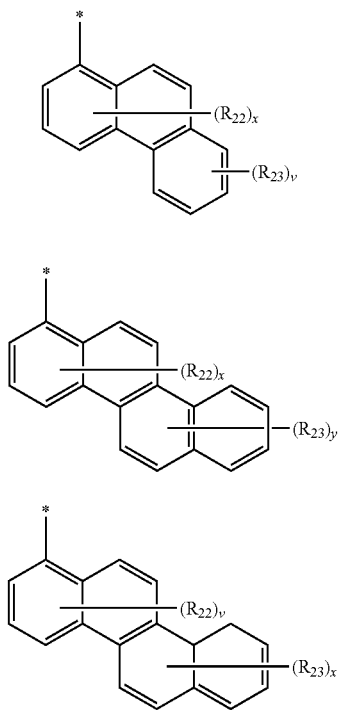

Formula 4I

Formula 4J in Formulae 2G and 4A to 4J:

$R_{21}$ to $R_{25}$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a dimethylfluorenyl group, a phenylcarbazolyl group, a pyrenyl group, a chrycenyl group, a benzothiazolyl group, a benzooxazolyl group, a phenylbenzoimidazolyl group, and —$N(Q_{11a})(Q_{12a})$, wherein $Q_{11a}$ and $Q_{12a}$ are each independently selected from a hydrogen atom, a $C_1$-$C_{10}$ alkyl group, a phenyl group, a naphthyl group, and an anthracenyl group;

r and x are each independently an integer of 1 to 5;

v is an integer of 1 to 4;

t is an integer of 1 to 7;

w is an integer of 1 to 9; and y is an integer of 1 to 6.

6. The organic light-emitting diode as claimed in claim 1, wherein $L_1$, $L_2$, $Ar_1$, and $Ar_2$ in Formulae 1 and 20 are each independently selected from:

a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, a cycloheptadienylene group, a thiophenylene group, a furanylene group, a pyrrolylene group, an imidazolylene group, a pyrrazolylene group, an isothiazolylene group, an isoxazolylene group, a thiazolylene group, an oxazolylene group, an oxadiazolylene group, a thiadiazolylene group, a triazolylene group, a phenylene group, a pyridinylene group, a pyrazinylene group, a pyrimidinylene group, a pyridazinylene group, a triazinylene group, a pentarenylene group, an indenylene group, a naphthylene group, an azulenylene group, a biphenylenylene group, an indacenylene group, an acenaphthylenylene group, a fluorenylene group, a spiro-fluorenylene group, a carbazolylene group, an anthracenylene group, a phenalenylene group, a phenanthrenylene group, a perylenylene group, a fluoranthenylene group, a naphthacenylene group, a picenylene group, a pentaphenylene group, a hexacenylene group, a dibenzofuranylene group, a dibenzothiophenylene group, a phenothiazinylene group, a phenoxazinylene group, a dihydrophenazinylene group, a phenoxathiinylene group, and a phenanthridinylene group; and a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, a cycloheptadienylene group, a thiophenylene group, a furanylene group, a pyrrolylene group, an imidazolylene group, a pyrrazolylene group, an isothiazolylene group, an isoxazolylene group, a thiazolylene group, an oxazolylene group, an oxadiazolylene group, a thiadiazolylene group, a triazolylene group, a phenylene group, a pyridinylene group, a pyrazinylene group, a pyrimidinylene group, a pyridazinylene group, a triazinylene group, a pentarenylene group, an indenylene group, a naphthylene group, an azulenylene group, a biphenylenylene group, an indacenylene group, an acenaphthylenylene group, a fluorenylene group, a spiro-fluorenylene group, a carbazolylene group, an anthracenylene group, a phenalenylene group, a phenanthrenylene group, a perylenylene group, a fluoranthenylene group, a naphthacenylene group, a picenylene group, a pentaphenylene group, a hexacenylene group, a dibenzofuranylene group, a dibenzothiophenylene group, a phenothiazinylene group, a phenoxazinylene group, a dihydrophenazinylene group, a phenoxathiinylene group, and a phenanthridinylene group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, or —$N(Q_{11b})(Q_{12b})$, wherein $Q_{11b}$ and $Q_{12b}$ are each independently a hydrogen atom, a $C_1$-$C_{10}$ alkyl group, a $C_6$-$C_{20}$ aryl group, and a $C_2$-$C_{20}$ heteroaryl group.

7. The organic light-emitting diode as claimed in claim 1, wherein:

$L_1$, $L_2$, $Ar_1$, and $Ar_2$ in Formulae 1 and 20 are each independently selected from Formulae 5A to 5J:

Formula 5A
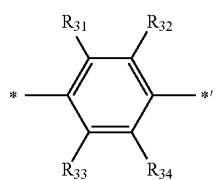

Formula 5B
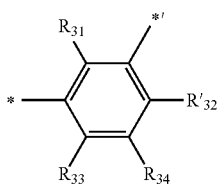

Formula 5C
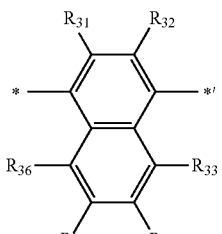

Formula 5D
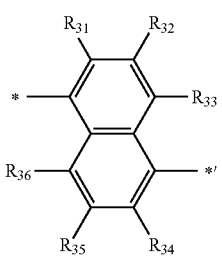

Formula 5E
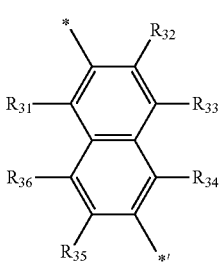

Formula 5F
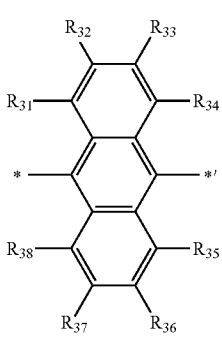

Formula 5G
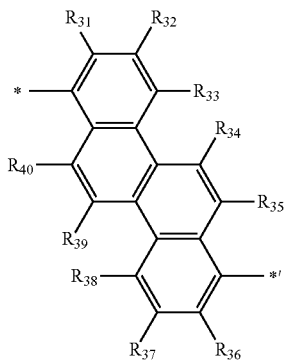

Formula 5H
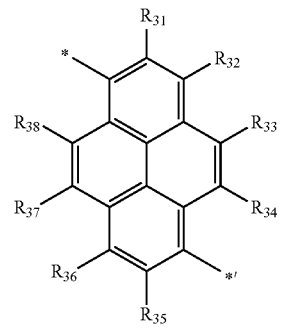

Formula 5I
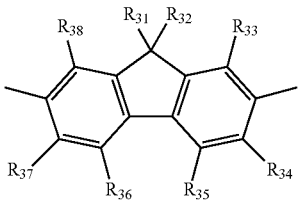

Formula 5J
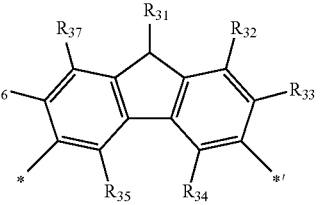

$R_{31}$ to $R_{40}$ in Formulae 5A to 5J are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11b}$)($Q_{12b}$), wherein $Q_{11b}$ and $Q_{12b}$ are each independently a hydrogen atom, a $C_1$-$C_{10}$ alkyl group, a $C_6$-$C_{20}$ aryl group, or a $C_2$-$C_{20}$ heteroaryl group; and

* indicates a binding site.

8. The organic light-emitting diode as claimed in claim 1, wherein in Formula 1:

n is 1;

$R_1$, $R_3$, $R_4$, and $R_6$ are each independently a substituted or unsubstituted $C_1$-$C_{60}$ alkyl group; and $R_2$ and $R_5$ are each independently selected from a substituted or unsubstituted non-condensed ring group in which the number of ring forming atoms is in a range of 3 to 10, and a substituted or unsubstituted condensed ring group in which two or more rings are condensed, wherein at least one of $R_3$ and $R_5$ is a substituted or unsubstituted condensed ring group in which two or more rings are condensed.

9. The organic light-emitting diode as claimed in claim 1, wherein in Formula 1:

n is 0;

$R_1$ and $R_3$ are each independently a substituted or unsubstituted $C_1$-$C_{60}$ alkyl group; and $R_2$ is a substituted or unsubstituted condensed ring group in which two or more rings are condensed.

10. The organic light-emitting diode as claimed in claim 1, wherein the anthracene-based compound is one of Compounds 1 to 24 below:

1

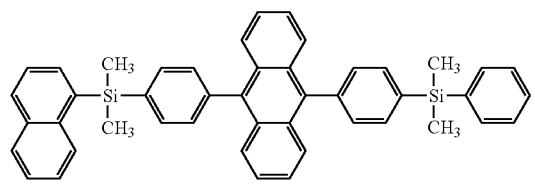

2

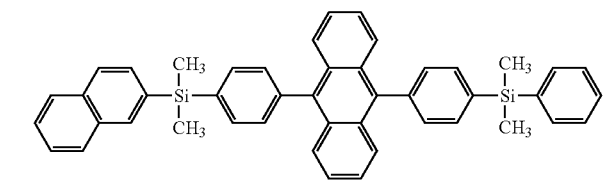

3

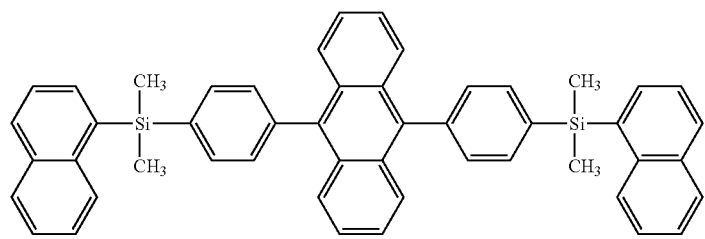

4

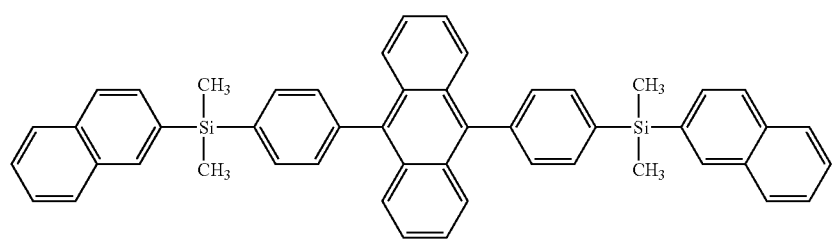

5

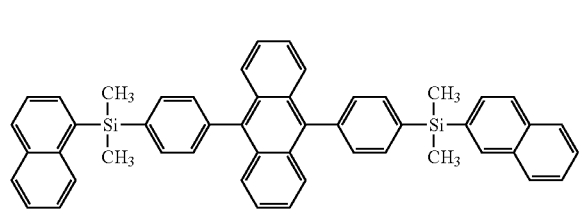

6

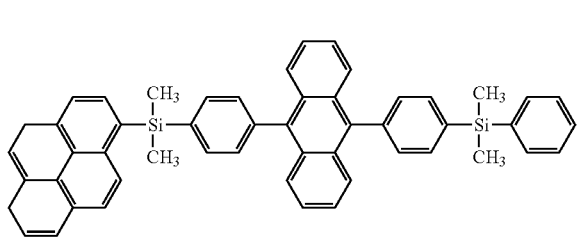

7

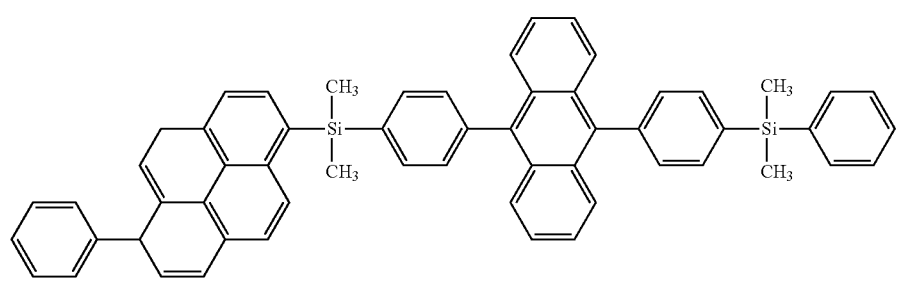

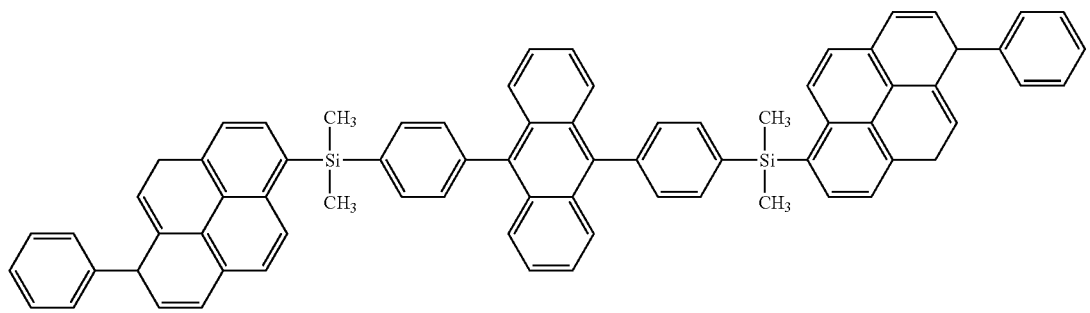
8
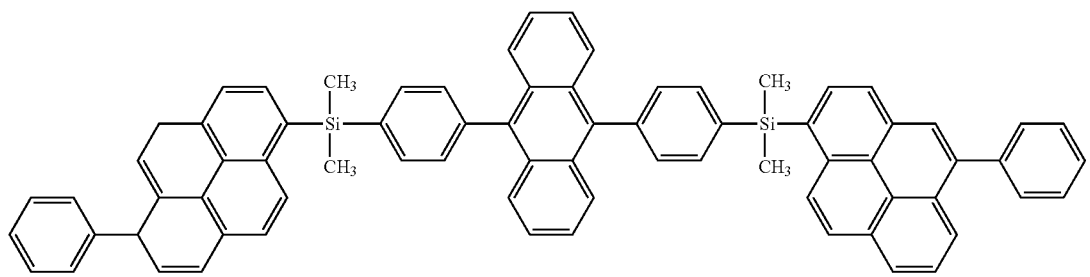
9
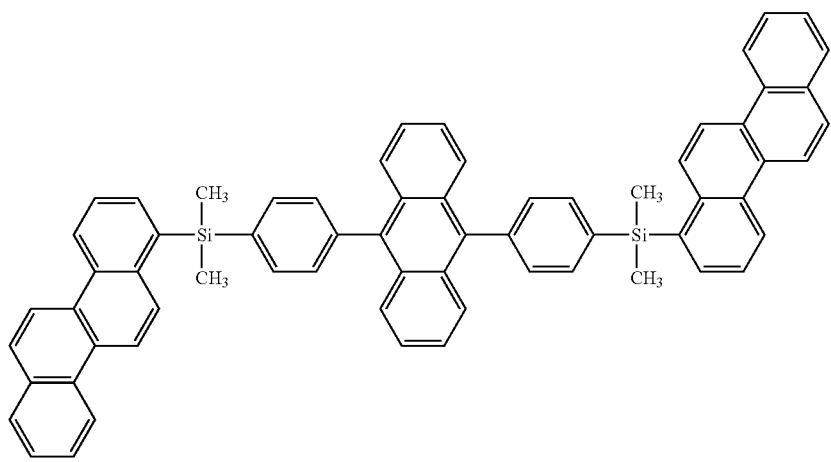
10
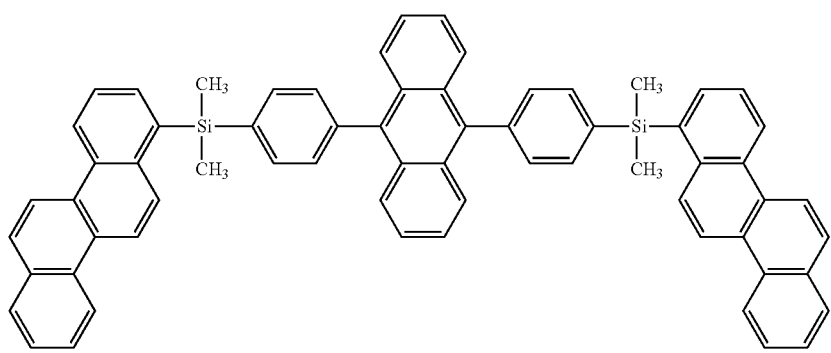
11
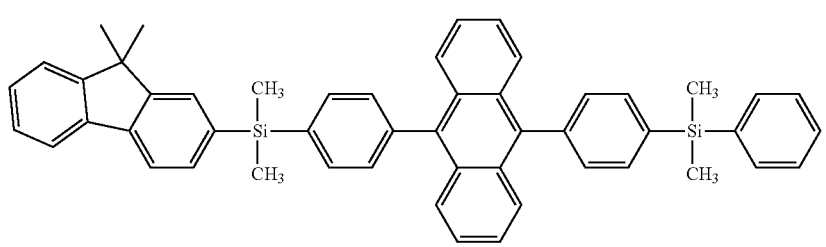
12

-continued
13
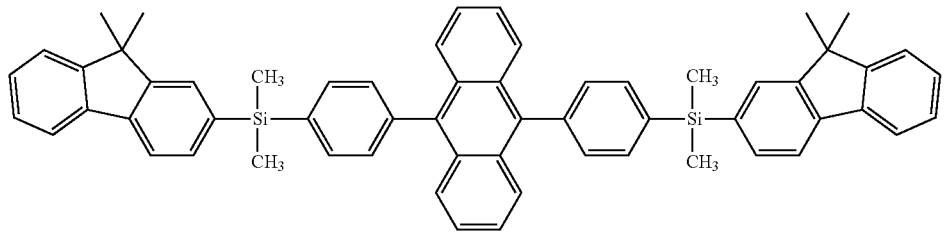
14
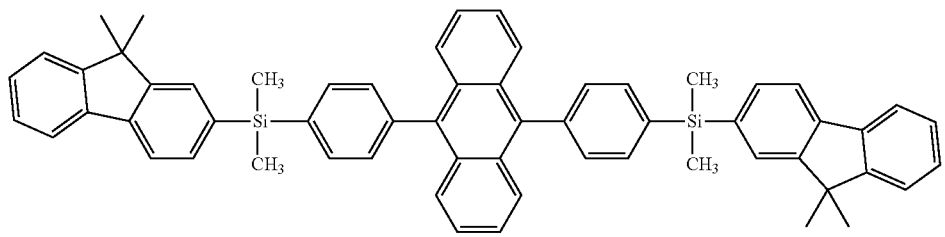
15
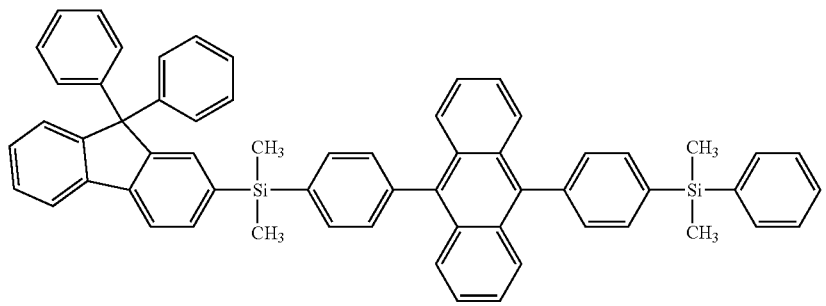
16
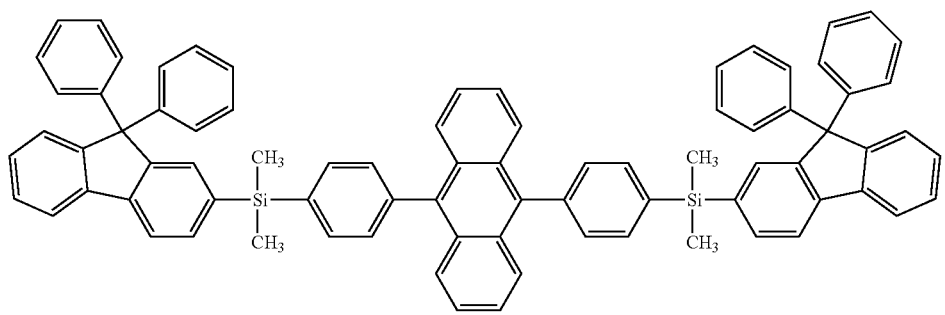
17
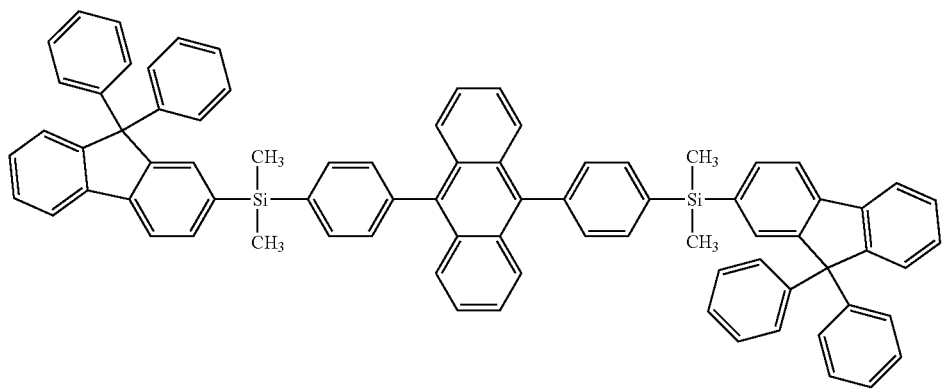

18
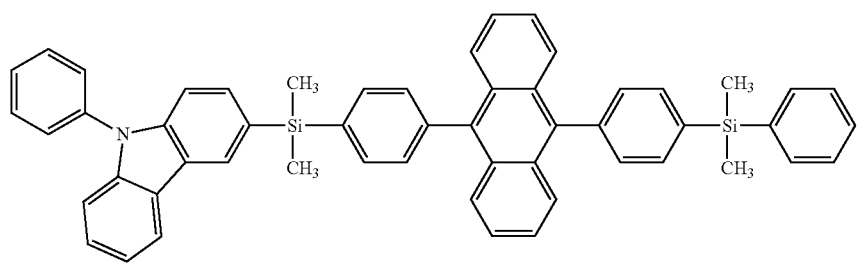
19
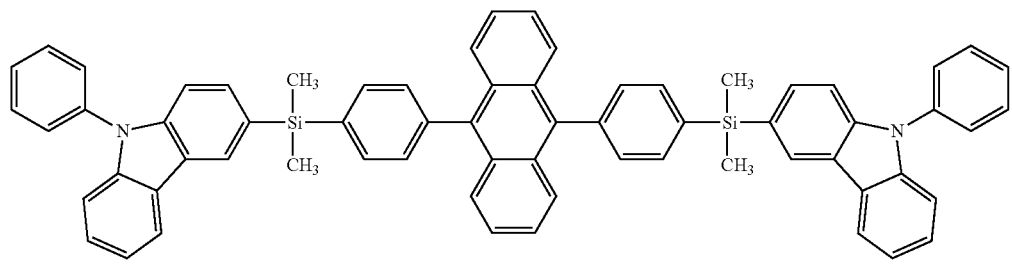
20
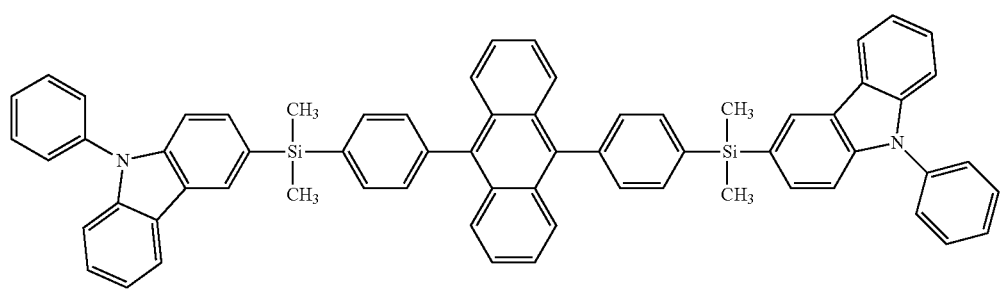
21
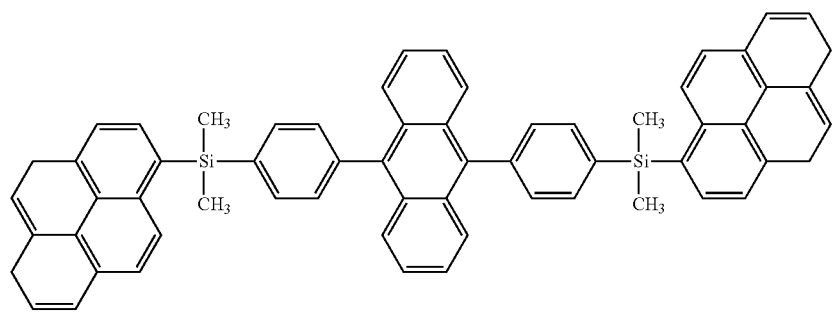
22
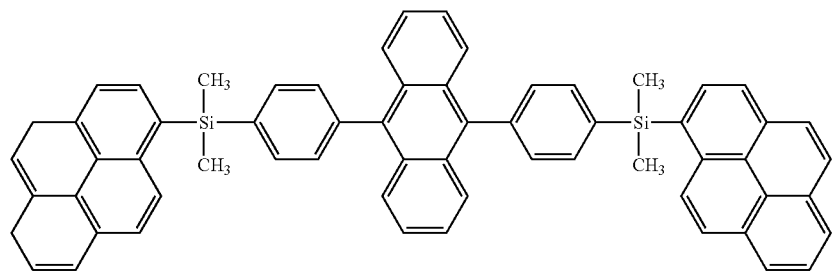

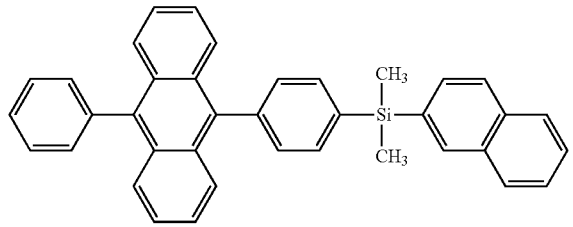

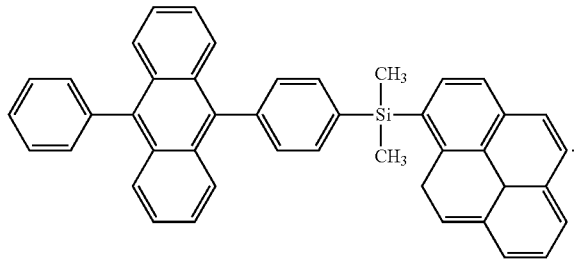

11. The organic light-emitting diode as claimed in claim 1, wherein the condensed ring compound is a blue fluorescent dopant that emits blue light according to a fluorescence emission mechanism.

12. The organic light-emitting diode as claimed in claim 1, wherein $R_{41}$ and $R_{42}$ in Formula 20 are each independently selected from:
- a $C_1$-$C_{20}$ alkyl group, a $C_1$-$C_{20}$ alkoxy group, a phenyl group, a naphthyl group, an anthracenyl group, a pyrenyl group, and a chrycenyl group; and
- a $C_1$-$C_{20}$ alkyl group, a $C_1$-$C_{20}$ alkoxy group, a phenyl group, a naphthyl group, an anthracenyl group, a pyrenyl group, and a chrycenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a pyrenyl group, and a chrycenyl group.

13. The organic light-emitting diode as claimed in claim 1, wherein in Formula 20, i is 0 and j is 0.

14. The organic light-emitting diode as claimed in claim 1, wherein $Z_{31}$ to $Z_{44}$ in Formulae 7B, 7D, and 7F are each independently selected from:
- a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;
- a $C_1$-$C_{20}$ alkyl group and a $C_1$-$C_{20}$ alkoxy group, each substituted with one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, and a phosphoric acid or a salt thereof;
- a phenyl group, a pentalenyl group, an indenyl group, a naphthyl group, an azulenyl group, an indacenyl group, an acenaphthyl group, a fluorenyl group, a spiro-fluorenyl group, a phenalenyl group, a phenanthrenyl group, an anthracenyl group, a fluorantenyl group, a triphenylenyle group, a pyrenyl group, a chrycenyl group, a naphthacenyl group, a pycenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group;
- a phenyl group, a pentalenyl group, an indenyl group, a naphthyl group, an azulenyl group, an indacenyl group, an acenaphthyl group, a fluorenyl group, a spiro-fluorenyl group, a phenalenyl group, a phenanthrenyl group, an anthracenyl group, a fluorantenyl group, a triphenylenyl group, a pyrenyl group, a chrycenyl group, a naphthacenyl group, a pycenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenylene group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_1$-$C_{60}$ alkoxy group, a $C_6$-$C_{60}$ aryl group, or a $C_2$-$C_{60}$ heteroaryl group; and
- —Si($Q_{53}$)($Q_{54}$)($Q_{55}$), wherein $Q_{53}$ to $Q_{55}$ are each independently a hydrogen atom, a $C_1$-$C_{10}$ alkyl group, a $C_6$-$C_{20}$ aryl group, or a $C_2$-$C_{20}$ heteroaryl group.

15. The organic light-emitting diode as claimed in claim 1, wherein $Z_{31}$ to $Z_{44}$ in Formulae 7B, 7D, and 7F are each independently selected from:

a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, and a phosphoric acid or a salt thereof;

a phenyl group, a naphthyl group, a fluorenyl group, a spiro-fluorenyl group, a phenalenyl group, a phenanthrenyl group, an anthracenyl group, a fluoranthenyl group, a pyrenyl group, a chrycenyl group, a pyridinyl group, a pyrazinyl group, a pyrimidinyl group, a pyridazinyl group, a quinolinyl group, an isoquinolinyl group, a carbazolyl group, a furanyl group, a benzofuranyl group, a thiophenyl group, and a benzothiophenyl group;

a phenyl group, a naphthyl group, a fluorenyl group, a spiro-fluorenyl group, a phenalenyl group, a phenanthrenyl group, an anthracenyl group, a fluoranthenyl group, a pyrenyl group, a chrycenyl group, a pyridinyl group, a pyrazinyl group, a pyrimidinyl group, a pyridazinyl group, a quinolinyl group, an isoquinolinyl group, a carbazolyl group, a furanyl group, a benzofuranyl group, a thiophenyl group, and a benzothiophenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a carbazolyl group, a pyridinyl group, a pyrimidinyl group, a pyrazinyl group, and a triazinyl group; and —Si($Q_{53}$)($Q_{54}$)($Q_{55}$), wherein $Q_{53}$ to $Q_{55}$ are each independently selected from a hydrogen atom, a $C_1$-$C_{10}$ alkyl group, a phenyl group, a naphthyl group, an anthracenyl group, and a pyrenyl group.

16. The organic light-emitting diode as claimed in claim 1, wherein $Ar_3$ and $Ar_4$ in Formula 20 are identical to each other.

17. The organic light-emitting diode as claimed in claim 1, wherein the condensed ring compound represented by Formula 20 is represented by Formula 20A(1) below:

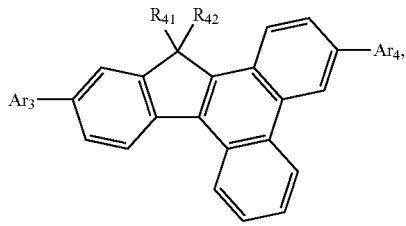

<Formula 20A(1)> wherein, in Formula 20A(1), $R_{41}$, $R_{42}$, $Ar_3$, and $Ar_4$ are defined the same as those of Formula 20.

18. The organic light-emitting diode as claimed in claim 1, wherein the condensed ring compound is one of Compounds 35 to 40, 51 to 56, and 63 to 68 below:

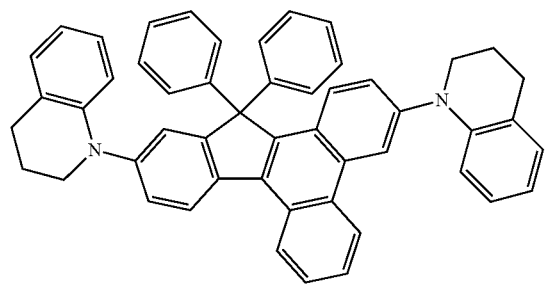

35

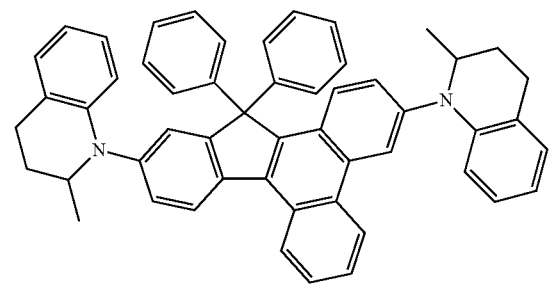

36

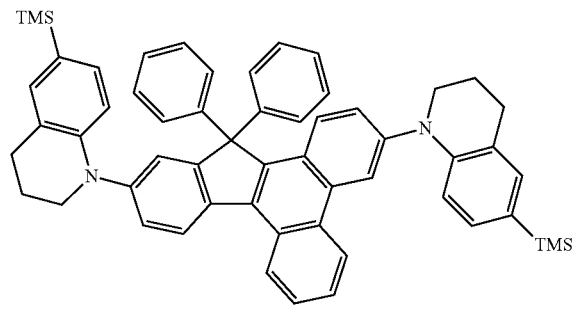

37

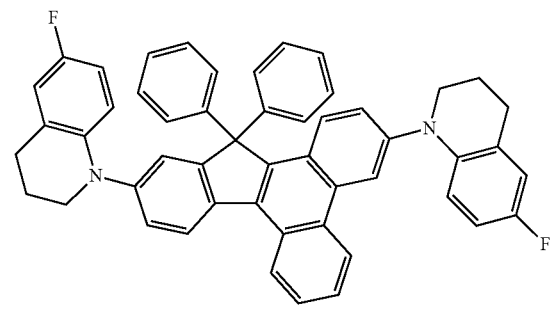

38

-continued
39
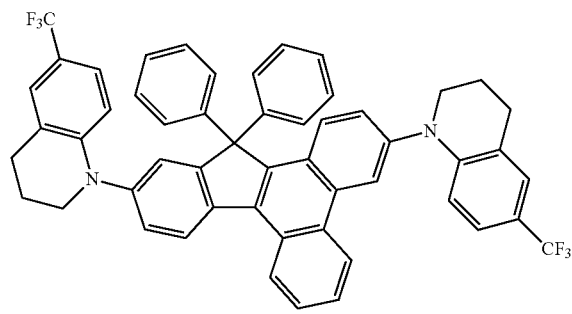
40
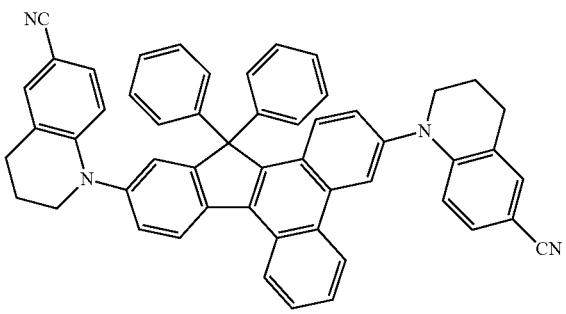
51
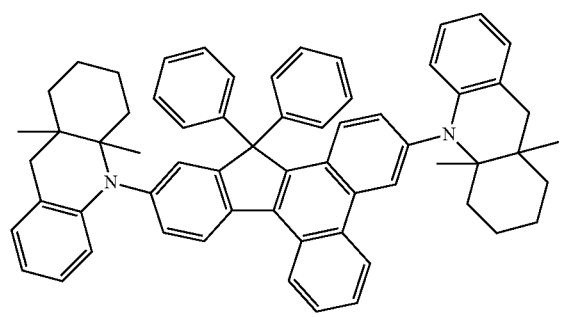
52
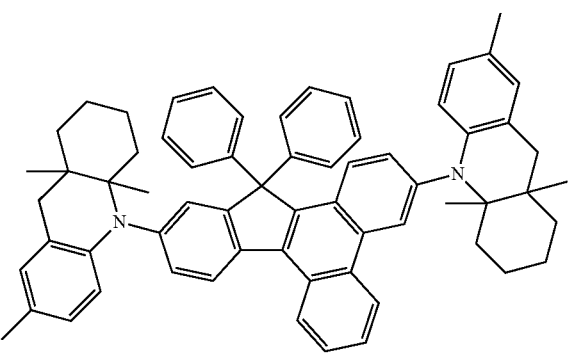
53
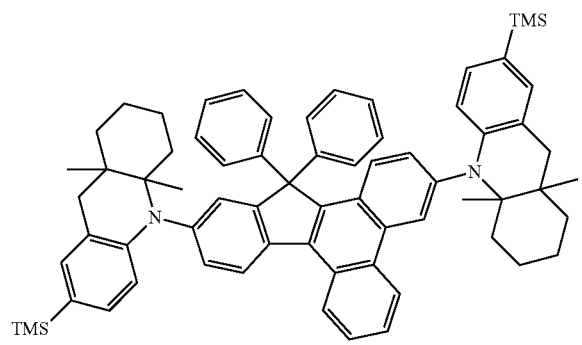
54
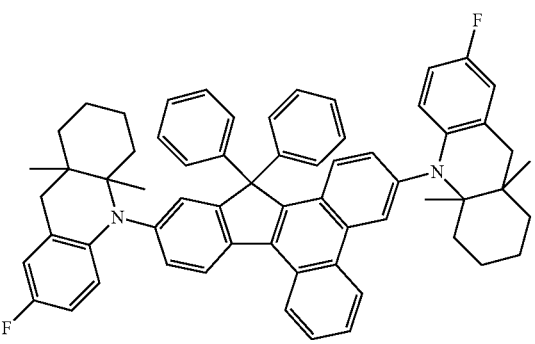
55
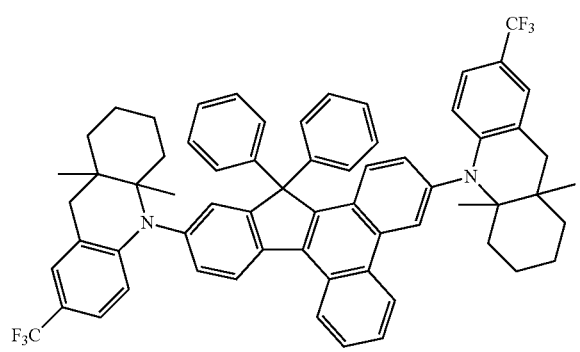
56
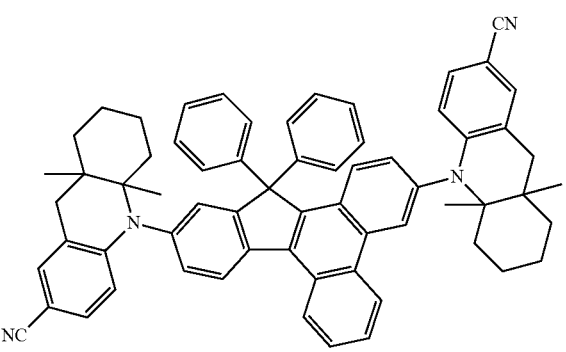

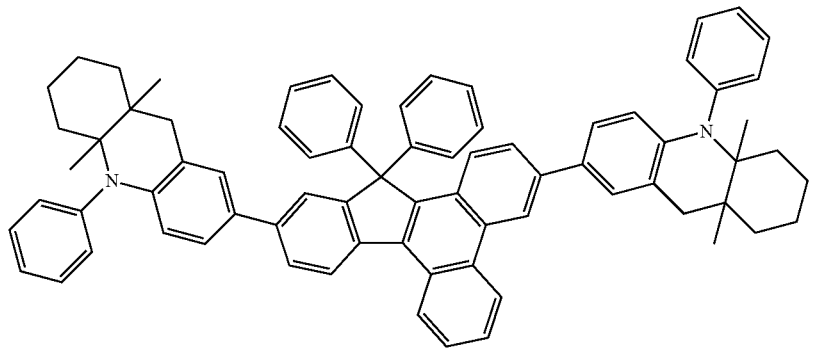
63
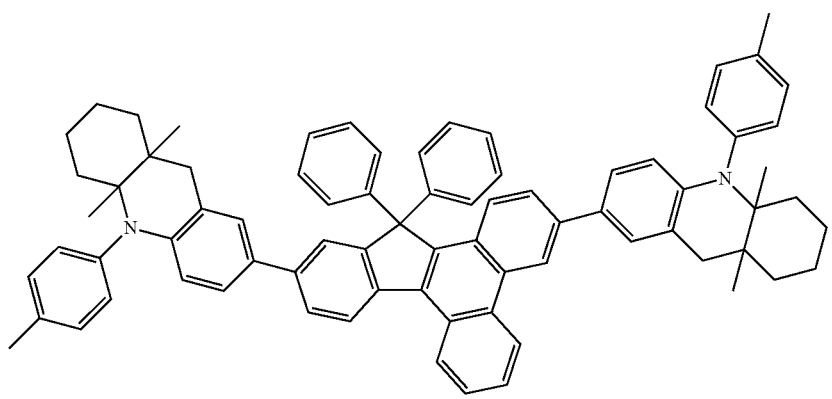
64
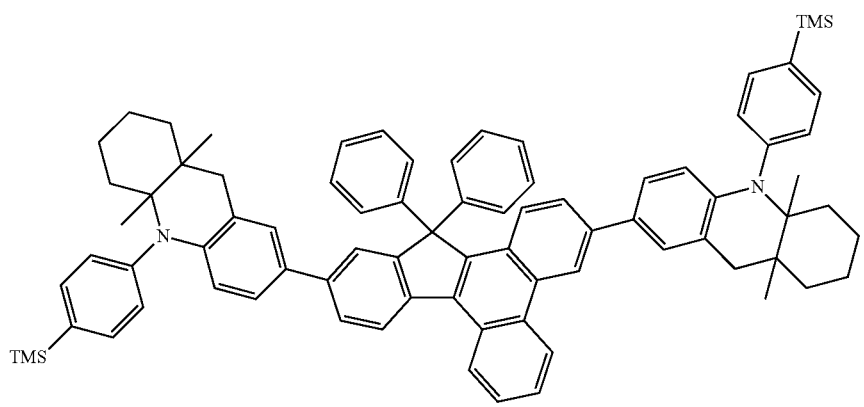
65
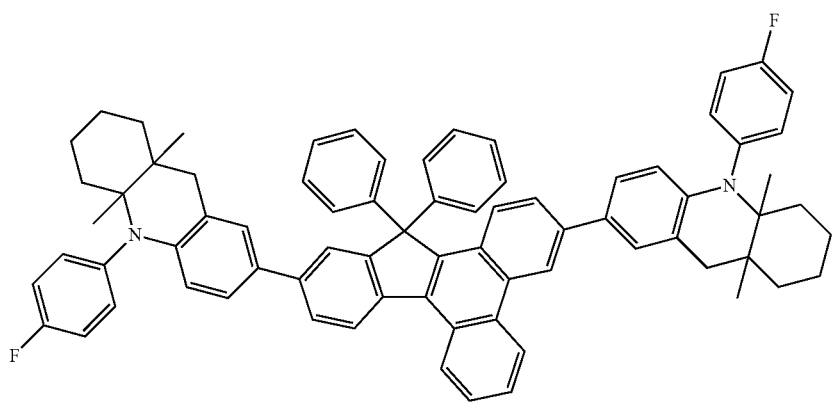
66

-continued

67

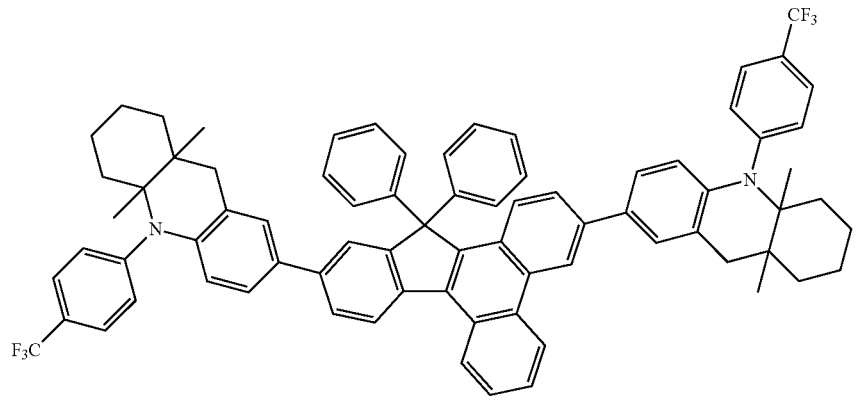

68

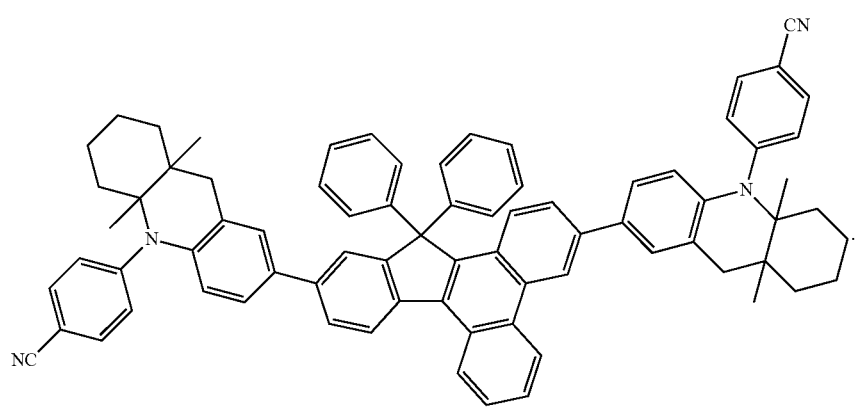

19. An organic light-emitting diode, comprising:

a substrate;
a first electrode on the substrate;
a second electrode facing the first electrode; and
an emission layer that is disposed between the first electrode and the second electrode and that includes an anthracene-based compound selected from Compounds 1 to 24 below and a condensed ring compound selected from Compounds 35 to 40, 51 to 56, and 63 to 68 below;

1

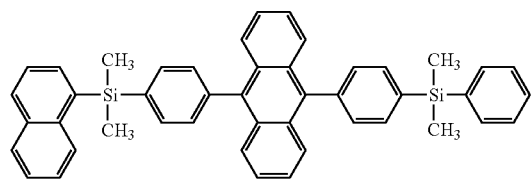

2

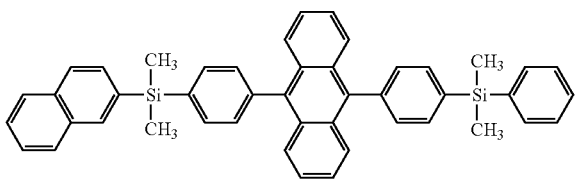

3

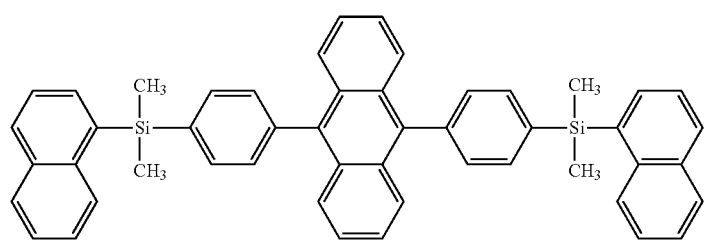

4
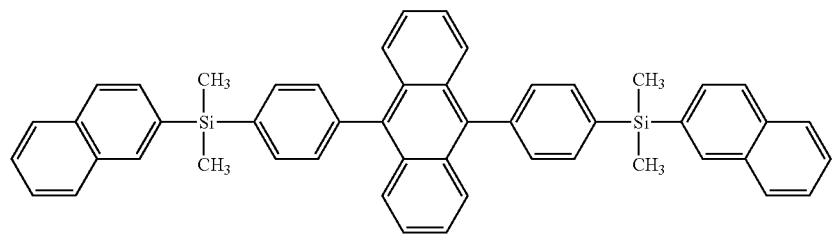
5
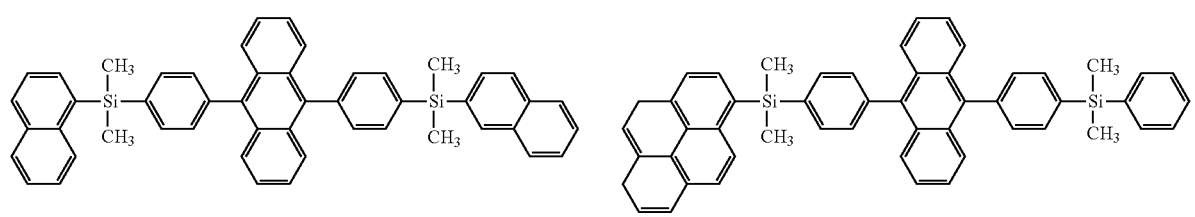
6
7
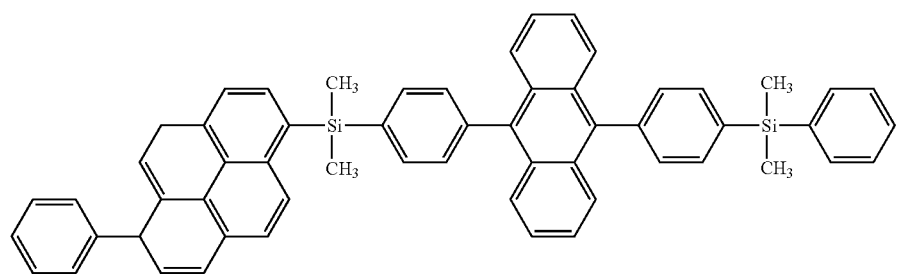
8
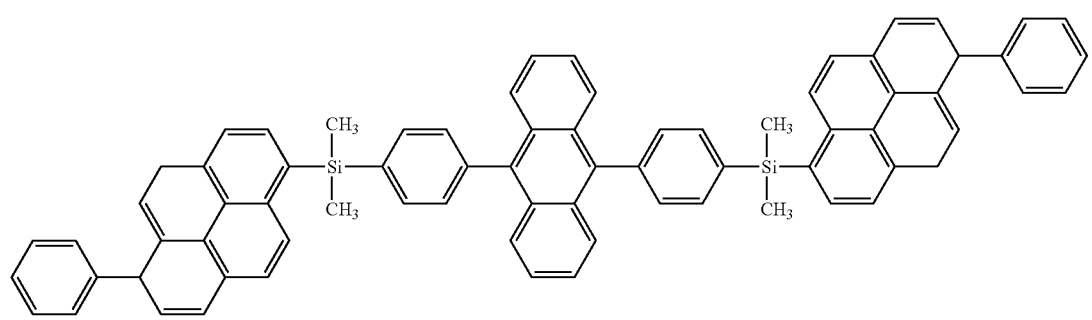
9
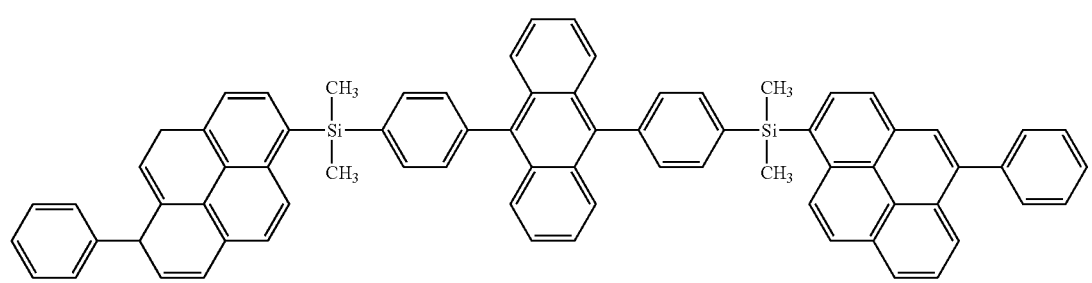

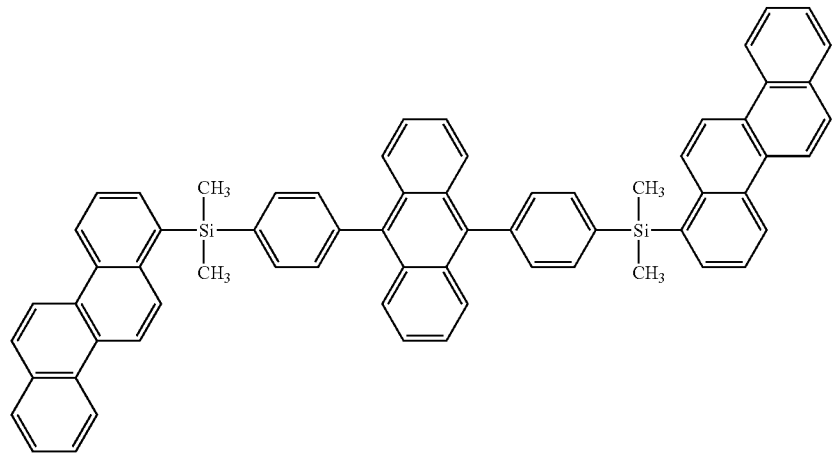
10
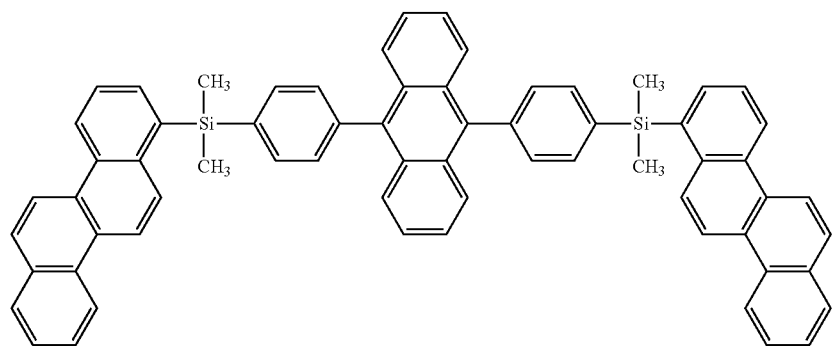
11
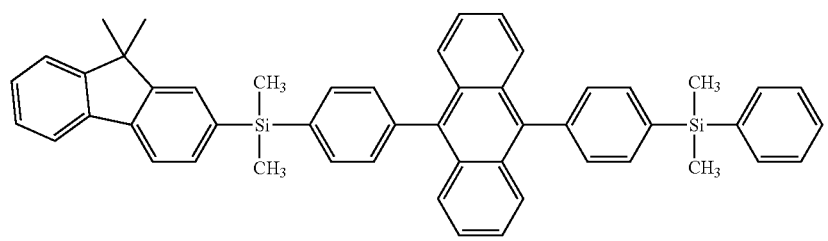
12
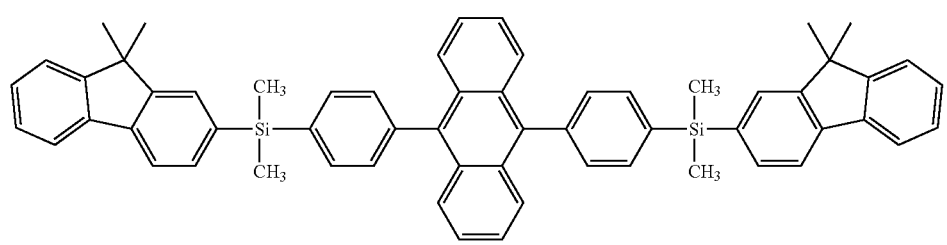
13
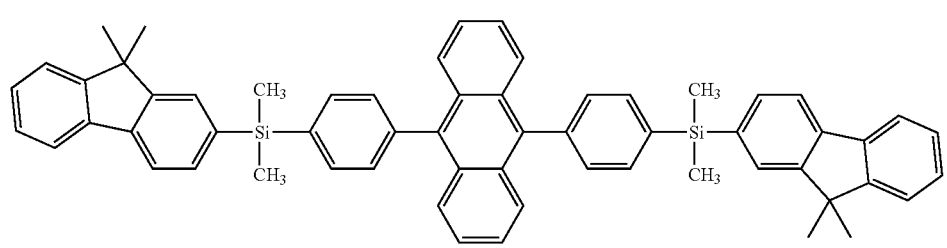
14

15
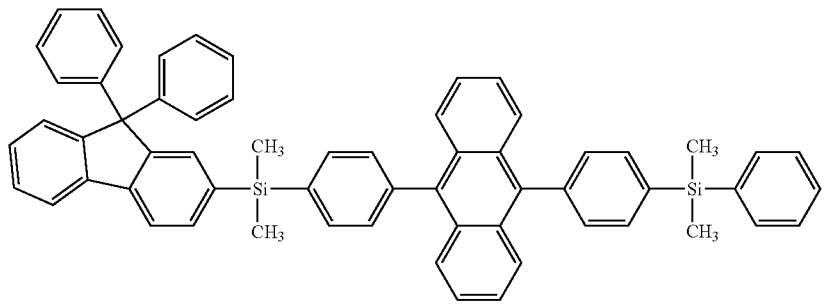
16
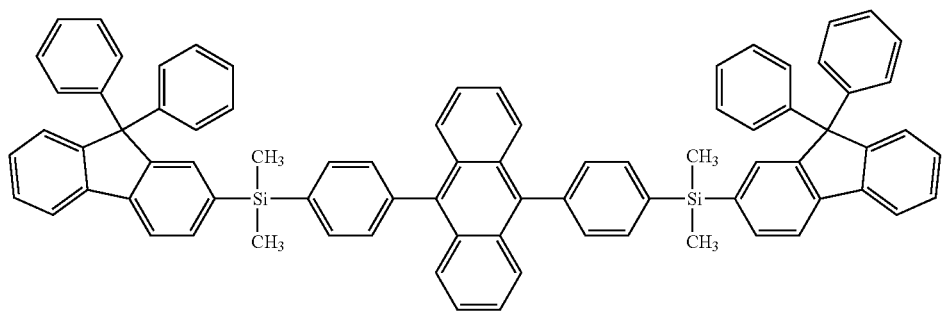
17
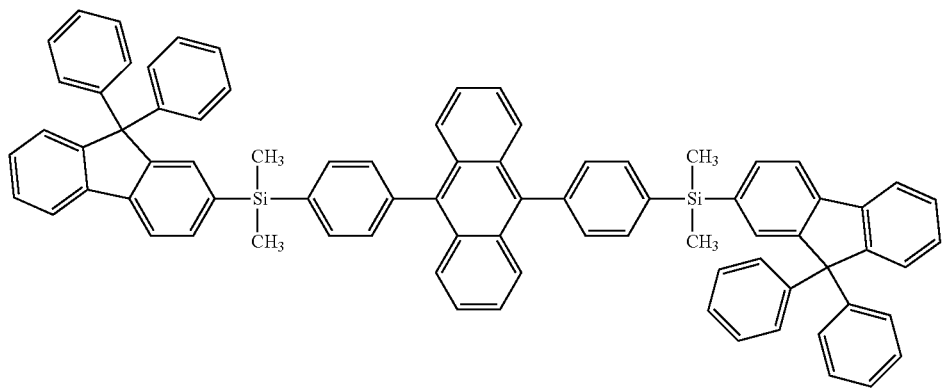
18
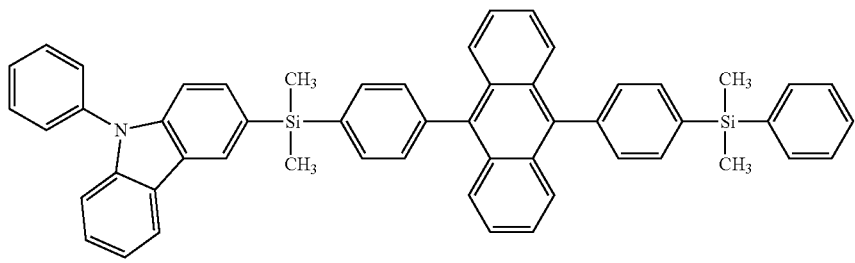
19
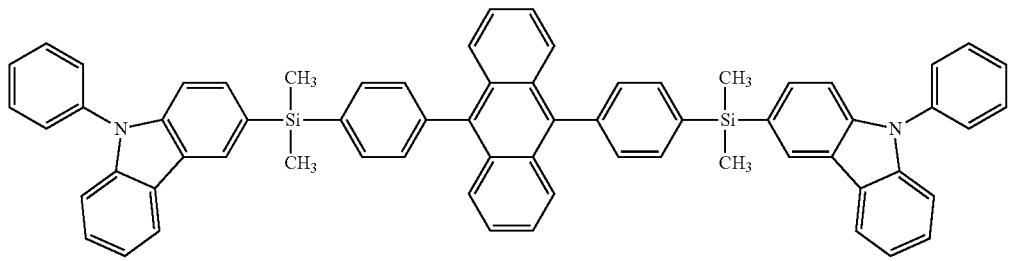

-continued
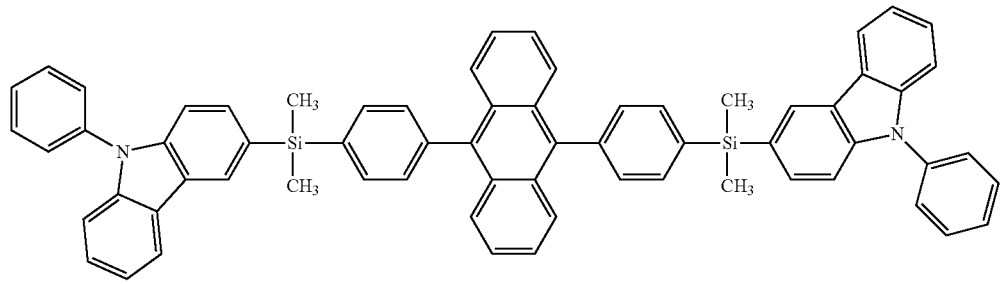
20
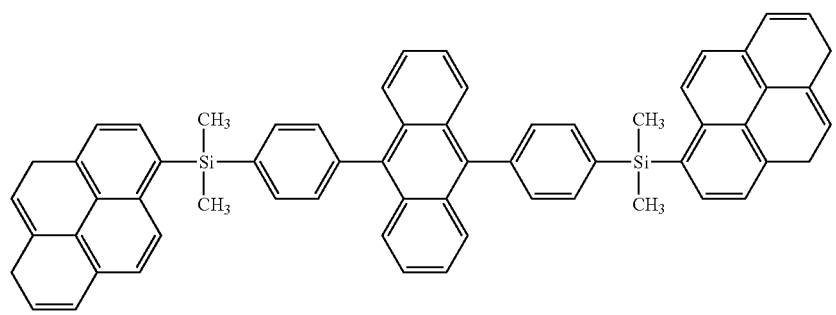
21
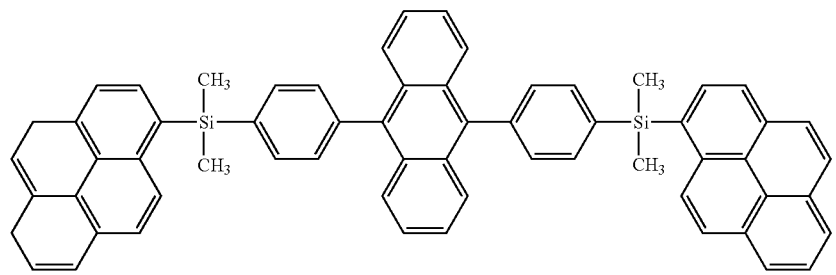
22
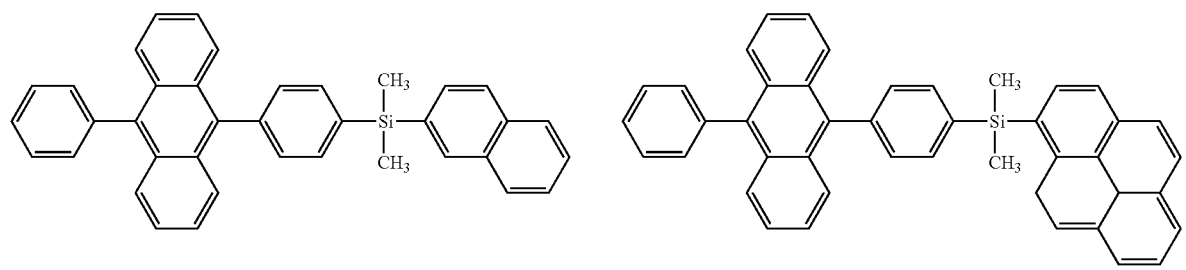
23  24
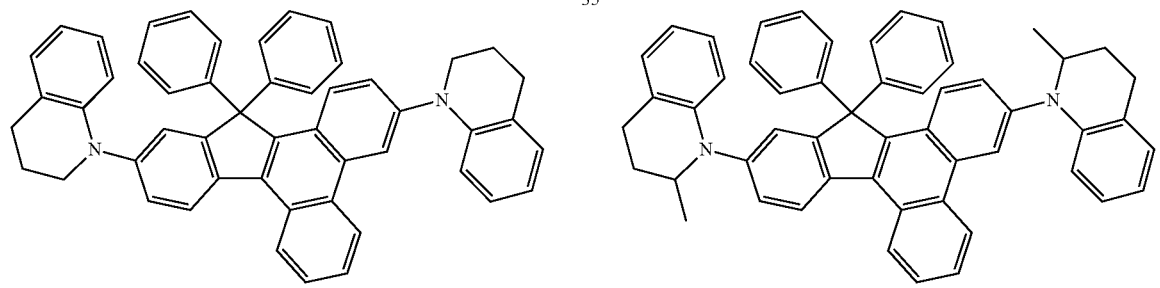
35  36

-continued
37
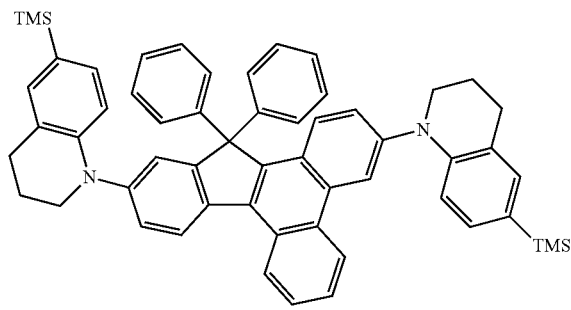
38
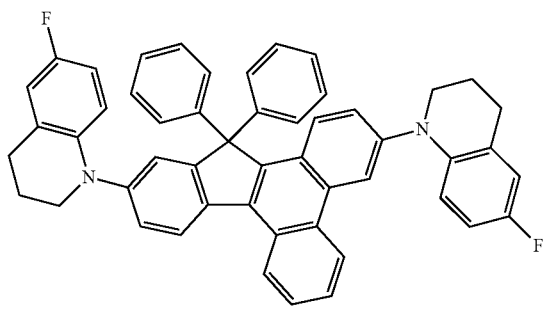
39
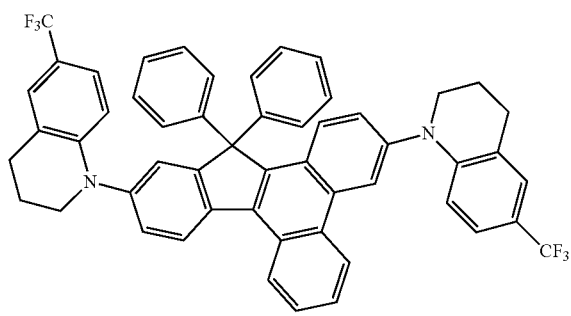
40
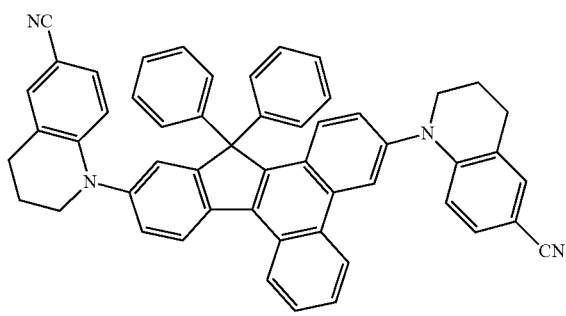
51
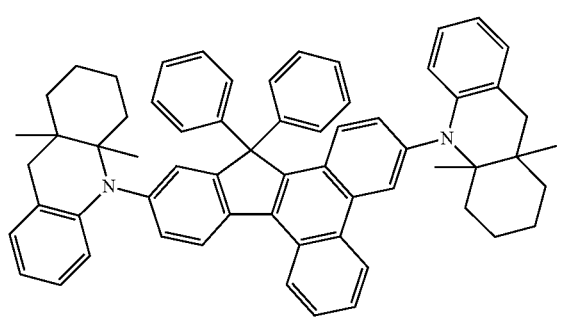
52
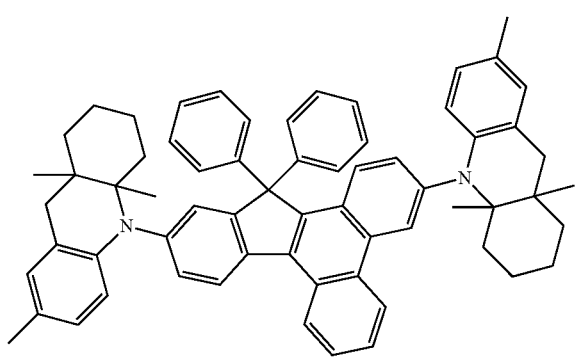
53
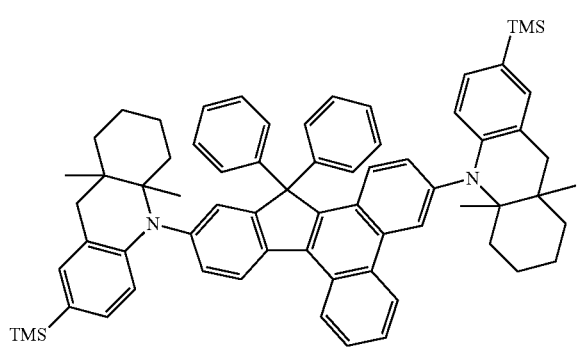
54
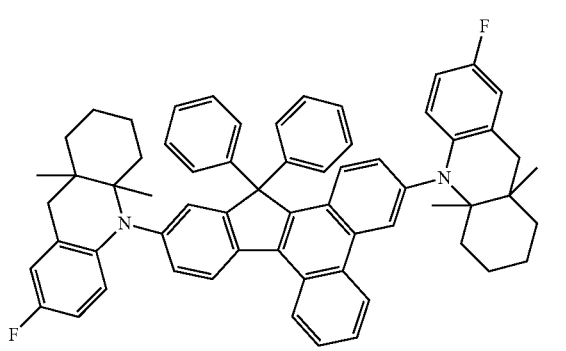

-continued
55
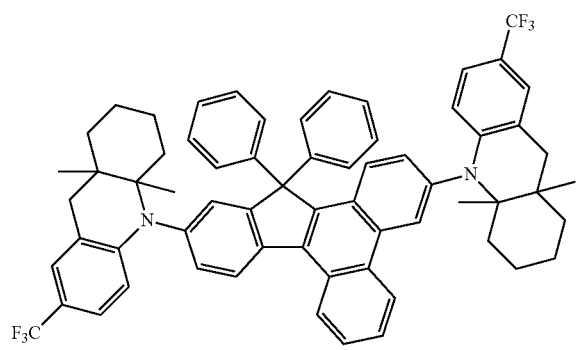
56
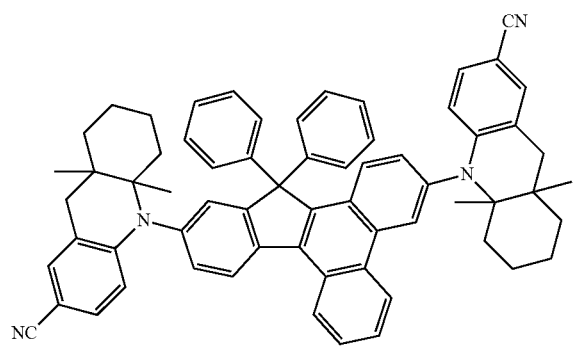
63
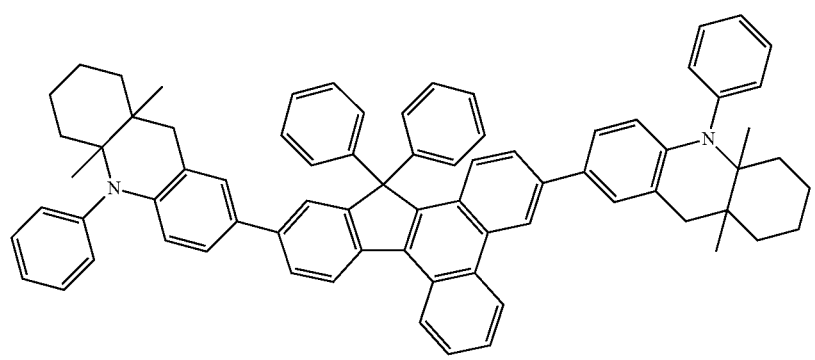
64
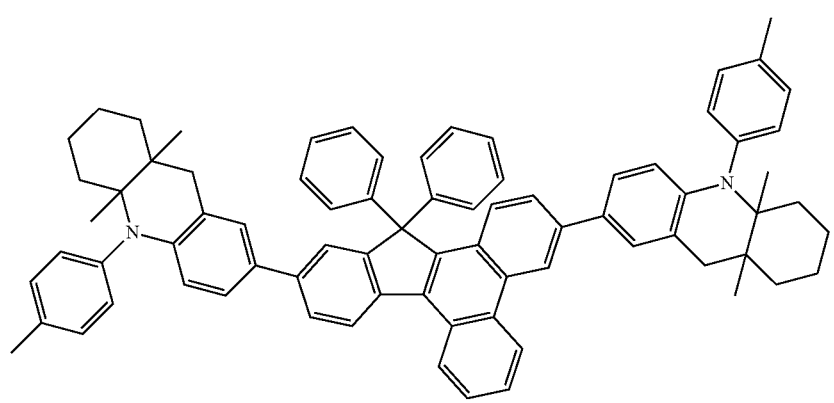
65
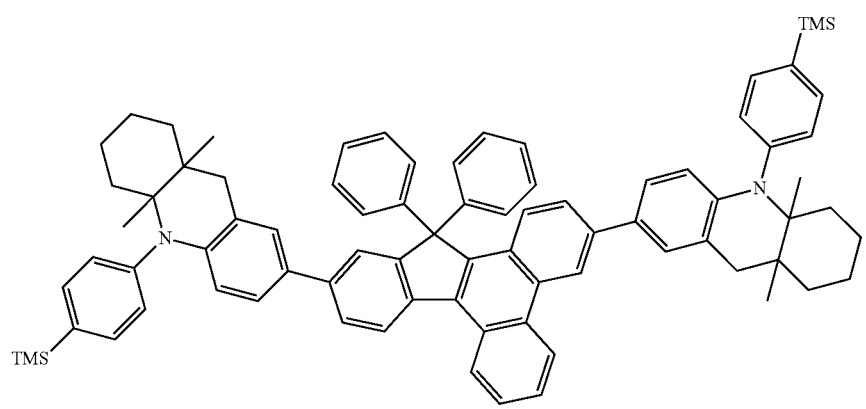

-continued
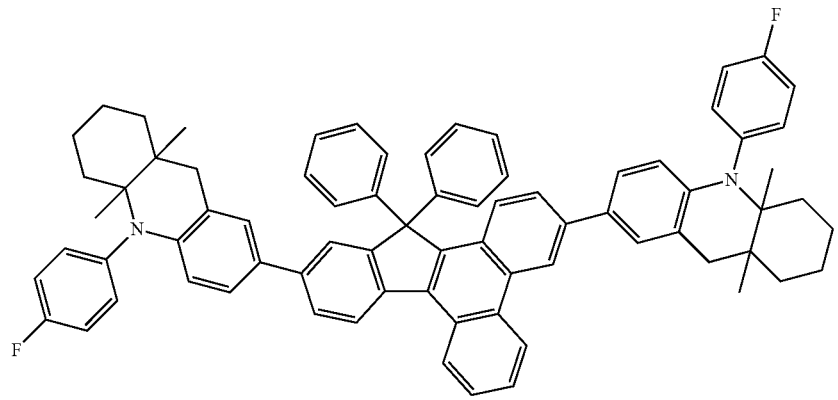
66
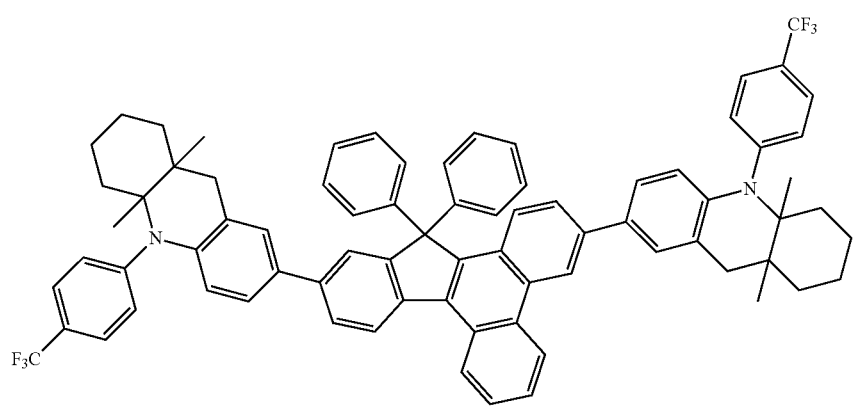
67
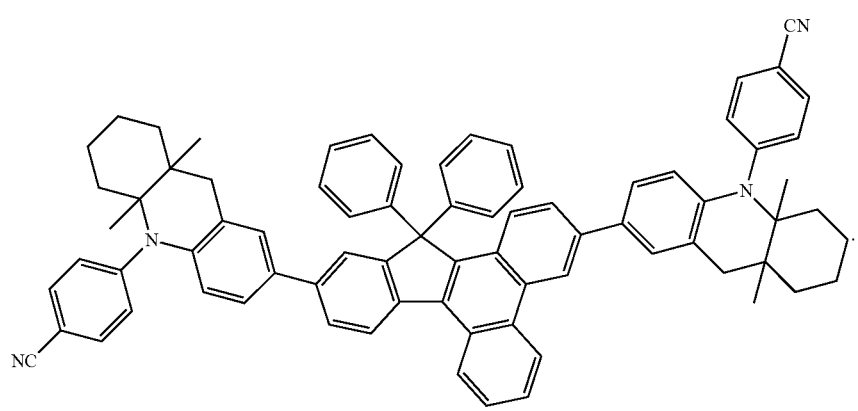
68
* * * * *